US012408537B2

(12) United States Patent
Kuwahara et al.

(10) Patent No.: US 12,408,537 B2
(45) Date of Patent: Sep. 2, 2025

(54) LAMINATE AND ORGANIC ELECTROLUMINESCENT DISPLAY DEVICE

(71) Applicant: FUJIFILM Corporation, Tokyo (JP)

(72) Inventors: Hiroki Kuwahara, Minamiashigara (JP); Nobutaka Fukagawa, Minamiashigara (JP); Daisuke Sasaki, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 644 days.

(21) Appl. No.: 17/677,288

(22) Filed: Feb. 22, 2022

(65) Prior Publication Data

US 2022/0223825 A1 Jul. 14, 2022

Related U.S. Application Data

(63) Continuation of application No. PCT/JP2020/037380, filed on Sep. 30, 2020.

(30) Foreign Application Priority Data

Sep. 30, 2019 (JP) ................................ 2019-178639
Nov. 14, 2019 (JP) ................................ 2019-206018
(Continued)

(51) Int. Cl.
*H10K 59/80* (2023.01)
*H10K 50/842* (2023.01)
*H10K 50/86* (2023.01)

(52) U.S. Cl.
CPC ..... *H10K 59/8722* (2023.02); *H10K 50/8426* (2023.02); *H10K 50/865* (2023.02); *H10K 59/8792* (2023.02)

(58) Field of Classification Search
None
See application file for complete search history.

(56) References Cited

U.S. PATENT DOCUMENTS 4,360,589 A * 11/1982 Kojima ................. C07C 205/38 430/552
2005/0256295 A1* 11/2005 Sakayori ................ C08G 73/10 528/310
(Continued)

FOREIGN PATENT DOCUMENTS

JP 11-193352 A 7/1999
JP 2007-262323 A 10/2007
(Continued)

OTHER PUBLICATIONS

Machine translation of JP 2014-089408 (Year: 2014).*
(Continued)

*Primary Examiner* — Ramsey Zacharia
(74) *Attorney, Agent, or Firm* — Birch, Stewart, Kolasch & Birch, LLP

(57) ABSTRACT

There are provided: a laminate including a wavelength selective absorption layer containing a resin, a dye containing at least one of four specific dyes A to D, and an antifading agent for a dye and a gas barrier layer directly arranged on at least one surface of the wavelength selective absorption layer, in which the gas barrier layer contains a crystalline resin, has a layer thickness of 0.1 μm to 10 μm, and has a layer oxygen permeability of 60 cc/m$^2$·day·atm or less; and an organic electroluminescent display device.

15 Claims, 1 Drawing Sheet

(30) Foreign Application Priority Data

| | | | |
|---|---|---|---|
| Apr. 28, 2020 | (JP) | ................................ | 2020-078899 |
| Jun. 1, 2020 | (JP) | ................................ | 2020-095784 |
| Sep. 30, 2020 | (JP) | ................................ | 2020-165766 |

(56) References Cited

U.S. PATENT DOCUMENTS

| | | | | |
|---|---|---|---|---|
| 2009/0002608 | A1 | 1/2009 | Kameyama et al. | |
| 2010/0148291 | A1* | 6/2010 | Tivarus .................. | G02B 5/208 257/E31.127 |
| 2010/0224839 | A1 | 9/2010 | Kimura et al. | |
| 2014/0044947 | A1 | 2/2014 | Sawada et al. | |
| 2014/0191215 | A1 | 7/2014 | Tojo | |
| 2017/0137444 | A1 | 5/2017 | Sasaki et al. | |

FOREIGN PATENT DOCUMENTS

| | | | |
|---|---|---|---|
| JP | 2007-262327 | A | 10/2007 |
| JP | 2008-203436 | A | 9/2008 |
| JP | 2010-152374 | A | 7/2010 |
| JP | 2011-2816 | A | 1/2011 |
| JP | 2013-101328 | A | 5/2013 |
| JP | 2014-89408 | A | 5/2014 |
| JP | 2014-132522 | A | 7/2014 |
| JP | 2017-203810 | A | 11/2017 |
| JP | 2018-22152 | A | 2/2018 |
| JP | 2019-133148 | A | 8/2019 |
| WO | WO 2007/111157 | A1 | 10/2007 |
| WO | WO 2016/031810 | A1 | 3/2016 |
| WO | WO 2017/014272 | A1 | 1/2017 |
| WO | WO 2018/164062 | A1 | 9/2018 |
| WO | WO 2018/190211 | A1 | 10/2018 |

OTHER PUBLICATIONS

Machine translation of JP 2008-203436 (Year: 2008).*

Japanese Office Action for corresponding Japanese Application No. 2021-551438, dated Sep. 6, 2022, with English translation.

Japanese Office Action for corresponding Japanese Application No. 2021-551438, dated Aug. 23, 2023, with English translation.

International Preliminary Report on Patentability and Written Opinion of the International Searching Authority (Forms PCT/IB/326, PCT/IB/373, and PCT/ISA/237) for International Application No. PCT/JP2020/037380, dated Apr. 14, 2022, with an English translation.

International Search Report (Form PCT/ISA/210) for International Application No. PCT/JP2020/037380, dated Dec. 22, 2020, with an English translation.

Chinese Office Action and Search Report for corresponding Chinese Application No. 202080068481.3, dated Dec. 31, 2024, with English translation.

“PVA system resin for barrier materials,” Kuraray Co., Ltd., Feb. 2011, pp. 3-6 (8 pages total).

“Fiber,” Journal of the Textile Machinery Society of Japan, vol. 55, Dec. 25, 2002, pp. 476-482 (10 pages total).

Asahi Kasei Amidas Corporation, plastics editorial department coeditorship, “Plastic Data Book,” Kogyo Chosakai Publishing Co., Ltd., Dec. 1, 1999, p. 36 (3 pages total).

Japanese Office Action for corresponding Japanese Application No. 2021-551438, dated Aug. 23, 2023, with English translation.

* cited by examiner

LAMINATE AND ORGANIC ELECTROLUMINESCENT DISPLAY DEVICE

CROSS-REFERENCE TO RELATED APPLICATIONS

This application is a Continuation of PCT International Application No. PCT/JP2020/037380 filed on Sep. 30, 2020, which claims priorities under 35 U.S.C. § 119 (a) to Japanese Patent Application No. 2019-178639 filed in Japan on Sep. 30, 2019, Japanese Patent Application No. 2019-206018 filed in Japan on Nov. 14, 2019, Japanese Patent Application No. 2020-078899 filed in Japan on Apr. 28, 2020, Japanese Patent Application No. 2020-095784 filed in Japan on Jun. 1, 2020, and Japanese Patent Application No. 2020-165766 filed in Japan on Sep. 30, 2020. Each of the above applications is hereby expressly incorporated by reference, in its entirety, into the present application.

BACKGROUND OF THE INVENTION

1. Field of the Invention

The present invention relates to a laminate and an organic electroluminescent display device.

2. Description of the Related Art

An organic electroluminescent (OLED) display device is a device that displays an image by utilizing self-luminescence of an OLED element. Therefore, the OLED display device has advantages that a high contrast ratio, a high color reproducibility, a wide viewing angle, a high-speed responsiveness, and reduction in thickness and weight can be achieved, as compared with various display devices such as a liquid crystal display device and a plasma display device. In addition to these advantages, in terms of flexibility, research and development are being actively carried out as a next-generation display device.

On the other hand, in a case where the OLED display device is used in an external light environment such as outdoors, external light is reflected by a metal electrode or the like configuring the OLED display device, resulting in a display defect such as a decrease in contrast. A technique of suppressing external light reflection by providing a circularly polarizing plate having an optically anisotropic layer such as a λ/4 retardation film is known, but the technique causes a problem that brightness decreases.

In recent years, a technique of suppressing a decrease in brightness while suppressing external light reflection by providing a light absorbing layer capable of absorbing external light has been studied.

For example, JP2017-203810A describes a light absorbing layer containing a carbon black pigment and a dye (coloring agent), having a transmittance of 15% to 50% in a wavelength range of 400 nm to 700 nm, and having a haze value of 1.0 or less, as a light absorbing layer, which is provided between a light emitting layer and antireflection film, in a white light source type of an OLED color filter.

In addition, JP2014-132522A describes a light absorption filter showing an absorption spectrum having a negative correlation with an emission spectrum obtained by synthesizing spectra for each pixel of a plurality of colors, as a light absorption filter in an OLED display device. However, there is no specific description on how to achieve a desired absorption spectrum.

SUMMARY OF THE INVENTION

As a result of a study by the present inventors, in the light absorbing layer (light absorption filter) as described in JP2017-203810A, a tint of an image of an OLED display device changes depending on a coloring material such as a coloring agent contained in the light absorption filter, and it has become clear that there is room for improvement in suppressing a change in tint.

As a result of further repeated studies by the present inventors, it was found that a wavelength selective absorption filter comprising four types of dyes each having a main absorption wavelength range in a specific different wavelength range in which an absorbance Ab (λ) at a wavelength a nm satisfies a specific relational expression can achieve both suppression of external light reflection and the suppression of brightness decrease required for application to an OLED display device, and further, an influence on an original tint of a display image can be sufficiently suppressed.

However, in a case where the wavelength selective absorption filter is used as an antireflection unit of an OLED display device instead of a circularly polarizing plate, a configuration is made such that a polarizing plate does not exist on an outside of the wavelength selective absorption filter. Therefore, a dye in the wavelength selective absorption filter is required to have a high light resistance.

For example, WO2017/014272A describes a color correction filter containing two types of coloring agents each having a maximum absorption at a specific different wavelength range and a resin as a color correction filter used in a liquid crystal display device using a white light emitting diode (LED) as a light source. Further, it is described that a gas barrier layer is provided in order to suppress a decrease in an absorption intensity of a coloring agent due to light irradiation. Specifically, a color correction filter provided with a gas barrier layer consisting of an inorganic material $SiO_x$ or $SiN_x$. Among materials having gas barrier properties, an inorganic material can exhibit more excellent gas barrier properties, because an oxygen permeability coefficient is lower and hygroscopicity is also lower than an organic material.

On the other hand, the gas barrier layer consisting of the inorganic material is unsuitable from the viewpoint of industrial productivity. That is, since the gas barrier layer of the inorganic material is obtained by laminating of the inorganic material, such as a plasma-enhanced chemical vapor deposition (plasma CVD) method, a sputtering method, or a thin film deposition method, a preparation step is complicated and the cost also increases, compared to an organic material with which the gas barrier layer can be produced by a coating method, film bonding, or the like. In addition, production efficiency is also inferior. For example, in a case where a gas barrier layer consisting of an inorganic material is formed by a sputtering method, it takes time about 100 to 1000 times to provide a layer having the same thickness as a gas barrier layer of an organic material to be obtained by a coating method, which is not suitable for mass production.

Therefore, an object of the present invention is to provide a laminate comprising a gas barrier layer on a wavelength selective absorption layer, exhibiting excellent light resistance even in a case of being used instead of a circularly polarizing plate as an antireflection unit of an OLED display device, and also being excellent in productivity and an organic electroluminescent display device containing the same.

As a result of intensive studies in view of the above object, it was found that it is not always possible to obtain a desired light resistance simply by combining a wavelength selective absorption layer containing a dye and an antifading agent for a dye and a gas barrier layer containing an organic material having a gas barrier properties, but excellent light resistance can be obtained by configuring the gas barrier layer so as to contain a crystalline resin and have a specific thickness. The present invention has been further studied based on these findings and has been completed.

That is, the above object has been achieved by the following aspects.

<1>

A laminate comprising:

a wavelength selective absorption layer containing a resin, a dye including at least one of the following dyes A to D, and an antifading agent for a dye; and a gas barrier layer directly arranged on at least one surface of the wavelength selective absorption layer, in which the gas barrier layer contains a crystalline resin, a thickness of the gas barrier layer is 0.1 μm to 10 μm, and an oxygen permeability of the gas barrier layer is 60 cc/m$^2$·day·atm or less, dye A: a dye having a main absorption wavelength range at a wavelength of 390 to 435 nm, dye B: a dye having a main absorption wavelength range at a wavelength of 480 to 520 nm, dye C: a dye having a main absorption wavelength range at a wavelength of 580 to 620 nm, and dye D: a dye having a main absorption wavelength range at a wavelength of 680 to 780 nm.

<2>

The laminate according to <1>, in which a degree of crystallinity of the crystalline resin contained in the gas barrier layer is 25% or more.

<3>

The laminate according to <1> or <2>, in which the oxygen permeability of the gas barrier layer is 0.001 cc/m$^2$·day·atm or more and 60 cc/m$^2$·day·atm or less.

<4>

The laminate according to any one of <1> to <3>, in which at least one of the dyes B or C is a squarine-based coloring agent represented by General Formula (1), General Formula (1)

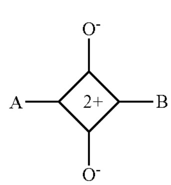

in the formula, A and B each independently represent an aryl group which may have a substituent, a heterocyclic group which may have a substituent, or —CH=G, and G represents a heterocyclic group which may have a substituent.

<5>

The laminate according to any one of <1> to <4>, in which the dye A is a coloring agent represented by General Formula (A1), General Formula (A1)

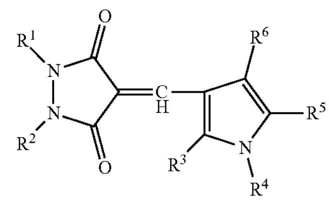

in the formula, $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

<6>

The laminate according to any one of <1> to <5>, in which the dye D is at least one of a coloring agent represented by General Formula (D1) or a coloring agent represented by General Formula (1), General Formula (D1)

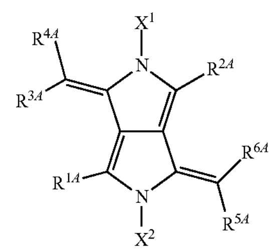

in the formula, $R^{1A}$ and $R^{2A}$ each independently represent an alkyl group, an aryl group, or a heteroaryl group, $R^{4A}$ and $R^{5A}$ each independently represent a heteroaryl group, and $R^{3A}$ and $R^{6A}$ each independently represent a substituent, $X^1$ and $X^2$ each independently represent —$BR^{21a}R^{22a}$, $R^{21a}$ and $R^{22a}$ each independently represent a substituent, and $R^{21a}$ and $R^{22a}$ may be bonded to each other to form a ring, General Formula (1)

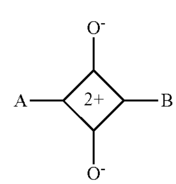

in the formula, A and B each independently represent an aryl group which may have a substituent, a heterocyclic group which may have a substituent, or —CH=G, and G represents a heterocyclic group which may have a substituent.

<7>

The laminate according to any one of <1> to <6>, in which the antifading agent is represented by General Formula (IV), General Formula (IV)

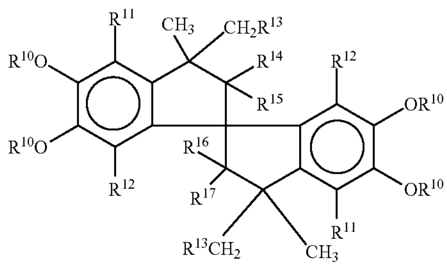

in the formula, $R^{10}$'s each independently represent an alkyl group, an alkenyl group, an aryl group, a heterocyclic group, or a group represented by $R^8CO$—, $R^{19}SO_2$— or $R^{20}NHCO$—, $R^{18}$, $R^{19}$, and $R^{20}$ each independently represent an alkyl group, an alkenyl group, an aryl group, or a heterocyclic group, $R^{11}$ and $R^{12}$ each independently represent a hydrogen atom, a halogen atom, an alkyl group, an alkenyl group, an alkoxy group, or an alkenyloxy group, and $R^3$ to $R^7$ each independently represent a hydrogen atom, an alkyl group, an alkenyl group, or an aryl group.

<8>

The laminate according to any one of <1> to <7>, in which the resin in the wavelength selective absorption layer includes a polystyrene resin.

<9>

The laminate according to any one of <1> to <8>, in which the resin in the wavelength selective absorption layer includes a cyclic polyolefin resin.

<10>

The laminate according to any one of <1> to <9>, in which the wavelength selective absorption layer contains all four dyes A to D.

<11>

The laminate according to any one of <1> to <10>, further comprising:

an ultraviolet absorption layer arranged on an opposite side of the wavelength selective absorption layer with respect to the gas barrier layer, and at least one layer of a pressure sensitive adhesive layer or an adhesive layer, in which any difference in a refractive index between adjacent layers in the laminate is 0.05 or less.

<12>

An organic electroluminescent display device comprising:

the laminate according to any one of <1> to <11>.

In the present invention, in a case where there are a plurality of substituents, linking groups, and the like (hereinafter, referred to as substituents and the like) represented by specific references or formulae, or in a case where a plurality of substituents and the like are defined at the same time, unless otherwise specified, the respective substituents and the like may be the same as or different from each other. The same applies to the definition of the number of the substituents and the like. In addition, in a case where a plurality of substituents and the like are close to each other (particularly in a case where the substituents and the like are adjacent to each other), unless otherwise specified, the substituents and the like may also be linked to each other to form a ring. In addition, unless otherwise specified, rings, for example, alicyclic rings, aromatic rings, and heterocycles may be further fused together and thus form a fused ring.

In the present invention, unless otherwise specified, one type of a component (such as a dye, a resin, an antifading agent for a dye, and other components) forming the wavelength selective absorption layer may be contained in the wavelength selective absorption layer, and two or more types thereof may be contained therein. Similarly, unless otherwise specified, one type of a component (such as a crystalline resin) forming the gas barrier layer may be contained in the gas barrier layer, or two or more types thereof may be contained therein.

In the embodiment of the present invention, unless otherwise specified, there are E-type and Z-type double bonds in the molecule, a double bond may be any of the types or a mixture thereof.

In the present invention, an expression of a compound (including a complex) is used to mean that a salt thereof and an ion thereof are included in addition to the compound itself. In addition, the expression of a compound has a meaning to include that a part of a structure is changed within a range in which an effect of the present invention is not impaired. Further, a compound for which substitution or non-substitution is not specified means that the compound may have a predetermined substituent within a range in which an effect of the present invention is not impaired. The same applies to the substituents and linking groups.

Also, in the present invention, the numerical range represented by "to" means a range including the numerical values described before and after "to" as the lower limit value and the upper limit value.

In the present invention, the term "composition" includes a mixture in which a component concentration varies within a range not impairing a desired function, in addition to a mixture in which a component concentration is constant (each component is uniformly dispersed).

In the present invention, an expression "having a main absorption wavelength range at a wavelength XX to YY nm" means that a wavelength at which the maximum absorption appears (that is, the maximal absorption wavelength) is present in the wavelength range of XX to YY nm. Therefore, in a case where the maximal absorption wavelength is present in the above-mentioned wavelength range, the entire absorption range including this wavelength may be in the above-mentioned wavelength range or may also extend up to the outside of the above-mentioned wavelength range. In addition, in a case where there are a plurality of maximal absorption wavelengths, a maximal absorption wavelength at which highest absorbance appears may be present in the above-mentioned wavelength range. That is, the maximal absorption wavelength other than the maximal absorption wavelength at which highest absorbance appears may be present any wavelength range other than the above-mentioned wavelength range of XX to YY nm.

The laminate according to the embodiment of the present invention is a laminate comprising a gas barrier layer on a wavelength selective absorption layer, and can exhibit excellent light resistance even in a case of being used instead of a circularly polarizing plate as an antireflection unit of an OLED display device and is also excellent in productivity.

In addition, the organic electroluminescent display device according to an embodiment of the present invention comprises the laminate instead of a circularly polarizing plate as an antireflection unit of an OLED display device, and a wavelength selective absorption layer of the laminate can exhibit an excellent light resistance.

DESCRIPTION OF THE PREFERRED EMBODIMENTS

[Laminate]

Figure 1:
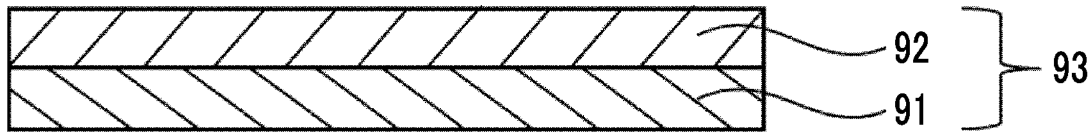
FIG. 1 is a schematic cross-sectional diagram showing an example of a laminate according to an embodiment of the present invention.

A laminate according to an embodiment of the present invention comprises a wavelength selective absorption layer containing a resin, a dye, and an antifading agent for a dye; and a gas barrier layer directly arranged on at least one surface of the wavelength selective absorption layer.

In the laminate according to an embodiment of the present invention, the dye contained in the wavelength selective absorption layer contains at least one of dyes A to D to be described later having a main absorption wavelength range in different wavelength ranges.

The gas barrier layer in the laminate according to an embodiment of the present invention contains a crystalline resin, has a layer thickness of 0.1 m to 10 μm, and has a layer oxygen permeability of 60 cc/m$^2$·day·atm or less.

In the present invention, the main absorption wavelength range of the dye refers to a main absorption wavelength range of the dye measured in a state where the laminate comprising the wavelength selective absorption layer and the gas barrier layer. Specifically, in Examples to be described later, the measurement is performed in the state where the laminate comprises the wavelength selective absorption layer and the gas barrier layer under conditions described in the section of Maximal Absorption Value of Light Resistance Evaluation Film.

The laminate according to the embodiment of the present invention can improve the light resistance of the dye contained in the wavelength selective absorption layer, by providing the gas barrier layer. The reason for this is presumed, and is thought to be as follows. In the dye contained in the wavelength selective absorption layer in the laminate according to the embodiment of the present invention, an absorbance may decrease due to light irradiation. The main cause of this phenomenon is that a singlet oxygen generated by a transfer of excitation energy due to the light irradiation to oxygen molecules decomposes molecules of the dye. The laminate according to the embodiment of the present invention can suppress the decomposition of the dye due to the singlet oxygen generated as described above, by containing the dye and an antifading agent for a dye in the wavelength selective absorption layer. Moreover, by providing the gas barrier layer at least near an air interface in the wavelength selective absorption layer, permeation of the oxygen molecules (oxygen gas) can be suppressed, and as a result, the decomposition of the dye in the wavelength selective absorption layer can be suppressed.

Further, in addition to the above configuration, the laminate according to the embodiment of the present invention comprises the gas barrier layer directly on at least one surface of the wavelength selective absorption layer, and the gas barrier layer contains a crystalline resin and exhibits a specific oxygen permeability. The laminate according to the embodiment of the present invention having such a configuration can suppress the permeation of oxygen molecules at a desired level and is excellent in productivity, but in a case where the gas barrier layer becomes too thick, the amount of the antifading agent moving to an amorphous portion in the crystalline resin increases. As a result, although the oxygen permeability of the gas barrier layer can be reduced by thickening the gas barrier layer, a problem that the desired effect of improving the light resistance cannot be obtained, or conversely, the effect of improving the light resistance is reduced occurs. It is considered that the laminate according to the embodiment of the present invention can realize the effect of suppressing the decrease in light resistance by the antifading agent and the gas barrier layer at an excellent level by forming the gas barrier layer having a specific thickness.

<<Wavelength Selective Absorption Layer>>

The wavelength selective absorption layer in the laminate according to the embodiment of the present invention contains a resin, a dye including at least one of the following dyes A to D each having a main absorption wavelength range in a different wavelength range, and an antifading agent for a dye.

Dye A: a dye having a main absorption wavelength range at a wavelength of 390 to 435 nm Dye B: a dye having a main absorption wavelength range at a wavelength of 480 to 520 nm Dye C: a dye having a main absorption wavelength range at a wavelength of 580 to 620 nm Dye D: a dye having a main absorption wavelength range at a wavelength of 680 to 780 nm In the wavelength selective absorption layer, the "dye" is dispersed (preferably dissolved) in the resin to make the wavelength selective absorption layer a layer exhibiting a specific absorption spectrum derived from the dye. Further, the above-mentioned "antifading agent for a dye" is dispersed (preferably dissolved) in the resin to capture radicals such as singlet oxygen and to be oxidized instead of the dye, and can effectively suppress a fading of the dye.

<Dye>

The wavelength selective absorption layer is a layer containing at least one of the dye A, the dye B, the dye C, or the dye D.

The dye A that can be contained in the wavelength selective absorption layer may include one type or two or more types. Similar to the dye A, the dyes B to D that can be contained in the wavelength selective absorption layer may each independently include one type or two or more types.

The wavelength selective absorption layer can contain a dye other than the dyes A to D.

The form of the wavelength selective absorption layer in the laminate according to the embodiment of the present invention may be adopted as long as the dye in the wavelength selective absorption layer can exhibit an absorption spectrum, may be adopted as long as preferably, both suppression of external light reflection and suppression of brightness decrease can be realized and more preferably, it is less likely to affect the original tint of the display image. Examples of one form of the wavelength selective absorption layer includes a form in which at least one of the dyes A to D is dispersed (preferably dissolved) in the resin. The dispersion may be random, regular, or the like.

In the wavelength selective absorption layer, the dyes A to D have main absorption wavelength ranges in 390 to 435 nm, 480 to 520 nm, 580 to 620 nm, and 680 to 780 nm, which are wavelength ranges other than B (Blue, 460 nm), G (Green, 520 nm), and R (Red, 620 nm) which are used as light emitting sources of the OLED display device, respectively. Therefore, by containing at least one of these dyes A to D, the wavelength selective absorption layer can suppress the external light reflection without impairing a color reproduction range of light emitted from the OLED.

In particular, from the viewpoint of using a wavelength selective absorption layer showing an absorption spectrum having a negative correlation with the emission spectrum of the light emitting source and drawing out the original tint of the image of the OLED display device, in the dye A, the dye B, the dye C, and the dye D contained in the wavelength selective absorption layer, at least two types thereof are preferably used in combination, at least three types thereof are more preferably used in combination, and all four types are still more preferably contained.

In a case where two or more kinds of the dyes A to D are contained in the wavelength selective absorption layer as described above, there may be a problem that the light resistance is lowered due to the mixing of the dyes due to the chain transfer of radicals generated at the time of dye decomposition. Even for such a problem, the laminate according to the embodiment of the present invention can exhibit an excellent level of light resistance that exceeds the decrease in light resistance due to the mixing of dyes by providing a specific gas barrier layer described later.

Above all, from the viewpoint of drawing out the original tint of the image of the OLED display device, it is preferable that the wavelength selective absorption layer contains all four dyes A to D and satisfies the following Relational Expressions (I) to (VI). The wavelength selective absorption layer having such a configuration can satisfy the suppression of external light reflection and the suppression of brightness decrease, and moreover, can maintain the original tint of an image of the OLED display device at an excellent level.

$$Ab\ (450)/Ab\ (430) < 1.0 \qquad \text{Relational Expression (I)}$$

$$Ab\ (450)/Ab\ (500) < 1.0 \qquad \text{Relational Expression (II)}$$

$$Ab\ (540)/Ab\ (500) < 1.0 \qquad \text{Relational Expression (III)}$$

$$Ab\ (540)/Ab\ (600) < 1.0 \qquad \text{Relational Expression (IV)}$$

$$Ab\ (630)/Ab\ (600) \leq 0.5 \qquad \text{Relational Expression (V)}$$

$$Ab\ (630)/Ab\ (700) < 1.0 \qquad \text{Relational Expression (VI)}$$

In addition, an absorbance ratio described in Relational Expressions (I) to (VI) is a value calculated by using a value of the absorbance Ab (λ) at the wavelength λ nm, measured in a state where the laminate comprises the wavelength selective absorption layer and the gas barrier layer under conditions disclosed in the section of "Maximal Absorption Value Of Light Resistance Evaluation Film", in Examples to be described later.

In ranges specified by Relational Expressions (I) to (VI), a preferable range is as follows. An upper limit value of Ab (450)/Ab (430) in Relational Expression (I) is preferably 0.90 or less, more preferably 0.85 or less, still more preferably 0.80 or less, and particularly preferably 0.60 or less. A lower limit value thereof is not particularly limited, and is practically 0.05 or more, preferably 0.10 or more, and more preferably 0.20 or more.

An upper limit value of Ab (450)/Ab (500) in Relational Expression (II) is preferably 0.90 or less, more preferably 0.80 or less, still more preferably 0.75 or less, particularly preferably 0.65 or less, especially preferably 0.60 or less, and most preferably 0.50 or less. A lower limit value thereof is not particularly limited, and is practically 0.05 or more, preferably 0.10 or more, and more preferably 0.20 or more.

An upper limit value of Ab (540)/Ab (500) in Relational Expression (III) is preferably 0.90 or less, more preferably 0.80 or less, still more preferably 0.75 or less, particularly preferably 0.70 or less, especially preferably 0.50 or less, and most preferably 0.20 or less. A lower limit value thereof is not particularly limited, and is practically 0.01 or more, preferably 0.02 or more, and more preferably 0.05 or more.

An upper limit value of Ab (540)/Ab (600) in Relational Expression (IV) is preferably 0.90 or less, more preferably 0.85 or less, still more preferably 0.80 or less, particularly preferably 0.70 or less, especially preferably 0.50 or less, and most preferably 0.25 or less. A lower limit value thereof is not particularly limited, and is practically 0.01 or more, preferably 0.02 or more, and more preferably 0.05 or more.

An upper limit value of Ab (630)/Ab (600) in Relational Expression (V) is preferably 0.40 or less, more preferably 0.30 or less, still more preferably 0.20 or less, and particularly preferably 0.15 or less. A lower limit value thereof is not particularly limited, and is practically 0.01 or more, preferably 0.02 or more, and more preferably 0.05 or more.

An upper limit value of Ab (630)/Ab (700) in Relational Expression (VI) is preferably 0.95 or less, more preferably 0.90 or less, still more preferably 0.80 or less, and particularly preferably 0.75 or less. A lower limit value thereof is not particularly limited, and is practically 0.01 or more, preferably 0.03 or more, more preferably 0.10 or more, still more preferably 0.40 or more, and particularly preferably 0.50 or more.

In a case where Relational Expressions (I) to (VI) satisfy the above-mentioned preferable ranges, providing the laminate according to the embodiment of the present invention can reduce change in tint, and the original tint of the image of the OLED display device can be further drawn out. Therefore, it is preferable that the dyes A to D have a sharp absorption waveform in the main absorption wavelength range.

For example, in a case where the dye B is a squarine-based coloring agent represented by General Formula (1) described later, in the laminate according to the embodiment of the present invention, Relational Expressions (II) and (III) can satisfy the above preferable ranges, and the original tint of the image of the OLED display device can be maintained at a more excellent level. It is considered that this is because the absorbance at a wavelength near the absorption maximum (534 nm) of a green visual pigment of human cones is low.

In addition, in a case where the dye C is the squarine-based coloring agent represented by General Formula (1) described later, in the laminate according to the embodiment of the present invention, Relational Expressions (I) to (IV) can satisfy the above preferable ranges, and the original tint of the image of the OLED display device can be maintained at a more excellent level. Also in this case, it is considered that this is because the absorbance at a wavelength near the absorption maximum (534 nm) of a green visual pigment of human cones is low, as described above.

In particular, satisfying Relational Expression (V) is important in terms of not affecting the original tint of the image of the OLED display device. It is considered that Relational Expression (V) can suppress a change of a*, and as a result, the tint can be maintained at an excellent level.

(Dye A)

The dye A is not particularly limited as long as the dye has the main absorption wavelength range in a wavelength of 390 to 435 nm in the laminate, and various dyes can be used.

As the dye A, a coloring agent represented by General Formula (A1) is preferable in that an absorption waveform in the main absorption wavelength range is sharp.

General Formula (A1)

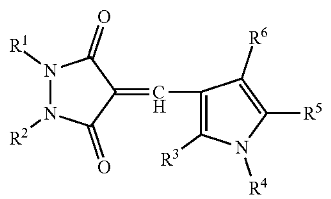

In Formula (A1), $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

The alkyl group that can be employed as $R^1$ and $R^2$ may be any of an unsubstituted alkyl group or a substituted alkyl group having a substituent, and any of linear or branched, and may have a cyclic structure.

Examples of the unsubstituted alkyl group include a methyl group, an ethyl group, a normal propyl group, an isopropyl group, and a cyclohexyl group. The number of carbon atoms in the unsubstituted alkyl group is preferably 1 to 12 and more preferably 1 to 6.

Examples of the substituent that the substituted alkyl group can include substituents included in a substituent group A below.

(Substituent Group A)

A halogen atom, an alkyl group, a cycloalkyl group, an aralkyl group, an alkenyl group, an alkynyl group, an aryl group, a heterocyclic group, a cyano group, a hydroxy group, a nitro group, and a carboxyl group (may be in the form of a salt), an alkoxy group, an aryloxy group, a silyloxy group, a heterocyclic oxy group, an acyloxy group, a carbamoyloxy group, a sulfonyloxy group, an alkoxycarbonyloxy group, an aryloxycarbonyloxy group, and an amino group (containing a substituted amino group represented by $—NR^a_2$ in addition to $—NH_2$, $R^a$ each independently represent a hydrogen atom, an alkyl group, an aryl group, or a heteroaryl group, where at least one $R^a$ is an alkyl group, an aryl group, or a heteroaryl group), an acylamino group, an aminocarbonylamino group, an alkylcarbonylamino group, an alkoxycarbonylamino group, an aryloxycarbonylamino group, sulfamoylamino group, an alkylsulfonylamino group, an arylsulfonylamino group, a sulfonamide group, a mercapto group, an alkylthio group, an arylthio group, a heterocyclic thio group, a sulfamoyl group, and a sulfo group (may be in the form of a salt), an alkyl sulfinyl group, an arylsulfinyl group, an alkylsulfonyl group, an arylsulfonyl group, an acyl group, an aryloxycarbonyl group, an alkoxycarbonyl group, a carbamoyl group, an imide group, a phosphino group, a phosphinyl group, a phosphinyloxy group, a phosphinylamino group, or a silyl group, and a monovalent group in which at least two of these are linked.

In the substituent group A, preferable examples of the substituent that the substituted alkyl group can include a halogen atom, an aryl group, an alkoxy group, an acyl group, and a hydroxy group.

The total number of carbon atoms in the substituted alkyl group is preferably 1 to 12 and. Examples thereof include a benzyl group, a hydroxybenzyl group, a methoxyethyl group, and the like.

The total number of carbon atoms in the substituted alkyl group means the total number of carbon atoms in the substituted alkyl group including the substituent that the substituted alkyl group can have. Hereinafter, the same meaning will be used in other groups.

In a case where both $R^1$ and $R^2$ represent an alkyl group, the alkyl groups may be the same as or different from each other.

The aryl group that can be employed as $R^1$ and $R^2$ may be any of an unsubstituted aryl group or a substituted aryl group having a substituent.

The unsubstituted aryl group is preferably an aryl group having 6 to 12 carbon atoms, and examples thereof include a phenyl group.

Examples of the substituent that the substituted aryl group can include substituents included in the substituent group A.

In the substituent group A, preferable examples of the substituent that the substituted aryl group can have include a halogen atom (for example, a chlorine atom, a bromine atom, and an iodine atom), a hydroxy group, a carboxy group, a sulfonamide group, and an amino group (preferably, a substituted amino group represented by $—NR^a_2$, $R^a$ each independently represents a hydrogen atom or an alkyl group, where at least one $R^a$ is an alkyl group, and the number of carbon atoms is preferably 1 to 4), an alkyl group (preferably, an alkyl group having 1 to 4 carbon atoms; for example, methyl, ethyl, normal propyl, and isopropyl), an alkoxy group (preferably, an alkoxy group having 1 to 4 carbon atoms; for example, methoxy, ethoxy, normal propoxy, and isopropoxy), an alkoxycarbonyl group (preferably, an alkoxycarbonyl groups having 2 to 5 carbon atoms; for example, methoxycarbonyl, ethoxycarbonyl, normal propoxycarbonyl, and isopropoxycarbonyl), or a sulfonyloxy group, and a monovalent group in which at least the two thereof are linked to each other.

As the substituted aryl group, an aryl group having a total number of 6 to 18 carbon atoms is preferable.

For example, examples thereof include a 4-chlorophenyl group, a 2,5-dichlorophenyl group, a hydroxyphenyl group, a 4-carboxyphenyl group, a 3,5-dicarboxyphenyl group, a 4-methanesulfonamidephenyl group, a 4-methylphenyl group, a 4-methoxyphenyl group, a 4-(2-hydroxyethoxy)phenyl group, an N,N-dimethylaminophenyl group, a 4-(N-carboxymethyl-N-ethylamino)phenyl group, a 4-ethoxycarbonylphenyl group, and 4-methanesulfonyloxyphenyl group.

In a case where both $R^1$ and $R^2$ represent an aryl group, the aryl groups may be the same as or different from each other.

Examples of the substituent that can be employed as $R^3$, $R^4$, $R^5$, and $R^6$ can include substituents included in the substituent group A.

In also the substituent group A, $R^3$, $R^5$, and $R^6$ are preferably an alkyl group or an aryl group. That is, $R^3$, $R^5$, and $R^6$ are each independently preferably a hydrogen atom, an alkyl groups, or an aryl group.

In addition, in the substituent group A, $R^4$ is preferably an alkyl group or an aryl group. That is, $R^4$ is preferably a hydrogen atom, an alkyl group, or an aryl group.

The alkyl group that can be employed as $R^3$, $R^5$, and $R^6$ may be any of an unsubstituted alkyl group or a substituted alkyl group having a substituent, and any of linear or branched, and may have a cyclic structure.

Examples of the unsubstituted alkyl group that can be employed as $R^3$, $R^5$, and $R^6$ include a methyl group, an ethyl group, a normal propyl group, and an isopropyl group. The number of carbon atoms of the unsubstituted alkyl group that can be employed as $R^3$, $R^5$, and $R^6$ is preferably 1 to 8 and more preferably 1 to 4.

Examples of the substituent that the substituted alkyl group can have in $R^3$, $R^5$, and $R^6$ include substituents included in the substituent group A.

Preferable examples of the substituent that the substituted alkyl group can have in $R^3$, $R^5$, and $R^6$ include an aryl group (preferably a phenyl group), a carboxy group, and a hydroxy group.

The total number of carbon atoms in the substituted alkyl group that can be employed as $R^3$, $R^5$, and $R^6$ is preferably 1 to 8. For example, a benzyl group, a carboxymethyl group, and a hydroxymethyl group are exemplified.

In a case where $R^3$, $R^5$, and $R^6$ all represent an alkyl group, the alkyl groups may be the same as or different from each other.

The aryl group that can be employed as $R^3$, $R^5$, and $R^6$ may be any of an unsubstituted aryl group or a substituted aryl group which has been substituted.

The unsubstituted aryl group that can be employed as $R^3$, $R^5$, and $R^6$ is preferably an aryl group having 6 to 10 carbon atoms, and examples thereof include a phenyl group.

Examples of the substituent that the substituted aryl group can have in $R^3$, $R^5$, and $R^6$ include substituents included in the substituent group A.

Preferable examples of the substituent that the substituted aryl group can have in $R^3$, $R^5$, and $R^6$ include a halogen atom (for example, a chlorine atom, a bromine atom, and an iodine atom), a hydroxy group, a carboxy group, alkyl groups (preferably alkyl groups having 1 to 4 carbon atoms; for example, methyl, ethyl, normal propyl, and isopropyl).

As the substituted aryl group that can be employed as $R^3$, $R^5$, and $R^6$, an aryl group having a total number of 6 to 10 carbon atoms is preferable. For example, a 4-chlorophenyl group, a 2,5-dichlorophenyl group, a hydroxyphenyl group, a carboxyphenyl group, a 3,5-dicarboxyphenyl group, and a 4-methylphenyl group are exemplified.

In a case where both $R^5$ and $R^6$ are substituents, it is preferable that $R^3$ is a hydrogen atom from the viewpoint of light resistance and heat resistance.

In a case where $R^3$, $R^5$, and $R^6$ are all aryl groups, the aryl groups may be the same as or different from each other.

The alkyl group that can be employed as $R^4$ may be any of unsubstituted alkyl group or a substituted alkyl group having a substituent and any of linear or branched, and may have a cyclic structure.

Examples of the unsubstituted alkyl group that can be employed as $R^4$ include a methyl group, an ethyl group, a normal propyl group, an isopropyl group, and a cyclohexyl group. The number of carbon atoms of the unsubstituted alkyl group that can be employed as $R^4$ is preferably 1 to 8 and more preferably 1 to 4.

Examples of the substituent that the substituted alkyl group can have in $R^4$ include substituents included in the substituent group A.

Preferable examples of the substituent that the substituted alkyl group in $R^4$ can include an aryl group (preferably, a phenyl group), a heterocyclic group, a carboxy group, a hydroxy group, an alkyl group (preferably, an alkyl group having 1 to 4 carbon atoms; for example, methyl, ethyl, normal propyl, and isopropyl), an alkoxy group (preferably, an alkoxy group having 1 to 4 carbon atoms; for example, methoxy, ethoxy, normal propoxy, and isopropoxy), an aryloxy group, an alkoxycarbonyl group (preferably, an alkoxycarbonyl groups having 2 to 5 carbon atoms; for example, methoxycarbonyl, ethoxycarbonyl, normal propoxycarbonyl, and isopropoxycarbonyl), and an alkylamino group (preferably an alkylamino group having 1 to 4 carbon atoms; for example, a dimethylamino group), an alkylcarbonylamino group (preferably, an alkylcarbonylamino group having 1 to 4 carbon atoms; for example, a methylcarbonylamino group), a cyano group, and an acyl group, and a monovalent group in which at least the two thereof are linked to each other.

The total number of carbon atoms in the substituted alkyl group that can be employed as $R^4$ is preferably 1 to 18.

For example, a benzyl group, a carboxybenzyl group, a hydroxybenzyl group, a methoxycarbonylethyl group, an ethoxycarbonylmethyl group, a 2-cyanoethyl group, a 2-propionylaminoethyl group, a dimethylaminomethyl group, a methylcarbonylaminopropyl group, a di(methoxycarbonylmethyl)aminopropyl group, and a phenacyl group are exemplified.

The aryl group that can be employed as $R^4$ may be any of an unsubstituted aryl group or a substituted aryl group having a substituent.

The unsubstituted aryl group that can be employed as $R^4$ is preferably an aryl group having 6 to 12 carbon atoms, and examples thereof include a phenyl group.

Examples of the substituent that the substituted aryl group can have in $R^4$ include substituents included in the substituent group A.

Preferable examples of the substituent that the substituted aryl group can have in $R^4$ include a halogen atom (for example, a chlorine atom, a bromine atom, and an iodine atom), a hydroxy group, a carboxy group, a sulfonamide group, and an amino group, an alkyl group (preferably, an alkyl group having 1 to 4 carbon atoms; for example, methyl, ethyl, normal propyl, and isopropyl), an alkoxy group (preferably, an alkoxy group having 1 to 4 carbon atoms; for example, methoxy, ethoxy, normal propoxy, and isopropoxy), an alkoxycarbonyl group (preferably, an alkoxycarbonyl groups having 2 to 5 carbon atoms; for example, methoxycarbonyl, ethoxycarbonyl, normal propoxycarbonyl, and isopropoxycarbonyl), and a sulfonyloxy group, and a monovalent group and the like in which at least the two thereof are linked to each other.

The amino groups that the substituted aryl group can have in $R^4$ may be any of an unsubstituted amino group ($—NH_2$) and a substituted amino group having a substituent ($—NR^a{}_2$ in the substituent group A).

In the amino group ($—NR^a{}_2$) that the substituted aryl group can have in $R^4$, a group similar to the substituted alkyl group in $R^4$ can be exemplified as $R^a$.

As the substituted amino group, an alkylamino group in which one or two hydrogen atoms in the amino group are substituted with an alkyl group is preferable.

Examples of the alkylamino group include a methylamino group, a dimethylamino group, a diethylamino group, and a pyrrolidino group. The number of carbon atoms in the alkylamino group is preferably 1 to 8 and more preferably 1 to 4.

As the substituted aryl group that can be employed as $R^4$, an aryl group having a total number of 6 to 22 carbon atoms is preferable. Examples thereof include a 4-chlorophenyl group, a 2,5-dichlorophenyl group, a hydroxyphenyl group, a 2,5-methoxyphenyl group, a 2-methoxy-5-ethoxycarbonylphenyl group, a 4-ethyloxycarbonylphenyl group, a 4-ethoxycarbonylphenyl group, a 4-butoxycarbonylphenyl group, a 4-octyloxycarbonylphenyl group, a 4-carboxyphenyl group, a 3,5-dicarboxyphenyl group, a 4-methanesulfonamidephenyl group, a 4-methylphenyl group, a 4-methoxyphenyl group, a 4-ethoxyphenyl group, a 4-(2-hydroxyethoxy)phenyl group, a N,N-dimethylaminophenyl group, a N,N-diethylaminophenyl group, a 4-(N-carboxymethyl-N-ethylamino)phenyl group, a 4-{N,N-di(ethoxycarbonylmethyl)amino}phenyl group, a 4-{di(ethoxycarbonylmethyl)amino}carbonylphenyl, a 4-ethoxycarbonylphenyl group, a 4-methanesulfonyloxyphenyl group, a 4-acetylsulfamoylphenyl, a 4-propionylsulfamoylphenyl, and 4-methanesulfoneamidephenyl.

$R^5$ and $R^6$ may be bonded to each other to form a 6-membered ring.

The 6-membered ring formed by $R^5$ and $R^6$ bonded to each other is preferably a benzene ring.

In particular, from the viewpoint of light resistance, among $R^1$ and $R^2$ in Formula (A1), it is preferable that $R^1$ is an alkyl group, and it is more preferable that $R^1$ is an alkyl group and $R^2$ is an alkyl group or an aryl group. In addition, from the same viewpoint, it is still more preferable that both $R^1$ and $R^2$ are each independently an alkyl group, and it is particularly preferable that both $R^1$ and $R^2$ are alkyl groups each having 1 to 8 carbon atoms.

Further, from the viewpoint of heat resistance and light resistance, it is also preferable that both $R^1$ and $R^2$ in Formula (A1) are aryl groups.

In a case where $R^1$ and $R^2$ each independently represent an aryl group, $R^3$, $R^5$, and $R^6$ are each independently a hydrogen atom, an alkyl group, or an aryl group, and at least one of $R^3$ or $R^6$ is preferably a hydrogen atom. Among these, from the viewpoint of heat resistance and light resistance, a case where $R^3$ represents a hydrogen atom, and $R^5$ and $R^6$ each independently represent an alkyl group or an aryl group is more preferable. A case where $R^3$ represents a hydrogen atom and $R^5$ and $R^6$ each independently represent an alkyl group is still more preferable. A case where $R^3$ represents a hydrogen atom, $R^5$ and $R^6$ each independently represent an alkyl group, and $R^5$ and $R^6$ are bonded to each other to form a ring and fused with a pyrrole ring to form an indole ring together with the pyrrole ring is particularly preferable. That is, the coloring agent represented by General Formula (A1) is particularly preferably a coloring agent represented by General Formula (A2).

General Formula (A2)

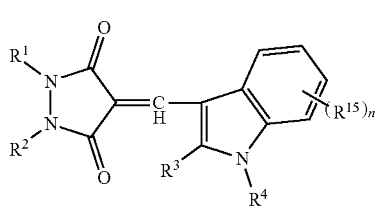

In Formula (A2), $R^1$ to $R^4$ have the same meanings as $R^1$ to $R^4$ in General Formula (A1), and preferable embodiments are also the same.

In Formula (A2), $R^5$ represents a substituent. Examples of the substituent that can be employed as $R^{15}$ can include substituents included in the substituent group A. As $R^{15}$, an alkyl group, an aryl group, a halogen atom, an acyl group, or an alkoxycarbonyl group is preferable.

The alkyl group and the aryl group that can be employed as $R^{15}$ have the same meaning as the alkyl group and the aryl group that can be employed as $R^3$, $R^5$, and $R^6$, respectively, and preferable embodiments thereof are the same, respectively.

Examples of the halogen atom that can be employed as $R^{15}$ include a chlorine atom, a bromine atom, and an iodine atom.

Examples of the acyl group that can be employed as $R^{15}$ include an acetyl group, a propionyl group, and a butyroyl group.

As the alkoxycarbonyl group that can be employed as $R^{15}$, an alkoxycarbonyl group having 2 to 5 carbon atoms is preferable, and examples thereof include methoxycarbonyl, ethoxycarbonyl, normal propoxycarbonyl, and isopropoxycarbonyl.

n represents an integer of 0 to 4. n is not particularly limited, and is, for example, preferably 0 or 1.

Specific examples of the coloring agent represented by General Formula (A1) are shown below. However, the present invention is not limited thereto.

In the specific examples below, Me represents a methyl group.

E-1

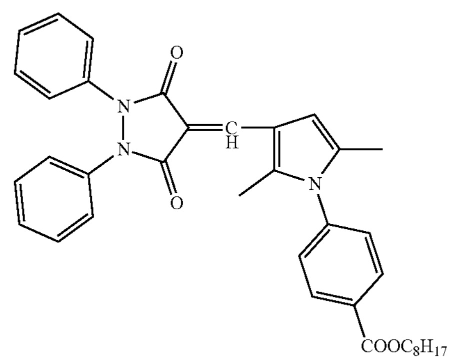

E-2

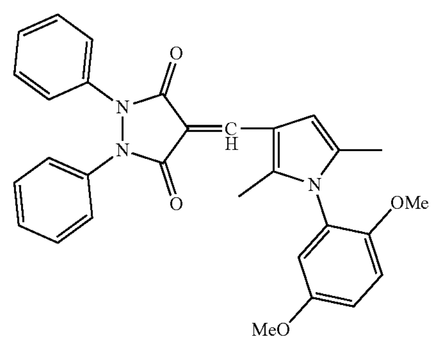

E-3

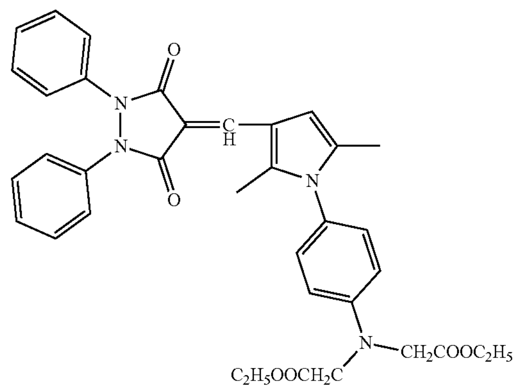

-continued
E-4
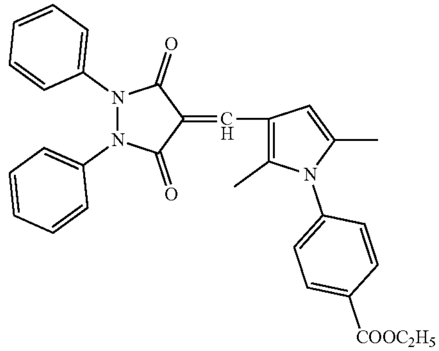
E-5
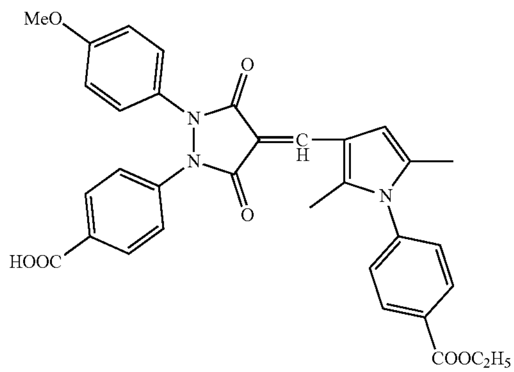
E-6
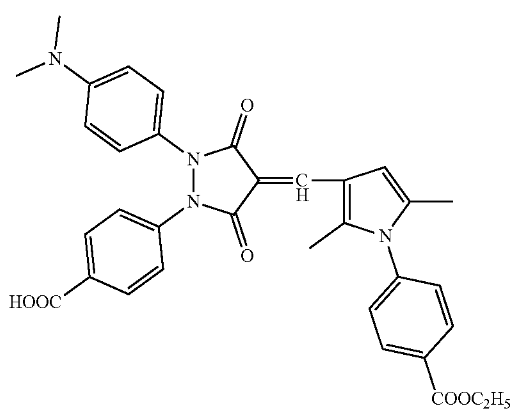
E-7
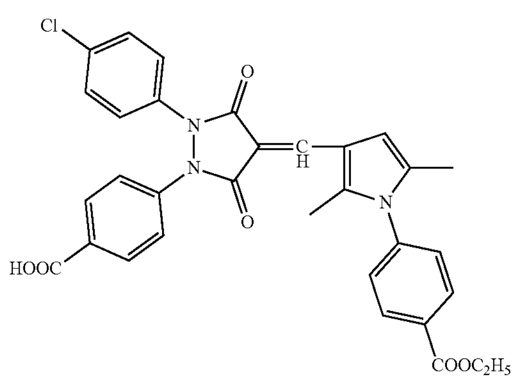
-continued
E-8
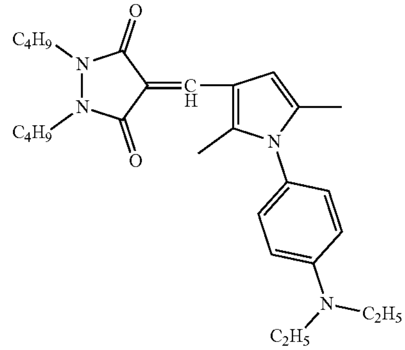
E-9
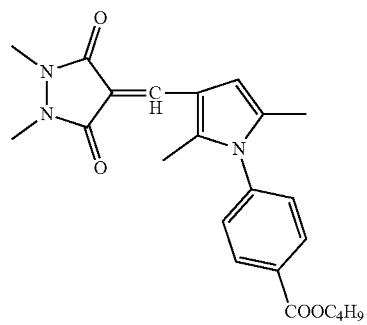
E-10
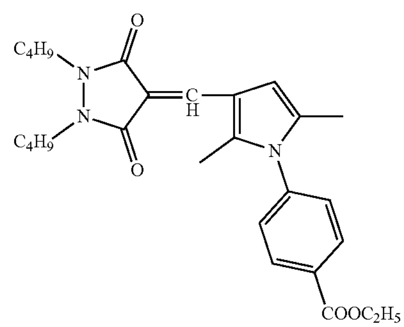
E-11
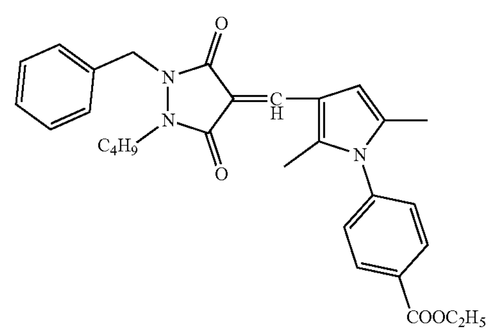

-continued
E-12
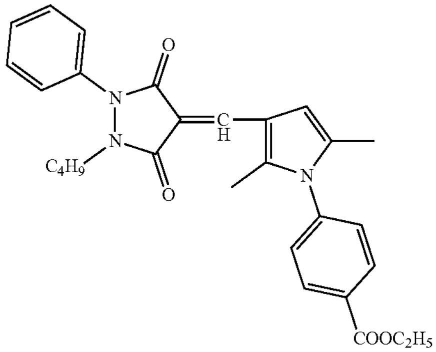
E-13
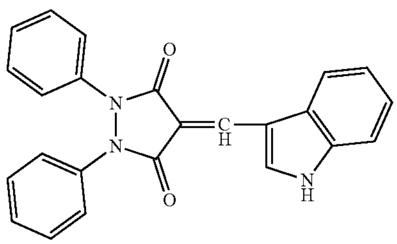
E-14
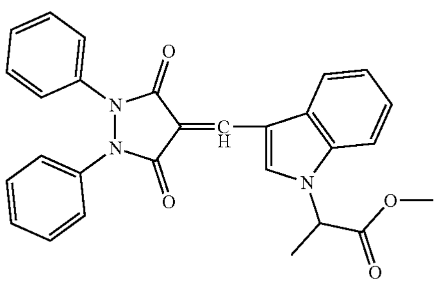
E-15
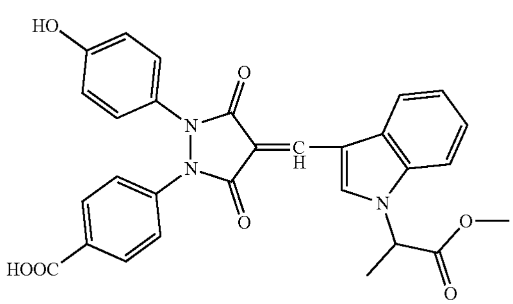
E-16
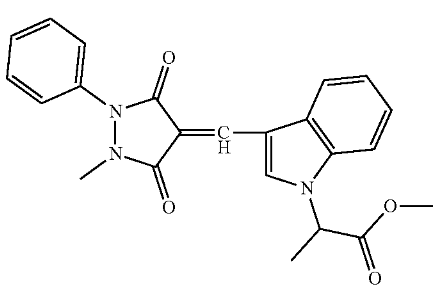
-continued
E-17
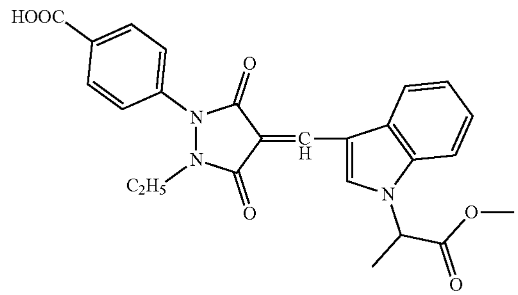
E-18
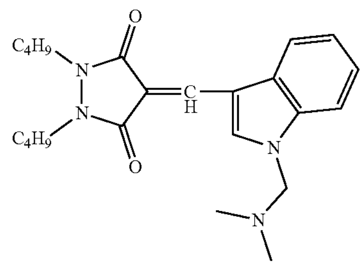
E-19
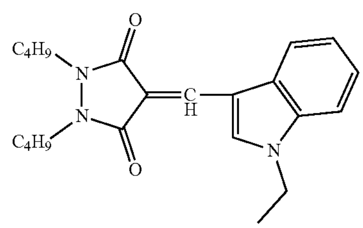
E-20
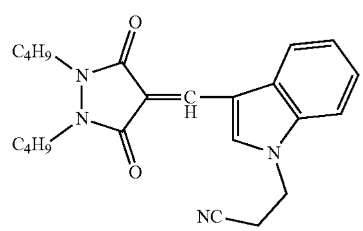
E-21
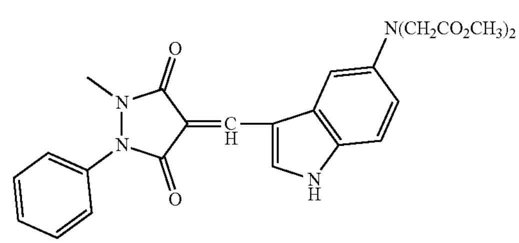
E-22
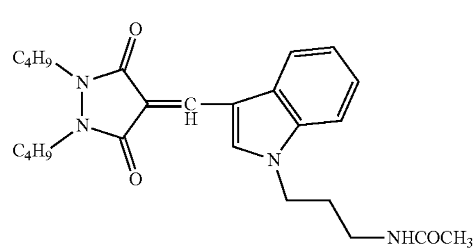

-continued
E-23
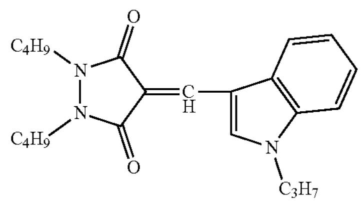
E-24
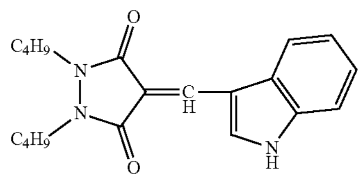
E-25
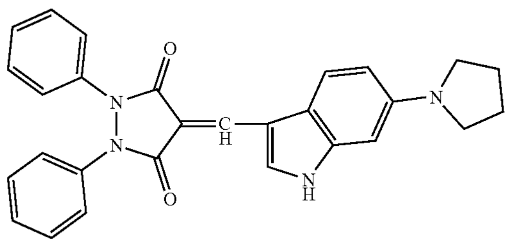
E-26
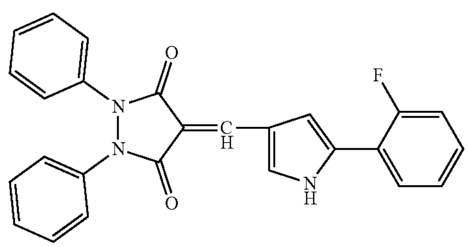
E-27
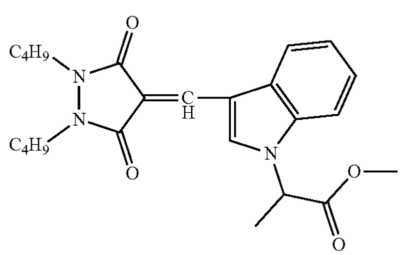
E-28
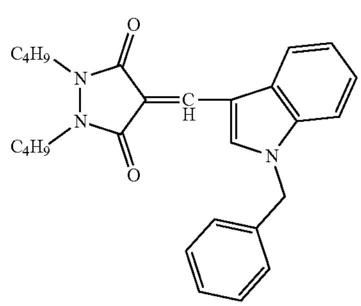
-continued
E-29
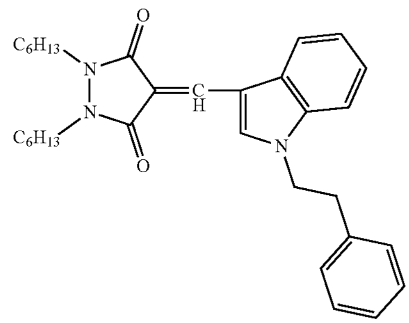
E-30
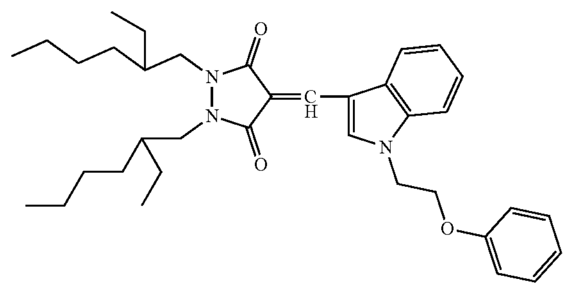
E-31
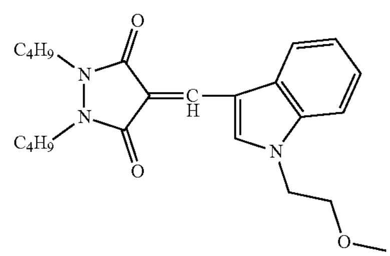
E-32
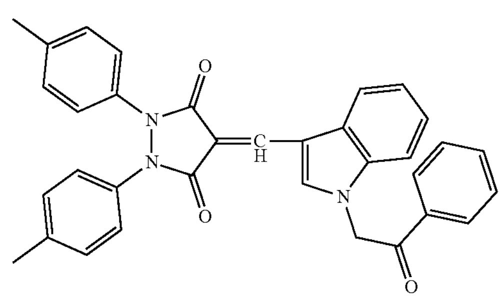
E-33
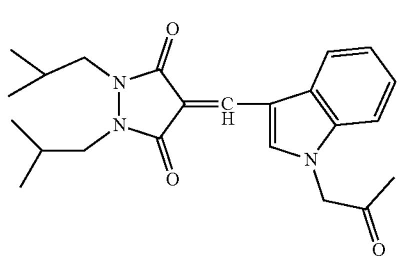

-continued

E-34

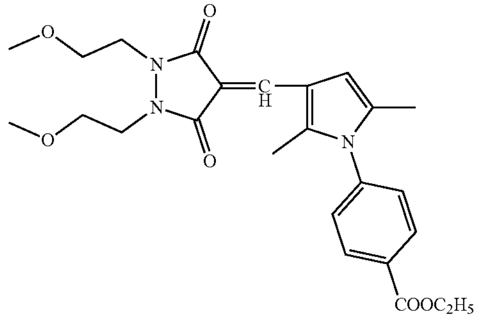

E-35

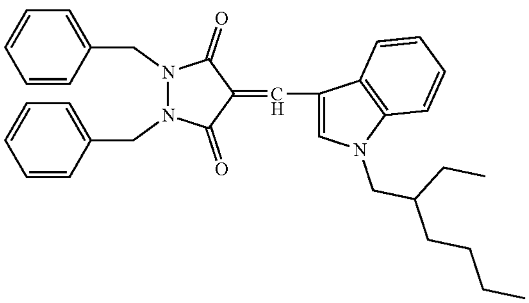

E-36

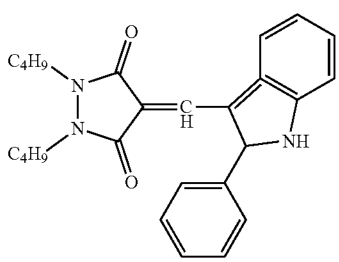

E-37

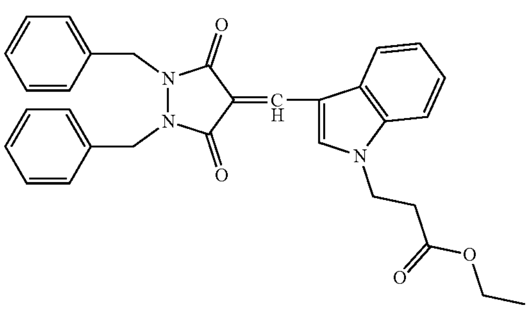

E-38

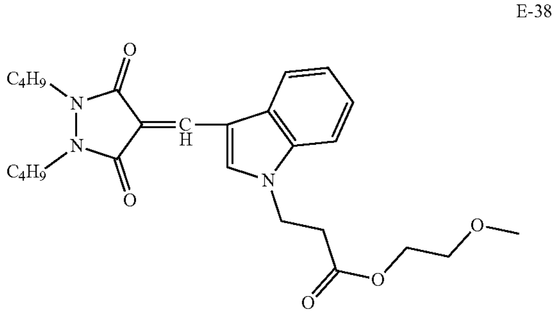

-continued

E-39

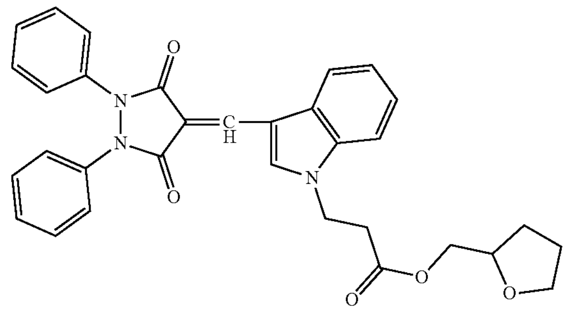

As the dye A, in addition to the coloring agent represented by General Formula (2), the compounds described in paragraphs 0012 to 0067 of JP2007-53241A (JP-H05-53241A) and the compounds described in paragraphs 0011 to 0076 of JP2707371B can also be preferably used.

(Dye B and Dye C)

The dye B is not particularly limited as long as the dye has the main absorption wavelength range in a wavelength of 480 to 520 nm in the laminate, and various dyes can be used.

In addition, the dye C is not particularly limited as long as the dye has the main absorption wavelength range in a wavelength of 580 to 620 nm in the laminate, and various dyes can be used.

Specific examples of the dye B include, for example, individual coloring agents (dyes) such as pyrrole methine (PM)-based dyes, rhodamine (RH)-based dyes, boron dipyrromethene (BODIPY)-based dyes, and squarine (SQ)-based dyes.

Specific examples of the dye C include, for example, individual coloring agents (dyes) such as tetraaza porphyrin (TAP)-based dyes, squarine-based dyes, and cyanine (CY)-based dyes.

Among these, as the dye B and the dye C, squarine-based coloring agents are preferable, and squarine-based coloring agents represented by General Formula (1) are more preferable in that an absorption waveform in the main absorption wavelength range is sharp. By using the coloring agent having a sharp absorption waveform as described above as the dye B and the dye C, Relational Expressions (I) to (VI) can be satisfied at a preferable level, and the original tint of the image of the OLED display device can be maintained at a more excellent level.

That is, in the wavelength selective absorption layer, from the viewpoint of suppressing a change in tint, it is preferable that at least one of the dye B or the dye C is a squarine-based coloring agent (preferably, a squarine-based coloring agent represented by General Formula (1)), and it is more preferable that both the dye B and the dye C are squarine-based coloring agents (preferably, squarine-based coloring agents represented by General Formula (1)).

In the present invention, in the coloring agents represented by each of general formulae, a cation is present in a delocalized manner, and a plurality of tautomer structures are present. Therefore, in the present invention, in a case where at least one tautomer structure of a certain coloring agent matches with each of the general formulae, a certain coloring agent is considered as the coloring agents represented by each of general formulae. Therefore, a coloring agent represented by a specific general formula can also be said to be a coloring agent having at least one tautomer structure that can be represented by the specific general formula. In the present invention, a coloring agent represented by a general formula may have any tautomer structure as long as at least one tautomer structure of the coloring agent matches with the general formula.

General Formula (1)

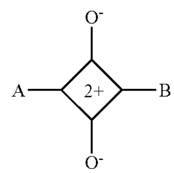

In General Formula (1), A and B each independently represent an aryl group which may have a substituent, a heterocyclic group which may have a substituent, or —CH=G. G represents a heterocyclic group which may have a substituent.

The aryl group that can be employed as A or B is not particularly limited and may be a group consisting of a single ring or a group consisting of a fused ring. The number of carbon atoms in the aryl group is preferably 6 to 30, more preferably 6 to 20, and still more preferably 6 to 12. Examples of the aryl group include individual groups consisting of a benzene ring or a naphthalene ring, and groups consisting of a benzene ring are more preferable.

A heterocyclic group that can be employed as A or B is not particularly limited, and examples thereof include groups consisting of an aliphatic heterocycle or an aromatic heterocycle. Groups consisting of an aromatic heterocycle are preferable. Examples of a heteroaryl group that is an aromatic heterocyclic group include heteroaryl groups that can be employed as a substituent X described below. The aromatic heterocyclic group that can be employed as A or B is preferably a group of a 5-membered ring or a 6-membered ring and more preferably a group of a nitrogen-containing 5-membered ring. Specific examples thereof suitably include a group consisting of any or a pyrrole ring, a furan ring, a thiophene ring, an imidazole ring, a pyrazole ring, a thiazole ring, an oxazole ring, a triazole ring, an indole ring, an indolenine ring, an indoline ring, a pyridine ring, a pyrimidine ring, a quinoline ring, a benzothiazole ring, a benzoxazole ring, and a pyrazolotriazole ring. Among these, groups consisting of any one of a pyrrole ring, a pyrazole ring, a thiazole ring, a pyridine ring, a pyrimidine ring, or a pyrazolotriazole ring are preferable. The pyrazolotriazole ring consists of a fused ring of a pyrazole ring and a triazole ring and may be a fused ring obtained by fusing at least one pyrazole ring and at least one triazole ring. Examples thereof include fused rings in General Formulae (4) and (5) described below.

A and B may be bonded to a squaric acid moiety (the 4-membered ring represented by General Formula (1)) at any moiety (ring-constituting atom) without particular limitation, and is preferable to be bonded with a carbon atom.

G in —CH=G that can be employed as A or B represents a heterocyclic group which may have a substituent, and examples thereof suitably include examples shown in the heterocyclic group that can be employed as A or B. Among these, groups consisting of any of a benzoxazole ring, a benzothiazole ring, and an indoline ring, or the like are preferable.

At least one of A or B may have a hydrogen-bonding group that forms an intramolecular hydrogen bond.

Each of A, B, and G may have the substituent X, and, in a case where A, B, or G has the substituent X, adjacent substituents may be bonded to each other to further form a ring structure. In addition, a plurality of substituents X may be present. In a case where adjacent substituents X are bonded to each other to further form a ring structure, the two substituents X may form a ring with a hetero atom such as a boron atom interposed therebetween. The boron atom may be further substituted with a substituent, and examples thereof include substituents such as an alkyl group and an aryl group. Examples of a ring formed by bonding two substituents X include a ring formed by bonding two following $—NR^{14}R^{15}$ and a ring formed by bonding two following $—NR^{14}R^{15}$'s with a boron atom therebetween.

Examples of the substituent X include substituents that can be employed as $R^1$ in General Formula (2) described below. Specific examples thereof include a halogen atom, a cyano group, a nitro group, an alkyl group (including a cycloalkyl group), an alkenyl group, an alkynyl group, an aryl group, a heteroaryl group, an aralkyl group, and a ferrocenyl group, $—OR^{10}$, $—C(=O)R^{11}$, $—C(=O)OR^{12}$, $—OC(=O)R^{13}$, $—NR^{14}R^{15}$, $—NHCOR^{16}$, $—CONR^{17}R^{18}$, $—NHCONR^{19}R^{20}$, $—NHCOOR^{21}$, $—SR^{22}$, $—SO_2R^{23}$, $—SO_3R^{24}$, $—NHSO_2R^{18}$, and $SO_2NR^{26}R^{27}$. Further, it is also preferable that the substituent X has a quencher portion described later, in addition to the ferrocenyl group.

In General Formula (1), $R^{10}$ to $R^{27}$ each independently represent a hydrogen atom, an aliphatic group, an aromatic group, or a heterocyclic group. The aliphatic group and the aromatic group that can be employed as $R^{10}$ to $R^{27}$ are not particularly limited, and appropriately selected from an alkyl group, a cycloalkyl group, an alkenyl group, and an alkynyl group which are classified as aliphatic groups, and an aryl group which is classified as an aromatic group, in the substituent that can be employed as $R^1$ in General Formula (2) described later. The heterocyclic group that can be employed as $R^{10}$ to $R^{21}$ may be aliphatic or aromatic, and can be appropriately selected from heteroaryl groups or heterocyclic groups that can be employed as $R^1$ in General Formula (2) described below.

Meanwhile, in a case where $R^{12}$ of $—COOR^{12}$ is a hydrogen atom (that is, a carboxy group), the hydrogen atom may be dissociated (that is, a carbonate group) or may be in a salt state. In addition, in a case where $R^{24}$ of $—SO_3R^{24}$ is a hydrogen atom (that is, a sulfo group), the hydrogen atom may be dissociated (that is, a sulfonate group) or may be in a salt state.

As the halogen atom that can be employed as the substituent X, a fluorine atom, a chlorine atom, a bromine atom, and an iodine atom are exemplified.

The number of carbon atoms in the alkyl group that can be employed as the substituent X is preferably 1 to 20, more preferably 1 to 15, and still more preferably 1 to 8. The number of carbon atoms in the alkenyl group is preferably 2 to 20, more preferably 2 to 12, and still more preferably 2 to 8. The number of carbon atoms in the alkynyl group is preferably 2 to 40, more preferably 2 to 30, and particularly preferably 2 to 25. The alkyl group, the alkenyl group, and the alkynyl group each may be any of linear, branched, or cyclic and are preferably linear or branched.

The aryl group that can be employed as the substituent X may include a monocyclic group or a fused ring group. The aryl group preferably has 6 to 30 carbon atoms, more preferably 6 to 20 carbon atoms, and even more preferably 6 to 12 carbon atoms.

An alkyl portion in the aralkyl group that can be employed as the substituent X is the same as that in the alkyl group. An aryl portion in the aralkyl group is the same as that in the aryl group. The number of carbon atoms in the aralkyl group is preferably 7 to 40, more preferably 7 to 30, and still more preferably 7 to 25.

The heteroaryl group that can be employed as the substituent X include a group consisting of a single ring or a fused ring, a group consisting of a single ring or a fused ring having 2 to 8 rings is preferable, and a group consisting of a single ring or a fused ring having 2 to 4 rings is more preferable. The number of hetero atoms constituting the ring of the heteroaryl group is preferably 1 to 3. Examples of the hetero atom constituting the ring of the heteroaryl group include a nitrogen atom, an oxygen atom, and a sulfur atom. The heteroaryl group is preferably a group having a 5-membered ring or a 6-membered ring. The number of carbon atoms constituting the ring in the heteroaryl group is preferably 3 to 30, more preferably 3 to 18, and still more preferably 3 to 12. Examples of the heteroaryl group include individual groups consisting of any of a pyridine ring, a piperidine ring, a furan ring, a furfuran ring, a thiophene ring, a pyrrole ring, a quinoline ring, a morpholine ring, an indole ring, an imidazole ring, a pyrazole ring, a carbazole ring, a phenothiazine ring, a phenoxazine ring, an indoline ring, a thiazole ring, a pyrazine ring, a thiadiazine ring, a benzoquinoline ring, and a thiadiazole ring.

The ferrocenyl group that can be employed as the substituent X is preferably represented by General Formula (2M).

General Formula (2M)

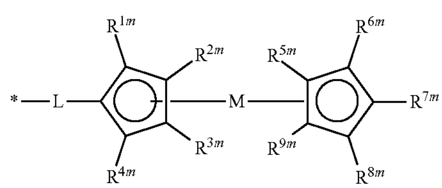

In General Formula (2M), L represents a single bond or a divalent linking group that does not conjugate with A, B, or G in General Formula (1). $R^{1m}$ to $R^{9m}$ each represent a hydrogen atom or a substituent. M represents an atom that can constitute a metallocene compound, and represents Fe, Co, Ni, Ti, Cu, Zn, Zr, Cr, Mo, Os, Mn, Ru, Sn, Pd, Rh, V, or Pt. * represents a bonding site with A, B, or G.

In the present invention, in a case where L in General Formula (2M) is a single bond, a cyclopentadienyl ring directly bonded to A, B, or G (a ring having $R^{1m}$ in General Formula (2M)) is not included in the conjugated structure which conjugates with A, B, or G.

The divalent linking group that can be employed as L is not particularly limited as long as it is a linking group that does not conjugate with A, B, or G, and may have the conjugated structure at the inside thereof or at a cyclopentadiene ring side end part in General Formula (2M). Examples of the divalent linking group include an alkylene group having 1 to 20 carbon atoms, an arylene group having 6 to 20 carbon atoms, a divalent heterocyclic group obtained by removing two hydrogens from the heterocycle, —CH═CH—, —CO—, —CS—, —NR— (R represents a hydrogen atom or a monovalent substituent), —O—, —S—, —$SO_2$—, or —N═CH—, or a divalent linking group formed by combining a plurality (preferably, 2 to 6) of these groups. The divalent linking group is preferably a group selected from the group consisting of an alkylene group having 1 to 8 carbon atoms, an arylene group having 6 to 12 carbon atoms, —CH═CH—, —CO—, —NR—(R is as described above), —O—, —S—, —$SO_2$— and —N═CH—, or a divalent linking group that is a combination of two or more (preferably 2 to 6) groups selected from the group, and particularly preferably, a group selected from the group consisting of an alkylene group having 1 to 4 carbon atoms, a phenylene group, —CO—, —NH—, —O—, and —$SO_2$—, or a linking group that is a combination of two or more (preferably 2 to 6) groups selected from the group. The divalent linking group combined is not particularly limited, and is preferably a group containing —CO—, —NH—, —O—, or —$SO_2$—, and examples thereof include a linking group formed by combining two or more of —CO—, —NH—, —O—, or —$SO_2$—, or a linking group obtained by combining at least one of —CO—, —NH—, —O—, or —$SO_2$— and an alkylene group or an arylene group. Examples of the linking group formed by combining two or more of —CO—, —NH—, —O—, or —$SO_2$— include —COO—, —OCO—, —CONH—, —NHCOO—, —NHCONH—, and —$SO_2$NH—. Examples of the linking group formed by combining at least one of —CO—, —NH—, —O—, or —$SO_2$— and an alkylene group or an arylene group include a group in which —CO—, —COO—, or —CONH— and an alkylene group or an arylene group are combined.

The substituent that can be employed as R is not particularly limited, and has the same meanings as the substituent X that A in General Formula (2) may have.

L is preferably a single bond or a group selected from the group consisting of an alkylene group having 1 to 8 carbon atoms, an arylene group having 6 to 12 carbon atoms, —CH═CH—, —CO—, —NR— (R is as described above), —O—, —S—, —$SO_2$—, and —N═CH—, or a group in which two or more groups selected from the group are combined.

L may have one or a plurality of substituents. The substituent that L may have is not particularly limited, and for example, has the same meaning as the substituent X. In a case where L has a plurality of substituents, the substituents bonded to adjacent atoms may be bonded to each other to further form a ring structure.

The alkylene group that can be employed as L may be any of linear, branched, or cyclic as long as the group has 1 to 20 carbon atoms, and examples thereof include methylene, ethylene, propylene, methylethylene, methylmethylene, dimethylmethylene, 1,1-dimethylethylene, butylene, 1-methylpropylene, 2-methylpropylene, 1,2-dimethylpropylene, 1,3-dimethylpropylene, 1-methylbutylene, 2-methylbutylene, 3-methylbutylene, 4-methylbutylene, 2,4-dimethylbutylene, 1,3-dimethylbutylene, pentylene, hexylene, heptylene, octylene, ethane-1,1-diyl, propane-2,2-diyl, cyclopropane-1,1-diyl, cyclopropane-1,2-diyl, cyclobutane-1,1-diyl, cyclobutane-1,2-diyl, cyclopentane-1,1-diyl, cyclopentane-1,2-diyl, cyclopentane-1,3-diyl, cyclohexane-1,1-diyl, cyclohexane-1,2-diyl, cyclohexane-1,3-diyl, cyclohexane-1,4-diyl, methylcyclohexane-1,4-diyl, and the like.

In a case where a linking group containing at least one of —CO—, —CS—, —NR— (R is as described above), —O—, —S—, —$SO_2$—, or —N═CH— in the alkylene group is employed as L, the group such as —CO— may be incorporated at any site in the alkylene group, and the number of the groups incorporated is not particularly limited.

The arylene group that can be employed as L is not particularly limited as long as the group has 6 to 20 carbon atoms, and examples thereof include a group obtained by further removing one hydrogen atom from each group exemplified as the aryl group having 6 to 20 carbon atoms that can be employed as A in General Formula (1).

The heterocyclic group that can be employed as L is not particularly limited, and examples thereof include a group obtained by further removing one hydrogen atom from each group exemplified as the heterocyclic group that can be employed as A.

In General Formula (2M), the remaining partial structure excluding the linking group L corresponds to a structure (metallocene structure portion) in which one hydrogen atom is removed from the metallocene compound. In the present invention, for the metallocene compound serving as the metallocene structure portion, a known metallocene compound can be used without particular limitation, as long as it is a compound conforming to the partial structure defined by General Formula (2M) (a compound in which a hydrogen atom is bonded instead of L). Hereinafter, the metallocene structure portion defined by General Formula (2M) will be specifically described.

In General Formula (2M), $R^{1m}$ to $R^{9m}$ each represent a hydrogen atom or a substituent. The substituents that can be employed as $R^{1m}$ to $R^{9m}$ are not particularly limited, and can be selected from, for example, the substituents that can be employed as $R^1$ in General Formula (3). $R^{1m}$ to $R^{9m}$ each are preferably a hydrogen atom, a halogen atom, an alkyl group, an acyl group, an alkoxy group, an amino group, or an amide group, more preferably a hydrogen atom, a halogen atom, an alkyl group, an acyl group, or an alkoxy group, still more preferably a hydrogen atom, a halogen atom, an alkyl group, or an acyl group, particularly preferably a hydrogen atom, a halogen atom, or an alkyl group, and most preferably a hydrogen atom.

As the alkyl group that can be employed as $R^{1m}$ to $R^{9m}$, among the alkyl groups that can be employed as $R^1$, an alkyl group having 1 to 8 carbon atoms is preferable, and examples thereof include methyl, ethyl, propyl, isopropyl, butyl, sec-butyl, tert-butyl, isobutyl, pentyl, tert-pentyl, hexyl, octyl, and 2-ethylhexyl.

This alkyl group may have a halogen atom as a substituent. Examples of the alkyl group substituted with a halogen atom include, for example, chloromethyl, dichloromethyl, trichloromethyl, bromomethyl, dibromomethyl, tribromomethyl, fluoromethyl, difluoromethyl, trifluoromethyl, 2,2,2-trifluoroethyl, perfluoroethyl, perfluoropropyl, perfluorobutyl, and the like.

In addition, in the alkyl group that can be employed as $R^{1m}$ or the like, at least one methylene group forming a carbon chain may be substituted with —O— or —CO—. Examples of the alkyl group in which the methylene group is substituted with —O— include, for example, an alkyl group in which the end part methylene group of methoxy, ethoxy, propoxy, isopropoxy, butoxy, sec-butoxy, tert-butoxy, 2-methoxyethoxy, chloromethyloxy, dichloromethyloxy, trichloromethyloxy, bromomethyloxy, dibromomethyloxy, tribromomethyloxy, fluoromethyloxy, difluoromethyloxy, trifluoromethyloxy, 2,2,2-trifluoroethyloxy, perfluoroethyloxy, perfluoropropyloxy, or perfluorobutyloxy is substituted, an alkyl group in which an internal methylene group of the carbon chain such as 2-methoxyethyl or the like is substituted, and the like. Examples of the alkyl group in which a methylene group is substituted with —CO— include, for example, acetyl, propionyl, monochloroacetyl, dichloroacetyl, trichloroacetyl, trifluoroacetyl, propane-2-one-1-yl, butane-2-one-1-yl, and the like.

In General Formula (2M), M represents an atom that can constitute a metallocene compound, and represents Fe, Co, Ni, Ti, Cu, Zn, Zr, Cr, Mo, Os, Mn, Ru, Sn, Pd, Rh, V, or Pt. Among these, M is preferably Fe, Ti, Co, Ni, Zr, Ru, or Os, more preferably Fe, Ti, Ni, Ru, or Os, still more preferably Fe or Ti, and most preferably Fe.

As the group represented by General Formula (2M), a group formed by combining L, $R^{1m}$ to $R^{9m}$, and M is preferable. For example, a group formed by combining, as L, a single bond or a group selected from the group consisting of an alkylene group having 2 to 8 carbon atoms, an arylene group having 6 to 12 carbon atoms, —CH═CH—, —CO—, —NR— (R is as described above), —O—, —S—, $—SO_2—$, and —N═CH—, or a group in which two or more groups selected from the group are combined, as $R^{1m}$ to $R^{9m}$, a hydrogen atom, a halogen atom, an alkyl group, an acyl group, or an alkoxy group, and as M, Fe is exemplified.

The alkyl group, the alkenyl group, the alkynyl group, the aralkyl group, the aryl group, and the heteroaryl group which can be employed as the substituent X and the aliphatic group, the aromatic group, and the heterocyclic group which can be employed as $R^{10}$ to $R^{27}$ each may further have a substituent or may be unsubstituted. The substituent that the above-mentioned groups may further have is not particularly limited, and is preferably a substituent selected from an alkyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, an alkylthio group, an arylthio group, an aromatic heterocyclic thio group, a sulfonyl group, a ferrocenyl group, a hydroxy group, a mercapto group, a halogen atom, a cyano group, a sulfo group, and a carboxy group, and more preferably a substituent selected from an alkyl group, an aryl group, an alkoxy group, an aryloxy group, an aromatic heterocyclic oxy group, an acyl group, an alkoxycarbonyl group, an aryloxycarbonyl group, an acyloxy group, an alkylthio group, an arylthio group, an aromatic heterocyclic thio group, a sulfonyl group, a ferrocenyl group, a hydroxy group, a mercapto group, a halogen atom, a cyano group, a sulfo group, and a carboxy group. These groups can be appropriately selected from the substituents that can be employed as $R^1$ in General Formula (2) described below.

A preferable embodiment of the coloring agent represented by General Formula (1) includes a coloring agent represented by General Formula (2).

General Formula (2)

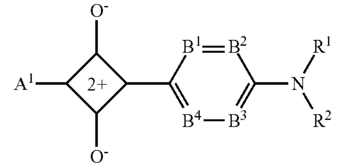

In General Formula (2), $A^1$ is the same as A in General Formula (1). Among these, a heterocyclic group which is a nitrogen-containing 5-membered ring is preferable.

In General Formula (2), $R^1$ and $R^2$ each independently represent a hydrogen atom or a substituent. $R^1$ and $R^2$ may be the same as or different from each other, and may be bonded together to form a ring.

The substituents that can be employed as $R^1$ and $R^2$ are not particularly limited, and examples thereof include alkyl groups (a methyl group, an ethyl group, a propyl group, an isopropyl group, a butyl group, a t-butyl group, an isobutyl group, a pentyl group, a hexyl group, an octyl group, a dodecyl group, a trifluoromethyl group, and the like), cycloalkyl groups (a cyclopentyl group, a cyclohexyl group, and the like), alkenyl groups (a vinyl group, an allyl group, and the like), alkynyl group (an ethynyl group, a propargyl group, and the like), aryl groups (a phenyl group, a naphthyl group, and the like), heteroaryl groups (a furyl group, a thienyl group, a pyridyl group, a pyridazyl group, a pyrimidyl group, a pyrazyl group, a triazyl group, an imidazolyl group, a pyrazolyl group, a thiazolyl group, a benzoimidazolyl group, a benzoxazolyl group, a quinazolyl group, a phthalazyl group, and the like), heterocyclic groups (also referred to as heterocyclic groups, for example, a pyrrolidyl group, an imidazolidyl group, a morpholyl group, an oxazolidyl group, and the like), alkoxy groups (a methoxy group, an ethoxy group, a propyloxy group, and the like), cycloalkoxy groups (a cyclopentyloxy group, a cyclohexyloxy group, and the like), aryloxy groups (a phenoxy group, a naphthyloxy group, and the like), heteroaryloxy groups (an aromatic heterocyclic oxy group), alkylthio groups (a methylthio group, an ethylthio group, a propylthio group, and the like), cycloalkylthio groups (a cyclopentylthio group, a cyclohexylthio group, and the like), arylthio groups (a phenythio group, a naphthylthio group, and the like), heteroarylthio groups (an aromatic heterocyclic thio group), alkoxycarbonyl groups (a methyloxycarbonyl group, an ethyloxycarbonyl group, a butyloxycarbonyl group, an octyloxycarbonyl group, and the like), aryloxycarbonyl groups (a phenyloxycarbonyl group, a naphthyloxycarbonyl group, and the like), phosphoryl groups (a dimethoxyphosphonyl group and a diphenylphosphoryl group), sulfamoyl groups (an aminosulfonyl group, a methylaminosulfonyl group, a dimethylaminosulfonyl group, a butylaminosulfonyl group, a cyclohexylaminosulfonyl group, an octylaminosulfonyl group, a phenylaminosulfonyl group, a 2-pyridylaminosulfonyl group, and the like), acyl groups (an acetyl group, an ethylcarbonyl group, a propylcarbonyl group, a cyclohexylcarbonyl group, an octylcarbonyl group, a 2-ethylhexylcarbonyl group, a phenylcarbonyl group, a naphthylcarbonyl group, a pyridylcarbonyl group, and the like), acyloxy groups (an acetyloxy group, an ethylcarbonyloxy group, a butylcarbonyloxy group, an octylcarbonyloxy group, a phenylcarbonyloxy group, and the like), amide groups (a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group, and the like), sulfonylamide groups (a methylsulfonylamino group, an octylsulfonylamino group, a 2-ethylhexylsulfonylamino group, a trifluoromethylsulfonylamino group, and the like), carbamoyl groups (an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group, and the like), ureido groups (a methylureido group, an ethylureido group, a pentylureido group, a cyclohexylureido group, an octylureido group, a dodecylureido group, a phenylureido group, a naphthylureido group, a 2-pyridylaminoureido group, and the like), alkylsulfonyl groups (a methylsulfonyl group, an ethylsulfonyl group, a butylsulfonyl group, a cyclohexylsulfonyl group, a 2-ethylhexylsulfonyl group, and the like), arylsulfonyl groups (a phenylsulfonyl group, a naphthylsulfonyl group, a 2-pyridylsulfonyl group, and the like), amino groups (an amino group, an ethylamino group, a dimethylamino group, a butylamino group, a dibutylamino group, a cyclopentylamino group, a 2-ethylhexylamino group, a dodecylamino group, an anilino group, a naphthylamino group, a 2-pyridylamino group, and the like), alkylsulfonyloxy groups (methanesulfonyloxy), a cyano group, a nitro group, halogen atoms (a fluorine atom, a chlorine atom, a bromine atom, and the like), and a hydroxy group.

Among these, an alkyl group, an alkenyl group, an aryl group, or a heteroaryl group is preferable, an alkyl group, an aryl group, or a heteroaryl group is more preferable, and an alkyl group is further preferable.

The substituent that can be employed as $R^1$ and $R^2$ may further have a substituent. The substituents that may be further provided include the substituents that can be employed as $R^1$ and $R^2$, and the substituent X which A, B, and G in above-described General Formula may have. In addition, $R^1$ and $R^2$ may be bonded to each other to form a ring, and $R^1$ or $R^2$ and the substituent of $B^2$ or $B^3$ may be bonded to each other to form a ring.

As the ring that is formed in this case, a heterocycle or a heteroaryl ring is preferable, and the size of the ring being formed is not particularly limited, and a 5-membered ring or a 6-membered ring is preferable. Also, the number of rings formed is not particularly limited, and may be one or two or more. Examples of a form in which two or more rings are formed include a form in which, for example, the substituents of $R^1$ and $B^2$ and the substituents of $R^2$ and $B^3$ are bonded to each other respectively to form two rings.

In General Formula (2), $B^1$, $B^2$, $B^3$, and $B^4$ each independently represent a carbon atom or a nitrogen atom. The ring including $B^1$, $B^2$, $B^3$, and $B^4$ is an aromatic ring. At least two or more of $B^1$ to $B^4$ are preferably carbon atoms, and more preferably all of $B^1$ to $B^4$ are carbon atoms.

The carbon atom that can be employed as $B^1$ to $B^4$ has a hydrogen atom or a substituent. Among carbon atoms that can be employed as $B^1$ to $B^4$, the number of carbon atoms having a substituent is not particularly limited, but is preferably zero, one, or two and more preferably one. Particularly, it is preferable that $B^1$ and $B^4$ are carbon atoms and at least one has a substituent.

The substituent that the carbon atom that can be employed as $B^1$ to $B^4$ has is not particularly limited, and examples thereof include the above-mentioned substituents that can be employed as $R^1$ and $R^2$. Among these, an alkyl group, an alkoxy group, an alkoxycarbonyl group, an aryl group, an acyl group, an amide group, a sulfonylamide group, a carbamoyl group, an alkylsulfonyl group, an arylsulfonyl group, an amino group, a cyano group, a nitro group, a halogen atom, or a hydroxy group is preferable, and an alkyl group, an alkoxy group, an alkoxycarbonyl group, an aryl group, an acyl group, an amide group, a sulfonylamide group, a carbamoyl group, an amino group, a cyano group, a nitro group, a halogen atom, or a hydroxy group is more preferable.

The substituent of a carbon atom that can be employed as $B^1$ to $B^4$ may further have a substituent. The substituents that may be further provided include the substituents that $R^1$ and $R^2$ in the above-mentioned General Formula (2) may further have, and the substituent X which A, B, and G in above described General Formula (1) may have.

As the substituent that the carbon atom that can be employed as $B^1$ and $B^4$ has, an alkyl group, an alkoxy group, a hydroxy group, an amide group, a sulfonylamide group, or a carbamoyl group is still more preferable, an alkyl group, an alkoxy group, a hydroxy group, an amide group, or a sulfonylamide group is particularly preferable, and a hydroxy group, an amide group, or a sulfonylamide group is most preferable.

As the substituent that the carbon atom that can be employed as $B^2$ and $B^3$ has, an alkyl group, an alkoxy group, an alkoxycarbonyl group, an acyl group, an amino group, a cyano group, a nitro group, or a halogen atom is still more preferable, and it is particularly preferable that the substituent in any one of $B^2$ or $B^3$ is an electron-withdrawing group (for example, an alkoxycarbonyl group, an acyl group, a cyano group, a nitro group, or a halogen atom).

The coloring agent represented by General Formula (2) is preferably a coloring agent represented by any of General Formulae (3), (4), and (5).

General Formula (3)

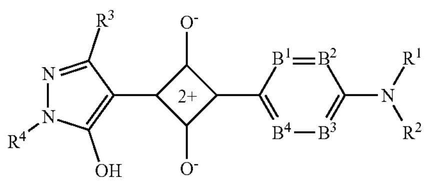

In General Formula (3), $R^1$ and $R^2$ each independently represent a hydrogen atom or a substituent, and have the same meanings as $R^1$ and $R^2$ in General Formula (2), and the preferable ranges are also the same.

In General Formula (3), $B^1$ to $B^4$ each independently represent a carbon atom or a nitrogen atom, have the same meanings as $B^1$ to $B^4$ in General Formula (2), and the preferable ranges are also the same.

In General Formula (3), $R^3$ and $R^4$ each independently represent a hydrogen atom or a substituent. The substituent that can be employed as $R^3$ and $R^4$ is not particularly limited, and the same substituents as the substituents that can be employed as $R^1$ and $R^2$ can be exemplified.

However, as the substituents that can be employed as $R^3$, an alkyl group, an alkoxy group, an amino group, an amide group, a sulfonylamide group, a cyano group, a nitro group, an aryl group, a heteroaryl group, a heterocyclic group, an alkoxycarbonyl group, a carbamoyl group, or a halogen atom is preferable, an alkyl group, an aryl group, or an amino group is more preferable, and an alkyl group is still more preferable.

As the substituent that can be employed as $R^4$, an alkyl group, an aryl group, a heteroaryl group, a heterocyclic group, an alkoxy group, an alkoxycarbonyl group, an acyl group, an acyloxy group, an amide group, a carbamoyl group, an amino group, or a cyano group is preferable, an alkyl group, an alkoxycarbonyl group, an acyl group, a carbamoyl group, or an aryl group is more preferable, and an alkyl group is still more preferable.

The alkyl group that can be employed as $R^3$ and $R^4$ may be any of linear, branched, or cyclic, and is preferably linear or branched. The number of carbon atoms in the alkyl group is preferably 1 to 12 and more preferably 1 to 8. As examples of the alkyl group, a methyl group, an ethyl group, an n-propyl group, an isopropyl group, a t-butyl group, a 2-ethylhexyl group, and a cyclohexyl group are preferable, and a methyl group and a t-butyl group are more preferable.

General Formula (4)

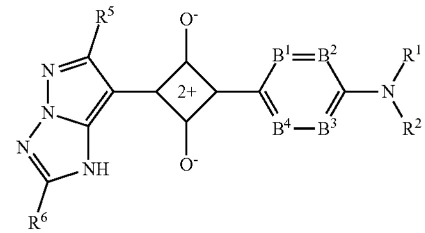

In General Formula (4), $R^1$ and $R^2$ each independently represent a hydrogen atom or a substituent, and have the same meanings as $R^1$ and $R^2$ in General Formula (2), and the preferable ranges are also the same.

In General Formula (4), $B^1$ to $B^4$ each independently represent a carbon atom or a nitrogen atom, have the same meanings as $B^1$ to $B^4$ in General Formula (2), and the preferable ranges are also the same.

In General Formula (4), $R^5$ and $R^6$ each independently represent a hydrogen atom or a substituent. The substituent that can be employed as $R^5$ and $R^6$ is not particularly limited, and the same substituents as the substituents that can be employed as $R^1$ and $R^2$ can be exemplified. However, the substituent that can be employed as $R^5$ is preferably an alkyl group, an alkoxy group, an aryloxy group, an amino group, a cyano group, an aryl group, a heteroaryl group, a heterocyclic group, an acyl group, an acyloxy group, an amide group, a sulfonylamide group, an ureido group, or a carbamoyl group, more preferably an alkyl group, an alkoxy group, an acyl group, an amide group, or an amino group, and still more preferably an alkyl group.

The alkyl group that can be employed as $R^5$ has the same meaning as the alkyl group that can be employed as $R^3$ in General Formula (3), and the preferable range is also the same.

In General Formula (4), the substituent that can be employed as $R^6$ is preferably an alkyl group, an alkenyl group, an aryl group, a heteroaryl group, a heterocyclic group, an alkoxy group, a cycloalkoxy group, an aryloxy group, an alkoxycarbonyl group, an acyl group, an acyloxy group, an amide group, a sulfonylamide group, an alkylsulfonyl group, an arylsulfonyl group, a carbamoyl group, an amino group, a cyano group, a nitro group, or a halogen atom, more preferably an alkyl group, an aryl group, a heteroaryl group, or a heterocyclic group, and still more preferably an alkyl group or an aryl group.

The alkyl group that can be employed as $R^6$ has the same meaning as the alkyl group that can be employed as $R^4$ in General Formula (3), and the preferable range is also the same. The aryl group that can be employed as $R^6$ is preferably an aryl group having 6 to 12 carbon atoms, and more preferably a phenyl group. This aryl group may have a substituent, as such a substitution, examples of this substituent included in the following substituent group B are exemplified, and, particularly, an alkyl group, a sulfonyl group, an amino group, an acylamino group, a sulfonylamino group, or the like, which have 1 to 10 carbon atoms, are preferable. These substituents may further have a substituent. Specifically, the substituent is preferably an alkylsulfonylamino group.

—Substituent Group B—

A halogen atom, an alkyl group, an alkenyl group, an alkynyl group, an aryl group, a heterocyclic group, a cyano group, a hydroxy group, a nitro group, a carboxy group, an alkoxy group, an aminooxy group, an aryloxy group, a silyloxy group, a heterocyclic oxy group, an acyloxy group, a carbamoyloxy group, an amino group, an acylamino group, an aminocarbonylamino group, an alkoxycarbonylamino group, an aryloxycarbonylamino group, a sulfamoylamino group, a sulfonylamino group (including an alkyl or arylsulfonylamino group), a mercapto group, an alkylthio group, an arylthio group, a heterocyclic thio group, a sulfamoyl group, a sulfo group, a sulfonyl group (including an alkyl or arylsulfinyl group), an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a silyl group, and the like.

General Formula (5)

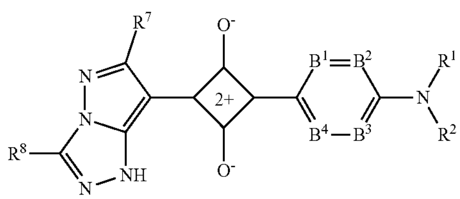

In General Formula (5), $R^1$ and $R^2$ each independently represent a hydrogen atom or a substituent, and have the same meanings as $R^1$ and $R^2$ in General Formula (2), and the preferable ranges are also the same.

In General Formula (5), $B^1$ to $B^4$ each independently represent a carbon atom or a nitrogen atom, have the same meanings as $B^1$ to $B^4$ in General Formula (2), and the preferable ranges are also the same.

In General Formula (5), $R^7$ and $R^8$ each independently represent a hydrogen atom or a substituent. The substituent that can be employed as $R^7$ and $R^8$ is not particularly limited, and the same substituents as the substituents that can be employed as $R^1$ and $R^2$ can be exemplified.

However, a preferable range, a more preferable range, and a still more preferable range of the substituent that can be employed as $R^7$ are the same as those of the substituent that can be employed as $R^5$ in General Formula (4). The alkyl group that can be employed as $R^5$ has the same meaning as the alkyl group that can be employed as $R^3$, and the preferable range is also the same.

In General Formula (5), a preferable range, a more preferable range, and a still more preferable range of the substituent that can be employed as $R^8$ are the same as the substituent that can be employed as $R^6$ in General Formula (4). The preferable ranges of the alkyl group and the aryl group that can be employed as $R^8$ have the same meaning as the alkyl group and the aryl group that can be employed as $R^6$ in General Formula (4), and the preferable ranges are also the same.

In the present invention, in a case where a squarine-based coloring agent is used as the dye A, any squarine-based coloring agent may be used without particular limitations as long as the squarine-based coloring agent is the squarine coloring agent represented by any of General Formulae (1) to (5). Examples thereof include compounds described in, for example, JP2006-160618A, WO2004/005981A, WO2004/007447A, Dyes and Pigment, 2001, 49, pp. 161 to 179, WO2008/090757A, WO2005/121098A, and JP2008-275726A.

Hereinafter, specific examples of the coloring agents represented by any of General Formula (1) to General Formula (5) will be shown. However, the present invention is not limited thereto.

In the following specific examples, Me represents methyl, Et represents ethyl, Bu represents butyl, and Ph represents phenyl, respectively.

A-1

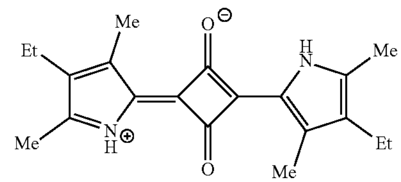

A-2

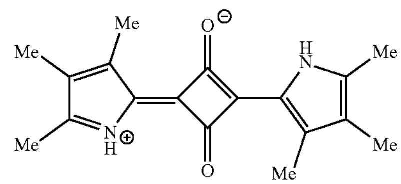

A-3

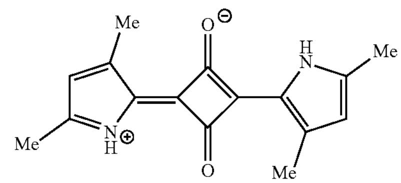

A-4

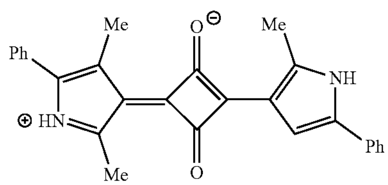

A-5

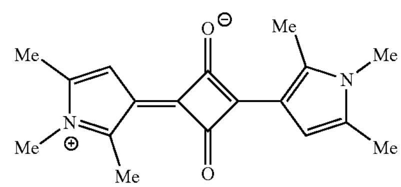

A-6

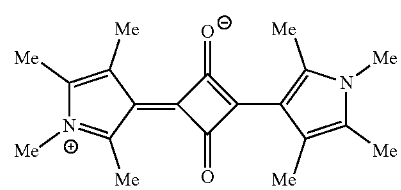

A-7

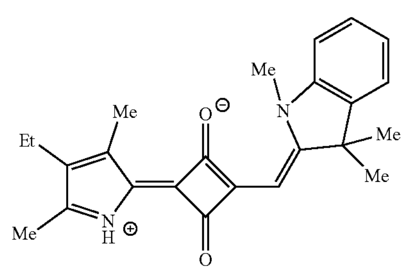

-continued

A-8

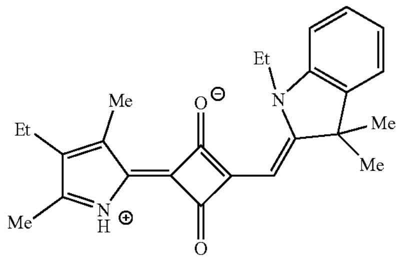

A-9

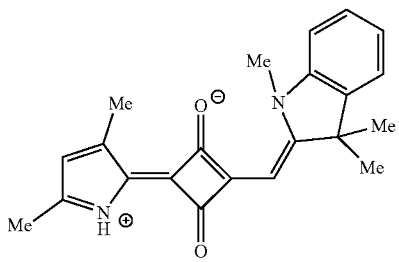

A-10

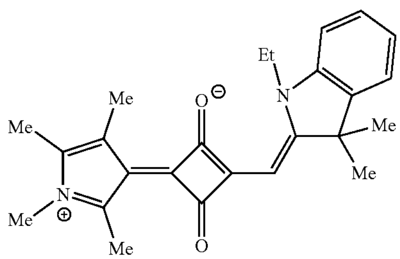

A-11

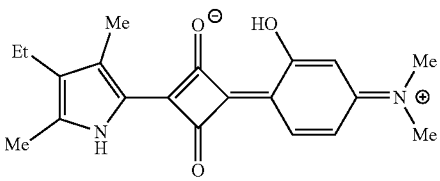

A-12

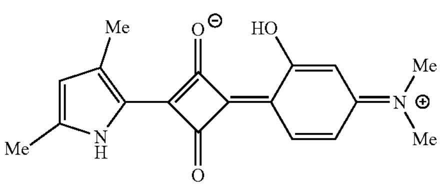

A-13

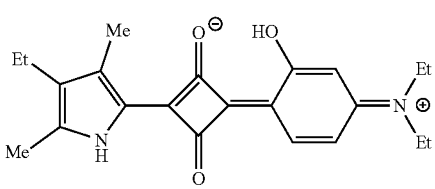

A-14

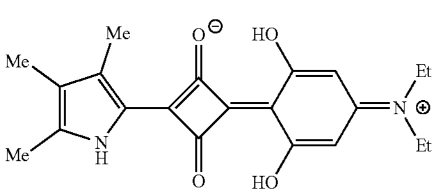

-continued

A-15

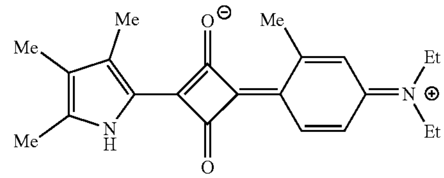

A-16

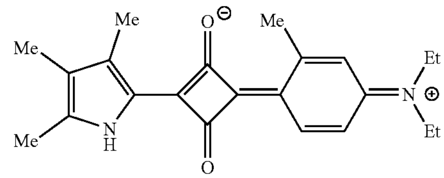

A-17

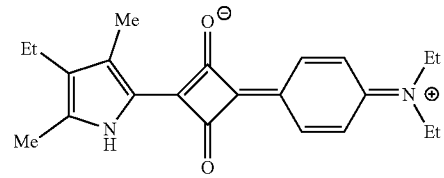

A-18

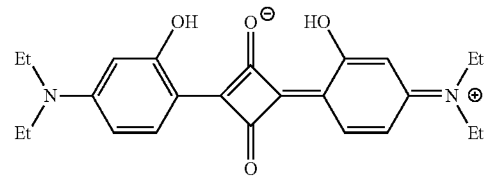

A-19

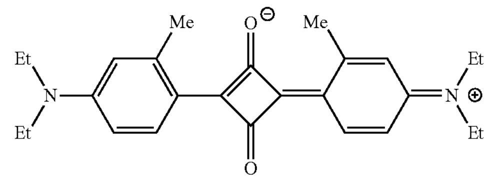

A-20

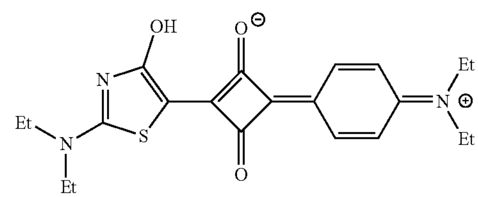

A-21

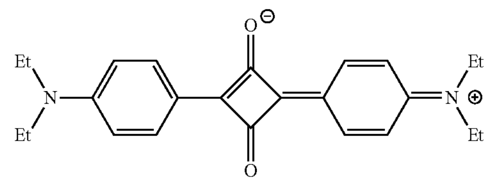

In addition to the above-mentioned specific examples, specific examples of the coloring agents represented by any of General Formulae (3) to (5) will be shown. Substituents B in the following tables represent the following structures. In the following structures and the following table, Me represents methyl, Et represents ethyl, i-Pr represents i-propyl, Bu represents n-butyl, t-Bu represents t-butyl, and Ph represents phenyl, respectively. In the following structures, * indicates a bonding site with a 4-membered carbon ring in each General Formula.

B-1
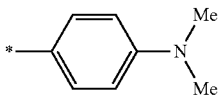
B-2
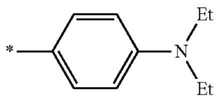
B-3
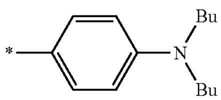
B-4
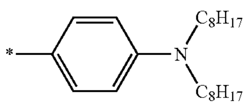
B-5
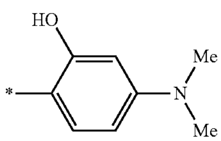
B-6
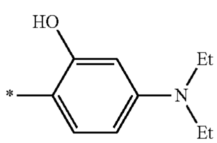
B-7
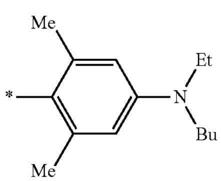
B-8
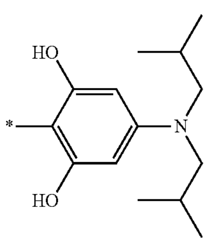
B-9
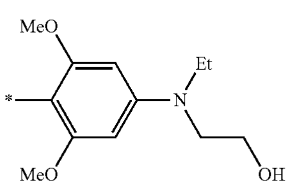
B-10
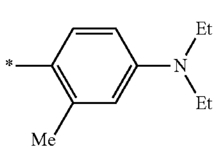
-continued
B-11
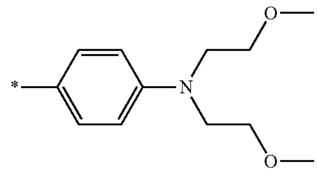
B-12
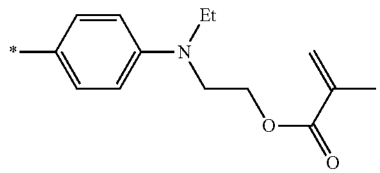
B-13
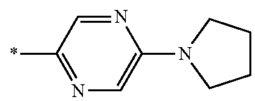
B-14
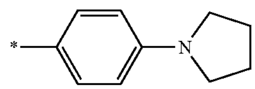
B-15
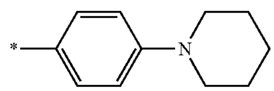
B-16
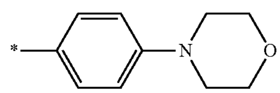
B-17
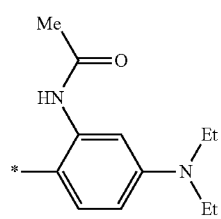
B-18
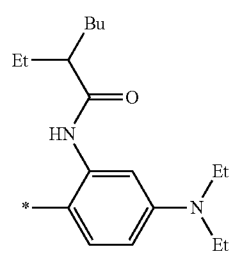
B-19
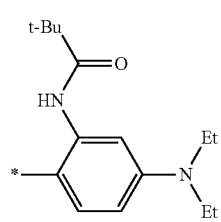

-continued
B-20
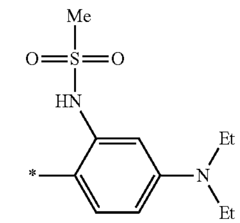
B-21
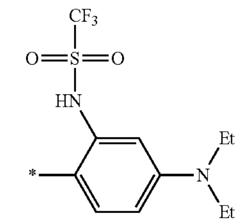
B-22
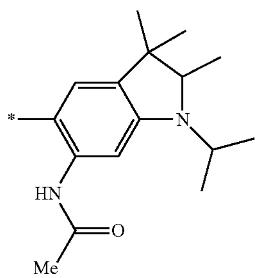
B-23
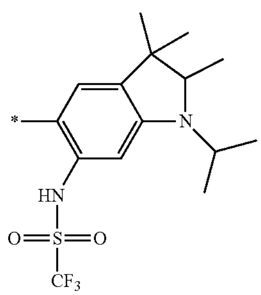
B-24
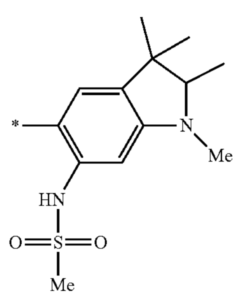
B-25
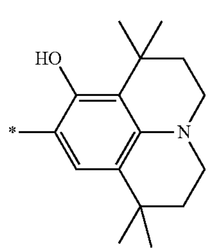
-continued
B-26
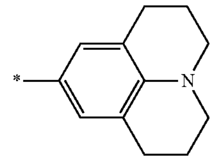
B-27
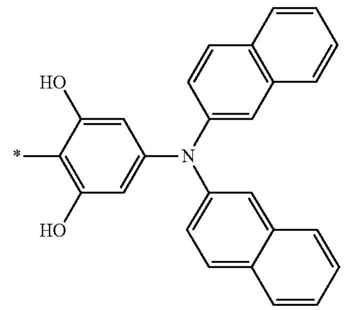
B-28
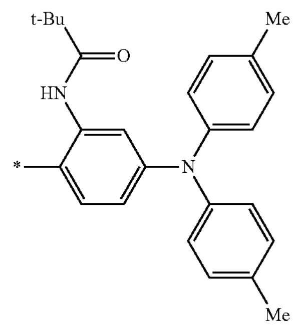
B-29
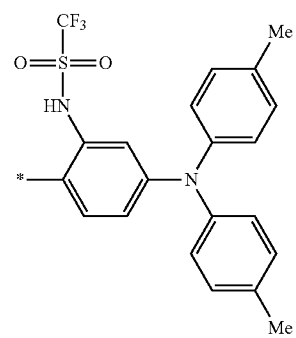
B-30
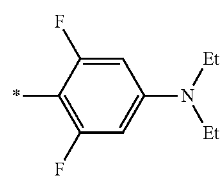
B-31
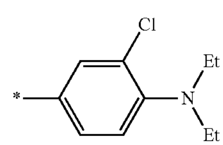
B-32
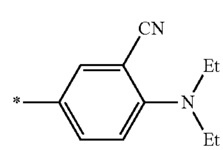

-continued
B-33
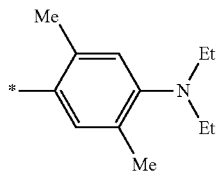
B-36
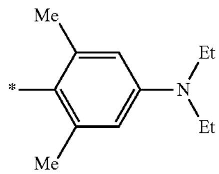
B-37
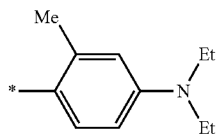
B-38
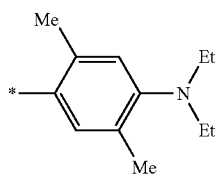
B-39
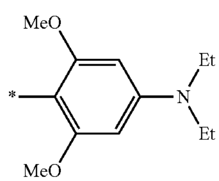
B-40
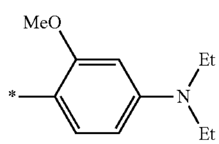
B-41
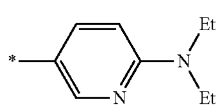
B-42
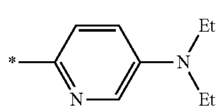
B-43
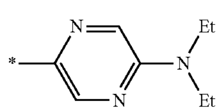
B-44
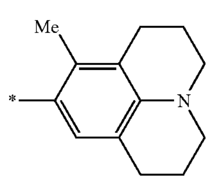
-continued
B-45
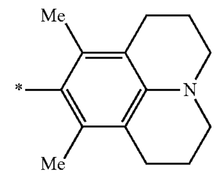
B-46
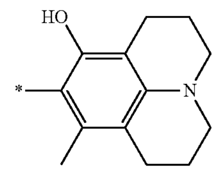
B-47
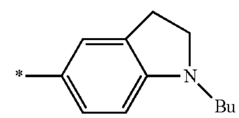
B-48
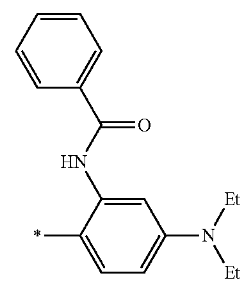
B-49
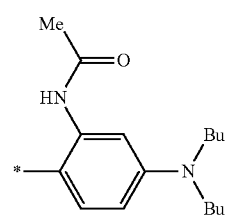
B-50
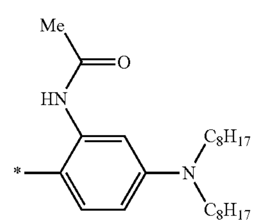
B-51
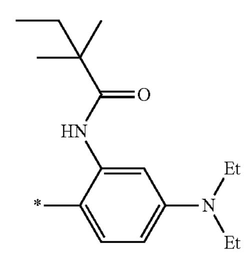

-continued
B-52
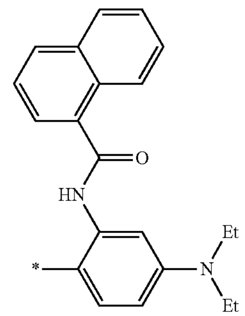
B-53
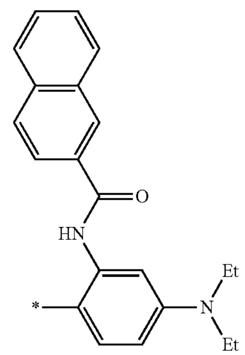
B-54
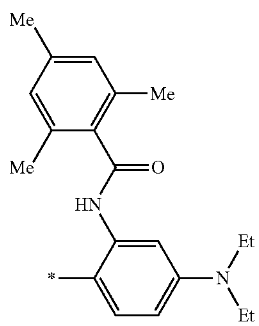
B-55
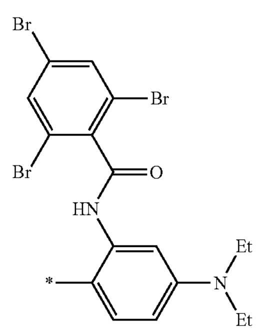
B-56
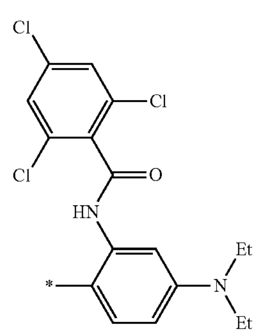
-continued
B-57
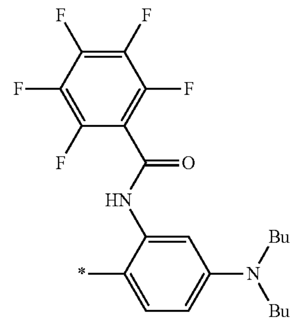
B-58
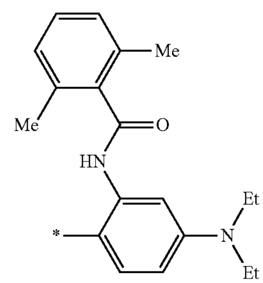
B-59
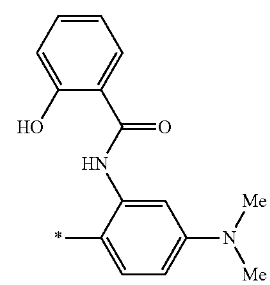
B-60
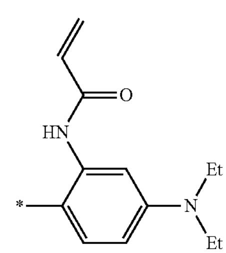
B-61
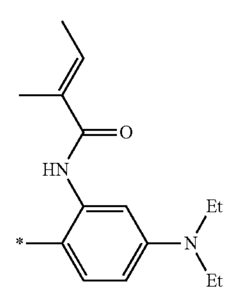

-continued
B-62
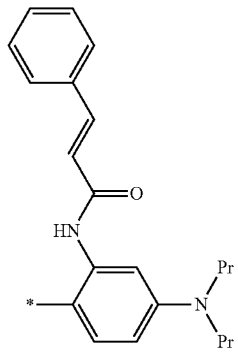
B-63
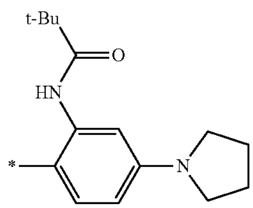
B-64
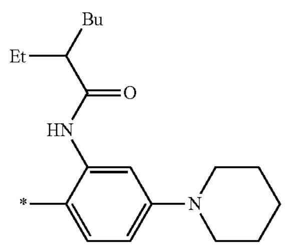
B-65
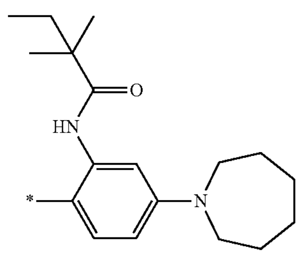
B-66
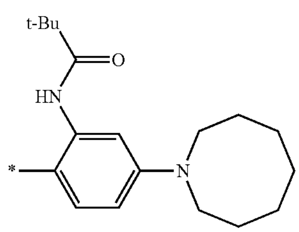
B-67
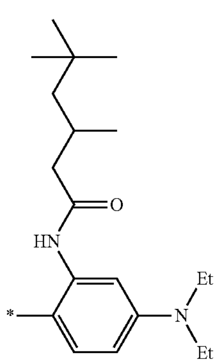
-continued
B-68
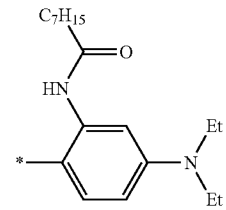
B-69
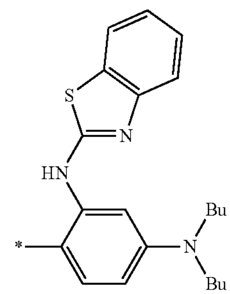
B-70
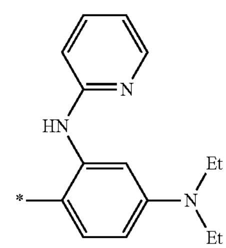
B-71
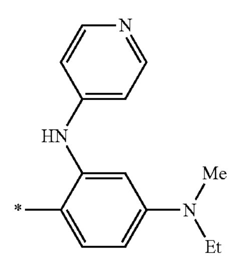
General Formula (3)
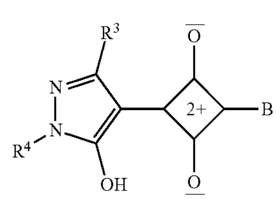

| Compound No. | $R^3$ | $R^4$ | B | Compound No. | $R^3$ | $R^4$ | B |
|---|---|---|---|---|---|---|---|
| 3-1 | Me | Me | B-3 | 3-21 | H | H | B-23 |
| 3-2 | Me | Me | B-4 | 3-22 | Et | t-Bu | B-21 |
| 3-3 | Me | Me | B-5 | 3-23 | t-Bu | Me | B-18 |
| 3-4 | Me | Me | B-10 | 3-24 | $CF_3$ | i-Pr | B-12 |
| 3-5 | Me | Me | B-14 | 3-25 | COOEt | Et | B -6 |
| 3-6 | Me | Me | B-16 | 3-26 | CN | Ph | B-11 |
| 3-7 | Me | Me | B-17 | 3-27 | $NMe_2$ | Me | B-2 |
| 3-8 | Me | Me | B-18 | 3-28 | i-Pr | Me | B-17 |
| 3-9 | Me | Me | B-19 | 3-29 | OEt | Bu | B-27 |
| 3-10 | Me | Me | B-20 | 3-30 | $NH_2$ | i-Pr | B-9 |
| 3-11 | Me | Me | B-21 | 3-31 | t-Bu | Me | B-17 |
| 3-12 | Me | Me | B-22 | 3-32 | t-Bu | Bu | B-21 |
| 3-13 | Me | Me | B-23 | 3-33 | $CF_3$ | Me | B-18 |
| 3-14 | Me | Me | B-26 | 3-34 | OEt | Et | B-33 |
| 3-15 | Me | Me | B-32 | 3-35 | $NMe_2$ | i-Pr | B-2 |
| 3-16 | Me | Me | B-33 | 3-36 | Et | Me | B-17 |
| 3-17 | Me | Me | B-38 | 3-37 | Bu | Me | B-18 |
| 3-18 | Me | Me | B-49 | 3-38 | $NH_2$ | Ph | B-19 |
| 3-19 | Et | 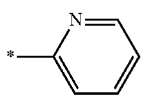 | B-28 | 3-39 | OEt | 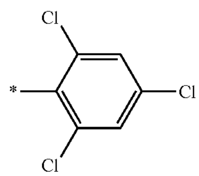 [SMILES: *c1c(Cl)cc(Cl)cc1Cl] | B-25 |
| 3-20 | Me | 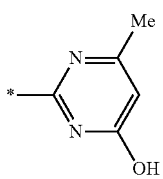 [SMILES: *c1nc(C)cc(O)n1] | B-29 | 3-40 | Me | 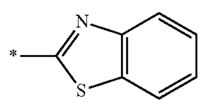 | B-2 |

| Compound No. | $R^3$ | $R^4$ | B |
|---|---|---|---|
| 3-41 | Me | Ph | B-17 |
| 3-42 | Me | Ph | B-21 |
| 3-43 | Me | Ph | B-36 |
| 3-44 | Me | t-Bu | B-17 |
| 3-45 | Me | t-Bu | B-18 |
| 3-46 | Me | t-Bu | B-10 |
| 3-47 | OEt | Me | B-17 |
| 3-48 | OEt | Me | B-10 |
| 3-49 | Me | 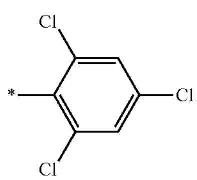 | B-17 |
| 3-50 | Me | 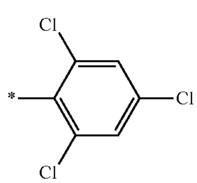 [SMILES: *c1c(Cl)cc(Cl)cc1Cl] | B-19 |
| 3-51 | Me | 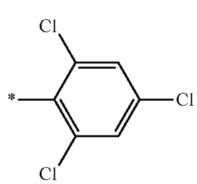 | B-21 |

-continued

| Compound No. | $R^3$ | $R^4$ | B |
|---|---|---|---|
| 3-52 | Me | 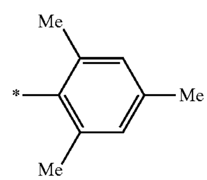 [SMILES: *c1c(C)cc(C)cc1C] | B-17 |
| 3-53 | Me | 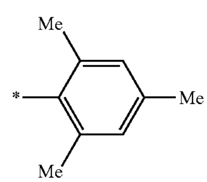 [SMILES: *c1c(C)cc(C)cc1C] | B-20 |
| 3-54 | Me | 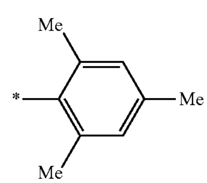 [SMILES: *c1c(C)cc(C)cc1C] | B-21 |
| 3-55 | t-Bu | Me | B-17 |
| 3-56 | t-Bu | Me | B-10 |
| 3-57 | t-Bu | Me | B-44 |
| 3-58 | t-Bu | t-Bu | B-17 |
| 3-59 | t-Bu | t-Bu | B-10 |
| 3-60 | t-Bu | t-Bu | B-6 |

-continued
| Compound No. | $R^3$ | $R^4$ | B |
|---|---|---|---|
| 3-61 | $NBu_2$ | Me | B-17 |
| 3-62 | $NBu_2$ | Me | B-10 |
| 3-63 | t-Bu | 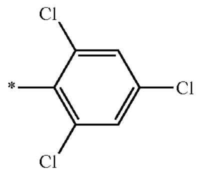 | B-17 |
| 3-64 | t-Bu | 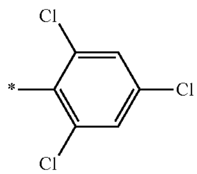 | B-19 |
| 3-65 | t-Bu | 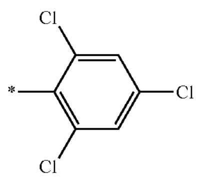 | B-21 |
| 3-66 | t-Bu | 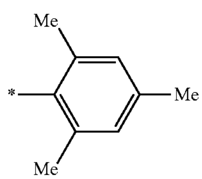 [SMILES: *c1c(C)cc(C)cc1C] | B-17 |
| 3-67 | t-Bu | 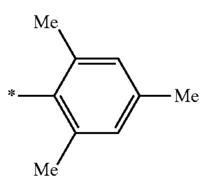 [SMILES: *c1c(C)cc(C)cc1C] | B-20 |
| 3-68 | t-Bu | 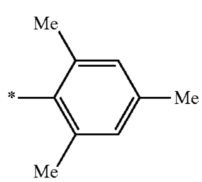 [SMILES: *c1c(C)cc(C)cc1C] | B-21 |
| 3-69 | Me | t-Bu | B-51 |
| 3-70 | Me | t-Bu | B-52 |
| 3-71 | Me | t-Bu | B-54 |
| 3-72 | Me | t-Bu | B-55 |
| 3-73 | Me | t-Bu | B-58 |
| 3-74 | Me | t-Bu | B-60 |
| 3-75 | Me | t-Bu | B-65 |
| 3-76 | Me | t-Bu | B-67 |
| 3-77 | Me | t-Bu | B-68 |
| 3-78 | H | t-Bu | B-51 |
| 3-79 | Et | t-Bu | B-53 |
| 3-80 | Pr | 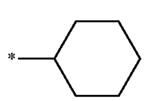 [SMILES: *C1CCCCC1] | B-64 |
| 3-81 | iPr | iPr | B-66 |
-continued
| Compound No. | $R^3$ | $R^4$ | B |
|---|---|---|---|
| 3-82 | Me | 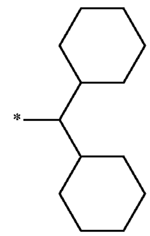 [SMILES: *C(C1CCCCC1)C1CCCCC1] | B-51 |
| 3-83 | Et | Bu | B-56 |
| 3-84 | Me | iPr | B-66 |
| 3-85 | Me | 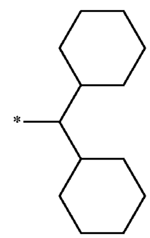 [SMILES: *C(C1CCCCC1)C1CCCCC1] | B-54 |
| 3-86 | Me | 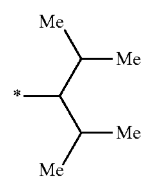 [SMILES: *C(C(C)C)C(C)C] | B-57 |
| 3-87 | Et | 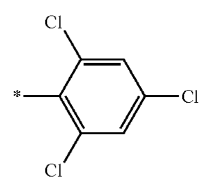 [SMILES: *c1c(Cl)cc(Cl)cc1Cl] | B-60 |
| 3-88 | Me | iPr | B-65 |
| 3-89 | Me | t-Bu | B-69 |
| 3-90 | Me | 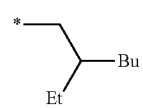 | B-50 |
| 3-91 | Me | 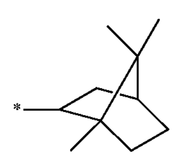 [SMILES: *C1CC2CCC1(C)C2(C)C] | B-61 |
| 3-92 | Me | 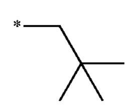 | B-51 |

-continued
| Compound No. | $R^3$ | $R^4$ | B |
|---|---|---|---|
| 3-93 | Me | 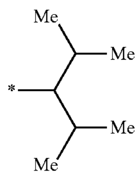 [SMILES: *C(C(C)C)C(C)C]  | B-51 |
| 3-94 | Me | 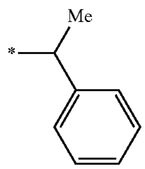 [SMILES: *C(C)c1ccccc1]  | B-67 |
| 3-95 | Me | 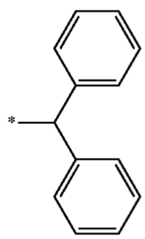 [SMILES: *C(c1ccccc1)c1ccccc1]  | B-51 |
| 3-96 | Me | 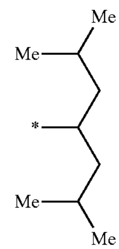  | B-51 |
General Formula (4)
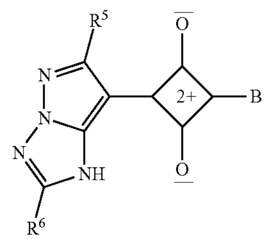
| Compound No. | $R^5$ | $R^6$ | B |
|---|---|---|---|
| 4-1 | t-Bu | 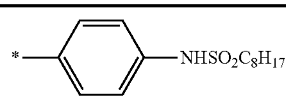  | B-2 |
| 4-2 | t-Bu | 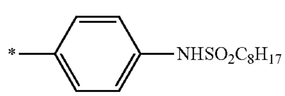  | B-6 |
| 4-3 | t-Bu | 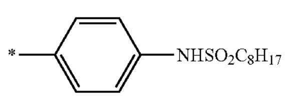  | B-10 |
| 4-4 | Me | 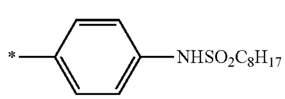  | B-4 |
| 4-5 | t-Bu | 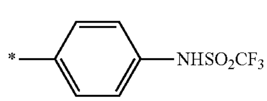  | B-6 |
| 4-6 | t-Bu | 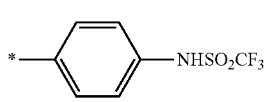  | B-14 |
| 4-7 | $NHCOCH_3$ | 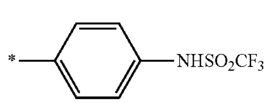  | B-1 |
| 4-8 | t-Bu | 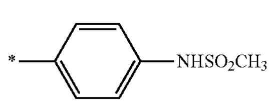  | B-6 |
| 4-16 | Me | Me | B-17 |
| 4-17 | Me | Et | B-18 |
| 4-18 | Ph | Ph | B-8 |
| 4-19 | Et | t-Bu | B-17 |
| 4-20 | OEt | t-Bu | B-3 |
| 4-21 | OEt | Bu | B-26 |
| 4-22 | OEt | 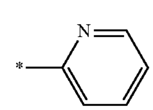 [SMILES: *c1ccccn1]  | B-2 |
| 4-23 | CF3 | t-Bu | B-19 |

-continued
| Compound No. | $R^5$ | $R^6$ | B | Compound No. | $R^5$ | $R^6$ | B |
|---|---|---|---|---|---|---|---|
| 4-9 | t-Bu | 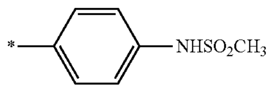 | B-16 | 4-24 | $NHCOCH_3$ | t-Bu | B-2 |
| 4-10 | OEt | 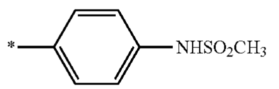 | B-11 | 4-25 | $NHCOCH_3$ | Me | B-1 |
| 4-11 | t-Bu | 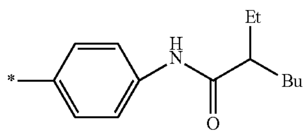 | B-6 | 4-26 | $NMe_2$ | t-Bu | B-6 |
| 4-12 | t-Bu | 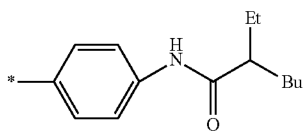 | B-12 | 4-27 | $NMe_2$ | Et | B-17 |
| 4-13 | OEt | 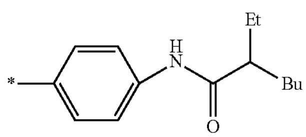 | B-31 | 4-28 | H | Me | B-2 |
| 4-14 | H | H | B-22 | 4-29 | t-Bu | t-Bu | B-18 |
| 4-15 | Me | Me | B-23 | 4-30 | t-Bu | Me | B-17 |
| 4-31 | t-Bu | 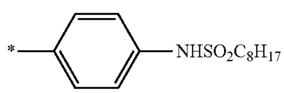 | B-51 | 4-36 | Me | Me | B-65 |
| 4-32 | t-Bu | 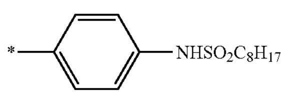 | B-52 | 4-37 | Me | Et | B-67 |
| 4-33 | t-Bu | 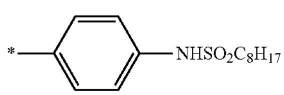 | B-54 | 4-38 | Ph | Ph | B-48 |
| 4-34 | Me | 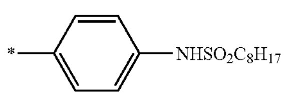 | B-55 | 4-39 | Et | t-Bu | B-54 |
| 4-35 | t-Bu | 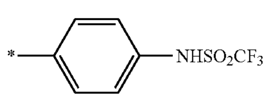 | B-60 | 4-40 | Me | Me | B-51 |
General Formula (5)
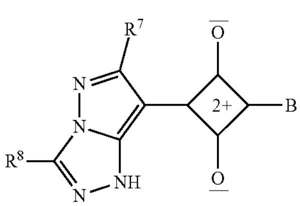

| Compound No. | $R^7$ | $R^8$ | B | Compound No. | $R^7$ | $R^8$ | B |
|---|---|---|---|---|---|---|---|
| 5-1 | t-Bu | 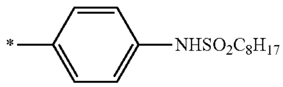 | B-2 | 5-11 | Me | Me | B-17 |
| 5-2 | Me | 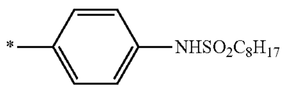 | B-6 | 5-12 | Me | t-Bu | B-18 |
| 5-3 | t-Bu | 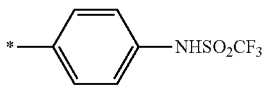 | B-4 | 5-13 | Ph | Ph | B-8 |
| 5-4 | Me | 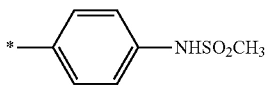 | B-10 | 5-14 | Ph | 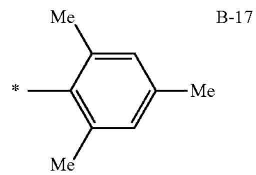 | B-17 |
| 5-5 | t-Bu | 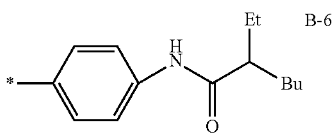 | B-6 | 5-15 | Et | Ph | B-17 |
| 5-6 | t-Bu | 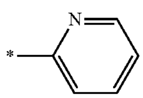 [SMILES: *c1ccccn1] | B-14 | 5-16 | OEt | t-Bu | B-3 |
| 5-7 | Me | 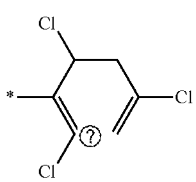 [SMILES: */C(=C\Cl)C(Cl)CC(=C)Cl] | B-1 | 5-17 | OEt | Bu | B-26 |
| 5-8 | Me | 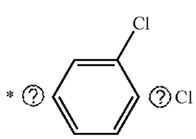 | B-6 | 5-18 | CF3 | t-Bu | B-19 |
| 5-9 | Me | 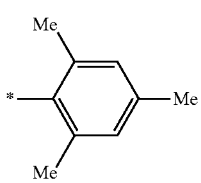 [SMILES: *c1c(C)cc(C)cc1C] | B-16 | 5-19 | NHCOCH3 | t-Bu | B-2 |
| 5-10 | t-Bu | 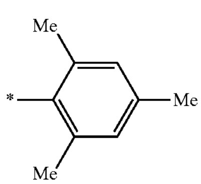 [SMILES: *c1c(C)cc(C)cc1C] | B-11 | 5-20 | NHCOCH3 | 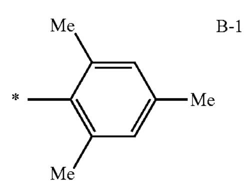 | B-1 |
| 5-21 | t-Bu | 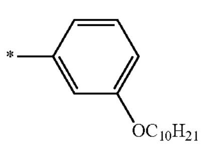 | B-2 | 5-26 | Me | Me | B-65 |

-continued

| Compound No. | $R^7$ | $R^8$ | B | Compound No. | $R^7$ | $R^8$ | B |
|---|---|---|---|---|---|---|---|
| 5-22 | Me | 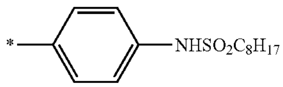 | B-51 | 5-27 | Me | t-Bu | B-67 |
| 5-23 | t-Bu | 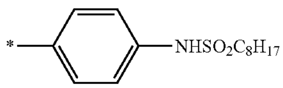 | B-52 | 5-28 | Ph | Ph | B-50 |
| 5-24 | Me | 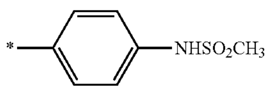 | B-55 | 5-29 | Ph | 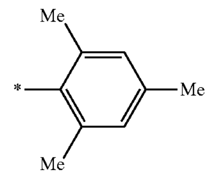 [SMILES: *c1c(C)cc(C)cc1C] | B-23 |
| 5-25 | t-Bu | 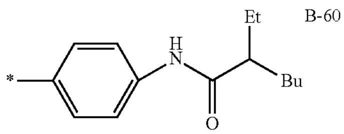 | B-60 | 5-30 | Et | Ph | B-59 |

As a preferable embodiment of the coloring agent represented by General Formula (1), a coloring agent represented by General Formula (6) is exemplified.

General Formula (6)

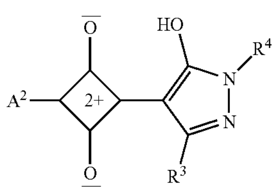

In General Formula (6), $R^3$ and $R^4$ each independently represent a hydrogen atom or a substituent and have the same meanings as $R^3$ and $R^4$ in General Formula (3), and the preferable ranges are also the same.

In General Formula (6), $A^2$ has the same meaning as A in General Formula (1). Among these, a heterocyclic group which is a nitrogen-containing 5-membered ring is preferable.

The coloring agent represented by General Formula (6) is preferably a coloring agent represented by any one of General Formulae (7), (8), or (9).

General Formula (7)

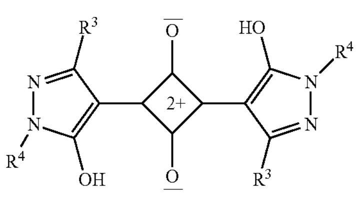

In General Formula (7), $R^3$ and $R^4$ each independently represent a hydrogen atom or a substituent, and have the same meanings as $R^3$ and $R^4$ in General Formula (3), and the preferable ranges are also the same. Two $R^3$'s and two $R^4$'s may be the same as or different from each other.

General Formula (8)

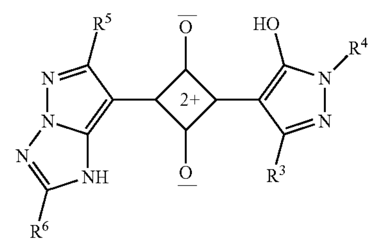

In General Formula (8), $R^3$ and $R^4$ each independently represent a hydrogen atom or a substituent, and have the same meanings as $R^3$ in General Formula (3), and the preferable ranges are also the same.

In General Formula (8), $R^5$ and $R^6$ each independently represent a hydrogen atom or a substituent, and have the same meanings as $R^5$ and $R^6$ in General Formula (4), and the preferable ranges are also the same.

General Formula (9)

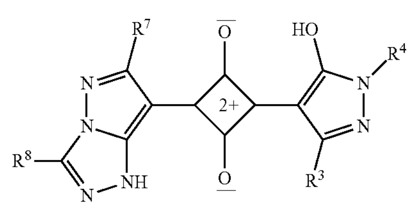

In General Formula (9), $R^3$ and $R^4$ each independently represent a hydrogen atom or a substituent, and have the same meanings as $R^3$ in General Formula (3), and the preferable ranges are also the same.

In General Formula (9), $R^7$ and $R^8$ each independently represent a hydrogen atom or a substituent, and have the same meanings as $R^7$ and $R^8$ in General Formula (5), and the preferable ranges are also the same.

In the present invention, in a case where a squarine-based coloring agent is used as the dye B, any squarine-based coloring agent may be used without particular limitations as long as the squarine-based coloring agent is a squarine-based coloring agent represented by any one of General Formulae (6) to (9). Examples thereof include the compounds described in, for example, JP2002-97383A and JP2015-68945A.

Hereinafter, specific examples of the coloring agents represented by any of General Formulae (6) to (9) will be shown. However, the present invention is not limited thereto. In the following specific examples, Me represents methyl, Et represents ethyl, i-Pr represents i-propyl, t-Bu represents t-butyl, and Ph represents phenyl, respectively. In the following structures, * indicates a bonding site with a 4-membered carbon ring in each General Formula.

General Formula (7)

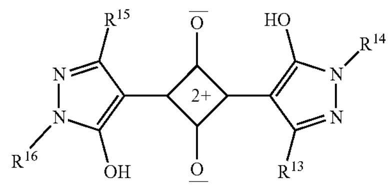

| Compound No. | $R^{13}$ | $R^{14}$ | $R^{15}$ | $R^{16}$ |
|---|---|---|---|---|
| 7-1 | Me | Me | Me | Me |
| 7-2 | Et | Me | Et | Me |
| 7-3 | Me | 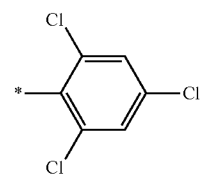 [SMILES: *c1c(Cl)cc(Cl)cc1Cl] | Me | 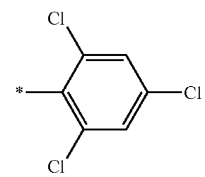 [SMILES: *c1c(Cl)cc(Cl)cc1Cl] |
| 7-4 | t-Bu | 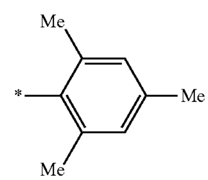 [SMILES: *c1c(C)cc(C)cc1C] | t-Bu | 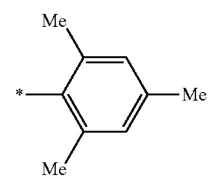 [SMILES: *c1c(C)cc(C)cc1C] |
| 7-5 | $NMe_2$ | Me | $NMe_2$ | Me |
| 7-6 | CN | Me | CN | Me |
| 7-7 | OEt | Me | OEt | Me |
| 7-8 | Me | 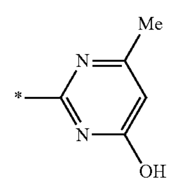 [SMILES: *c1nc(C)cc(O)n1] | Me | 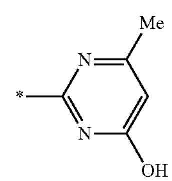 [SMILES: *c1nc(C)cc(O)n1] |
| 7-9 | Et | 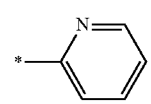 | Et | 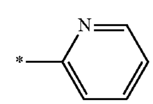 [SMILES: *c1ccccn1] |
| 7-10 | i-Pr | 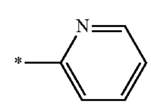 | i-Pr | 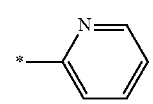 [SMILES: *c1ccccn1] |
| 7-11 | t-Bu | t-Bu | t-Bu | t-Bu |
| 7-12 | $CF_3$ | Ph | $CF_3$ | Ph |
| 7-13 | COOEt | Me | COOEt | Me |
| 7-14 | $NH_2$ | Me | $NH_2$ | Me |
| 7-15 | Me | Me | Me | 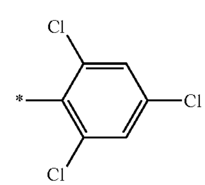 |

-continued
| Compound No. | $R^{13}$ | $R^{14}$ | $R^{15}$ | $R^{16}$ |
|---|---|---|---|---|
| 7-16 | Me | Me | t-Bu | t-Bu |
| 7-17 | Me | Me | $NMe_2$ | Me |
| 7-18 | Me | Me | Me | Ph |
| 7-19 | Et | Me | Et | 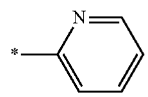 [SMILES: *c1ccccn1] |
| 7-20 | COOEt | Me | Me | 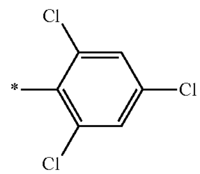 [SMILES: *c1c(Cl)cc(Cl)cc1Cl] |
7-21
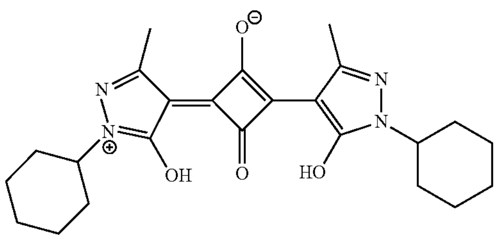
General Formula (8)
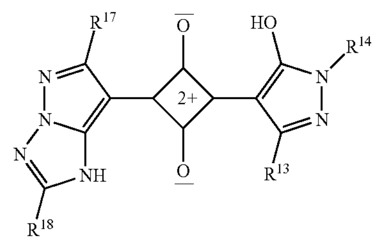
| Compound No | $R^{13}$ | $R^{14}$ | $R^{17}$ | $R^{18}$ |
|---|---|---|---|---|
| 8-1 | Me | Me | Me | Me |
| 8-2 | Me | Me | t-Bu | 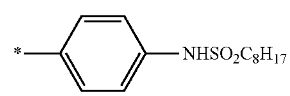 |
| 8-3 | Me | Me | t-Bu | 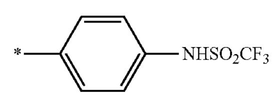 |
| 8-4 | Me | Me | t-Bu | 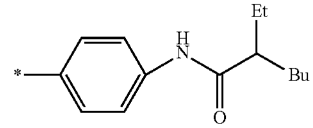 |
| 8-5 | Me | 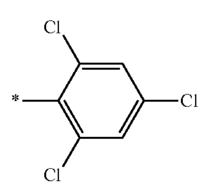 [SMILES: *c1c(Cl)cc(Cl)cc1Cl] | Me | Me |
| 8-6 | Me | 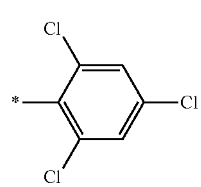 | t-Bu | 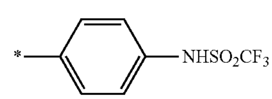 |

-continued
| Compound No | $R^{13}$ | $R^{14}$ | $R^{17}$ | $R^{18}$ |
|---|---|---|---|---|
| 8-7 | Me | Ph | t-Bu | 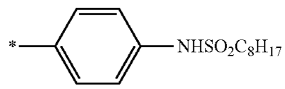 |
| 8-8 | Me | 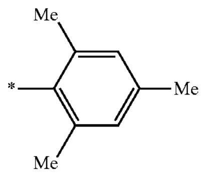 | Me | Me |
| 8-9 | Et | Me | Me | Me |
| 8-10 | i-Pr | Me | Me | Me |
| 8-11 | t-Bu | Me | Me | Me |
| 8-12 | Me | Me | OEt | Bu |
| 8-13 | COOEt | Me | Me | Me |
| 8-14 | $NH_2$ | Me | Me | Me |
| 8-16 | Me | Me | $CF_3$ | t-Bu |
General Formula (9)
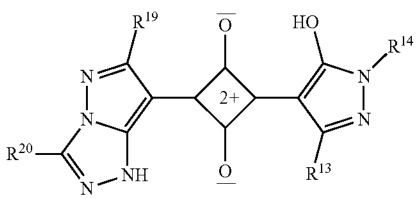
| Compound No | $R^{13}$ | $R^{14}$ | $R^{19}$ | $R^{20}$ |
|---|---|---|---|---|
| 9-1 | Me | Me | Me | Me |
| 9-2 | Me | Me | t-Bu | 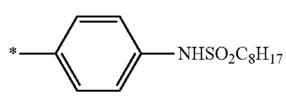 |
| 9-3 | Me | Me | Me | 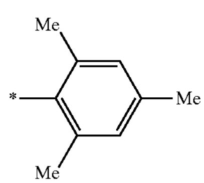 [SMILES: *c1c(C)cc(C)cc1C] |
| 9-4 | Me | Me | Me | 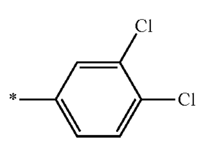 [SMILES: *c1ccc(Cl)c(Cl)c1] |
| 9-5 | Me | 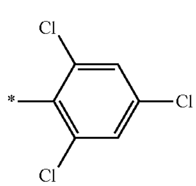 | Me | Me |

-continued

| Compound No | $R^{13}$ | $R^{14}$ | $R^{19}$ | $R^{20}$ |
|---|---|---|---|---|
| 9-6 | Me | 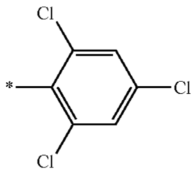 [SMILES: *c1c(Cl)cc(Cl)cc1Cl] | Me | 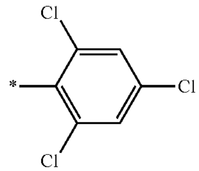 [SMILES: *c1c(Cl)cc(Cl)cc1Cl] |
| 9-7 | t-Bu | Me | t-Bu | 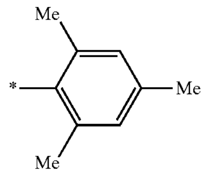 [SMILES: *c1c(C)cc(C)cc1C] |
| 9-8 | t-Bu | Me | Me | Me |
| 9-9 | Et | Me | t-Bu | Me |
| 9-10 | i-Pr | Me | Me | 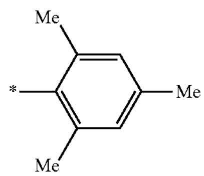 [SMILES: *c1c(C)cc(C)cc1C] |

(Quencher-Embedded Coloring Agent)

The squarine-based coloring agent represented by General Formula (1) may be a quencher-embedded coloring agent in which a quencher portion is linked to a coloring agent by a covalent bond via a linking group. The quencher-embedded coloring agent can also be preferably used as the coloring agent of at least one of the dyes B or C. That is, the quencher-embedded coloring agent is counted as the dye B or dye C according to the wavelength having the main absorption wavelength range.

Examples of the quencher portion include the ferrocenyl group in the above-mentioned substituent X. In addition, the quencher portion in a quencher compound described in paragraphs 0199 to 0212 and paragraphs 0234 to 0310 of WO2019/066043A can be exemplified.

Among the squarine-based coloring agents represented by General Formula (1), specific examples of the coloring agents corresponding to the quencher-embedded coloring agents are shown below. However, the present invention is not limited thereto.

In the following specific examples, Me represents methyl, Et represents ethyl, and Bu represents butyl, respectively.

AA-1

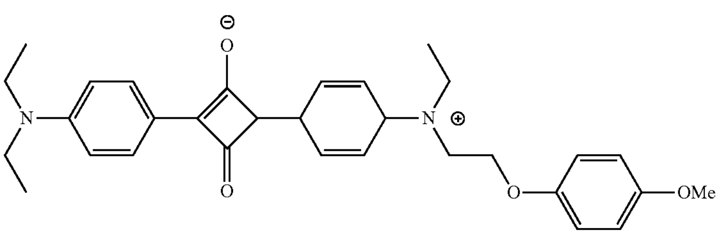

AA-2

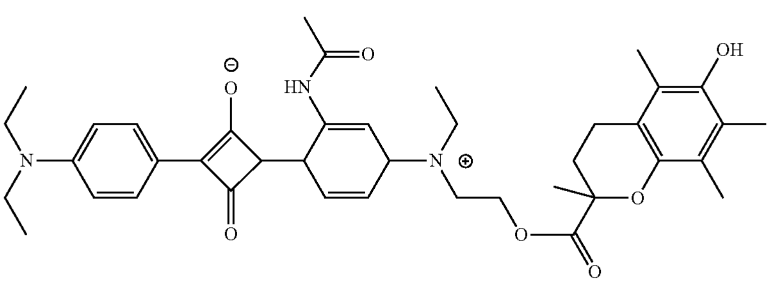

-continued
AA-3
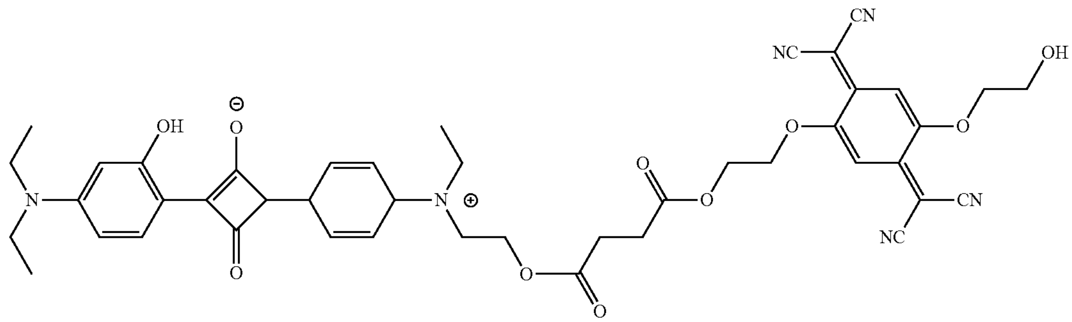
AA-4
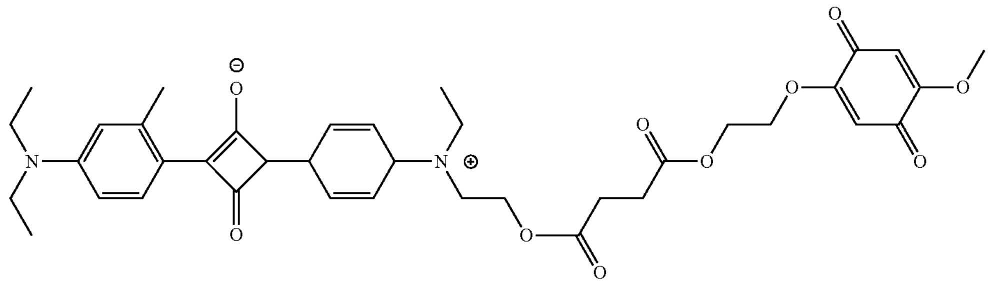
AA-5
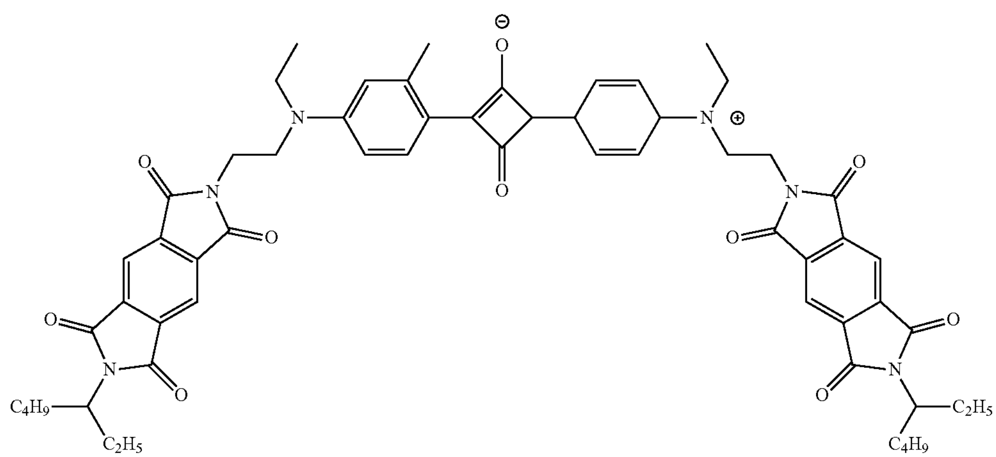
AA-6
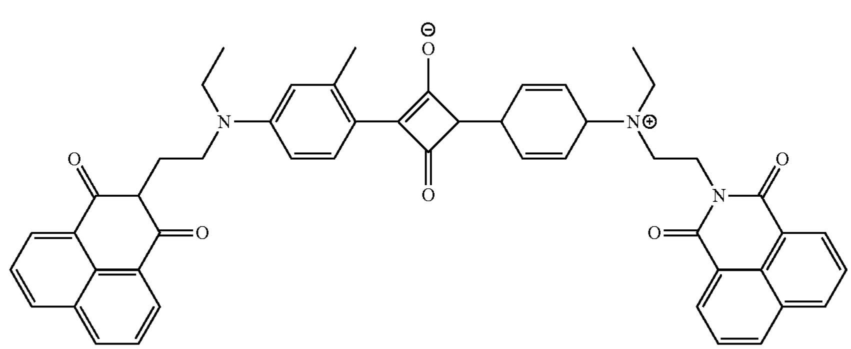

-continued
AA-7
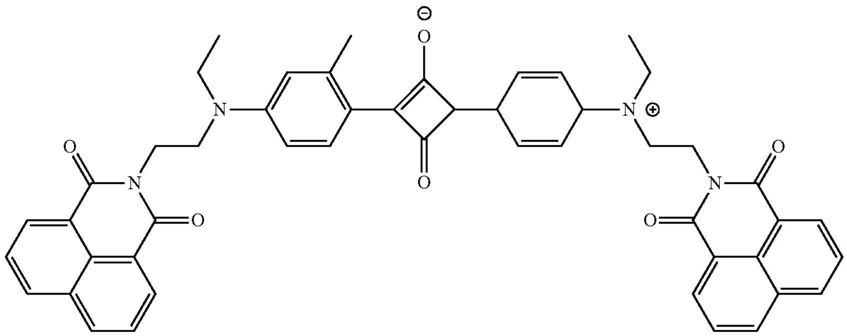
AA-8
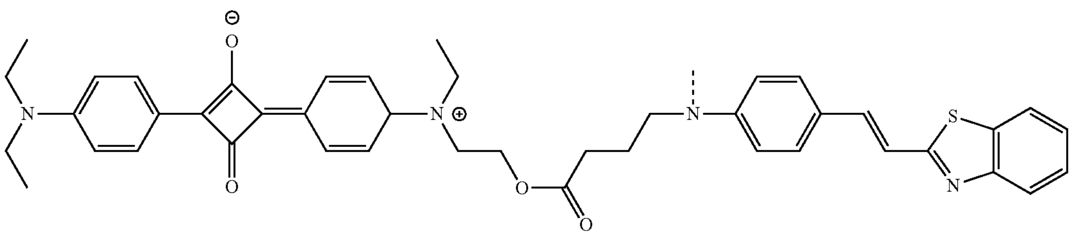
AA-9
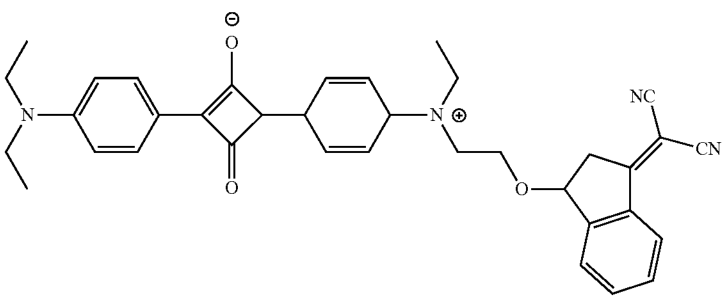
A-10
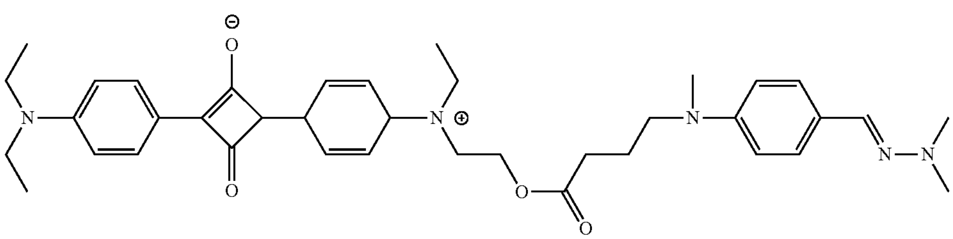
A-11
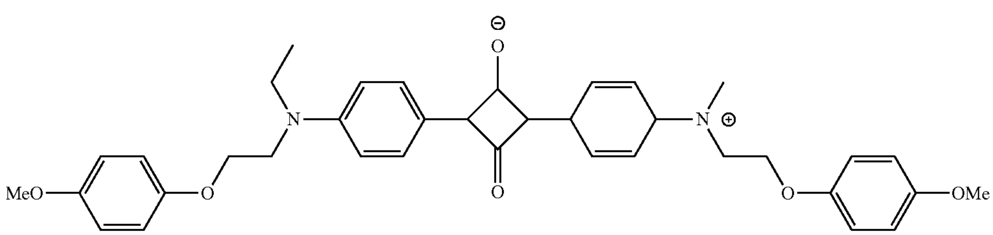
AA-12
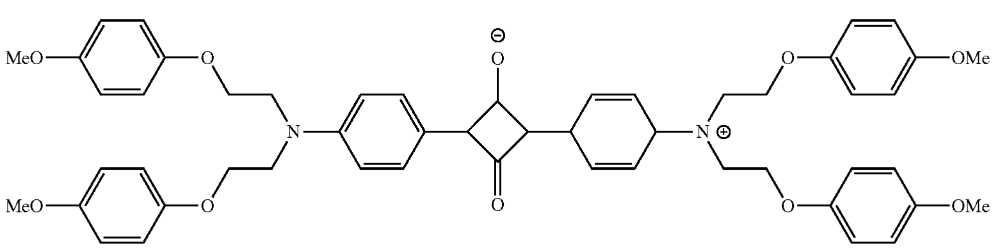

-continued
AA-13
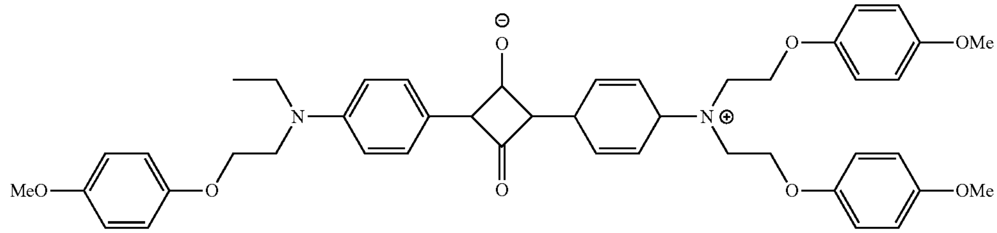
AA-14
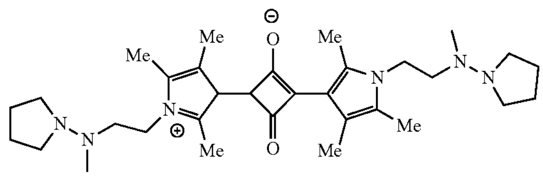
AA-15
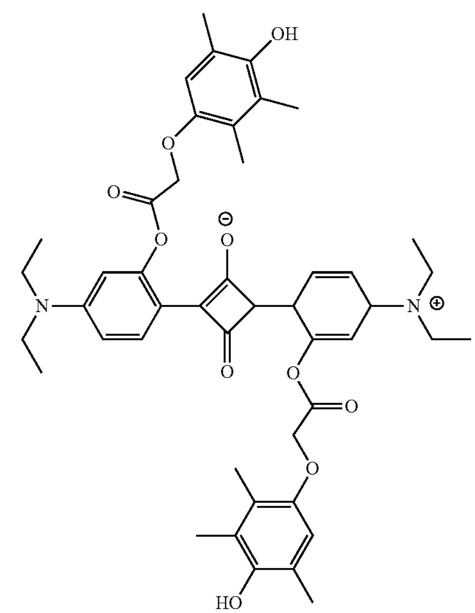
AA-16
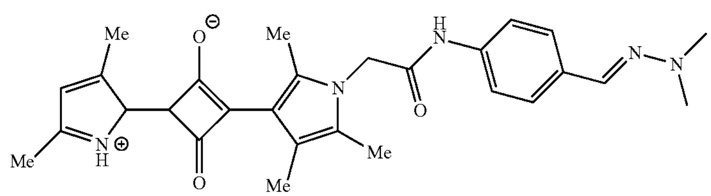
AA-17
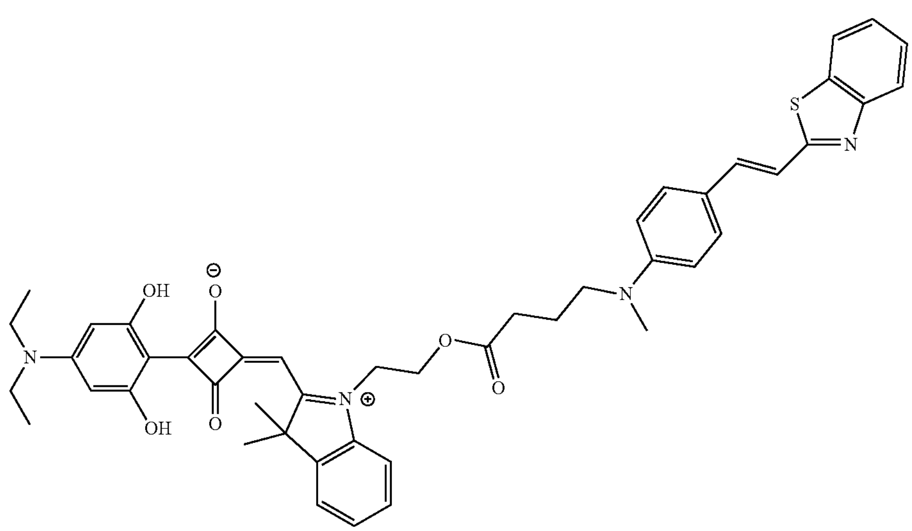

-continued
AA-18
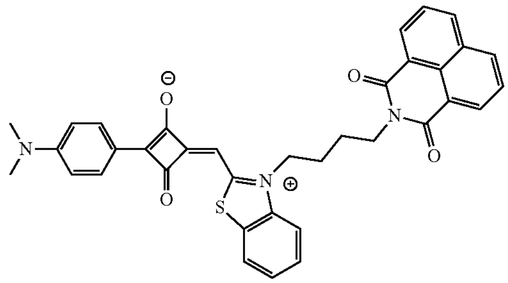
AA-19
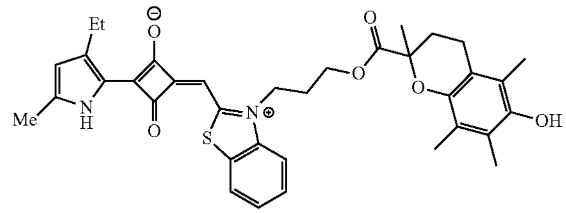
BB-1
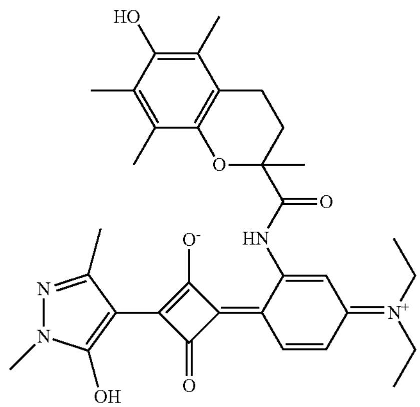
BB-2
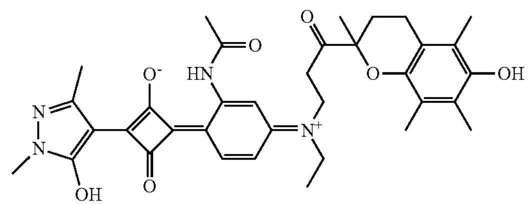
BB-3
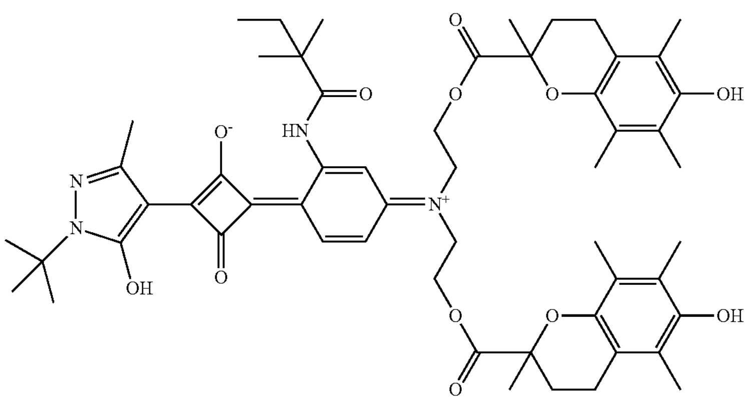
BB-4
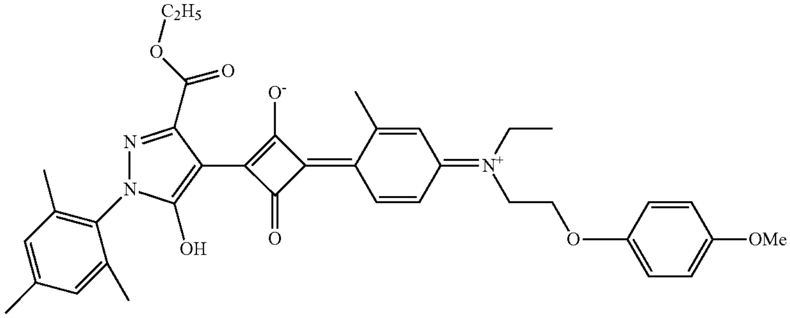

-continued
BB-5
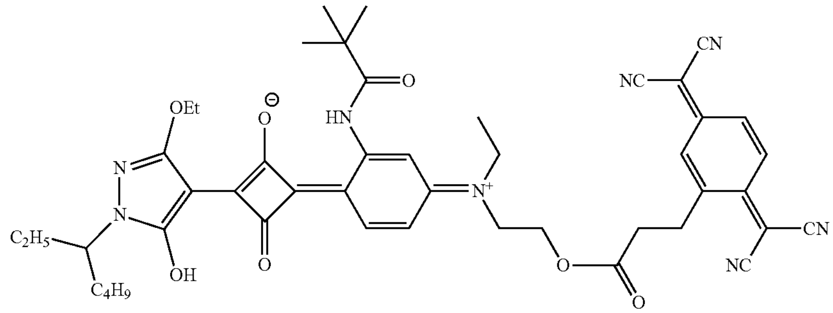
BB-6
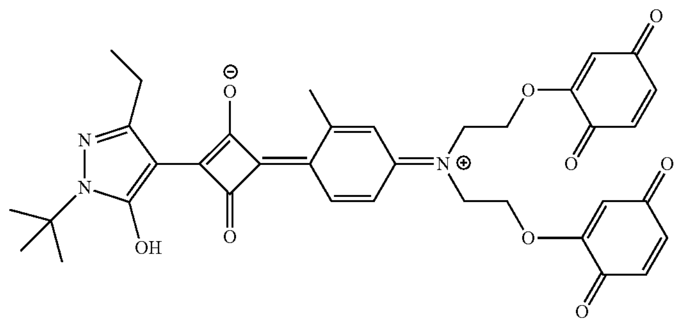
BB-7
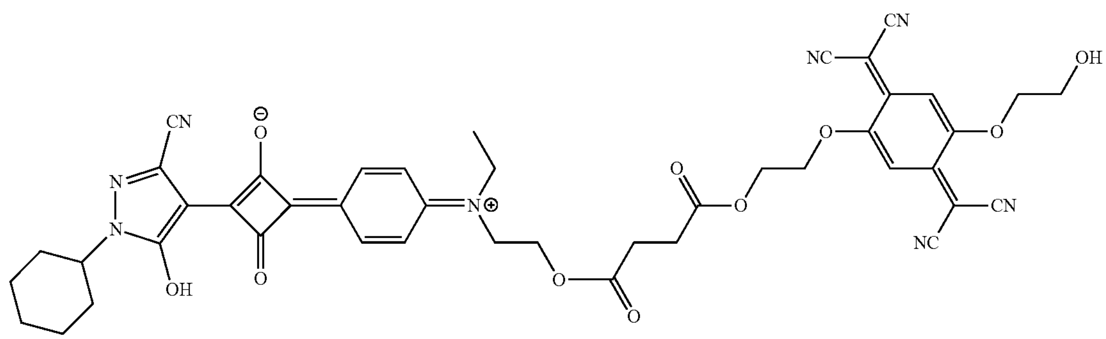
BB-8
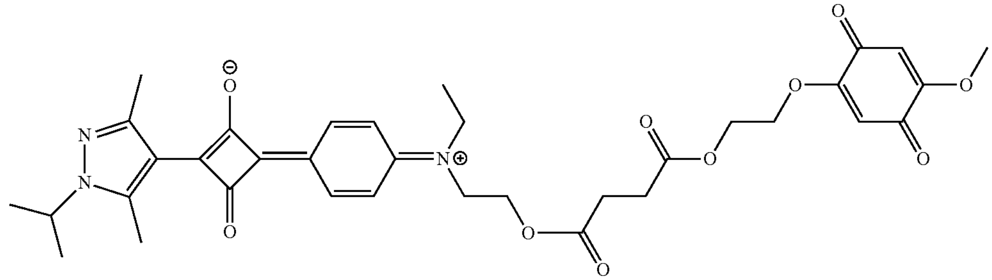

-continued
BB-9
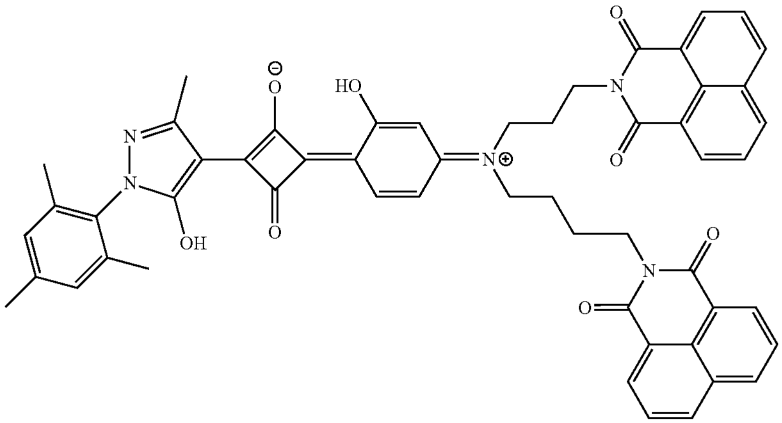
BB-10
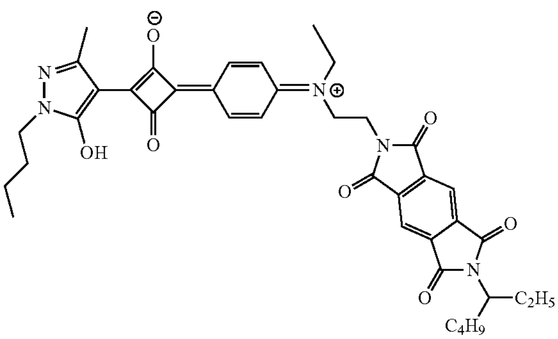
BB-11
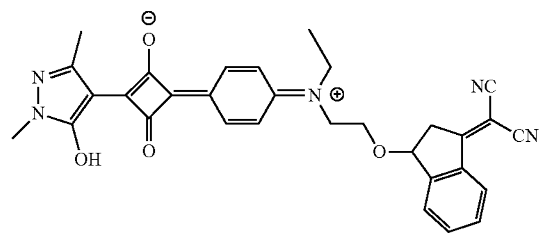
BB-12
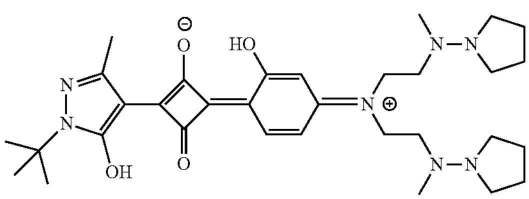
BB-13
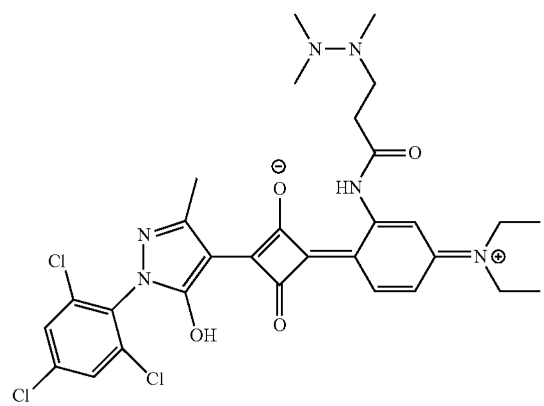
BB-14
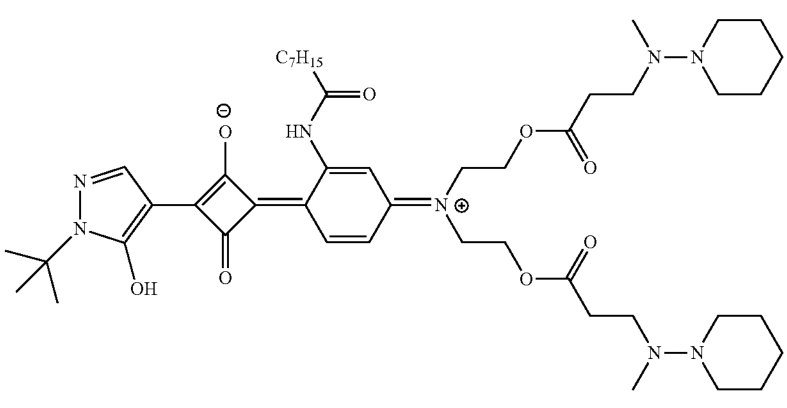

-continued
BB-15
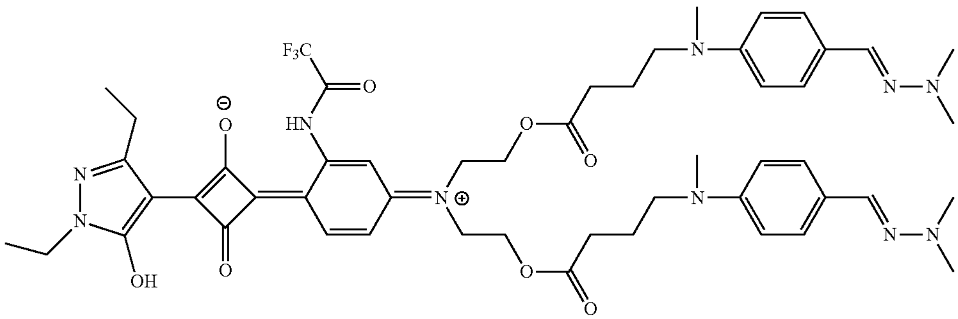
BB-16
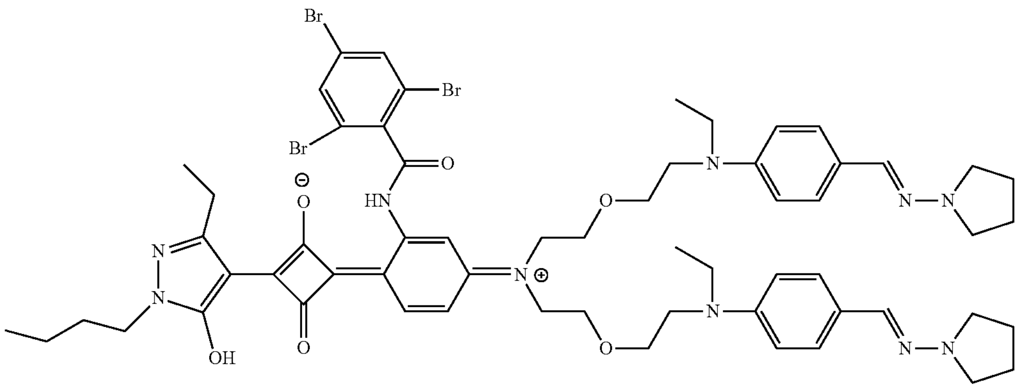
BB-17
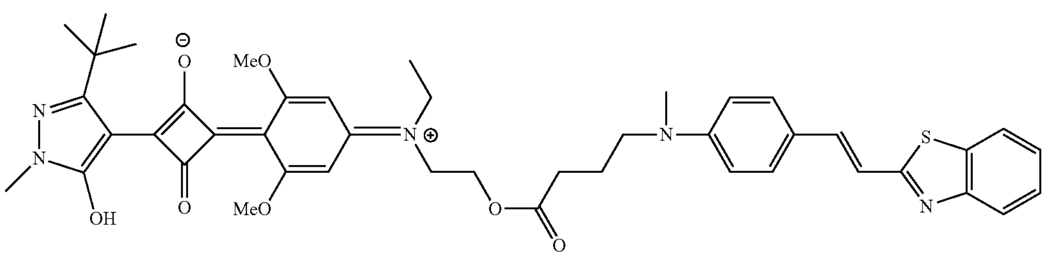
BB-18
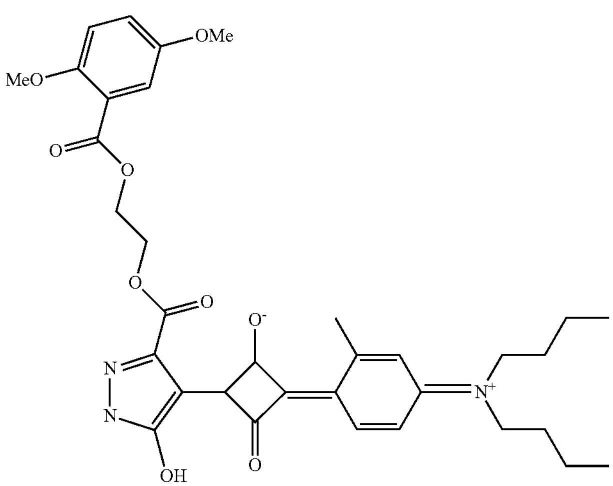

-continued
BB-19
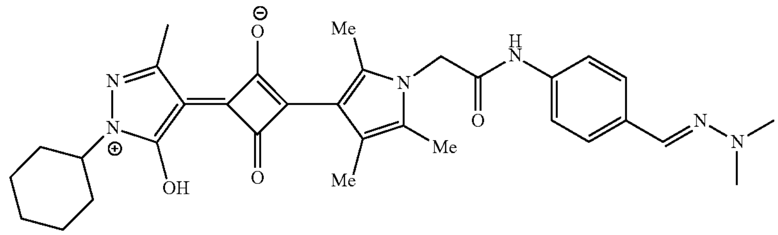
BB-20
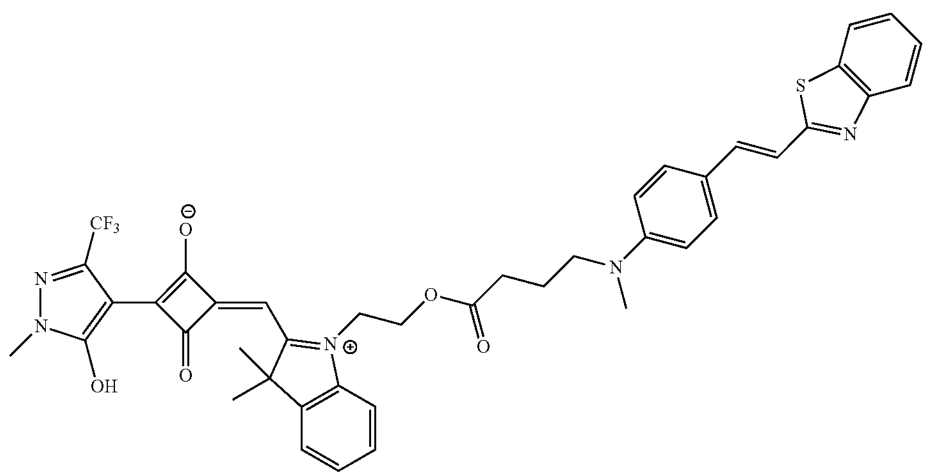
BB-21
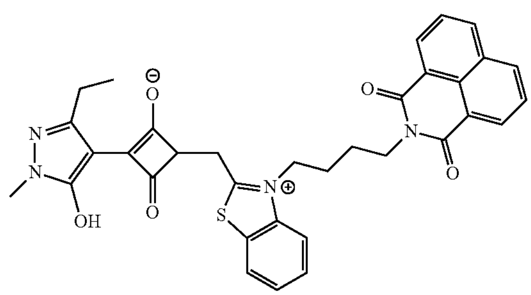
BB-22
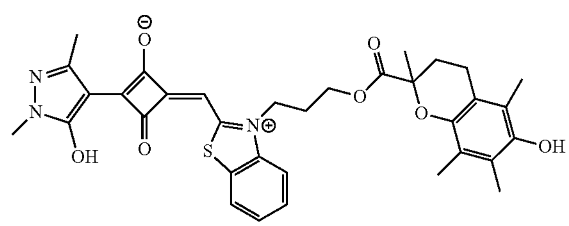
BB-23
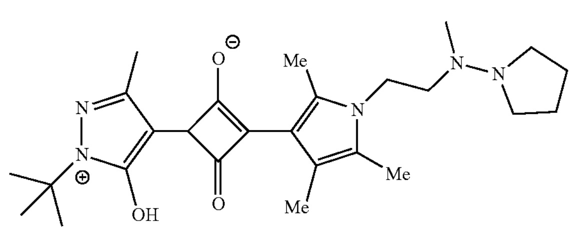

-continued
C-1
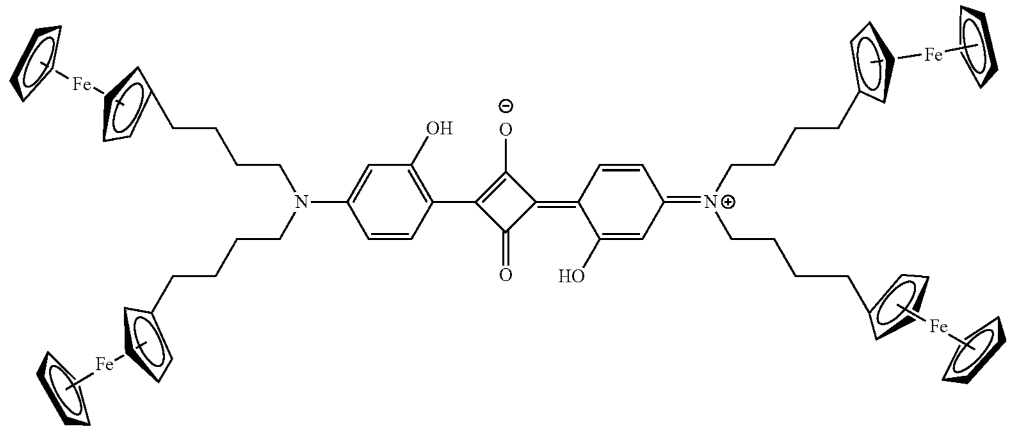
C-2
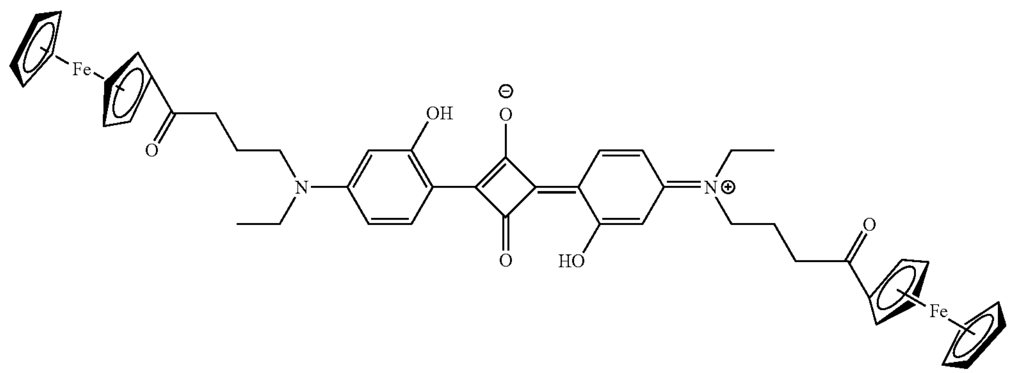
C-3
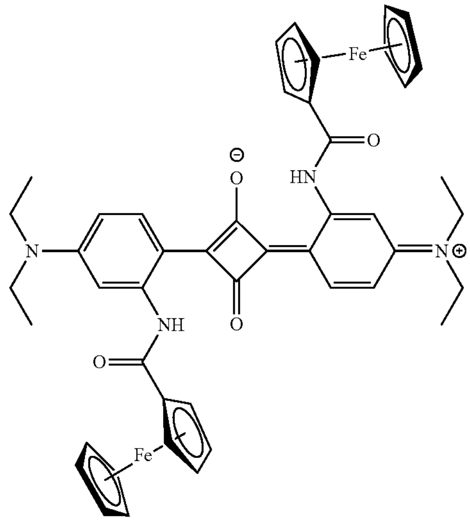
C-4
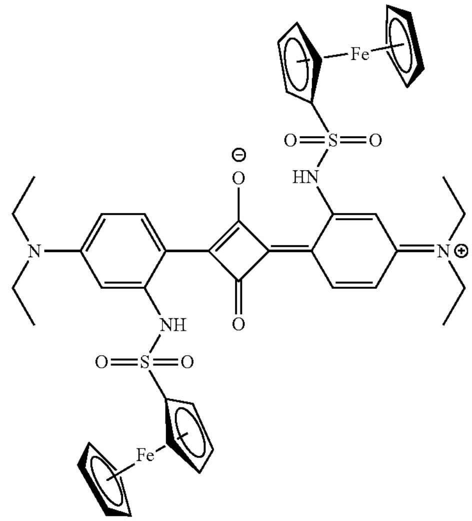

-continued
C-5
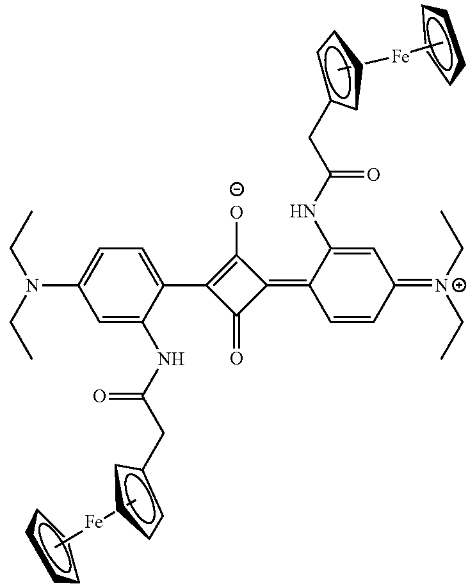
C-6
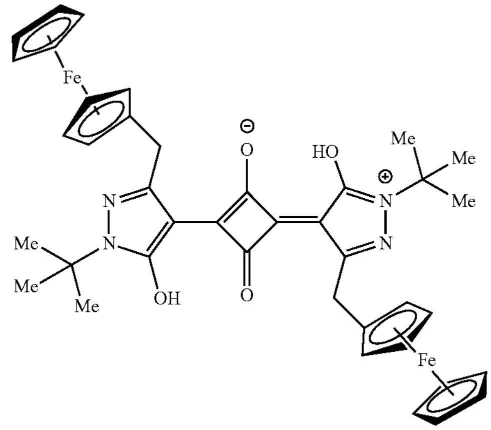
C-7
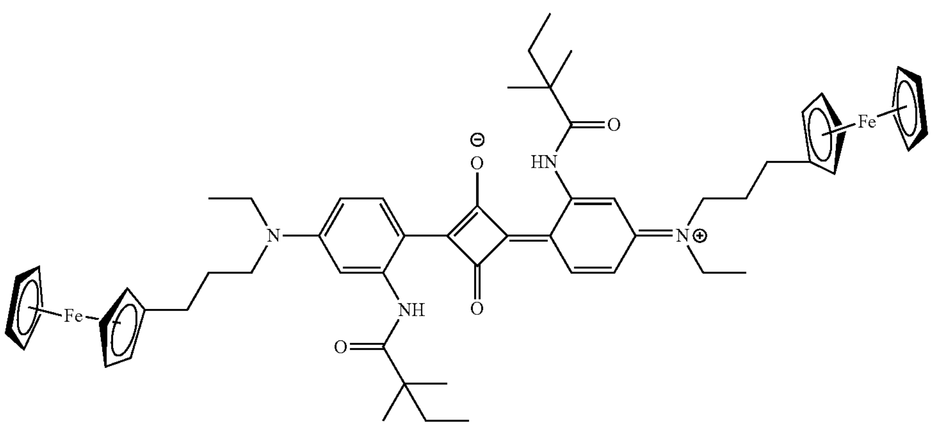
C-8
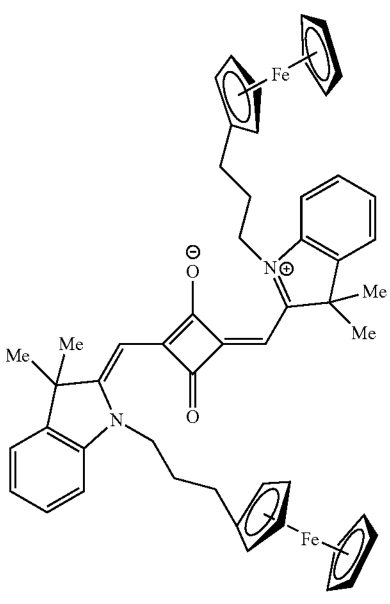

-continued
C-9
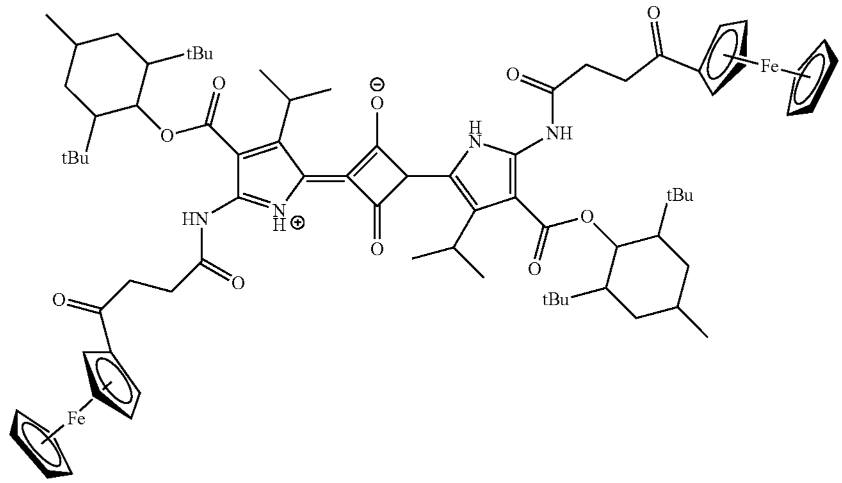
C-10
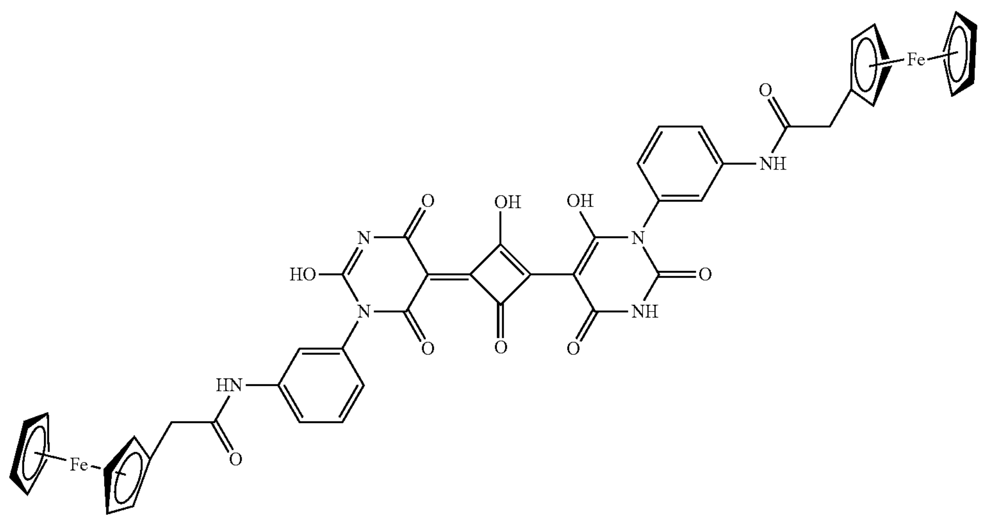
C-11
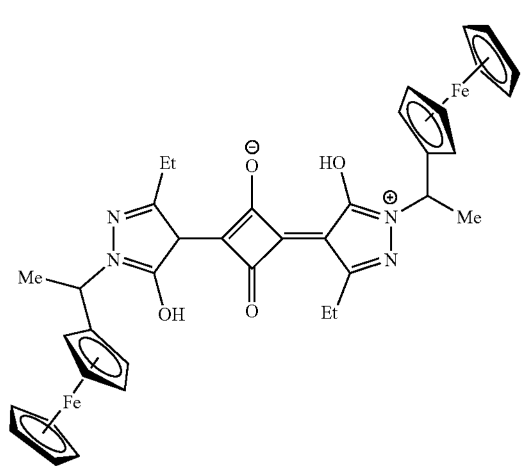
C-12
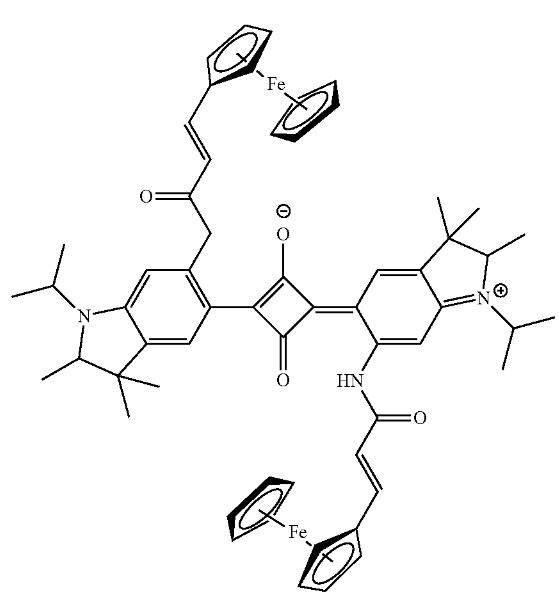

-continued
C-13
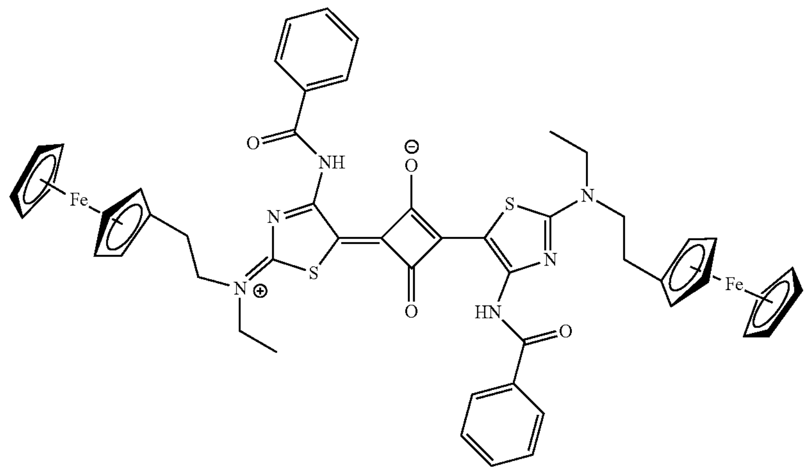
C-14
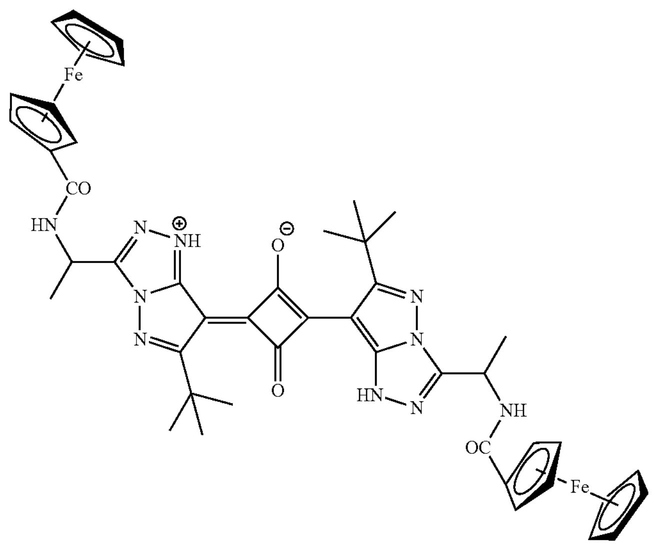
C-15
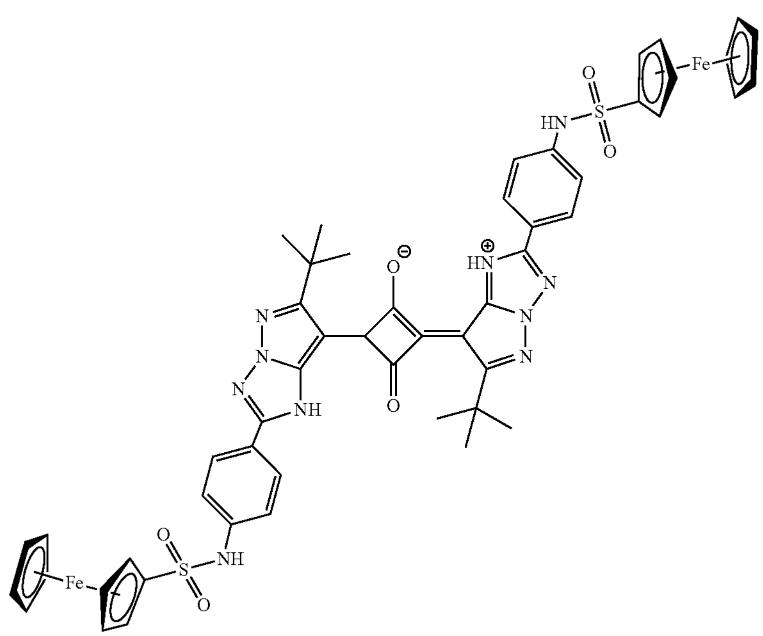

-continued
C-16
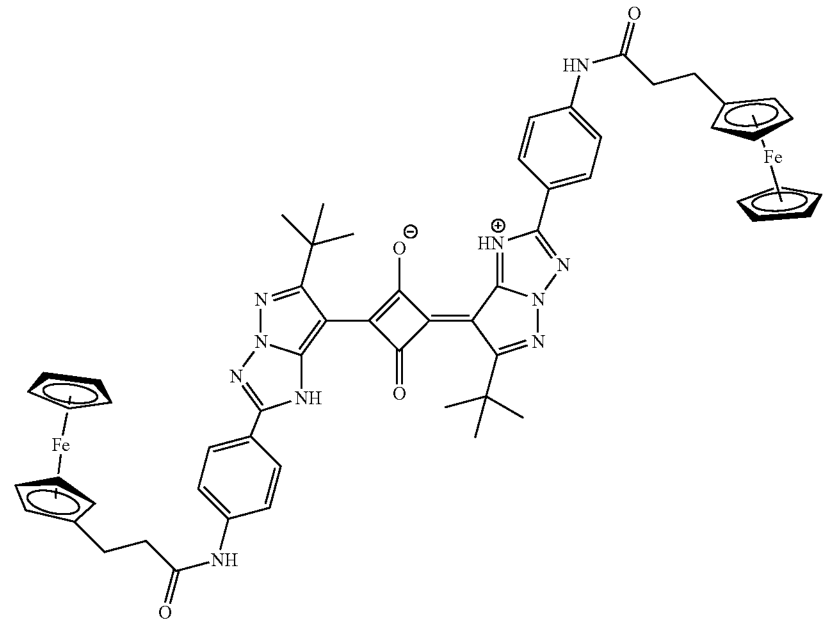
C-17
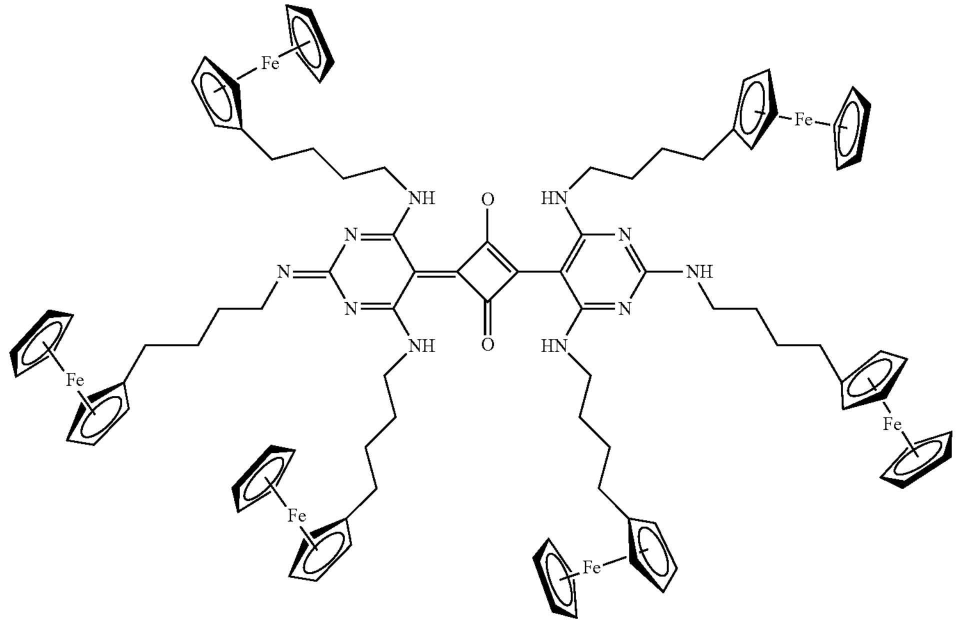

-continued
C-18
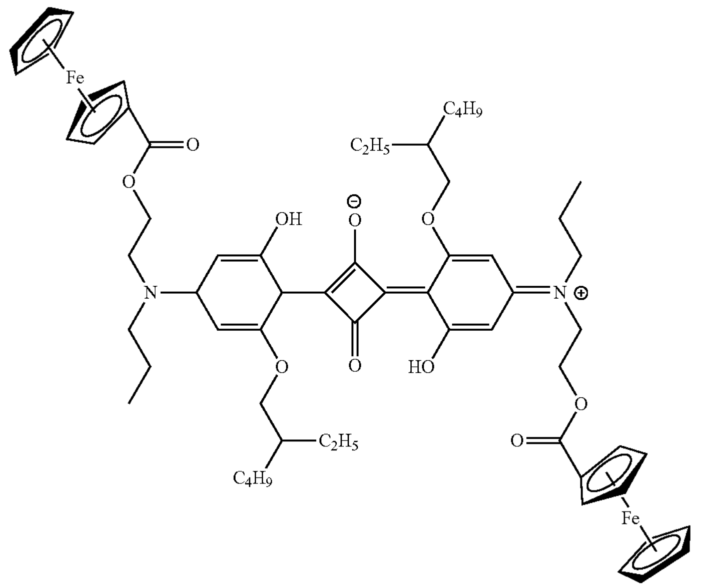
C-19
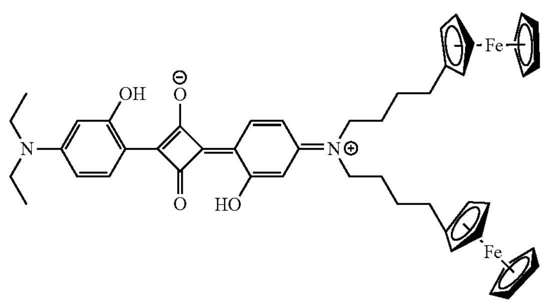
C-20
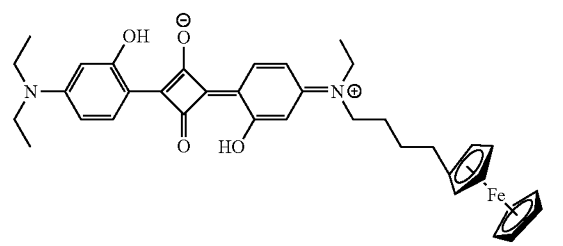
C-21
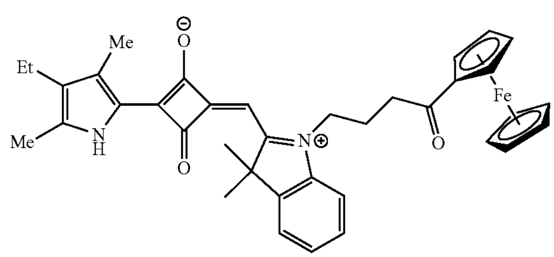
C-22
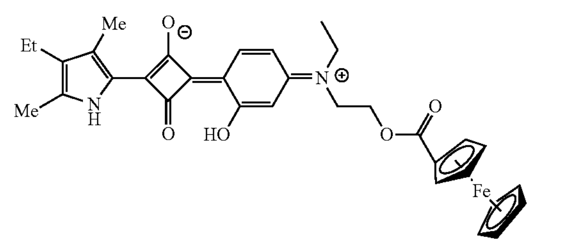
C-23
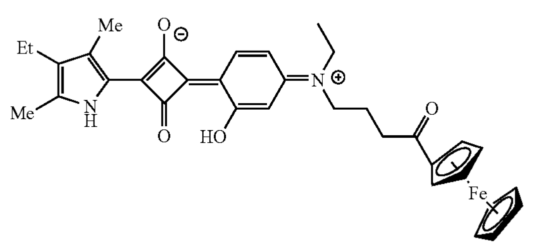
C-24
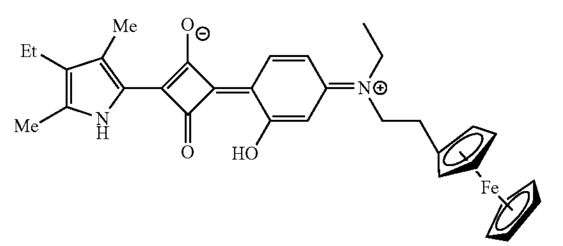

-continued
C-25
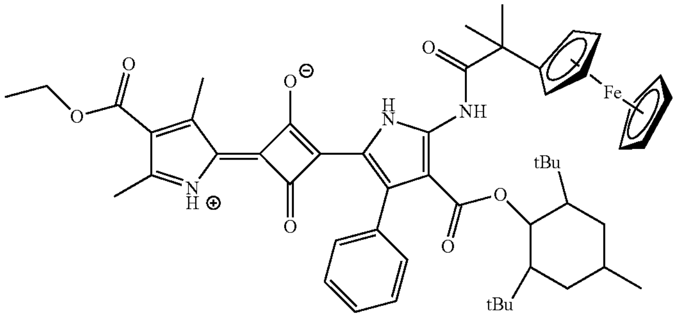
C-26
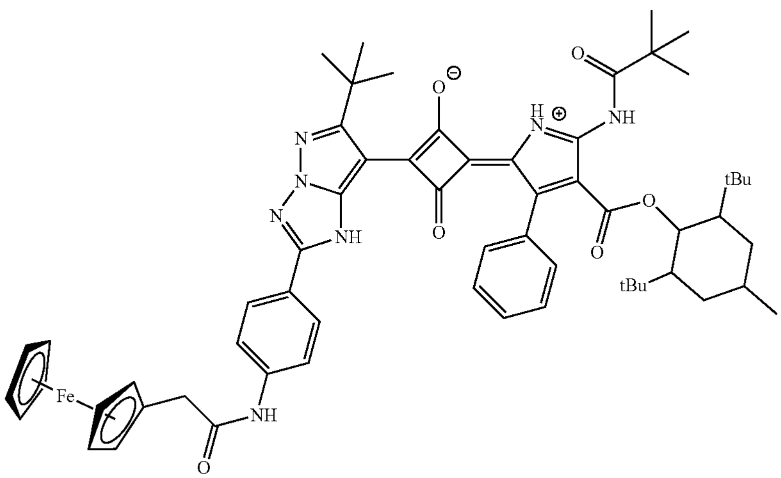
C-27
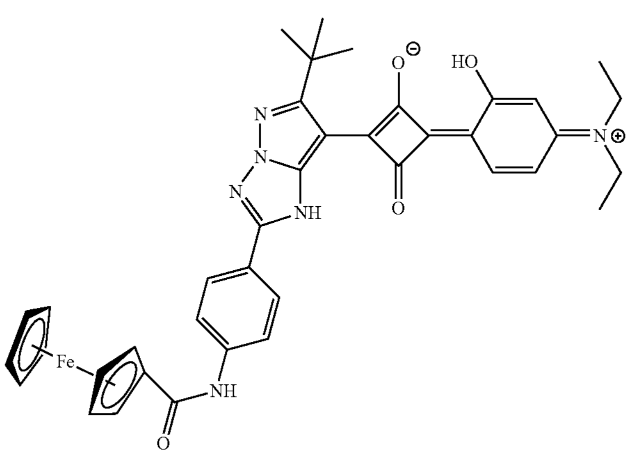

-continued
C-28
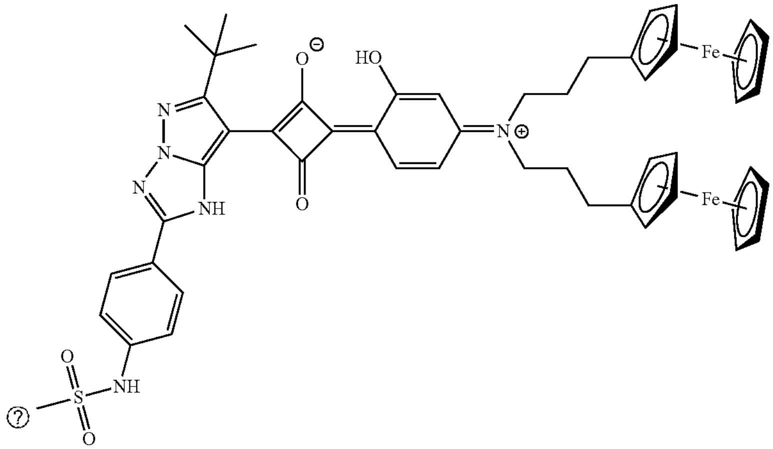
C-29
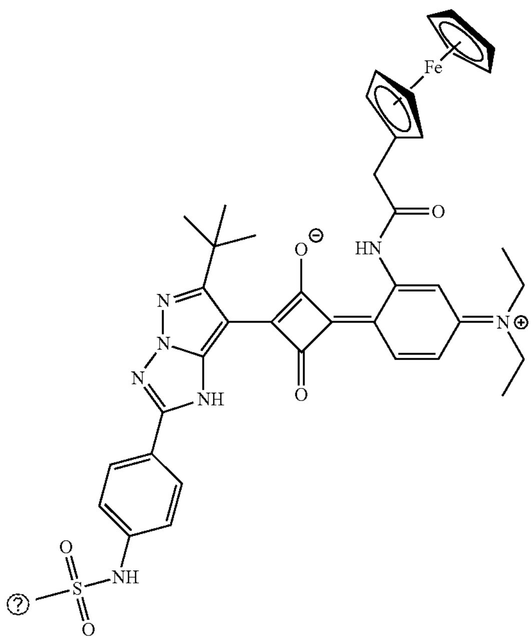
C-30
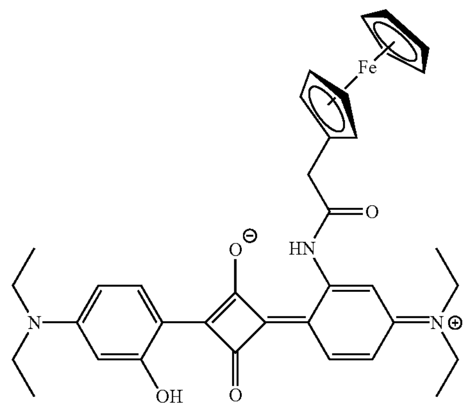
C-31
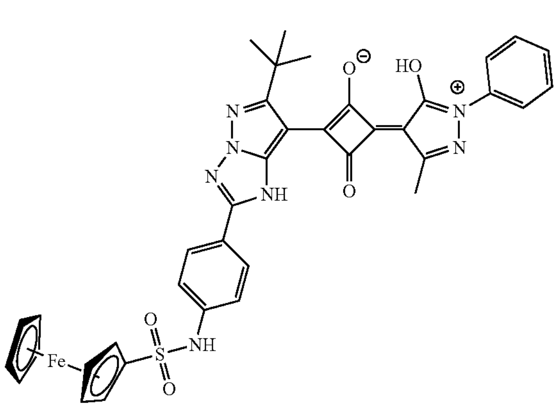
C-32
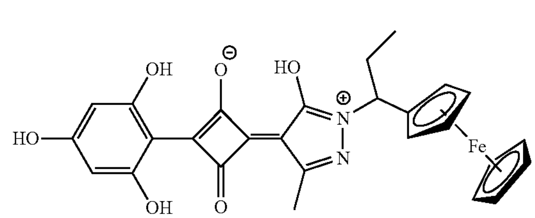

-continued
C-33
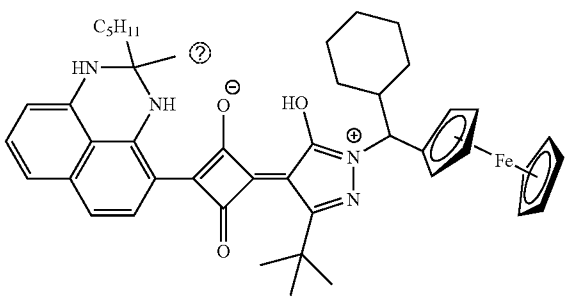
C-34
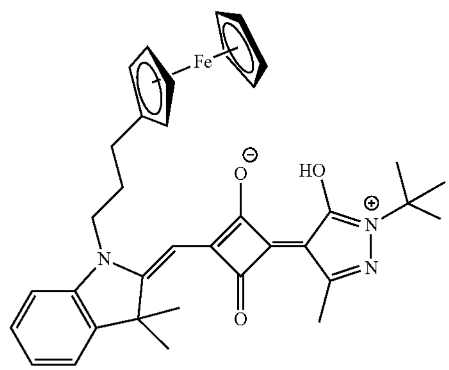
C-35
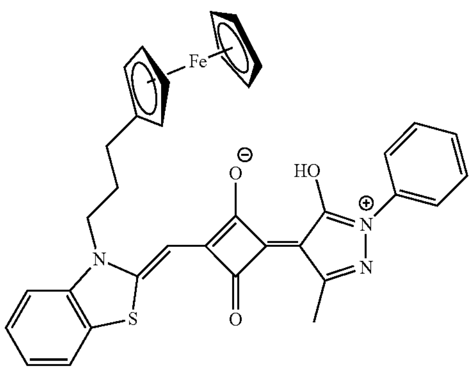
C-36
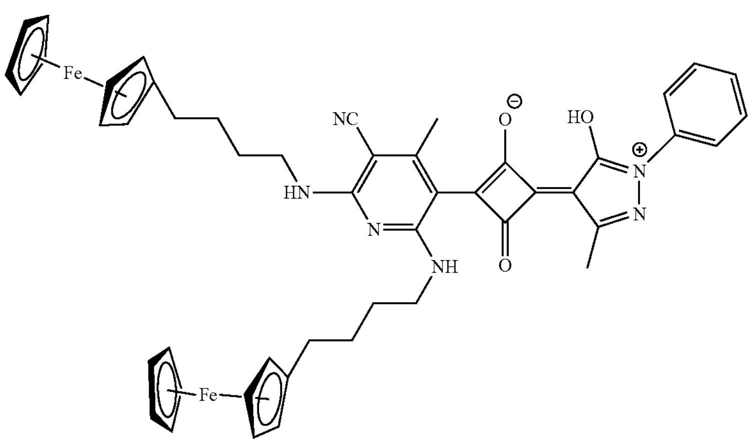
C-37
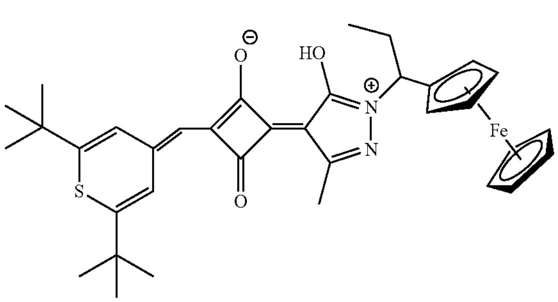
C-38
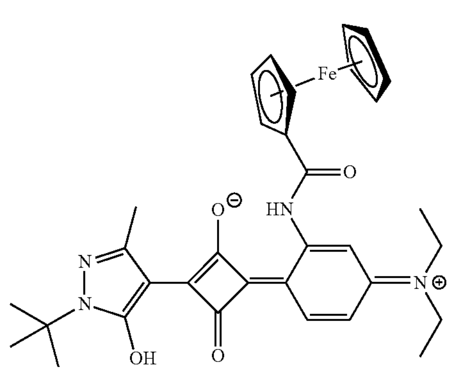

-continued
C-39
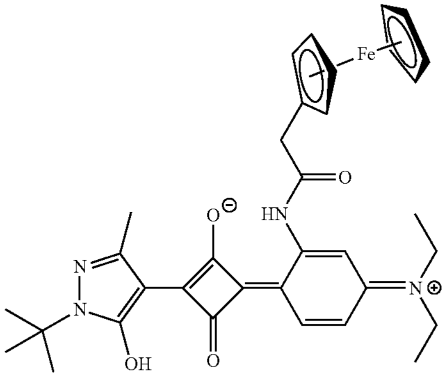
C-40
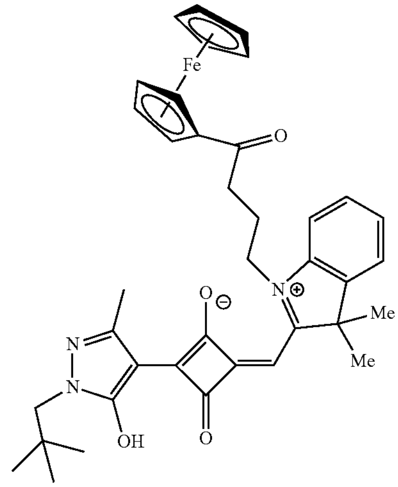
C-41
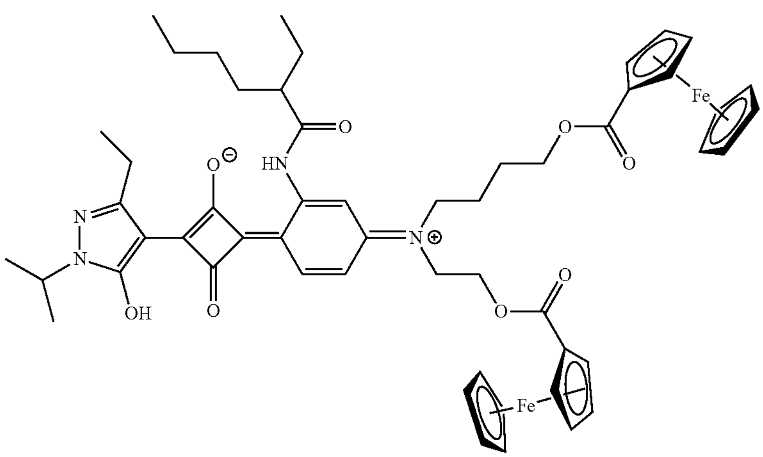
C-42
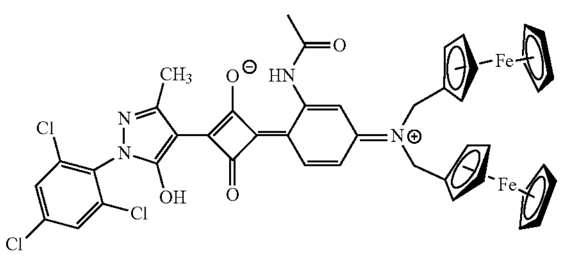
C-43
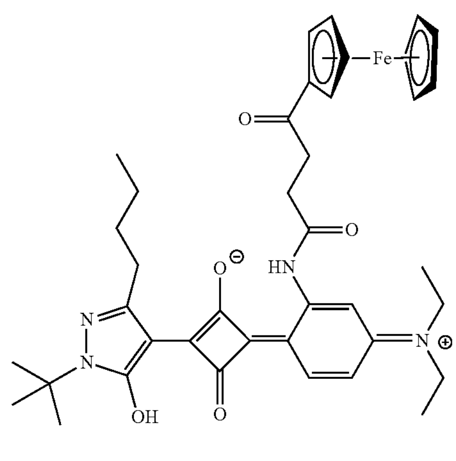

-continued
C-44
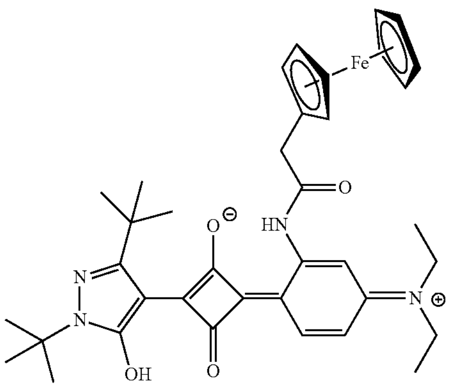
C-45
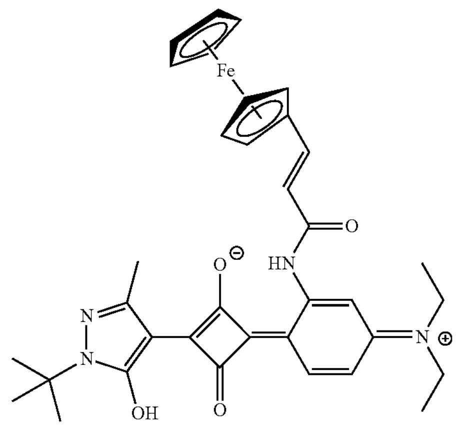
C-46
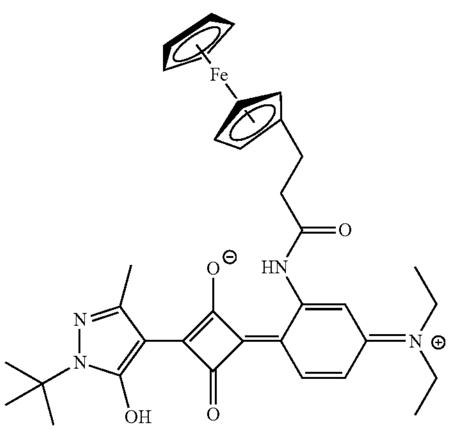
C-47
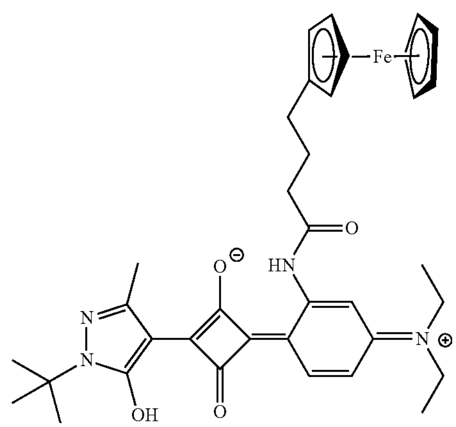
C-48
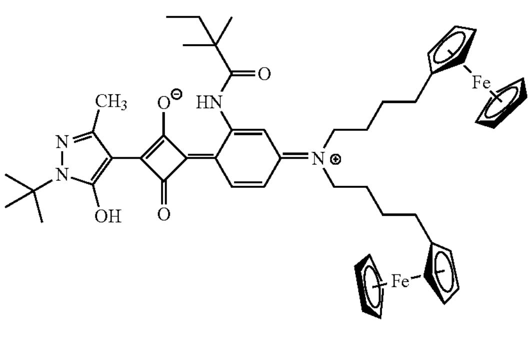
C-49
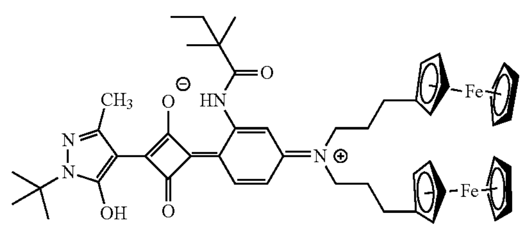
C-50
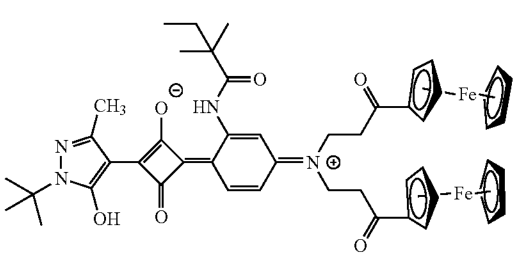
C-51
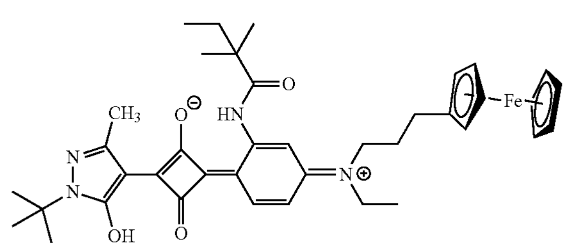

-continued
C-52
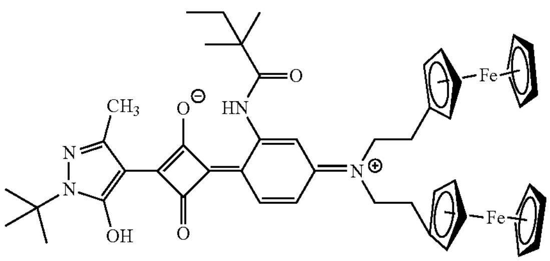
C-53
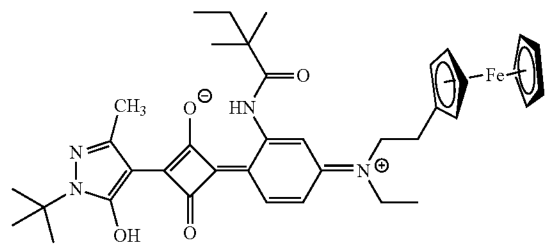
C-54
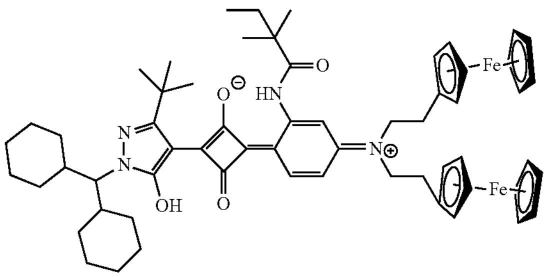
C-55
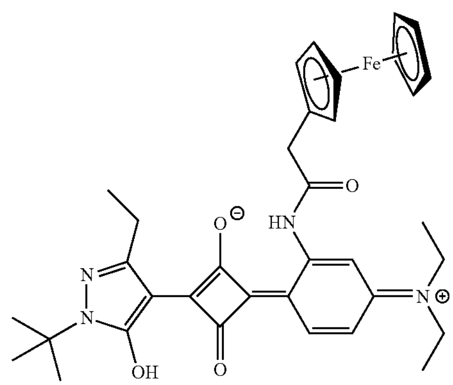
C-56
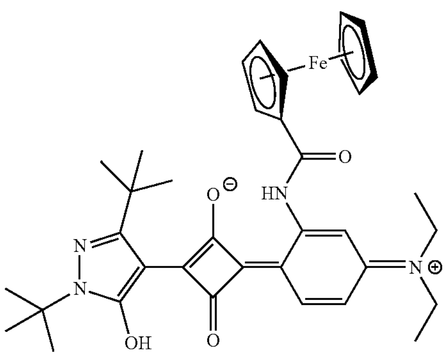
C-57
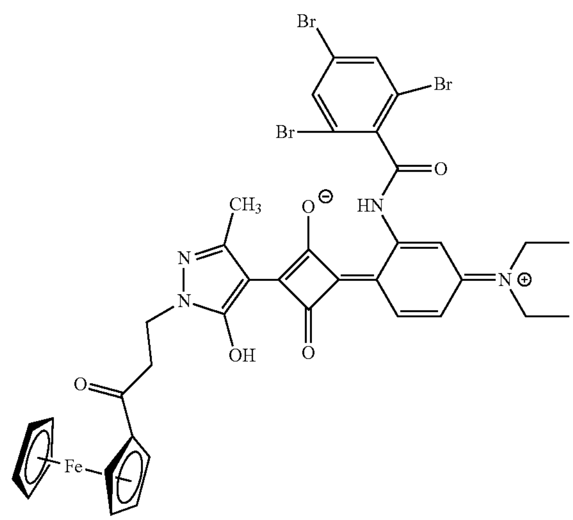
C-58
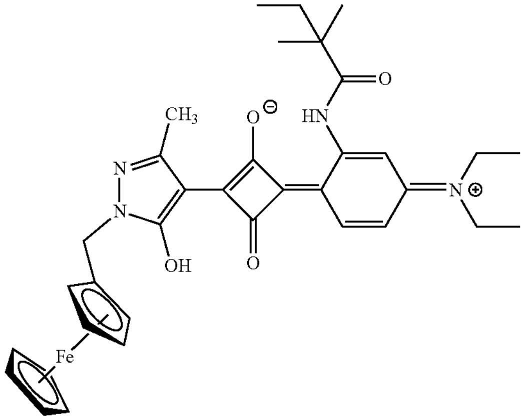
C-59
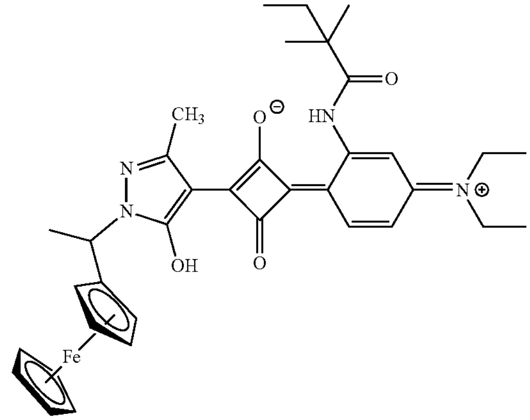

-continued
C-60
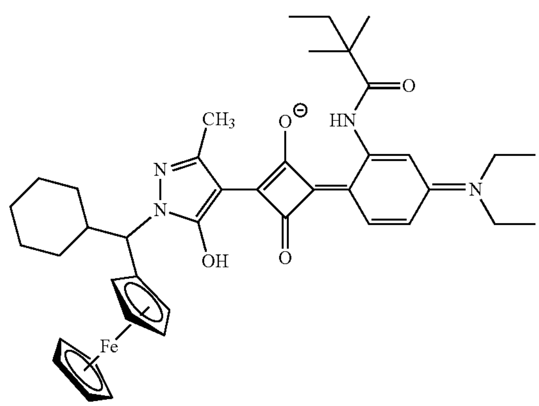
C-61
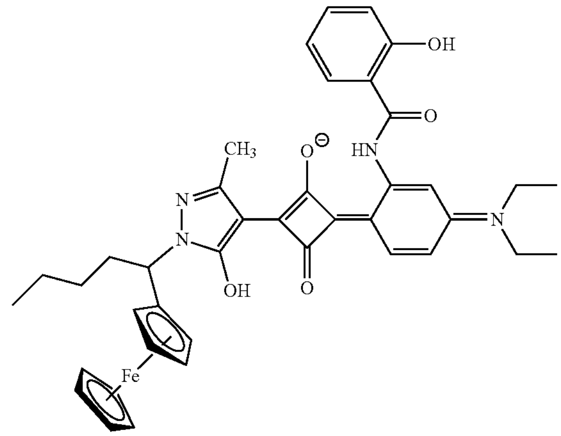
C-62
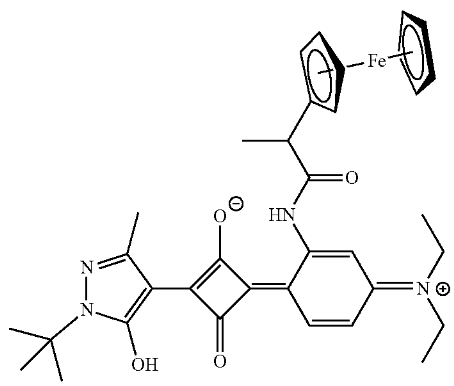
C-63
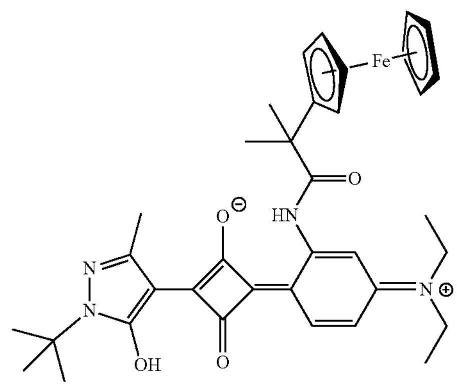
C-64
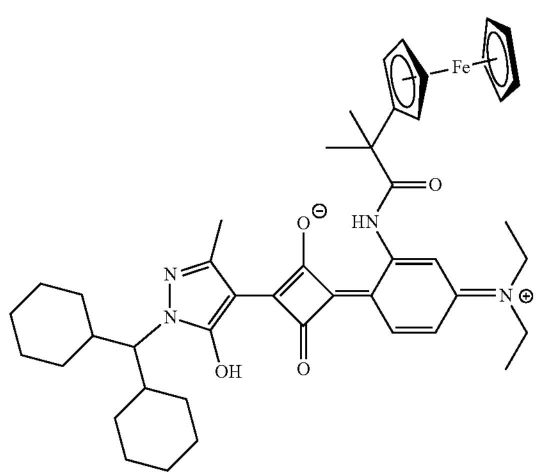
C-65
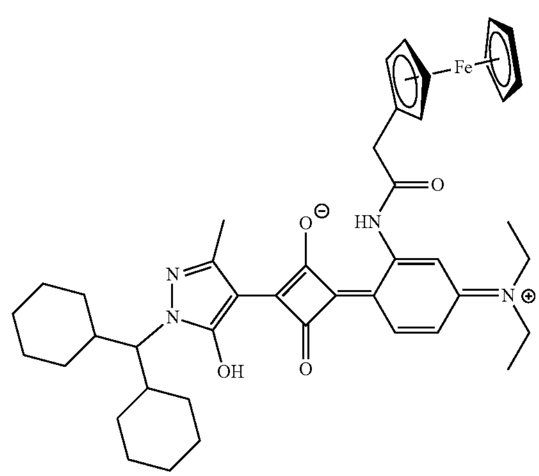

-continued
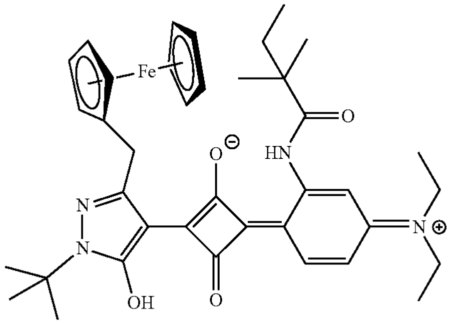
C-66
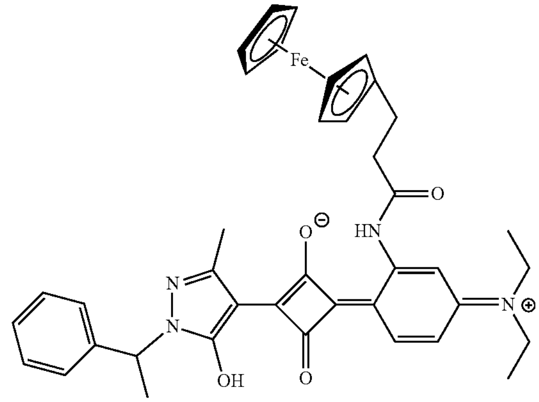
C-67
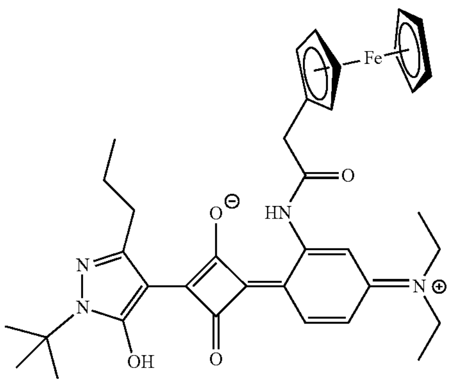
C-68
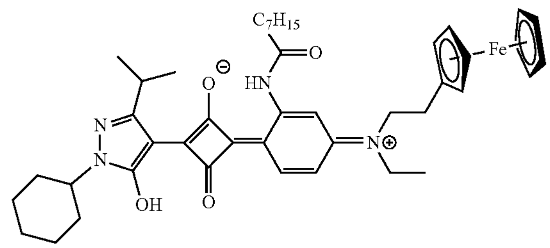
C-69
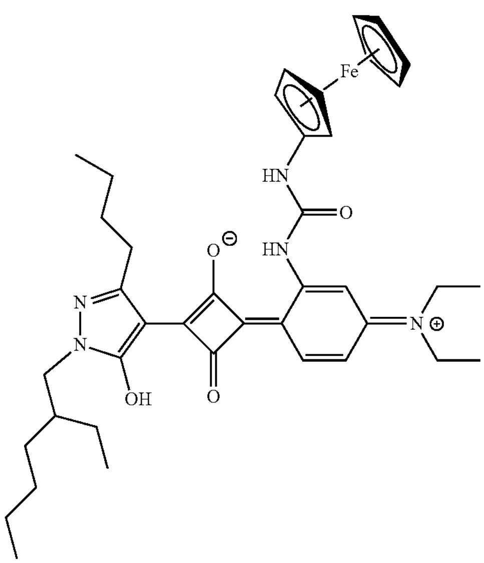
C-70
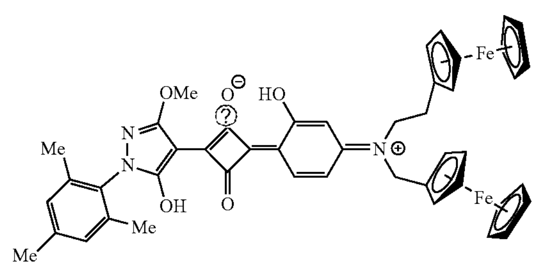
C-71

-continued
C-72
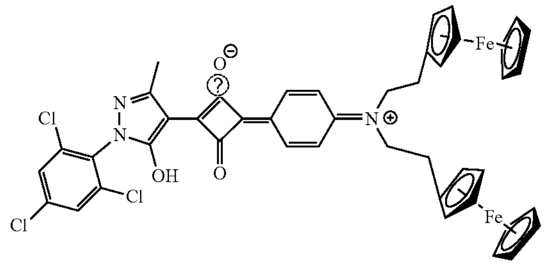
C-73
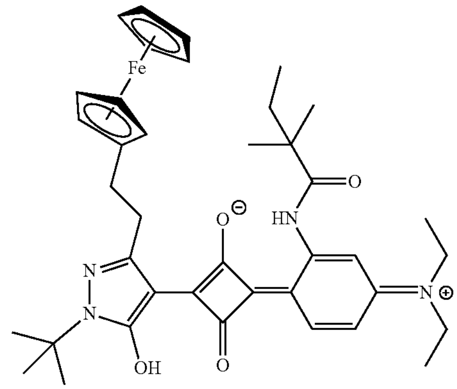
C-74
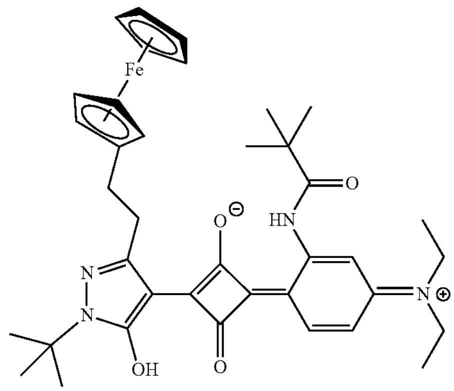
C-75
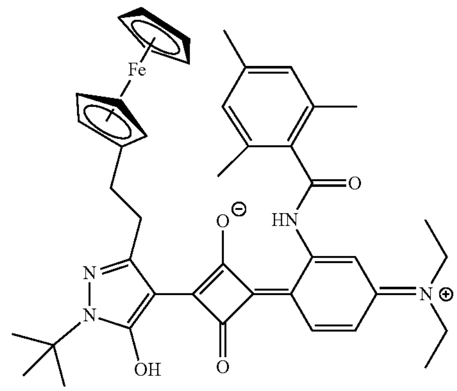
C-76
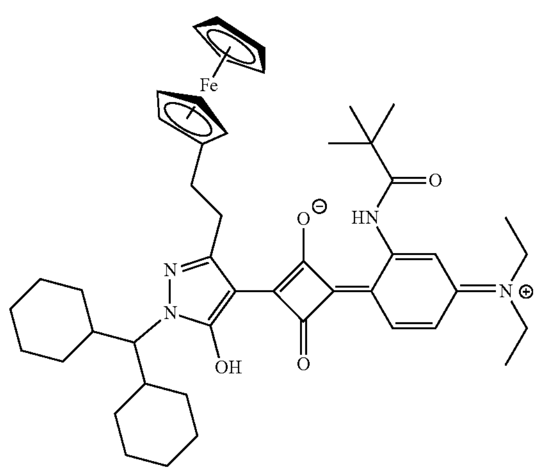
C-77
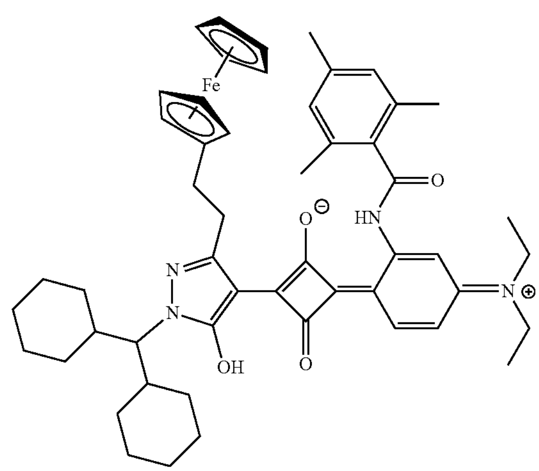

-continued
C-78
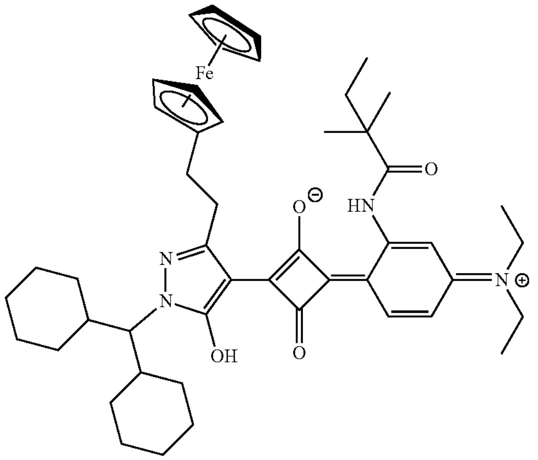
C-79
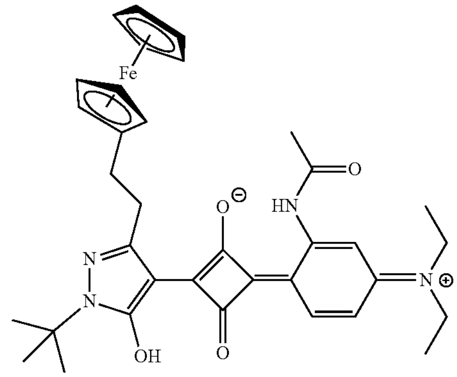
C-80
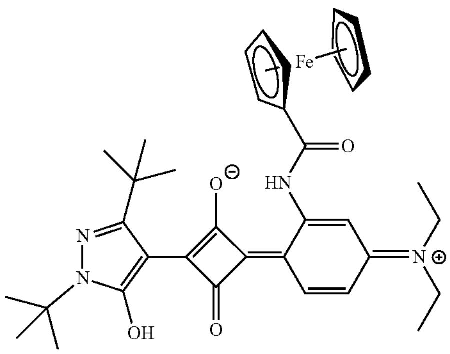
C-81
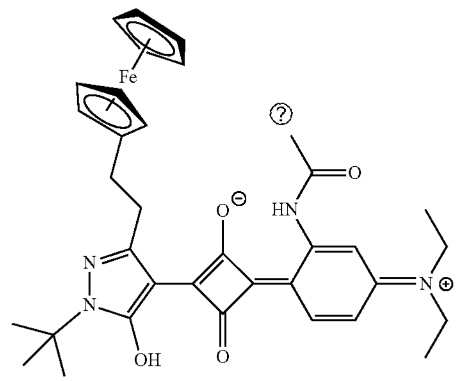
C-82
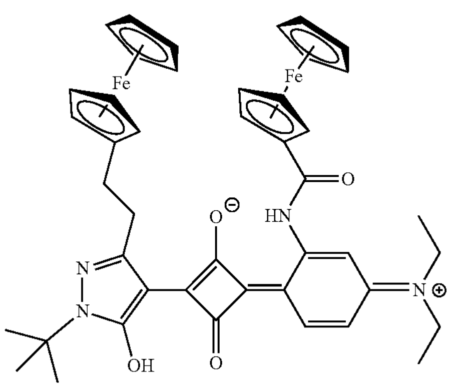
C-83
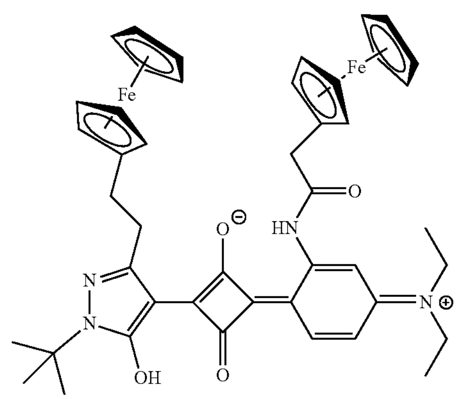
C-84
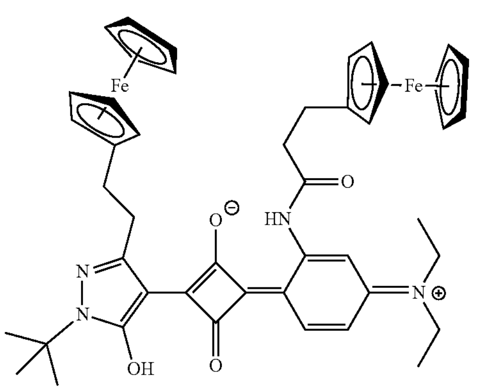
C-85
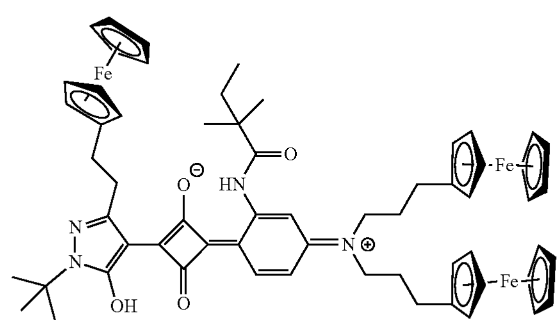

-continued
C-86
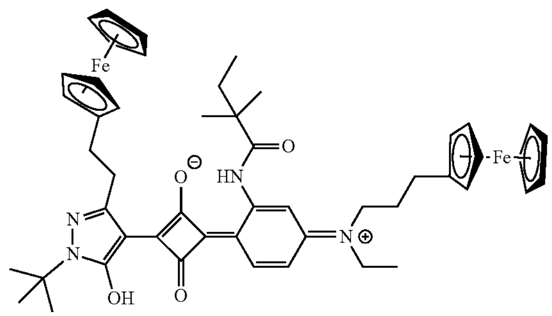
C-87
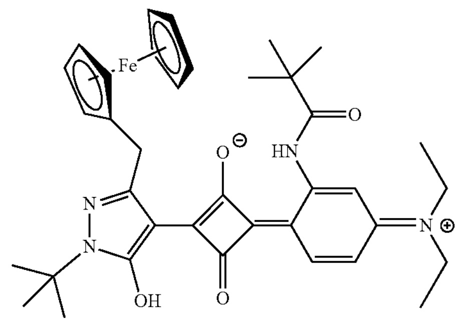
C-88
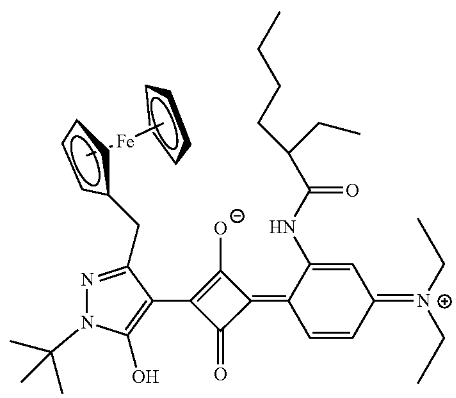
C-89
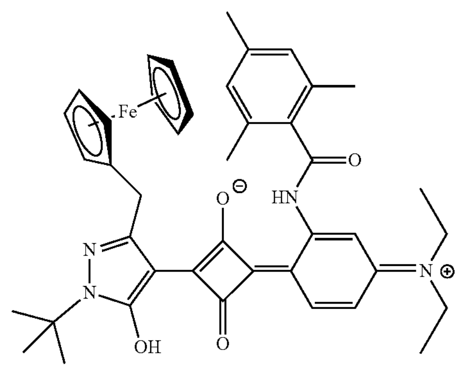
C-90
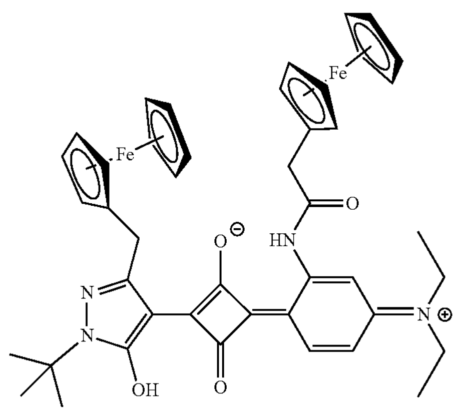
C-91
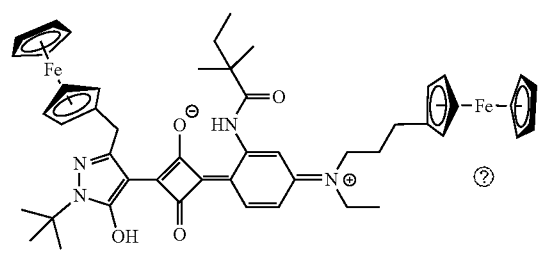
C-92
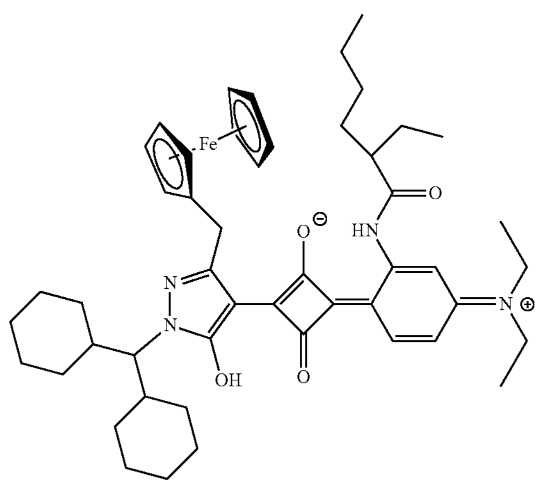
C-93
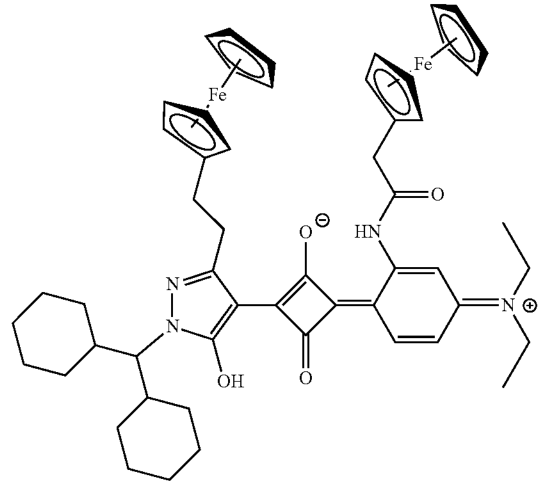

-continued
C-94
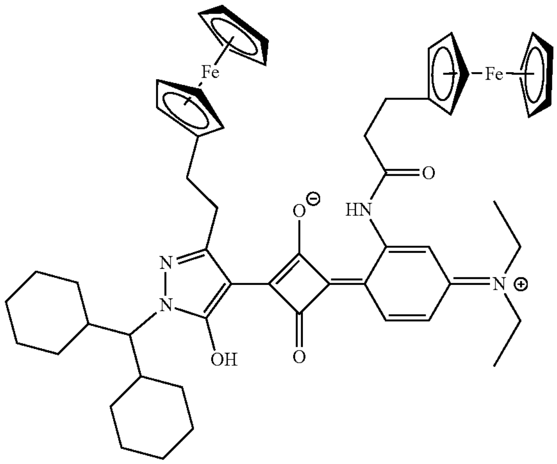
C-95
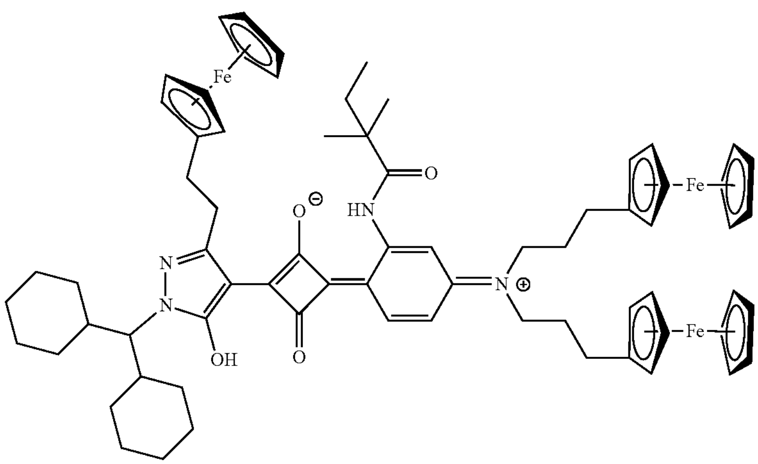
C-96
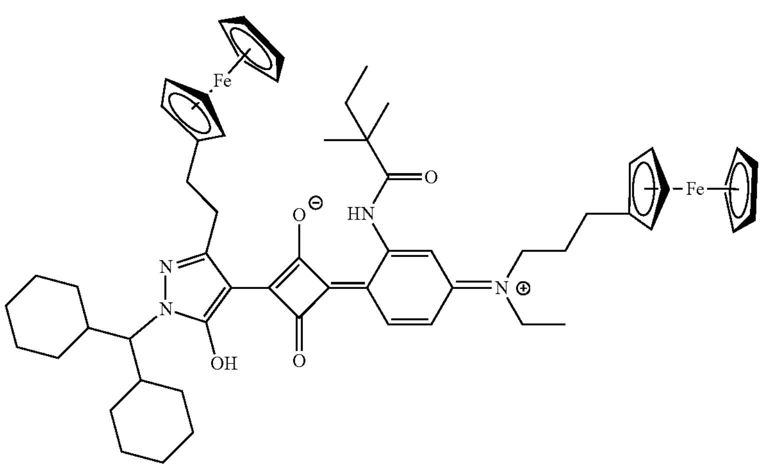

-continued
C-97
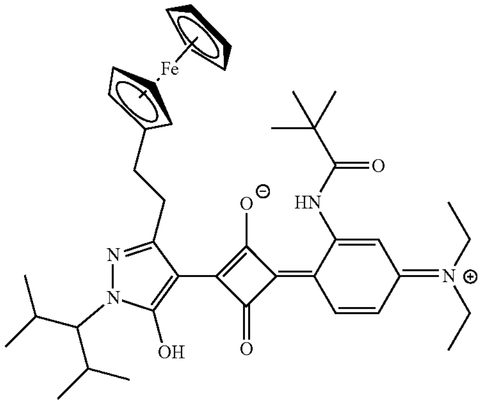
C-98
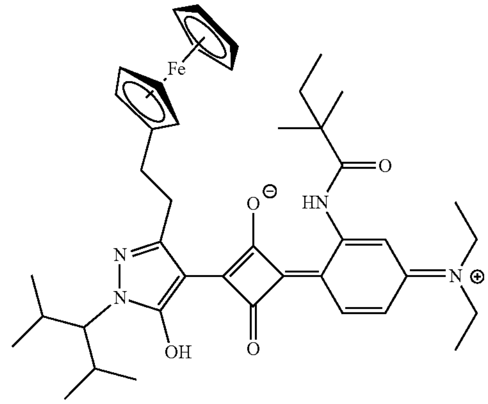
C-99
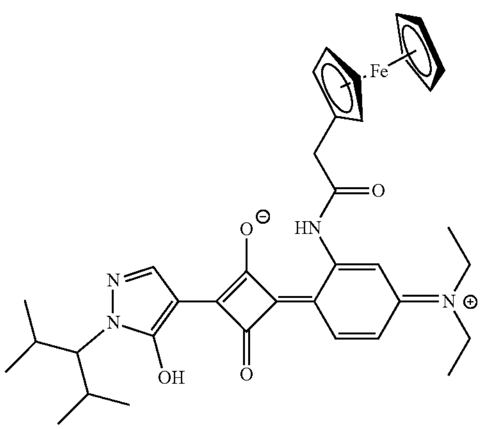
C-100
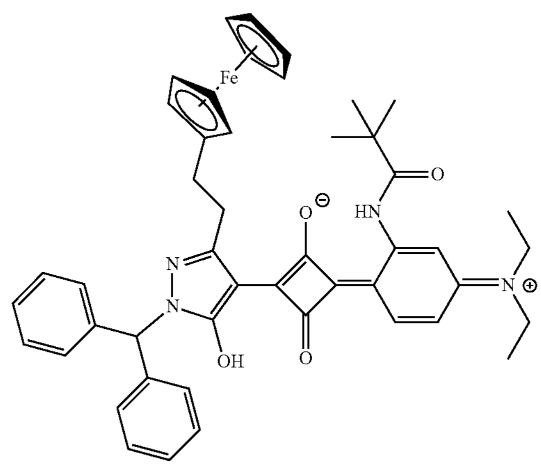
C-101
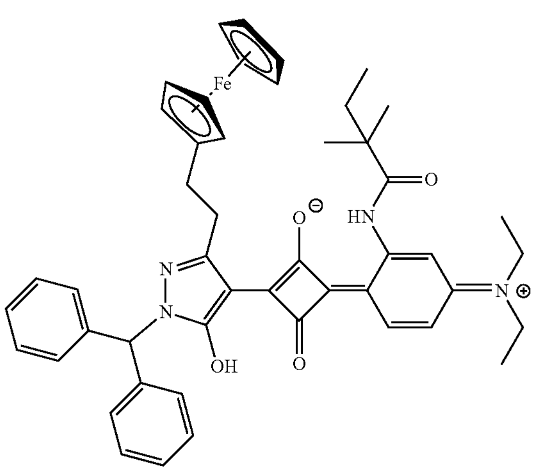
C-102
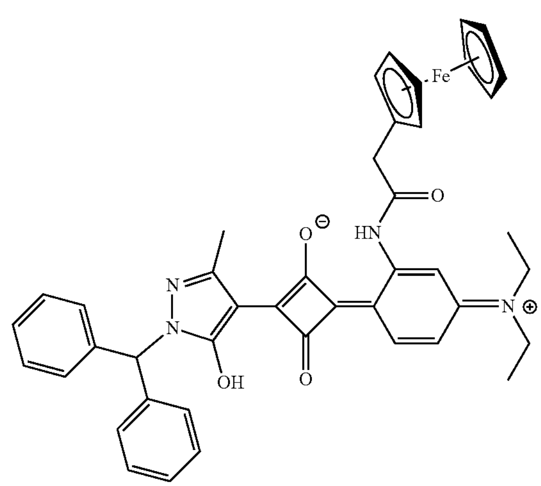

-continued
C-103
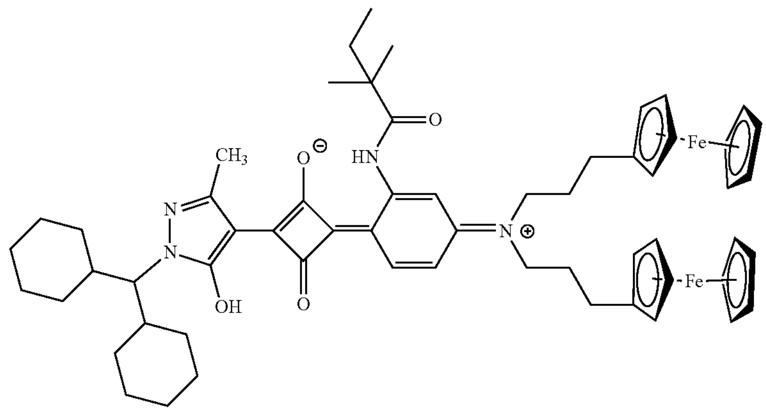
C-104
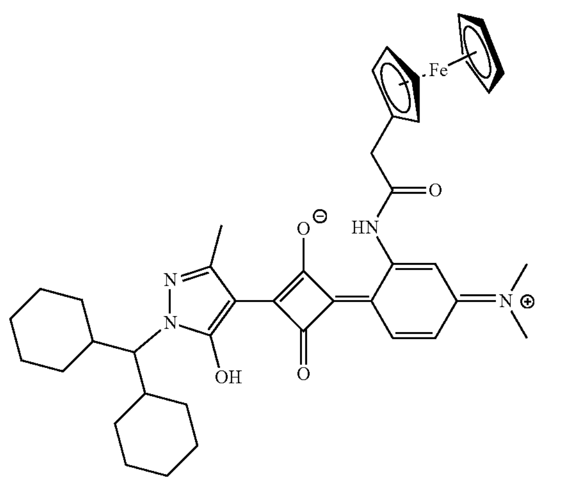
C-105
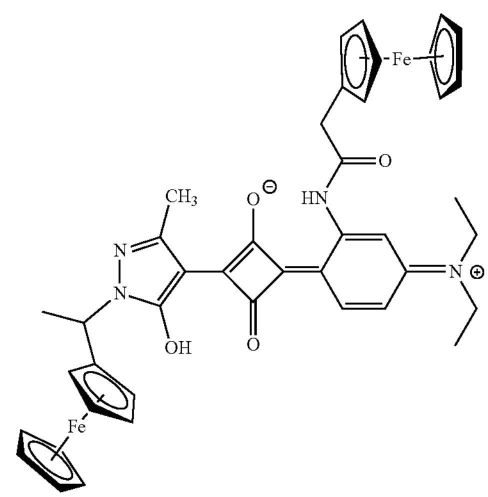
C-106
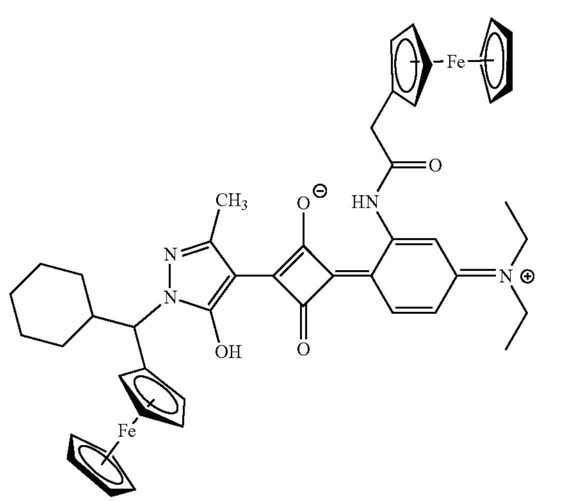

-continued
C-107
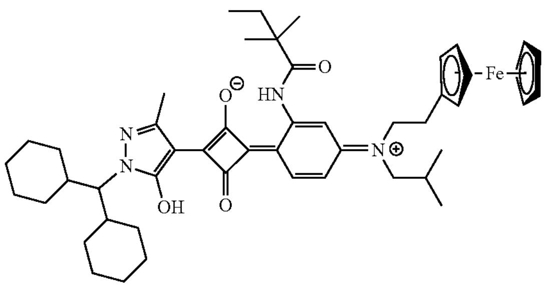
C-108
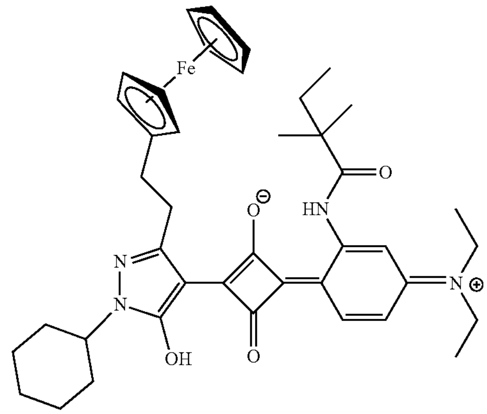
C-109
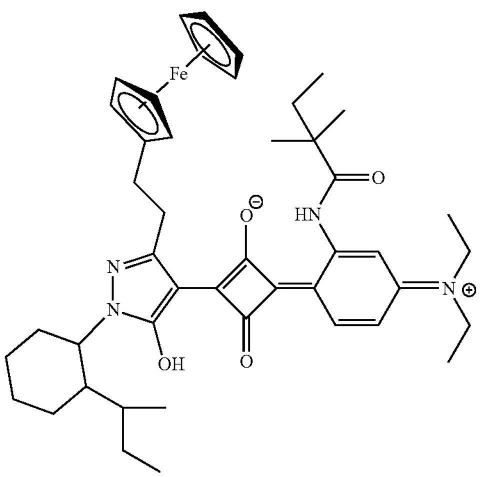
C-110
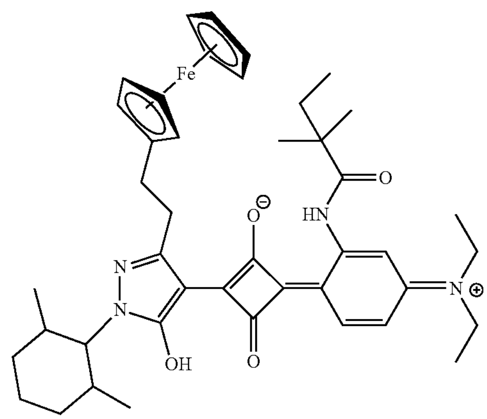
C-111
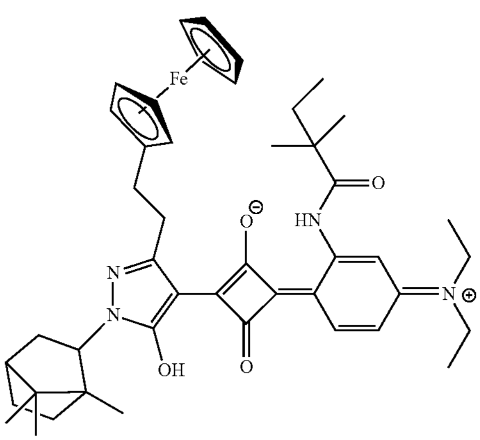
C-111
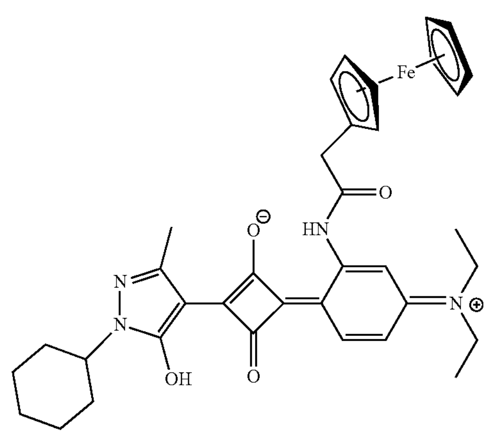

-continued
C-113
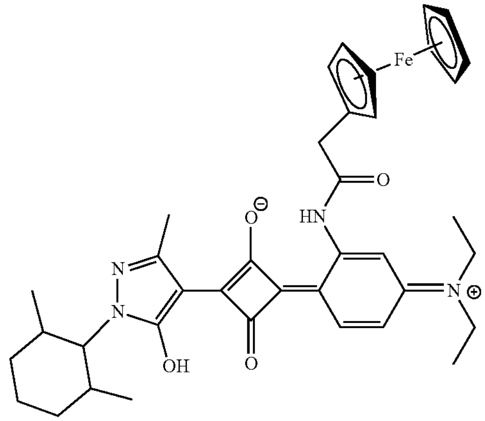
C-114
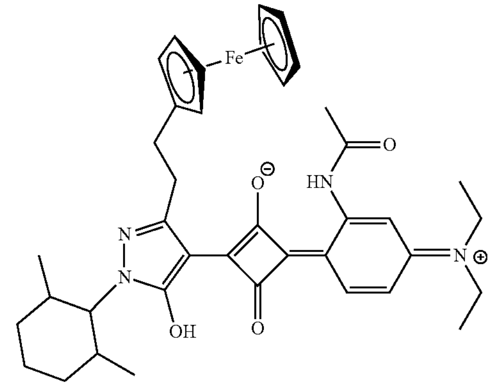
C-115
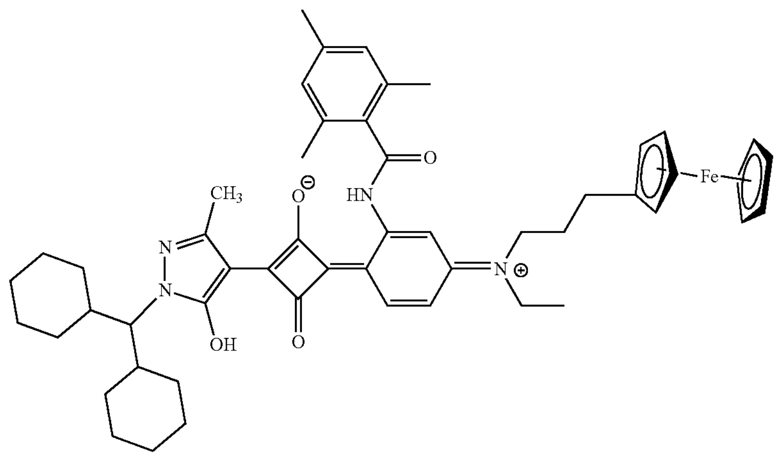
C-116
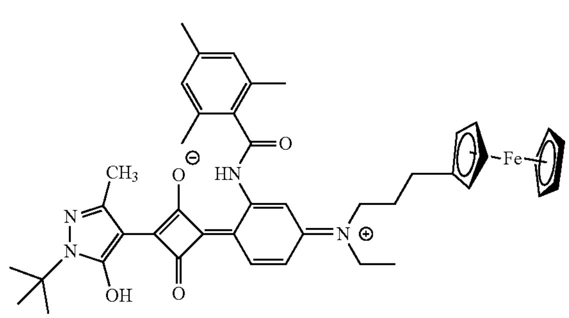
C-117
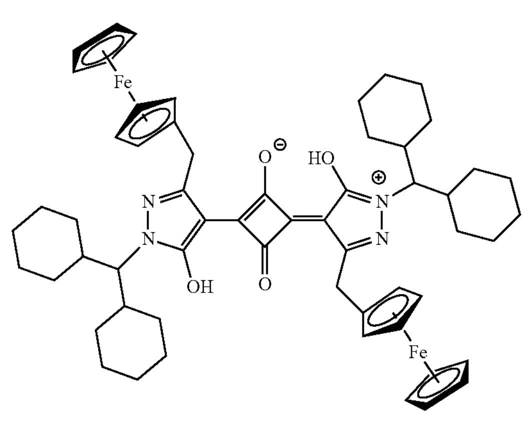

-continued

C-118

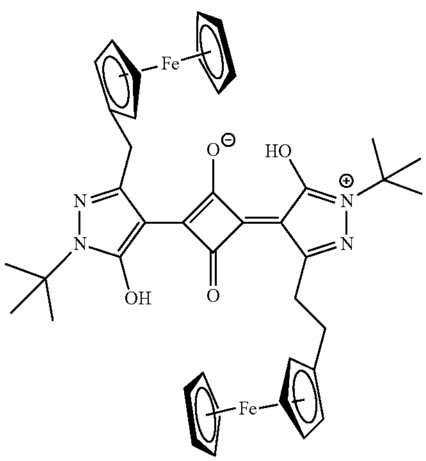

C-119

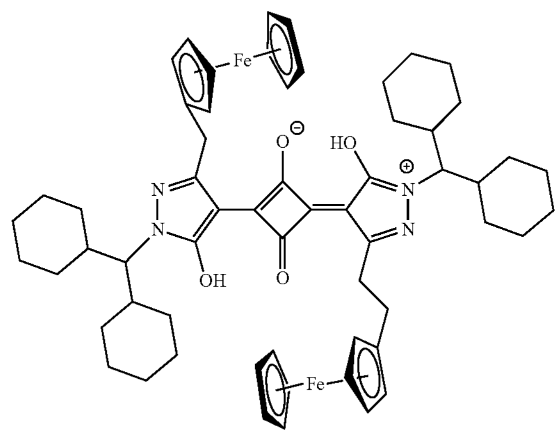

C-120

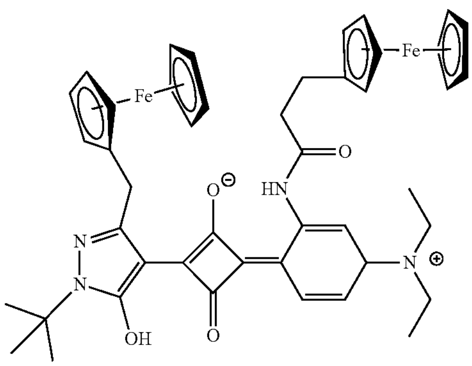

(Dye D)

The dye D is not particularly limited as long as the dye has the main absorption wavelength range in a wavelength of 680 to 780 nm in the laminate, and various dyes can be used.

Specific examples of the dye D include, for example, porphyrin-based, squarine-based, and cyanine (CY)-based coloring agents (dyes).

In the dye D, at least one of a coloring agent represented by General Formula (D1) and a coloring agent represented by General Formula (1) is preferable in that the absorption waveform is sharp.

(Coloring Agent Represented by General Formula (D1))

General Formula (D1)

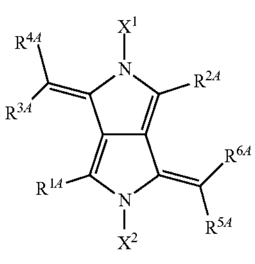

In Formula (D1), $R^{1A}$ and $R^{2A}$ each independently represent an alkyl group, an aryl group, or a heteroaryl group, $R^{4A}$ to $R^{5A}$ each independently represent a heteroaryl group, and $R^{3A}$ and $R^{6A}$ each independently represent a substituent. $X^1$ and $X^2$ each independently represent —$BR^{21a}R^{22a}$, $R^{21a}$ and $R^{22a}$ each independently represent a substituent, and $R^{21a}$ and $R^{22a}$ may be bonded to each other to form a ring.

$R^{1A}$ and $R^{2A}$ each independently represent an alkyl group, an aryl group, or a heteroaryl group.

The number of carbon atoms in the alkyl group is preferably 1 to 40. A lower limit thereof is more preferably 3 or more, still more preferably 5 or more, still further preferably 8 or more, and particularly preferably 10 or more. An upper limit thereof is more preferably 35 or less, and still more preferably 30 or less. The alkyl group may be any of linear, branched, or cyclic, and is preferably linear or branched and particularly preferably branched. The number of carbon atoms in the branched alkyl group is preferably 3 to 40. A lower limit thereof is, for example, more preferably 5 or more, still more preferably 8 or more, and still further preferably 10 or more. An upper limit thereof is more preferably 35 or less, and still more preferably 30 or less. The number of branches in the branched alkyl group is, for example, preferably 2 to 10 and more preferably 2 to 8. In a case where the number of branches is in the above range, the solubility in a solvent is favorable.

The number of carbon atoms in the aryl group is preferably 6 to 30, more preferably 6 to 20, and still more preferably 6 to 12. Among these, a phenyl group is preferable.

The heteroaryl group is preferably a monocyclic ring or a fused ring, more preferably a monocyclic ring or a fused ring having a fused number of 2 to 8, and still more preferably a monocyclic ring or a fused ring having a fused number of 2 to 4. The number of hetero atoms constituting the heteroaryl group is preferably 1 to 3. The hetero atom constituting the heteroaryl group is preferably a nitrogen atom, an oxygen atom, or a sulfur atom. The number of carbon atoms in the heteroaryl group is preferably 3 to 30, more preferably 3 to 18, more preferably 3 to 12, and particularly preferably 3 to 5. The heteroaryl group is preferably a 5-membered ring or a 6-membered ring. Specific examples of the heteroaryl group include an imidazolyl group, a pyridyl group, a pyrazyl group, a pyrimidyl group, a pyridazyl group, a triazyl group, a quinolyl group, a quinoxalyl group, an isoquinolyl group, an indolenyl group, a furyl group, a thienyl group, a benzoxazolyl group, a benzimidazolyl group, a benzthiazolyl group, a naphthiazolyl group, a benzoxazoly group, a m-carbazolyl group, and an azepinyl group.

The alkyl group, the aryl group, and the heteroaryl group in $R^{1A}$ and $R^{2A}$ may have a substituent or may be unsubstituted. Examples of the substituents that may be provided a hydrocarbon group which may have an oxygen atom, a heteroaryl group, an amino group, an acylamino group, an alkoxycarbonylamino group, an aryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a sulfinyl group, a ureido group, a phosphate amide group, a mercapto group, a sulfo group, a carboxyl group, a nitro group, a hydroxamic acid group, a sulfino group, a hydrazino group, an imino group, a silyl group, a hydroxy group, a halogen atom, a cyano group, and the like.

As the heteroaryl group, the description of the heteroaryl group in $R^{1A}$ and $R^{2A}$ can be preferably applied.

Examples of the halogen atom include a fluorine atom, a chlorine atom, a bromine atom, an iodine atom, and the like.

Examples of the hydrocarbon group include an alkyl group, an alkenyl group, an aryl group, and the like.

As the alkyl group, the description of the alkyl group in $R^{1A}$ and $R^{2A}$ can be preferably applied.

The number of carbon atoms in the alkenyl group is preferably 2 to 40. A lower limit thereof is, for example, more preferably 3 or more, still more preferably 5 or more, still further preferably 8 or more, and particularly preferably 10 or more. An upper limit thereof is more preferably 35 or less, and still more preferably 30 or less. The alkenyl group may be any of linear, branched, or cyclic, and is preferably linear or branched, and particularly preferably branched. The number of carbon atoms in the branched alkenyl group is preferably 3 to 40. A lower limit thereof is, for example, more preferably 5 or more, still more preferably 8 or more, and still further preferably 10 or more. An upper limit thereof is more preferably 35 or less, and still more preferably 30 or less. The number of branches in the branched alkenyl group is preferably 2 to 10 and more preferably 2 to 8. In a case where the number of branches is in the above range, the solubility in a solvent is favorable.

The number of carbon atoms in the aryl group is preferably 6 to 30, more preferably 6 to 20, and still more preferably 6 to 12.

Examples of the hydrocarbon group containing an oxygen atom include a group represented by $-L-R^{x1}$.

L represents —O—, —CO—, —COO—, —OCO—, $—(OR^{x2})_m—$ or $—(R^{x2}O)_m—$. $R^{x1}$ represents an alkyl group, an alkenyl group, or an aryl group. $R^{x2}$ represents an alkylene group or an arylene group. m represents an integer of 2 or more, and m $R^{x2}$ may be the same as or different from each other.

L is preferably —O—, —COO—, or —OCO—, and more preferably —O—.

An alkyl group, an alkenyl group, and an aryl group represented by $R^{x1}$ have the same meanings as those described above, and the preferable range is also the same. $R^{x1}$ is preferably an alkyl group or an alkenyl group, and more preferably an alkyl group.

The number of carbon atoms in the alkylene group represented by $R^{x2}$ is preferably 1 to 20, more preferably 1 to 10, and still more preferably 1 to 5. The alkylene group may be any of linear, branched, or cyclic, and is preferably linear or branched.

The number of carbon atoms in the arylene group represented by $R^{x2}$ is preferably 6 to 20, and more preferably 6 to 12.

m represents an integer of 2 or more, preferably 2 to 20, and more preferably 2 to 10.

As the substituent that the alkyl group, the aryl group, and the heteroaryl group in $R^{1A}$ and $R^{2A}$ may have, a hydrocarbon group which may contain an oxygen atom is preferable, and a hydrocarbon group containing an oxygen atom is more preferable.

The hydrocarbon group containing an oxygen atom is preferably a group represented by $—O—R^{x1}$. $R^{x1}$ is preferably an alkyl group or an alkenyl group, more preferably an alkyl group, and particularly preferably a branched alkyl group. That is, the substituents represented by $R^{1A}$ and $R^{2A}$ each are preferably an alkoxy group. In a case where $R^{1A}$ and $R^{2A}$ are the alkoxy groups, a dye can be suitably used as the dye D according to the embodiment of the present invention, as a near-infrared absorbing substance having excellent solubility in a solvent, light resistance, and visible transmittance.

The number of carbon atoms in the alkoxy group is preferably 1 to 40. A lower limit thereof is, for example, more preferably 3 or more, still more preferably 5 or more, still further preferably 8 or more, and particularly preferably 10 or more. An upper limit thereof is more preferably 35 or less, and still more preferably 30 or less. The alkoxy group may be any of linear, branched, or cyclic, and is preferably linear or branched, and particularly preferably branched. The number of carbon atoms in the branched alkoxy group is preferably 3 to 40. A lower limit thereof is, for example, more preferably 5 or more, still more preferably 8 or more, and still further preferably 10 or more. An upper limit thereof is more preferably 35 or less, and still more preferably 30 or less. The number of branches in the branched alkoxy group is preferably 2 to 10 and more preferably 2 to 8.

As $R^{1A}$ and $R^{2A}$, a heteroaryl group or an aryl group is preferable, an aryl group is more preferable, and a phenyl group having a substituent at the 3-position is still more preferable.

$R^{3A}$ and $R^{6A}$ each independently represent a substituent. Examples of the substituent include an alkyl group, an alkenyl group, an alkynyl group, an aryl group, a heteroaryl group, an amino group (including an alkylamino group, an arylamino group, and a heterocyclic amino group), an alkoxy group, an aryloxy group, a heteroaryloxy group, an acyl group, an alkylcarbonyl group, an arylcarbonyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a sulfinyl group, a ureido group, a phosphate amide group, a hydroxy group, a mercapto group, a halogen atom, a cyano group, a sulfo group, a carboxyl group, a nitro group, a hydroxamic acid group, a sulfino group, a hydrazino group, an imino group, a silyl group, and the like.

$R^{3A}$ and $R^{6A}$ are preferably an electron-withdrawing group.

A substituent having a positive Hammett σp value (sigma para value) acts as an electron-withdrawing group.

In the present invention, a substituent having a Hammett σp value of 0.2 or more can be exemplified as an electron-withdrawing group. The σp value is preferably 0.25 or more, more preferably 0.3 or more, and particularly preferably 0.35 or more. An upper limit thereof is not particularly limited, and is preferably 0.80.

Specific examples of the electron-withdrawing group include a cyano group (0.66), a carboxyl group (—COOH: 0.45), an alkoxycarbonyl group (—COOMe: 0.45), an aryloxycarbonyl group (—COOPh: 0.44), a carbamoyl group (—$CONH_2$: 0.36), an alkylcarbonyl group (—COMe: 0.50), an arylcarbonyl group (—COPh: 0.43), an alkylsulfonyl group (—$SO_2$Me: 0.72), an arylsulfonyl group (—$SO_2$Ph: 0.68), and the like. The cyano group is particularly preferable. Here, Me represents a methyl group and Ph represents a phenyl group.

For the Hammett σp value, for example, paragraphs 0024 to 0025 of JP2009-263614A can be referred to, and the contents thereof are incorporated in the present specification.

$R^{4A}$ and $R^{1A}$ each independently represent a heteroaryl group.

The heteroaryl group is preferably a monocyclic ring or a fused ring, more preferably a monocyclic ring or a fused ring having a fused number of 2 to 8, and still more preferably a monocyclic ring or a fused ring having a fused number of 2 to 4. The number of hetero atoms constituting the heteroaryl group is preferably 1 to 3. The hetero atom constituting the heteroaryl group is preferably a nitrogen atom, an oxygen atom, or a sulfur atom. The number of carbon atoms in the heteroaryl group is preferably 3 to 30, more preferably 3 to 18, more preferably 3 to 12, and particularly preferably 3 to 5. The heteroaryl group is preferably a 5-membered ring or a 6-membered ring. Specific examples of the heteroaryl group include those described in RIA and $R^{2A}$, and a pyridyl group, a pyrimidyl group, a triazyl group, a quinolyl group, a quinoxalyl group, an isoquinolyl group, an indolenyl group, a benzoxazolyl group, or a benzthiazolyl group is preferable.

The heteroaryl group may have a substituent or may be unsubstituted. Examples of the substituent include an alkyl group, an alkenyl group, an alkynyl group, an aryl group, an amino group (including an alkylamino group, an arylamino group, and a heterocyclic amino group), an alkoxy group, an aryloxy group, an acyl group, an alkylcarbonyl group, an arylcarbonyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heteroarylthio group, a sulfonyl group, an alkylsulfonyl group, an arylsulfonyl group, a sulfinyl group, a ureido group, a phosphate amide group, a hydroxy group, a mercapto group, a halogen atom, a cyano group, a sulfo group, a carboxyl group, a nitro group, a hydroxamic acid group, a sulfino group, a hydrazino group, an imino group, a silyl group, and the like. A halogen atom, an alkyl group, or an alkoxy group is preferable.

As the halogen atom, a fluorine atom, a chlorine atom, a bromine atom, or an iodine atom is preferable, and a chlorine atom is particularly preferable.

The number of carbon atoms in the alkyl group is preferably 1 to 40, more preferably 1 to 30, and particularly preferably 1 to 25. The alkyl group may be any of linear, branched, or cyclic, and is preferably linear or branched, and particularly preferably linear.

The number of carbon atoms in the alkoxy group is preferably 1 to 40, more preferably 1 to 30, and particularly preferably 1 to 25. The alkoxy group may be any of linear, branched, or cyclic, and is preferably linear or branched, and particularly preferably linear.

$R^{3A}$ and $R^{4A}$ may be bonded to each other to form a ring, and $R^{5A}$ and $R^{6A}$ may be bonded to each other to form a ring.

In a case where $R^{3A}$ and $R^{4A}$, and $R^{5A}$ and $R^{6A}$ are bonded to each other to form a ring, it is preferable to form a 5- to 7-membered ring (preferably a 5- or 6-membered ring). As the ring to be formed, a ring to be used as an acidic nucleus in a merocyanine pigment is preferable. Specific examples include the followings.

(a) 1,3-Dicarbonyl ring: For example, 1,3-indandione, 1,3-cyclohexanedione, 5,5-dimethyl-1,3-cyclohexanedione, 1,3-dioxane-4,6-dione, and the like.

(b) Pyrazolinone ring: For example, 1-phenyl-2-pyrazolin-5-one, 3-methyl-1-phenyl-2-pyrazolin-5-one, 1-(2-benzothiazoyl)-3-methyl-2-pyrazolin-5-one, and the like.

(c) Isooxazolinene ring: For example, 3-phenyl-2-isooxazoline-5-one, 3-methyl-2-isooxazoline-5-one, and the like.

(d) Oxindole ring: For example, 1-alkyl-2,3-dihydro-2-oxyindole and the like.

(e) 2,4,6-Triketohexahydropyrimidine ring: For example, barbituric acid or 2-thiobarbituric acid, a derivative thereof, and the like. Examples of the derivative include 1-alkyls such as 1-methyl and 1-ethyl, 1,3-dialkyls such as 1,3-dimethyl, 1,3-diethyl, and 1,3-dibutyl, 1,3-diaryls such as 1,3-diphenyl, 1,3-di(p-chlorophenyl), and 1,3-di(p-ethoxycarbonylphenyl), 1-alkyl-1-aryls such as 1-ethyl-3-phenyl, and 1,3-diheterocyclic substituents such as 1,3-di(2-pyridyl), and the like.

(f) 2-Thio-2,4-thiazolidinedione ring: For example, rhodanine, a derivative thereof, and the like. Examples of the derivative include 3-alkyl rhodanine such as 3-methyl rhodanine, 3-ethyl rhodanine, and 3-allyl rhodanine, 3-aryl rhodanine such as 3-phenyl rhodanine, and 3-heterocyclic substituted rhodanine such as 3-(2-pyridyl) rhodanine, and the like.

(g) 2-Thio-2,4-oxazolidinedione (2-thio-2,4-(3H,5H)-oxazoledione ring: For example, 3-ethyl-2-thio-2,4-oxazolidinedione and the like.

(h) Tianaftenone ring: For example, 3(2H)-thianaftenone-1,1-dioxide and the like.

(i) 2-Thio-2,5-thiazolidinedione ring: For example, 3-ethyl-2-thio-2,5-thiazolidinedione and the like.

(j) 2,4-Thiazolidinedione ring: For example, 2,4-thiazolidinedione, 3-ethyl-2,4-thiazolidinedione, 3-phenyl-2,4-thiazolidinedione, and the like.

(k) Thiazoline-4-one ring: For example, 4-thiazolinone, 2-ethyl-4-thiazolinone, and the like.

(l) 4-Thiazolidinone ring: For example, 2-ethylmercapto-5-thiazolin-4-one, 2-alkylphenylamino-5-thiazolin-4-one, and the like.

(m) 2,4-Imidazolidinedione (hydantoin) ring: For example, 2,4-imidazolidinedione, 3-ethyl-2,4-imidazolidinedione, and the like.

(n) 2-Thio-2,4-imidazolidinedione (2-thiohydantoin) ring: For example, 2-thio-2,4-imidazolidinedione, 3-ethyl-2-thio-2,4-imidazolidinedione, and the like.

(o) Imidazoline-5-one ring: For example, 2-propyl mercapto-2-imidazolin-5-one, and the like.

(p) 3,5-Pyrazolidinedione ring: For example, 1,2-diphenyl-3,5-pyrazolidinedione, 1,2-dimethyl-3,5-pyrazolidinedione, and the like.

(q) Benzothiophene-3-one ring: For example, benzothiophene-3-one, oxobenzothiophene-3-one, dioxobenzothiophene-3-one, and the like.

(r) Indanone ring: For example, 1-indanone, 3-phenyl-1-indanone, 3-methyl-1-indanone, 3,3-diphenyl-1-indanone, 3,3-dimethyl-1-indanone, and the like.

Examples of the ring formed by $R^{3A}$ and $R^{4A}$ bonded to each other and the ring formed by $R^{5A}$ and $R^{6A}$ bonded to each other preferably include a 1,3-dicarbonyl ring, a pyrazolinone ring, a 2,4,6-triketohexahydropyrimidine ring (including thioketones), a 2-thio-2,4-thiazolidinedione ring, a 2-thio-2,4-oxazolidinedione ring, a 2-thio-2,5-thiazolidinedione ring, a 2,4-thiazolidinedione ring, a 2,4-imidazolidinedione ring, a 2-thio-2,4-imidazolidinedione ring, a 2-imidazoline-5-one ring, a 3,5-pyrazolidinedione ring, a benzothiophene-3-one ring, or an indanone ring, and still more preferably a 1,3-dicarbonyl ring, a 2,4,6-triketohexahydropyrimidine ring (including a thioketone), a 3,5-pyrazolidinedione ring or a benzothiophene-3-one ring, or an indanone ring.

In a case where $R^{3A}$ and $R^{4A}$ are bonded to each other to form a ring or in a case where $R^{5A}$ and $R^{6A}$ are bonded to each other to form a ring, although it is not possible to specify the σp value of the $R^{3A}$ to $R^{6A}$ forming the ring, in the present invention, it is considered that the partial structures of the rings are replaced by $R^{3A}$ to $R^{6A}$, respectively. Therefore, the σp value in the case of ring formation is defined. For example, in a case where $R^{3A}$ and $R^{4A}$ are bonded to form a 1,3-indandion ring, it is considered that $R^{3A}$ and $R^{4A}$ are substituted with benzoyl groups, respectively.

$X^1$ and $X^2$ each independently represent —$BR^{21}R^{22}$.

$R^{21}$ and $R^{22}$ each independently represent a substituent, and $R^{21}$ and $R^{22}$ may be bonded to each other to form a ring.

As the substituent represented by $R^{21}$ and $R^{22}$, a halogen atom, an alkyl group, an alkoxy group, an aryl group, a heteroaryl group, and a group represented by Formula (2-4) are preferable, a halogen atom, an aryl group, or a heteroaryl group is more preferable, and an aryl group is further preferable.

As the halogen atom, a fluorine atom, a chlorine atom, a bromine atom, or an iodine atom is preferable, and a fluorine atom is particularly preferable.

The number of carbon atoms in the alkyl group is preferably 1 to 40. A lower limit thereof is, for example, more preferably 3 or more. An upper limit thereof is, for example, more preferably 30 or less, and still more preferably 25 or less. The alkyl group may be any of linear, branched, or cyclic, and is preferably linear or branched, and particularly preferably linear.

The number of carbon atoms in the alkoxy group is preferably 1 to 40. A lower limit thereof is, for example, more preferably 3 or more. An upper limit thereof is, for example, more preferably 30 or less, and still more preferably 25 or less. The alkoxy group may be any of linear, branched, or cyclic, and is preferably linear or branched, and particularly preferably linear.

The number of carbon atoms in the aryl group is preferably 6 to 20 and more preferably 6 to 12. As the aryl group, a phenyl group is preferable.

The heteroaryl group may be monocyclic or polycyclic, and a monocyclic ring is preferable. The number of hetero atoms constituting the heteroaryl group is preferably 1 to 3. The hetero atom constituting the heteroaryl group is preferably a nitrogen atom, an oxygen atom, or a sulfur atom. The number of carbon atoms in the heteroaryl group is preferably 3 to 30, more preferably 3 to 18, more preferably 3 to 12, and particularly preferably 3 to 5. The heteroaryl group is preferably a 5-membered ring or a 6-membered ring. Specific examples of the heteroaryl group include those described in $R^{1A}$ and $R^{2A}$.

(2-4)

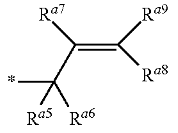

In Formula (2-4), $R^{a5}$ to $R^{a9}$ each independently represent a hydrogen atom or a substituent. * represents a bonding site with Formula (D1). Examples of the substituent represented by $R^{a5}$ to $R^{a9}$ include an alkyl group, an alkoxy group, an aryl group, or a heteroaryl group, and an alkyl group is preferable.

$R^{21}$ and $R^{22}$ may be bonded to each other to form a ring. Examples of the ring formed by $R^{21}$ and $R^{22}$ bonded to each other include the structures shown in (2-1) to (2-3) below, and the like. In the following, R represents a substituent, $R^{a1}$ to $R^{a4}$ each independently represent a hydrogen atom or a substituent, and m1 to m3 each independently represent an integer of 0 to 4. Examples of the substituent represented by R and $R^{a1}$ to $R^{a4}$ include the substituents described in $R^{21}$ and $R^{22}$, and an alkyl group is preferable.

(2-1)

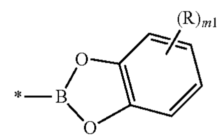

(2-2)

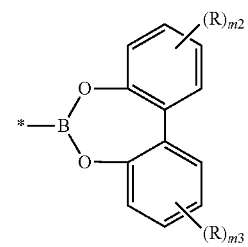

(2-3)

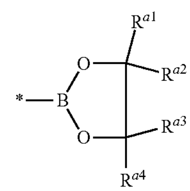

The coloring agent represented by General Formula (D1) is preferably a coloring agent represented by General Formula (D2).

General Formula (D2)

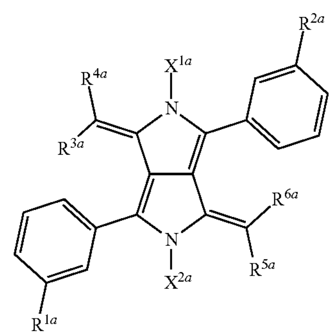

In Formula (D2), $R^{1a}$ and $R^{2a}$ each independently represent a substituent, and $R^{3a}$ and $R^{6a}$ each independently represent a substituent, $R^{4a}$ and $R^{5a}$ each independently represent a heteroaryl group. $R^{3a}$ and $R^{4a}$ may be bonded to each other to form a ring, and $R^{5a}$ and $R^{6a}$ may be bonded to each other to form a ring. $X^{1a}$ and $X^{2a}$ each independently represent —$BR^{21a}R^{22a}$, $R^{Z1a}$ and $R^{22a}$ each independently represent a substituent, and $R^{21a}$ and $R^{22a}$ may be bonded to each other to form a ring.

In Formula (D2), $R^{3a}$ to $R^{6a}$, $X^{1a}$, $X^{2a}$, $R^{21a}$, and $R^{22a}$ have the same meanings as $R^{3A}$ to $R^{6A}$, $X^1$, $X^2$, $R^{21}$, and $R^{22}$, and the preferable range is also the same.

Substituents in $R^{1a}$ and $R^{2a}$ have the same meaning as the substituents that the alkyl group, the aryl group, and the heteroaryl group in $R^{1A}$ and $R^{2A}$ may have, and the preferable range is also the same.

The coloring agent represented by General Formula (D1) is more preferably a coloring agent represented by General Formula (D3).

General Formula (D3)

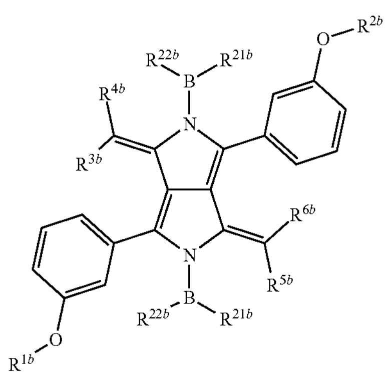

In Formula (D3), $R^{1b}$ and $R^{2b}$ each independently represent a branched alkyl group, and $R^{3b}$ and $R^{6b}$ each independently represent a substituent, $R^{4b}$ and $R^{5b}$ each independently represent a heteroaryl group. $R^{3b}$ and $R^{4b}$ may be bonded to each other to form a ring, and $R^{5b}$ and $R^{6b}$ may be bonded to each other to form a ring. $R^{21b}$ and $R^{22b}$ each independently represent a substituent, and $R^{21b}$ and $R^{22b}$ may be bonded to each other to form a ring.

$R^{1b}$ and $R^{2b}$ each independently represent a branched alkyl group. The number of carbon atoms is preferably 3 to 40. A lower limit thereof is, for example, more preferably 5 or more, still more preferably 8 or more, and still further preferably 10 or more. An upper limit thereof is more preferably 35 or less, and still more preferably 30 or less. The number of branches in the branched alkyl group is preferably 2 to 10 and more preferably 2 to 8.

$R^{3b}$ to $R^{6b}$, and $R^{21b}$ and $R^{22b}$ have the same meanings as $R^{3A}$ to $R^{6A}$, $R^{21}$, and $R^{22}$, respectively, and the preferable range is also the same.

That is, $R^{3b}$ and $R^{6b}$ each are preferably an electron-withdrawing group, and more preferably a cyano group.

$R^{21b}$ and $R^{22b}$ are each independently preferably a halogen atom, an alkyl group, an alkoxy group, an aryl group, or a heteroaryl group, more preferably a halogen atom, an aryl group, or a heteroaryl group, and still more preferably an aryl group.

Specific examples of the dye D are shown below. Compounds D-1 to D-24 and D-28 to D-90 shown below are coloring agents represented by General Formula (D1).

In the following structural formulae, "i" such as i-$C_{10}H_{21}$ represents a branched state. In addition, Bu represents a butyl group, and Ph represents a phenyl group.

D-1

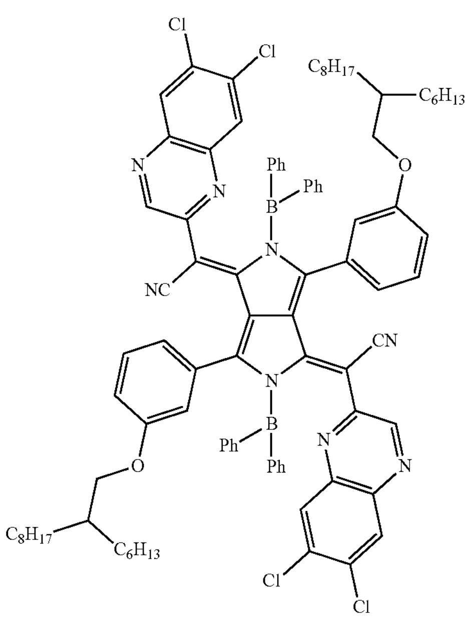

D-2

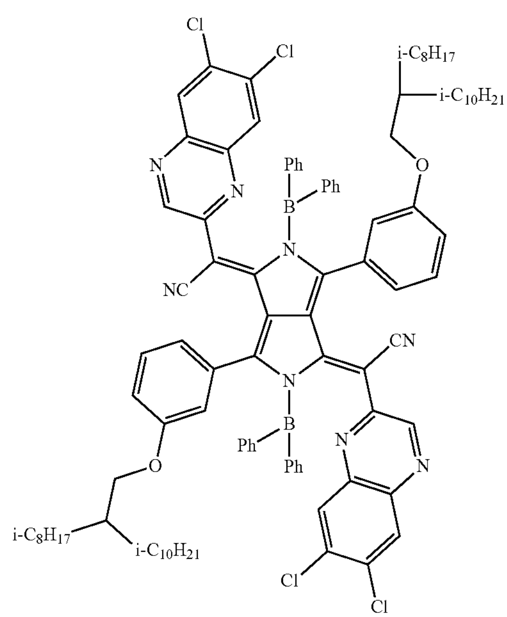

-continued
D-3
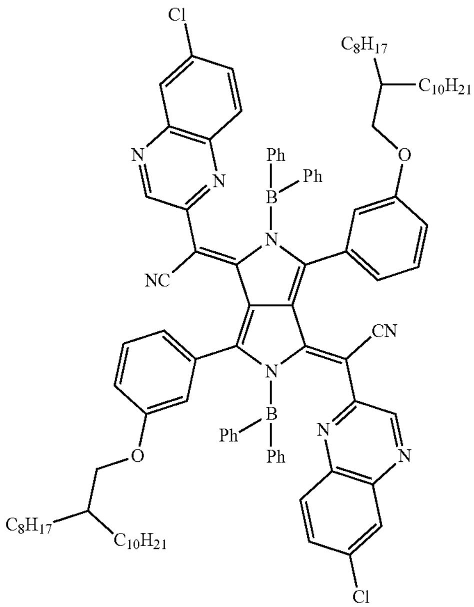
D-4
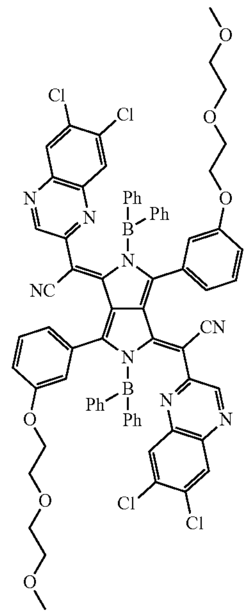
D-5
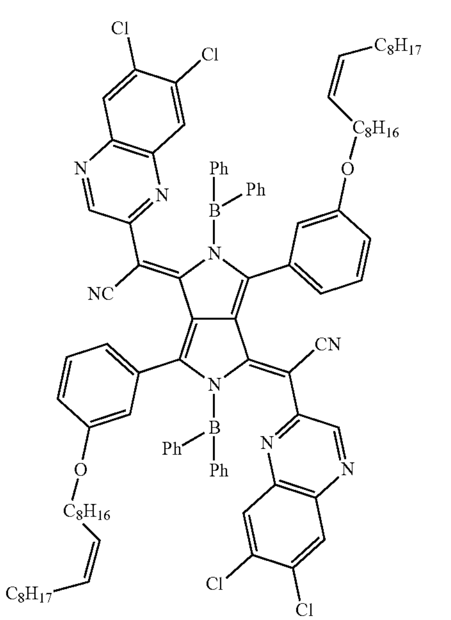
D-6
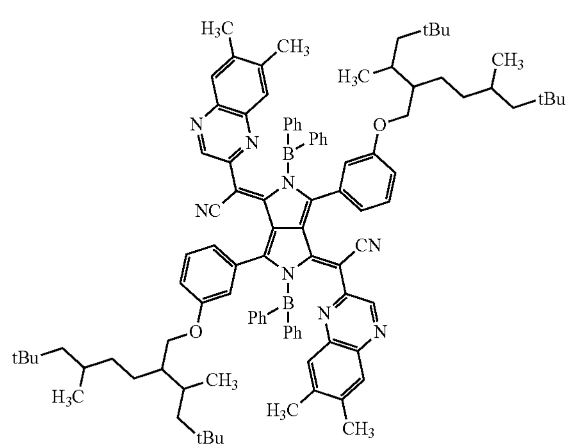

-continued
D-7
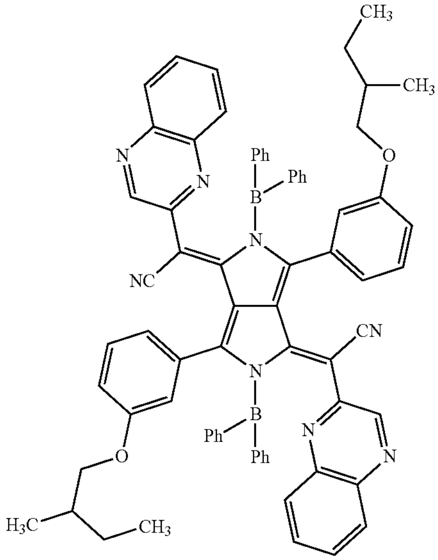
D-8
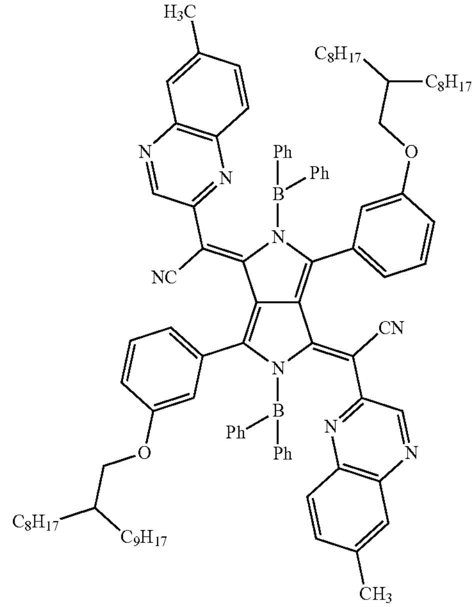
D-9
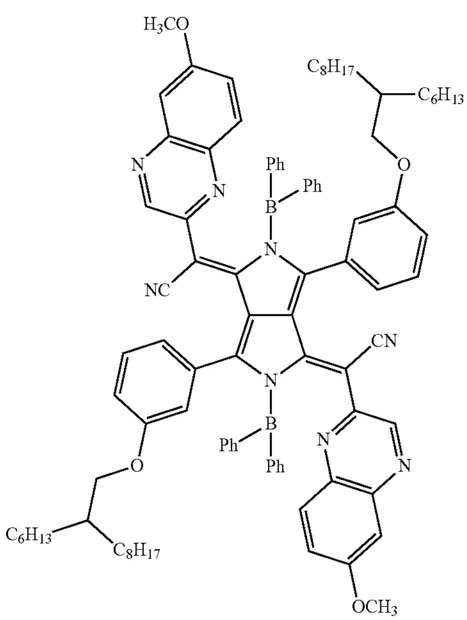
D-10
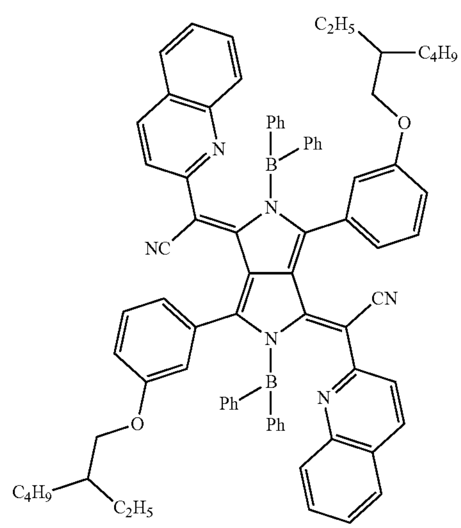

-continued
D-11
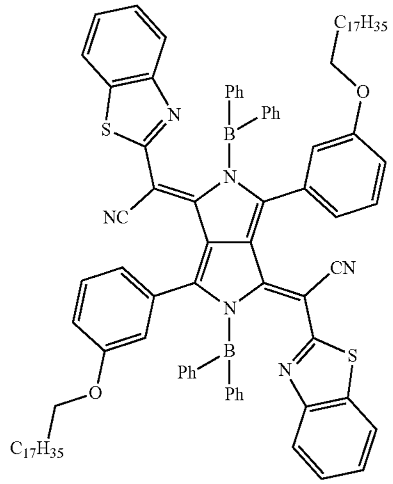
D-12
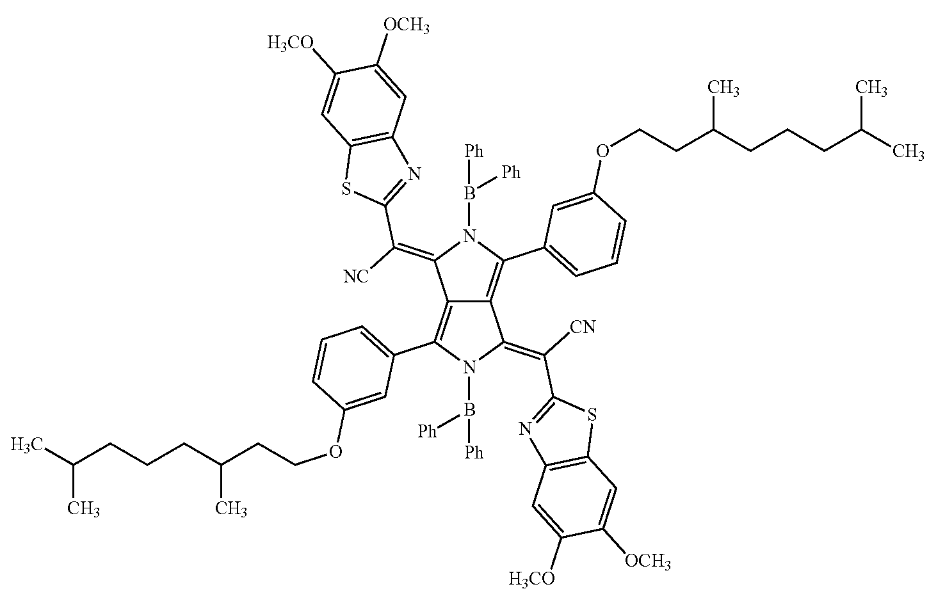

-continued
D-13
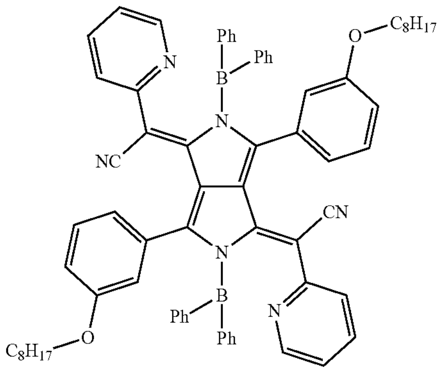
D-14
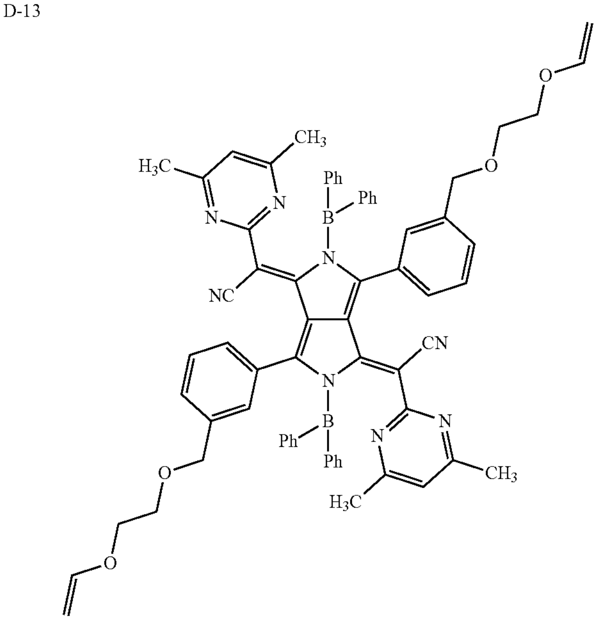
D-15
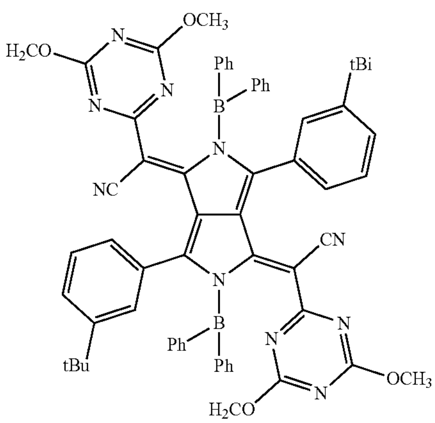
D-16
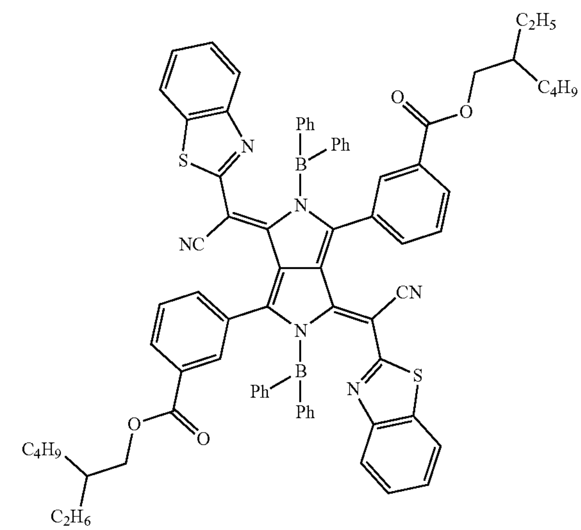
D-17
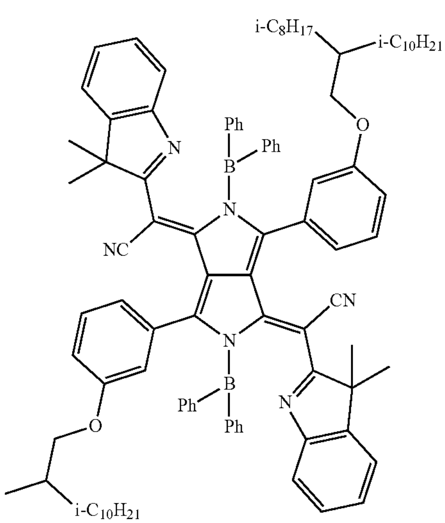
D-18
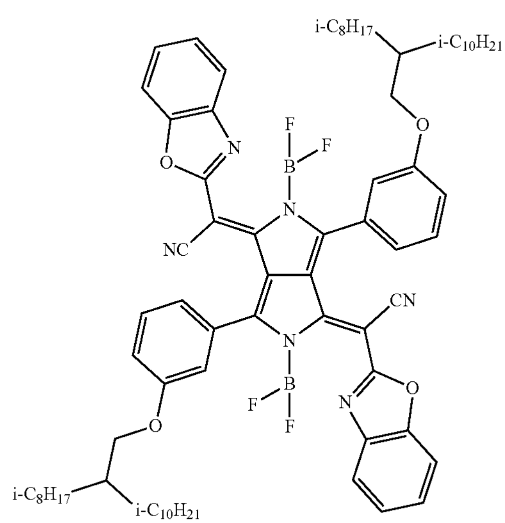

-continued
D-19
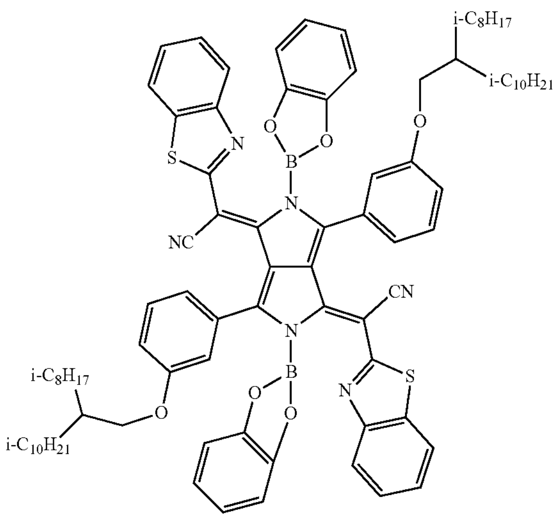
D-20
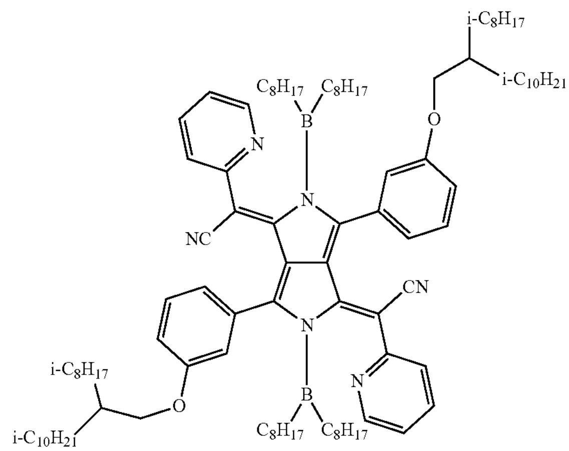
D-21
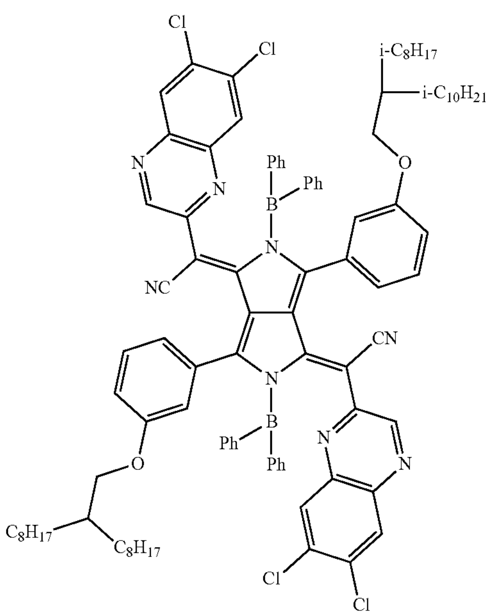
D-22
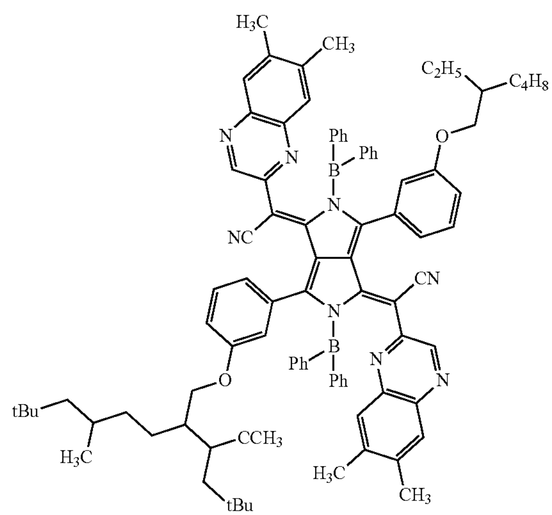

-continued
D-23
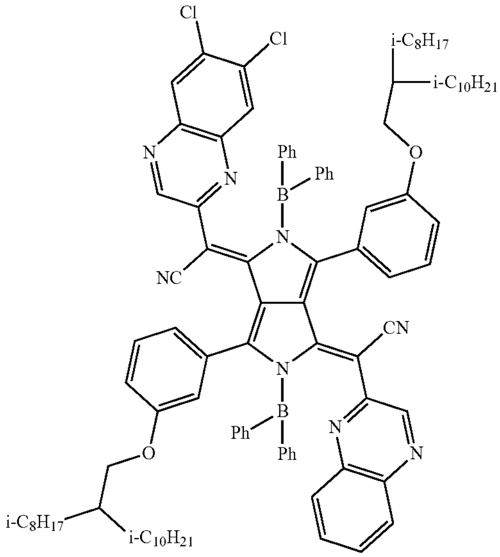
D-24
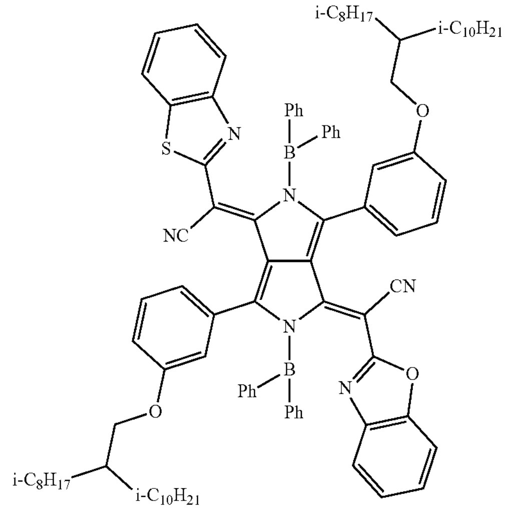
D-28
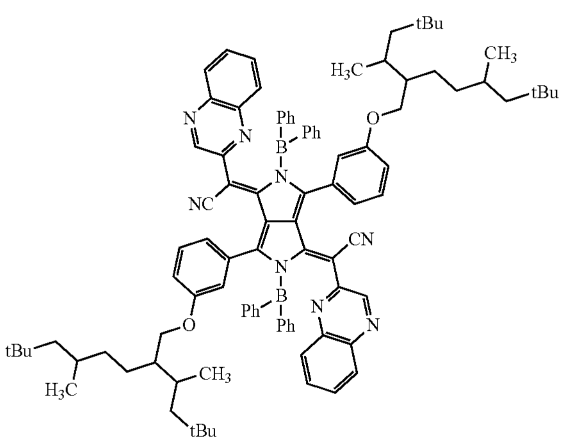
D-29
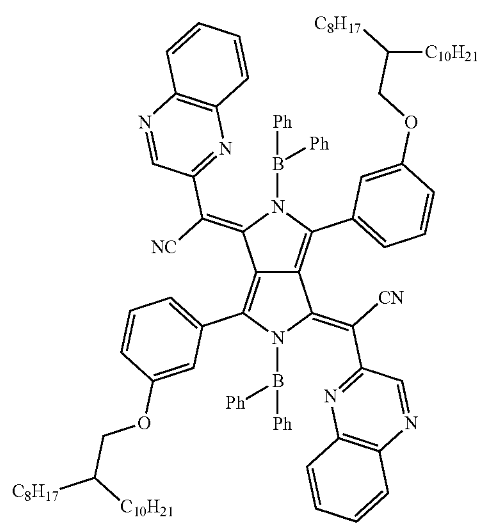

-continued
D-30
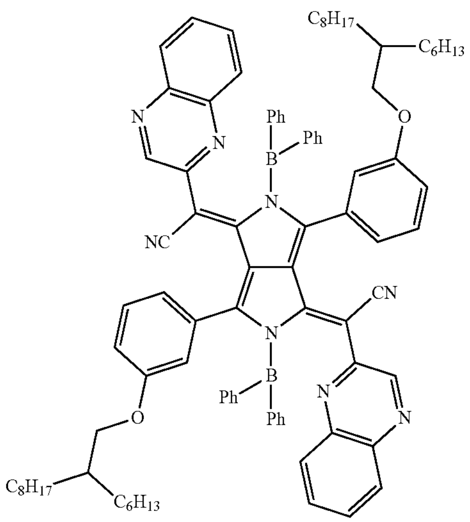
D-31
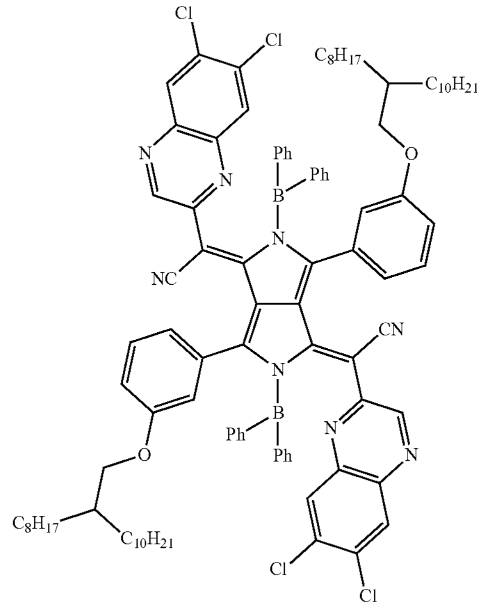
D-32
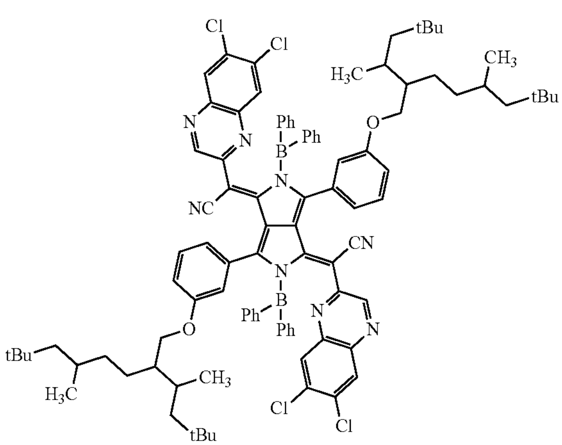
D-33
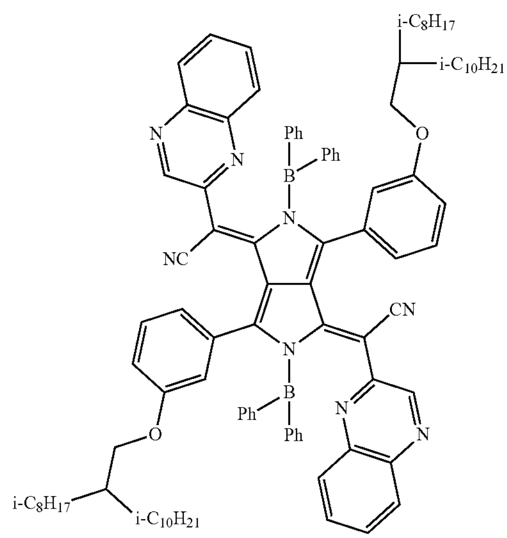

-continued
D-34
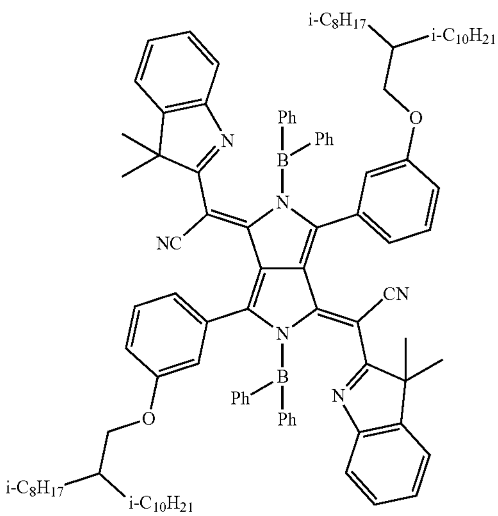
D-35
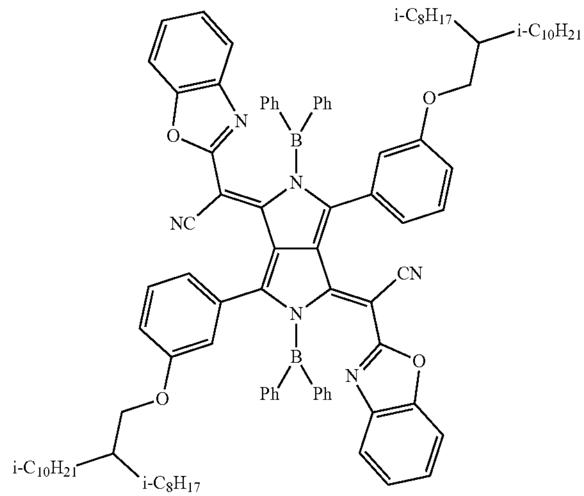
D-36
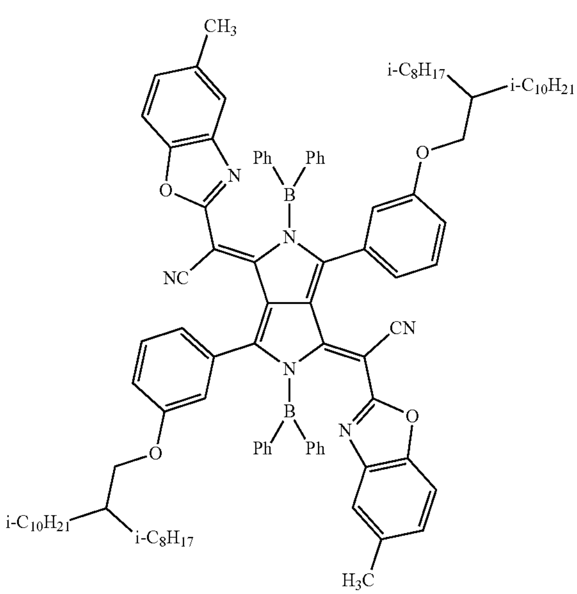
D-37
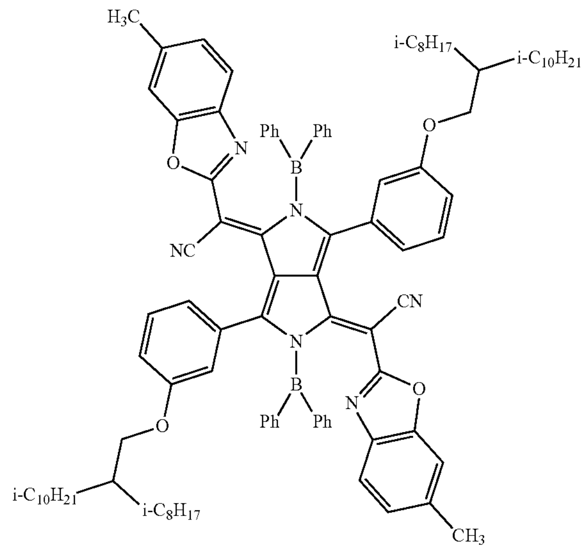

-continued
D-38
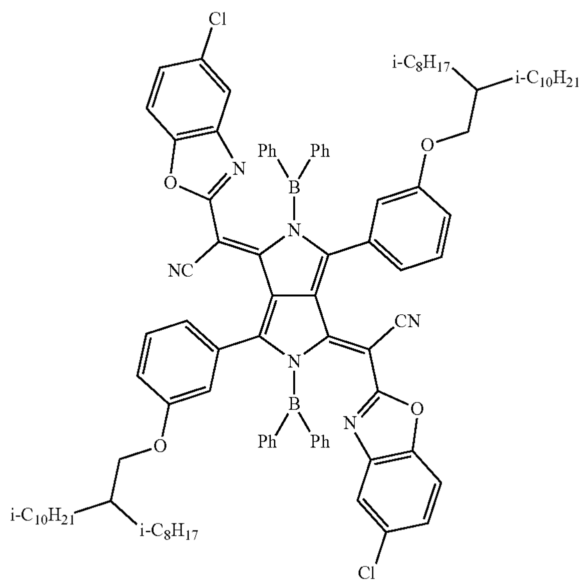
D-39
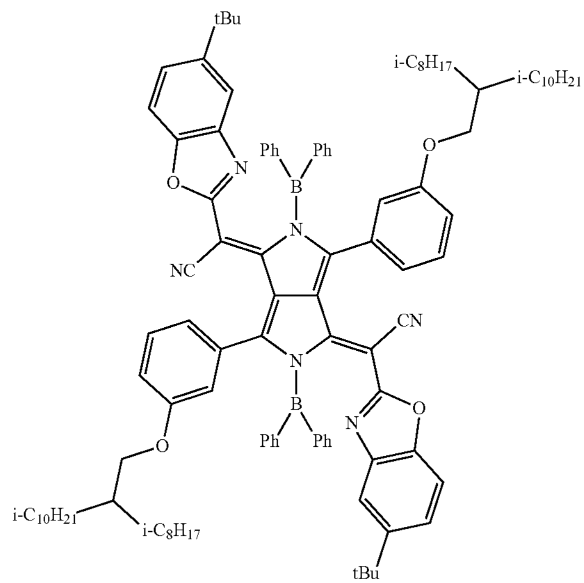
D-40
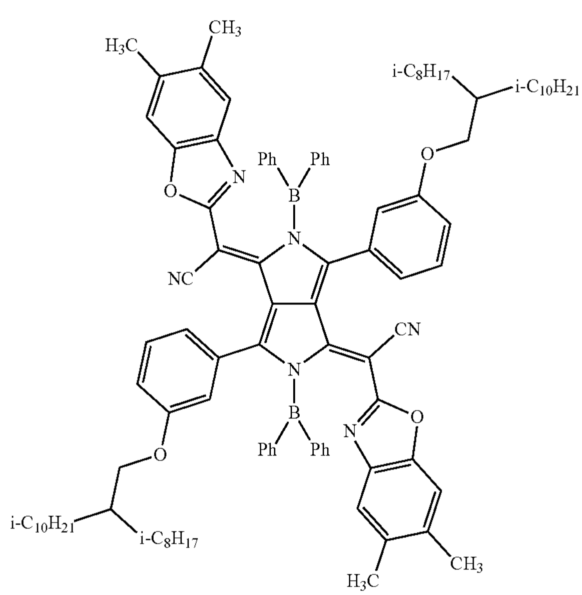
D-41
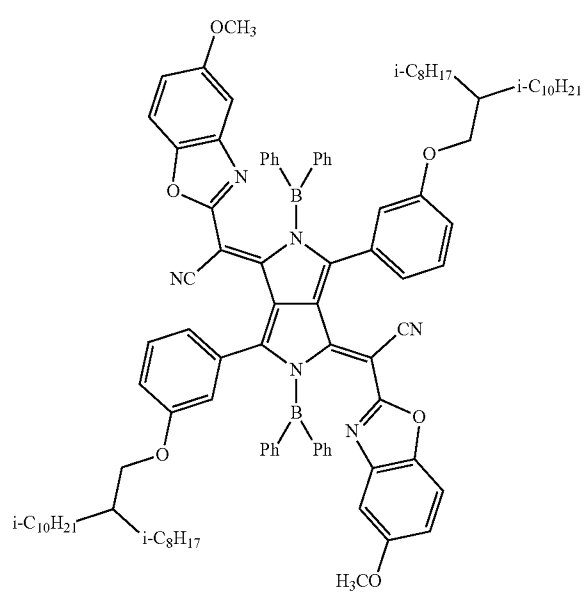

-continued
D-42
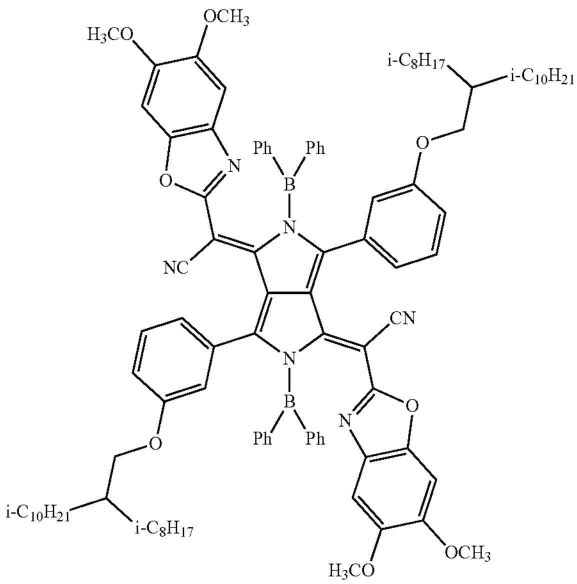
D-43
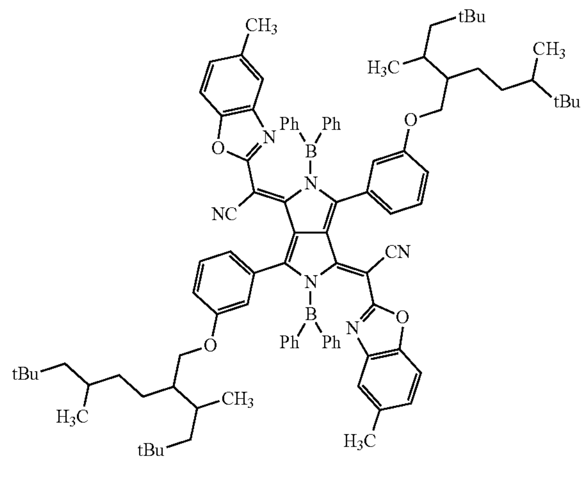
D-44
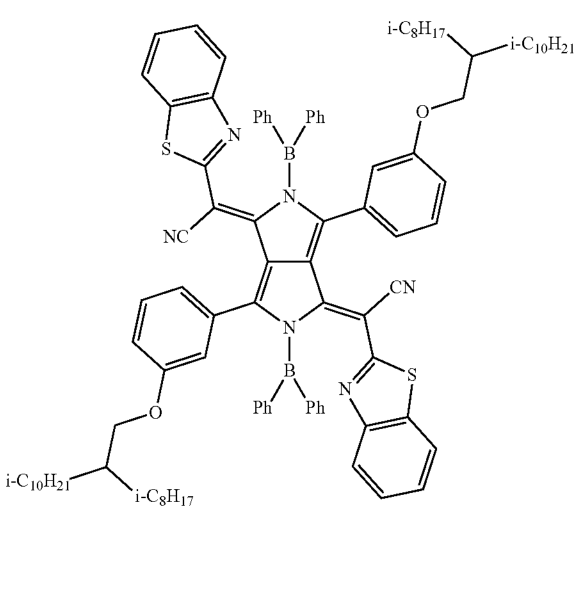
D-45
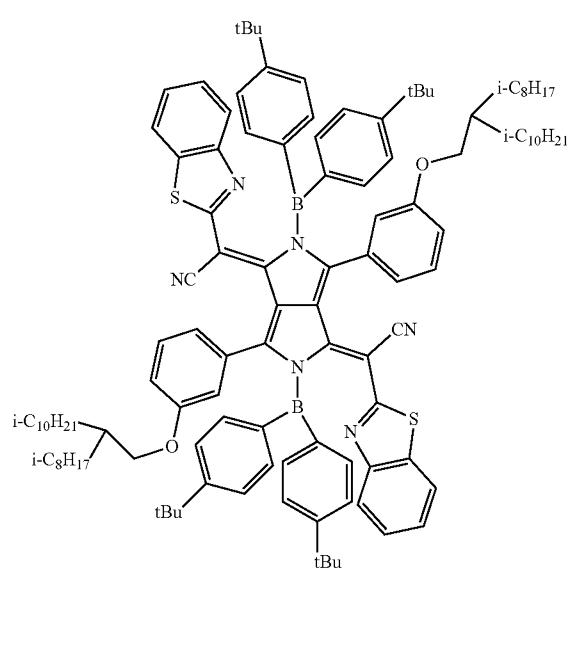

-continued
D-46
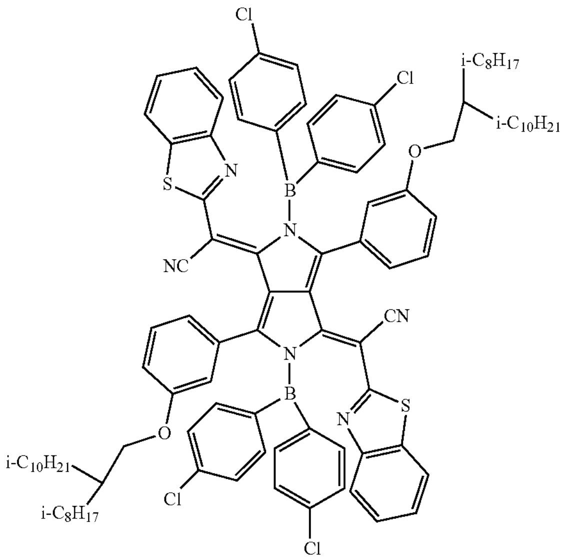
D-47
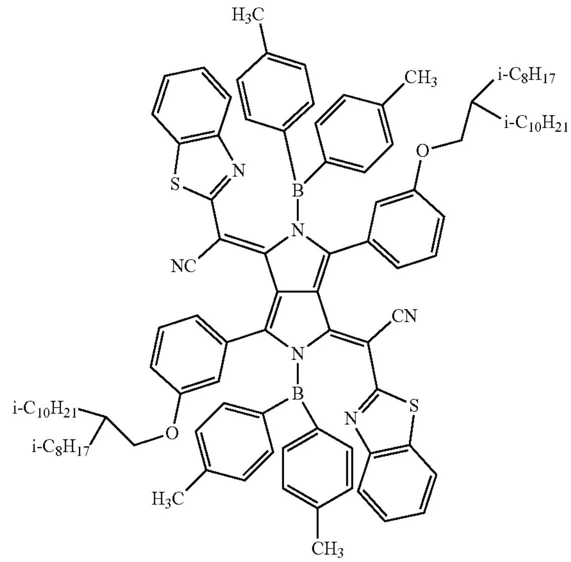
D-48
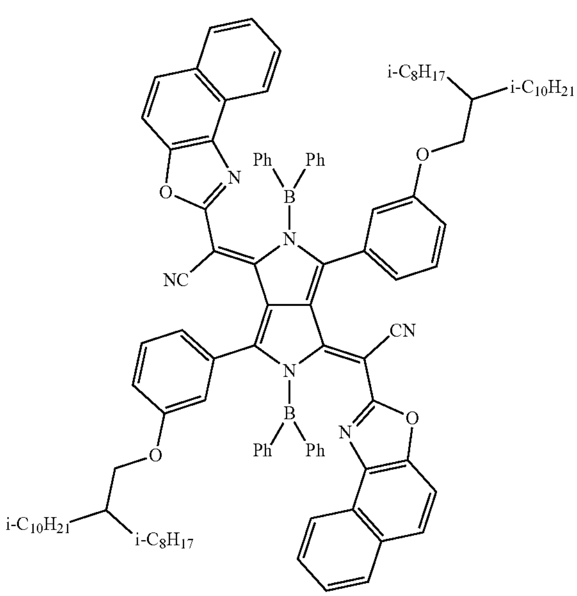
D-49
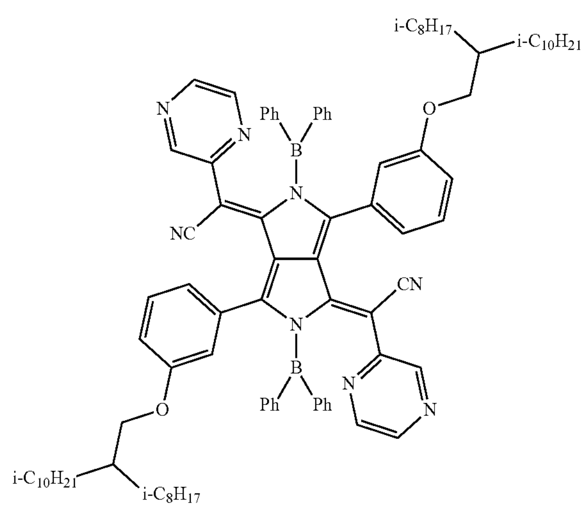

-continued
D-50
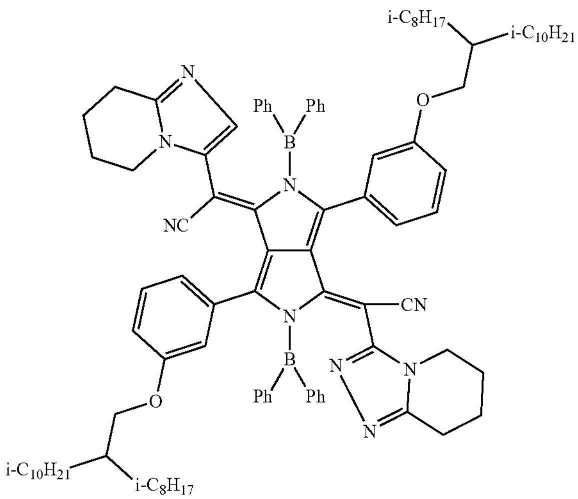
D-51
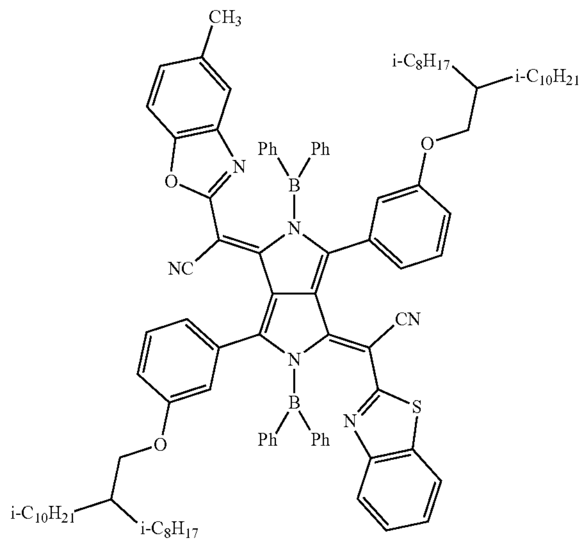
D-52
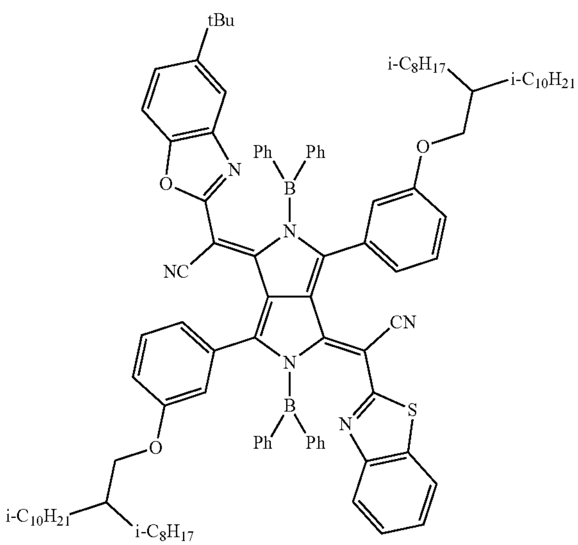
D-53
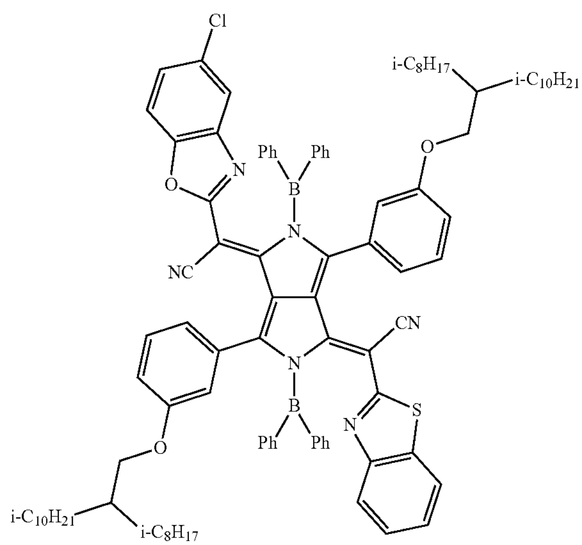
D-54
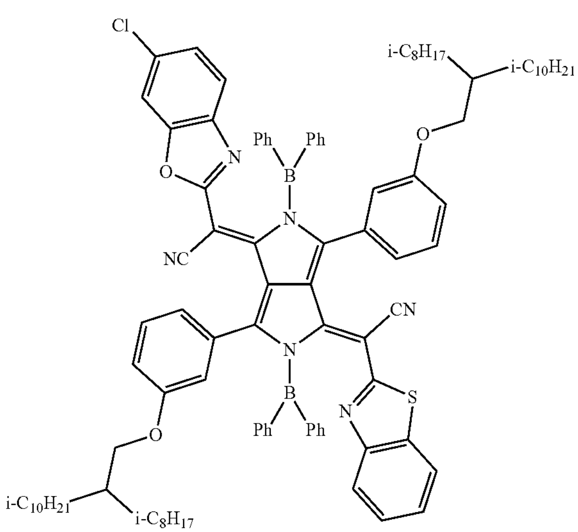
D-55
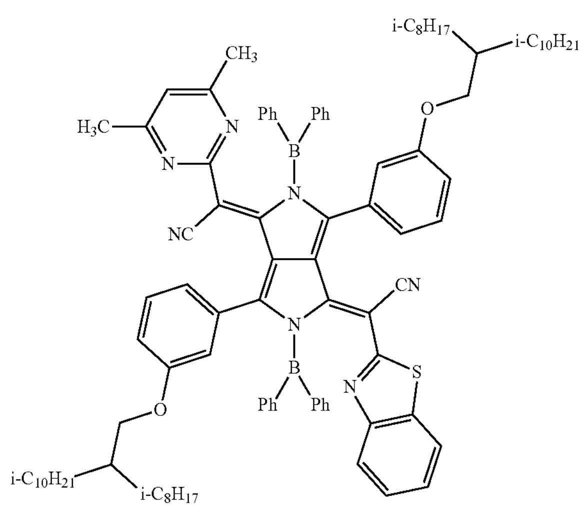

-continued
D-56
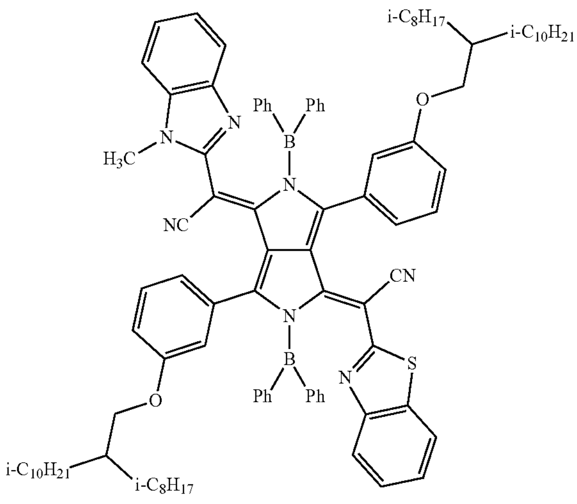
D-57
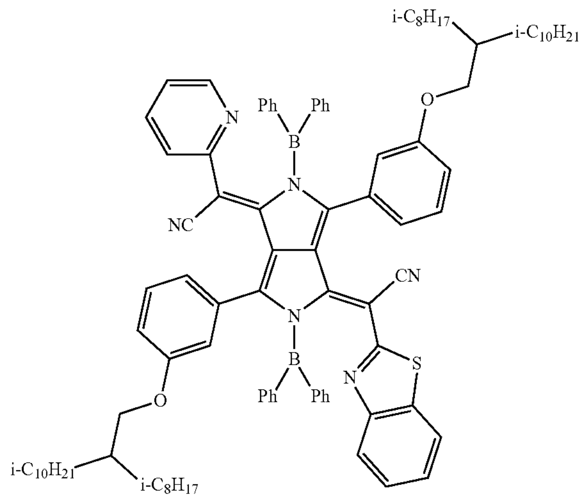
D-58
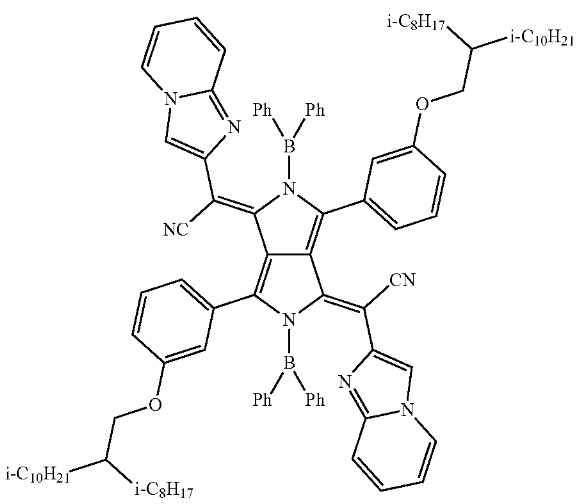
D-59
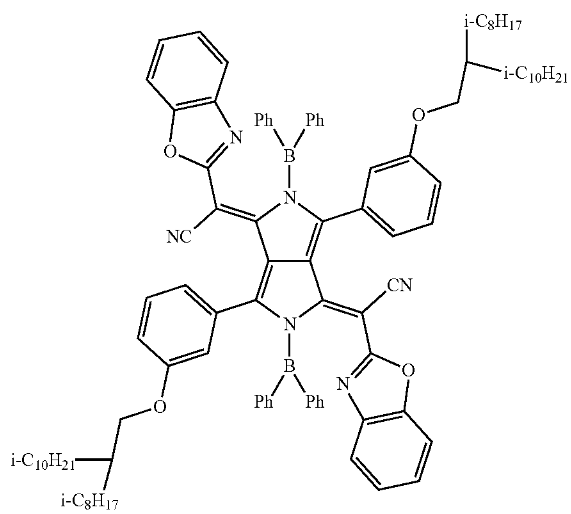
D-60
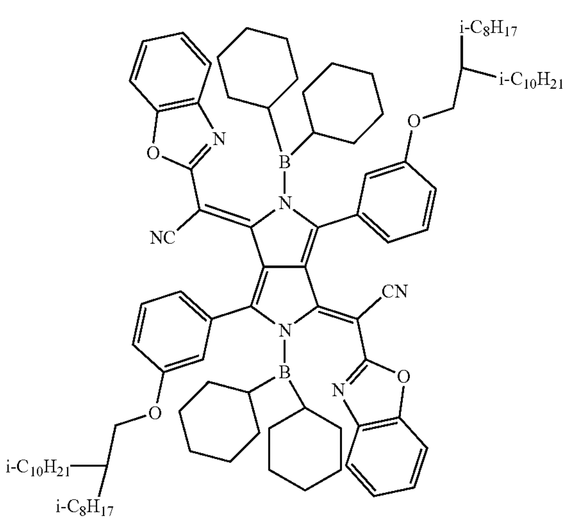
D-61
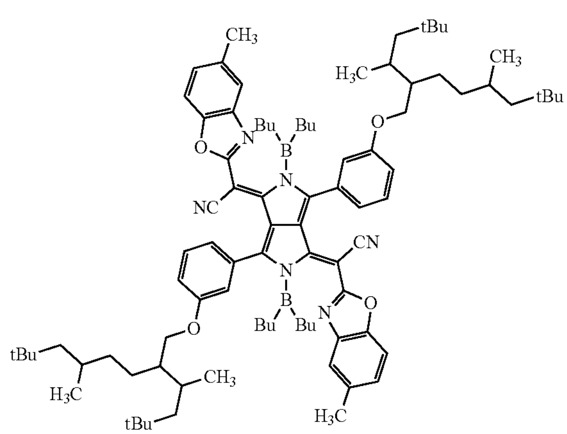

-continued
D-62
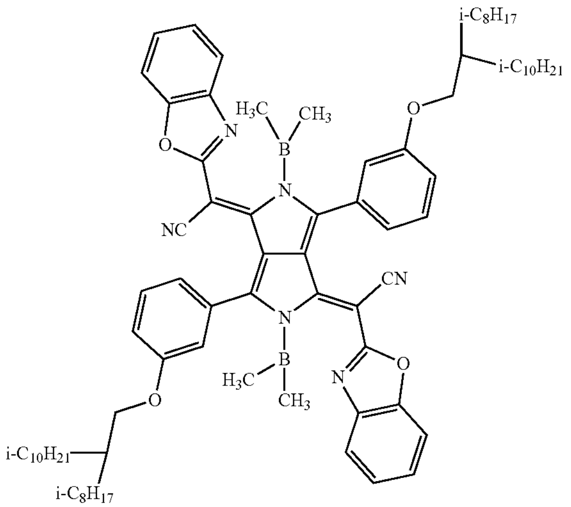
D-63
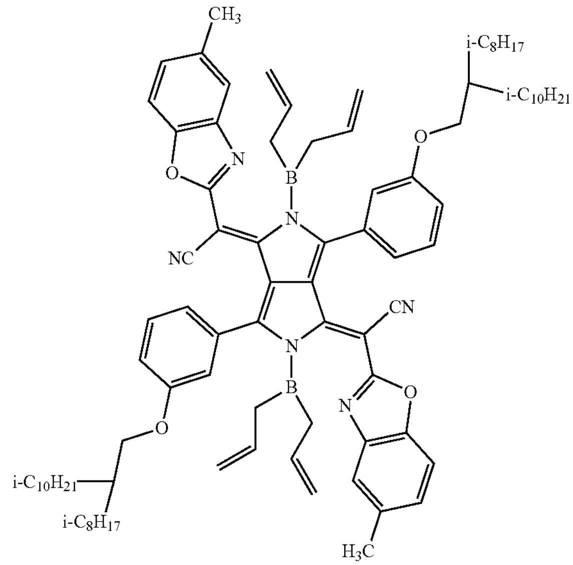
D-64
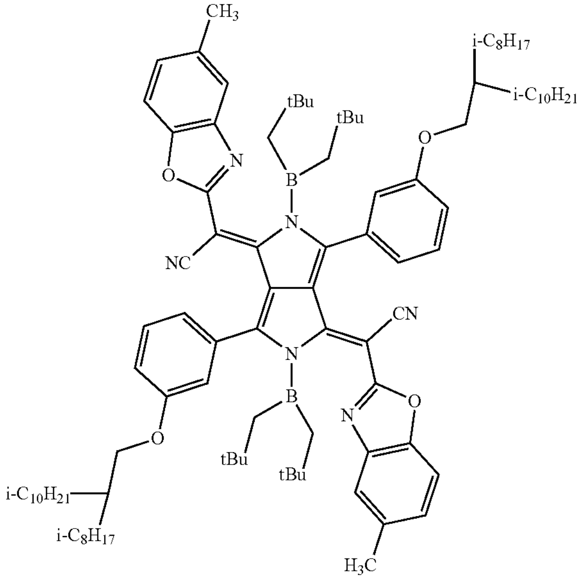
D-65
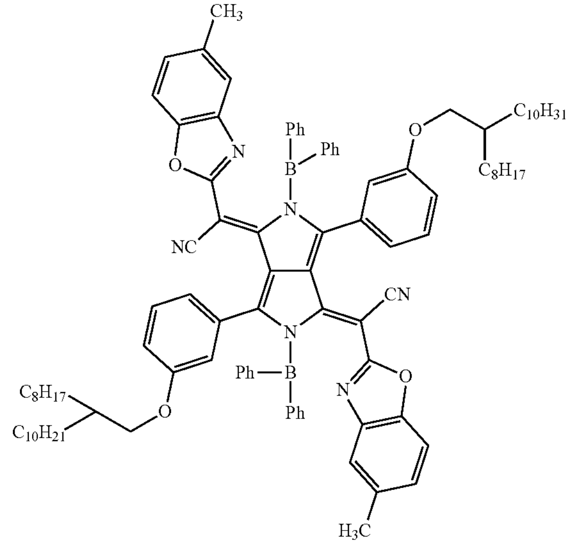

-continued
D-66
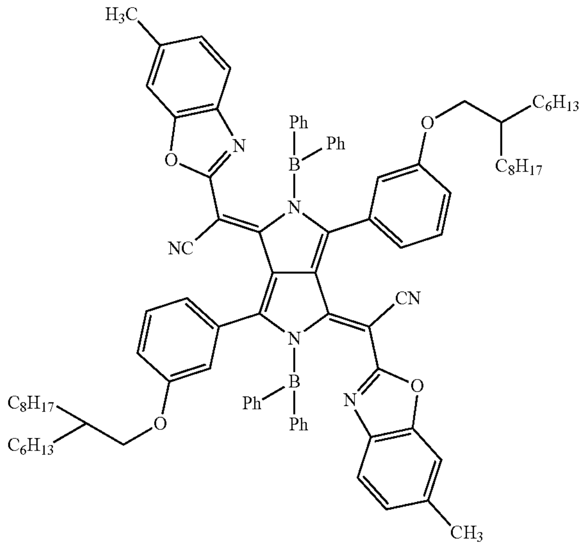
D-67
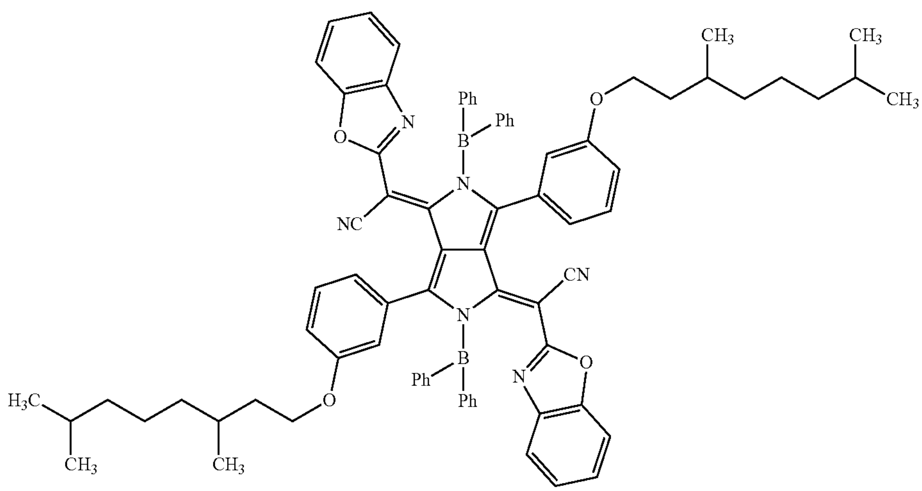
D-68
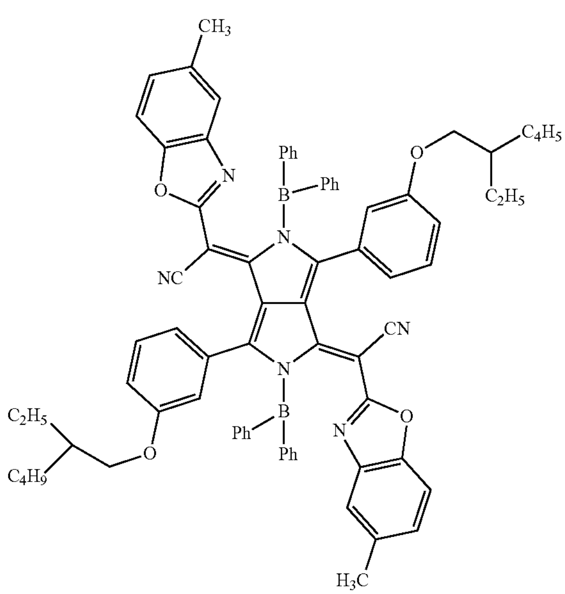
D-69
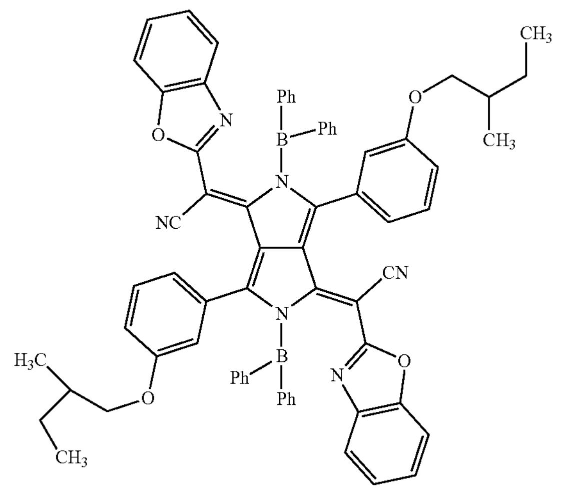

-continued
D-70
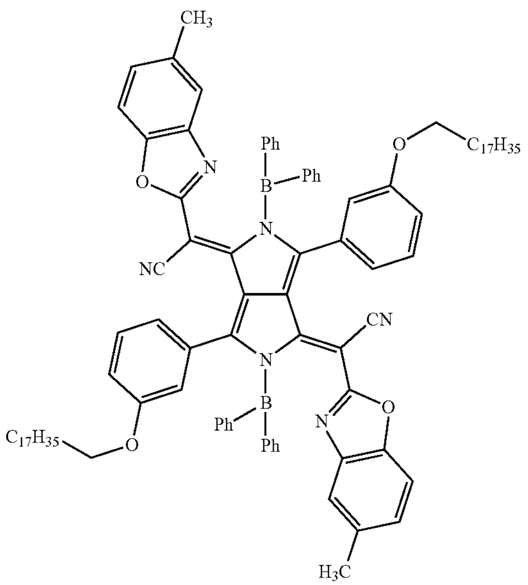
D-71
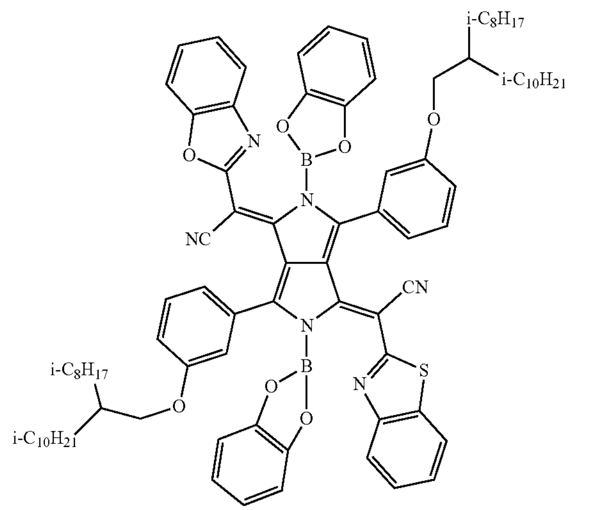
D-72
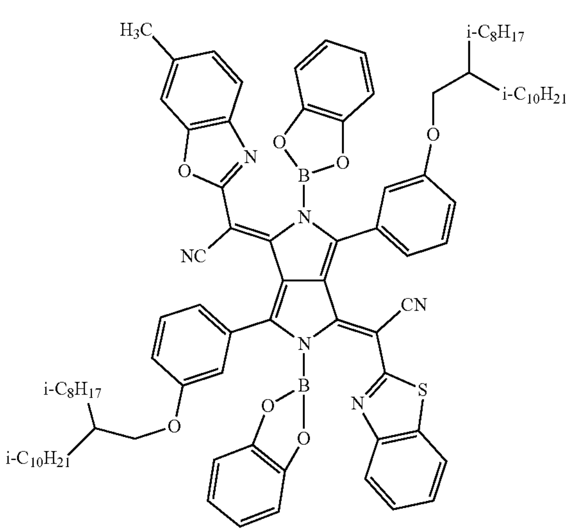
D-73
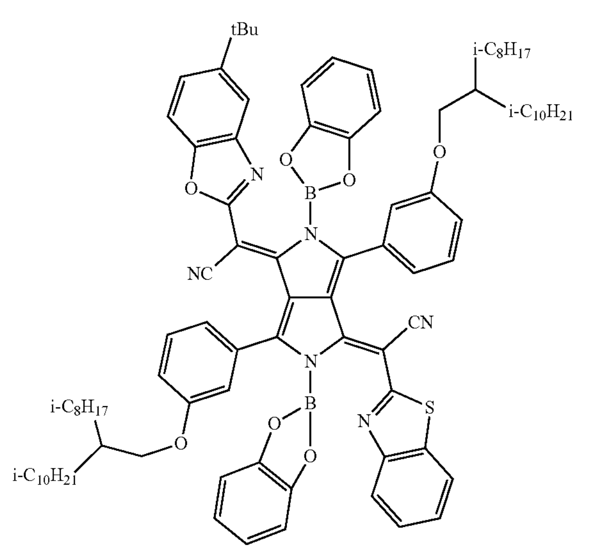

-continued
D-74
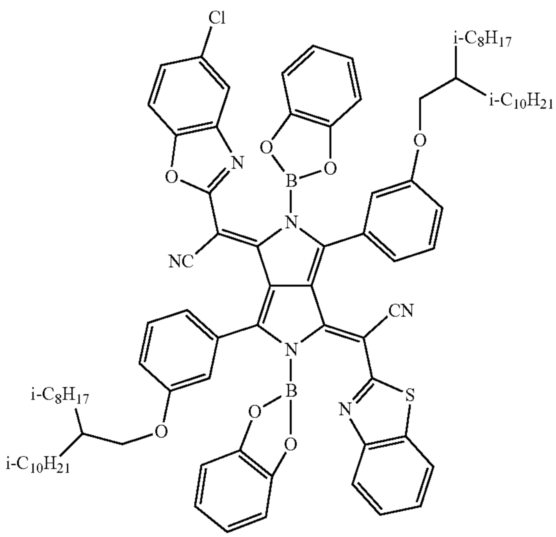
D-75
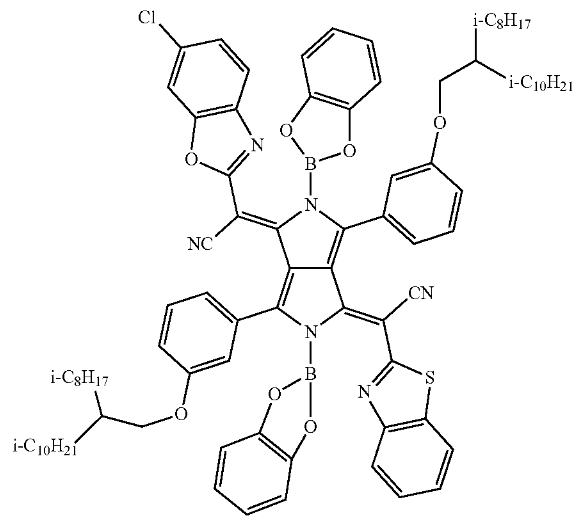
D-76
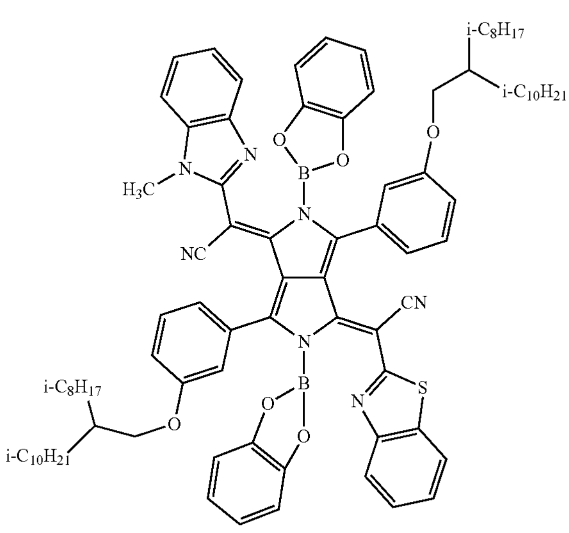
D-77
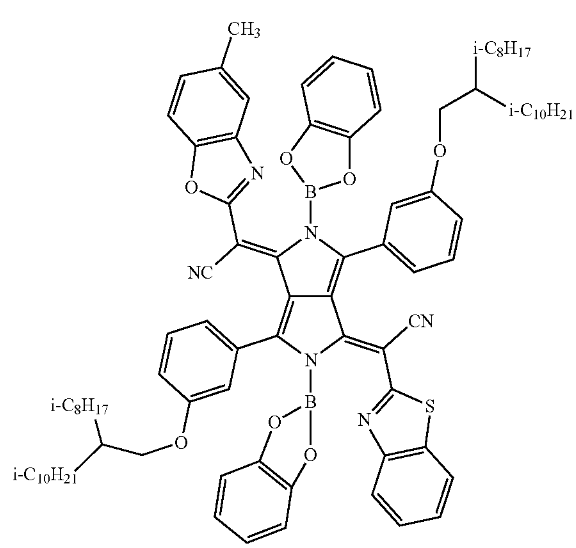

-continued
D-78
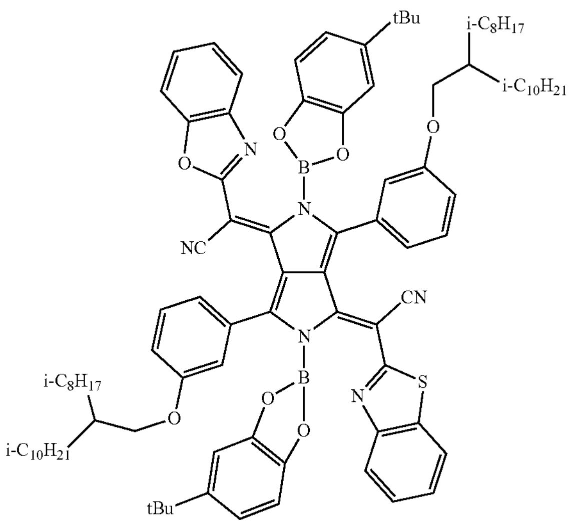
D-79
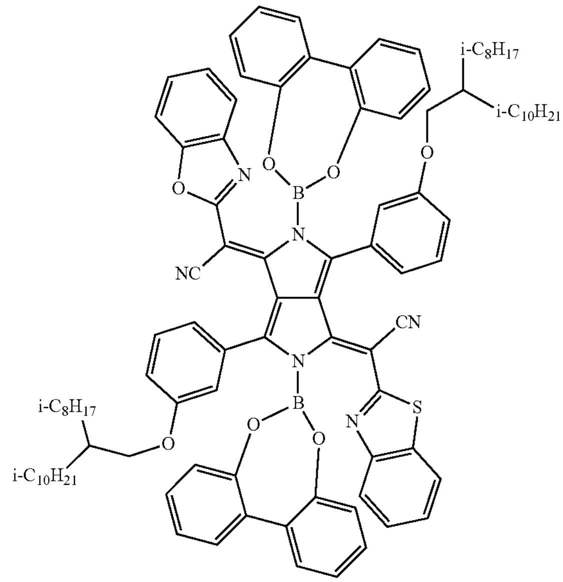
D-80
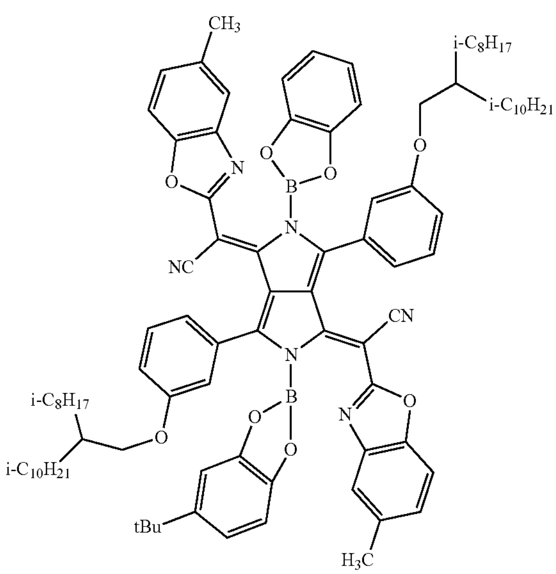
D-81
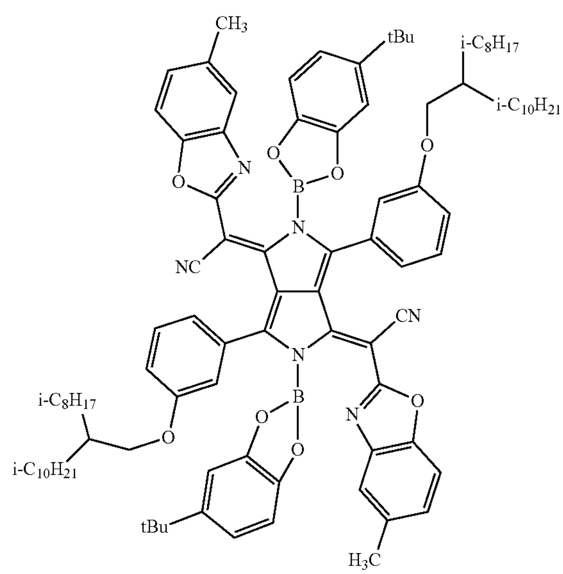

-continued
D-82
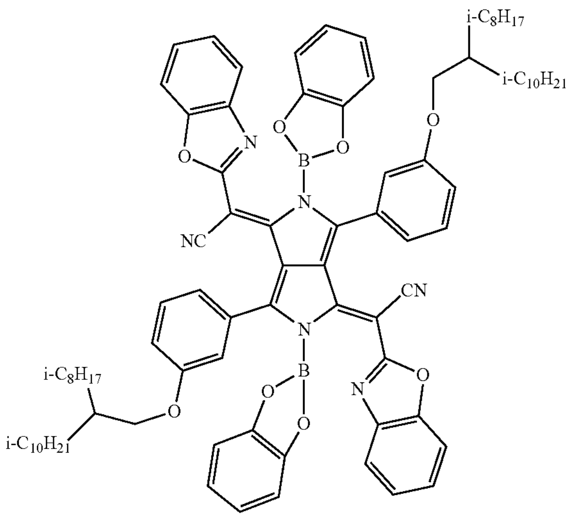
D-83
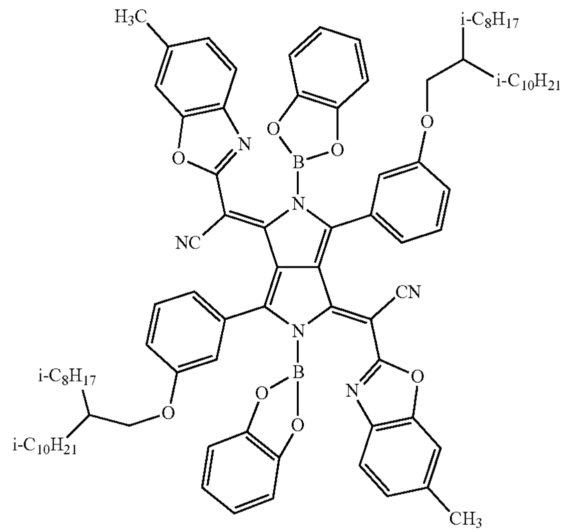
D-84
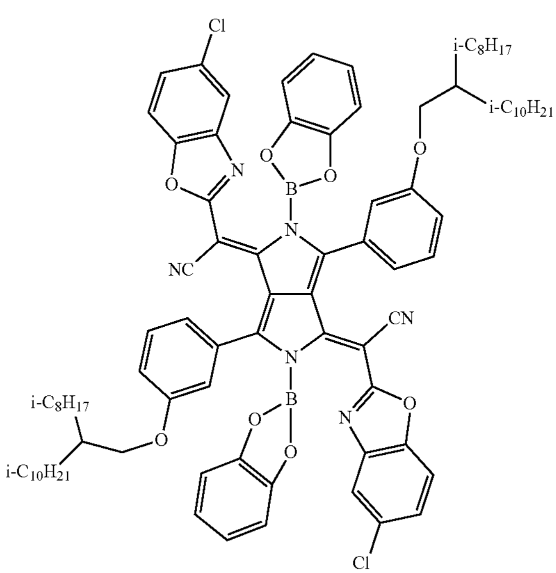
D-85
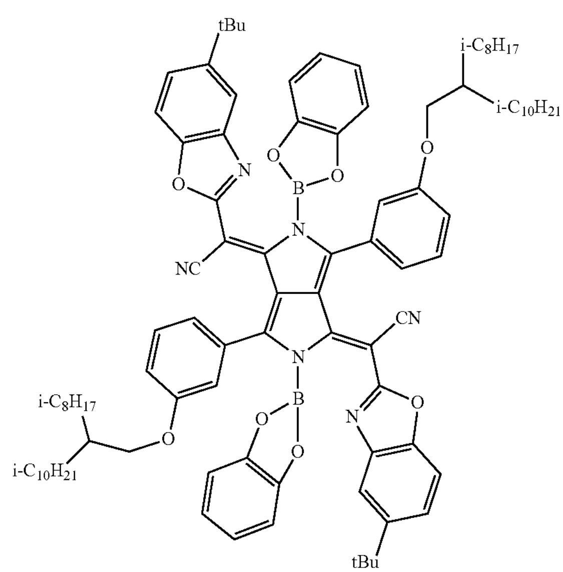

-continued
D-86
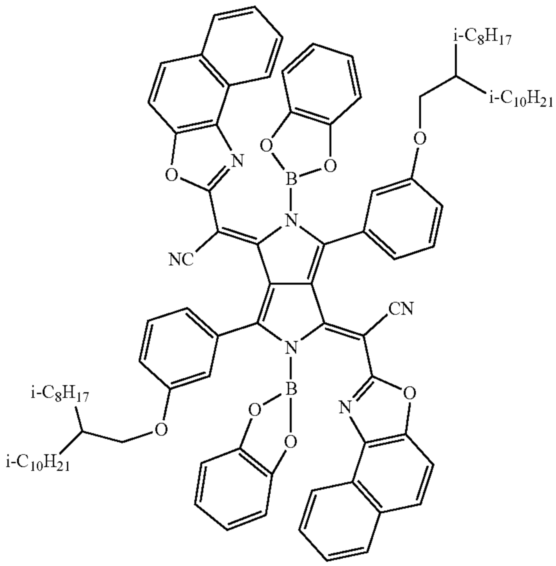
D-87
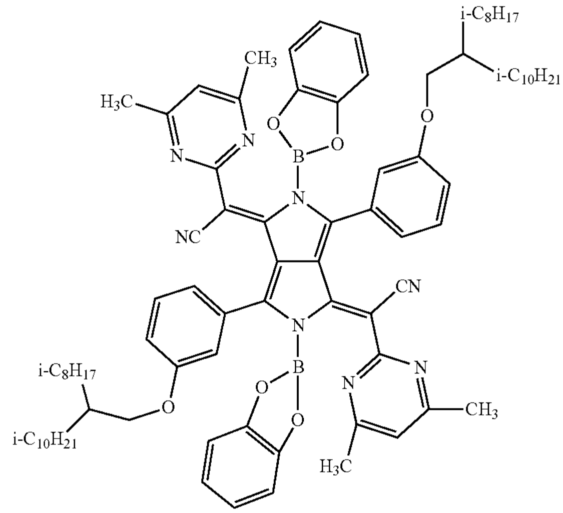
D-88
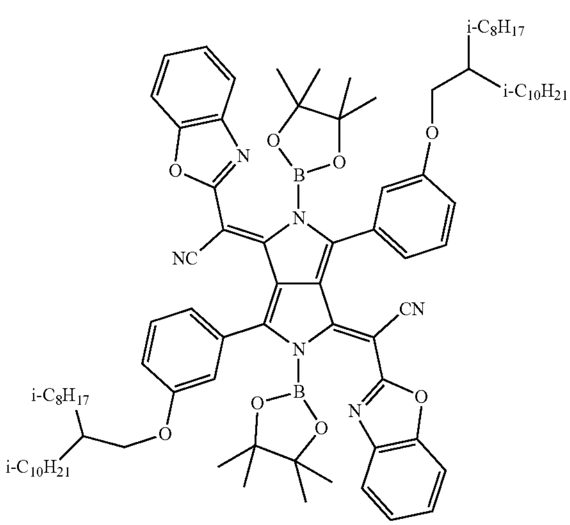
D-89
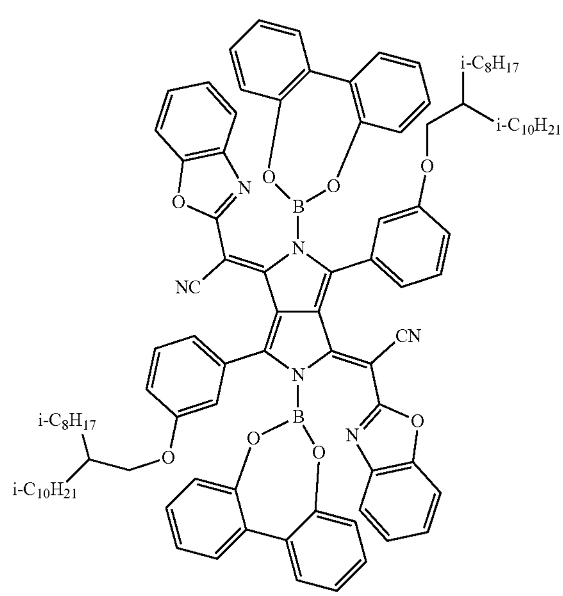

-continued

D-90

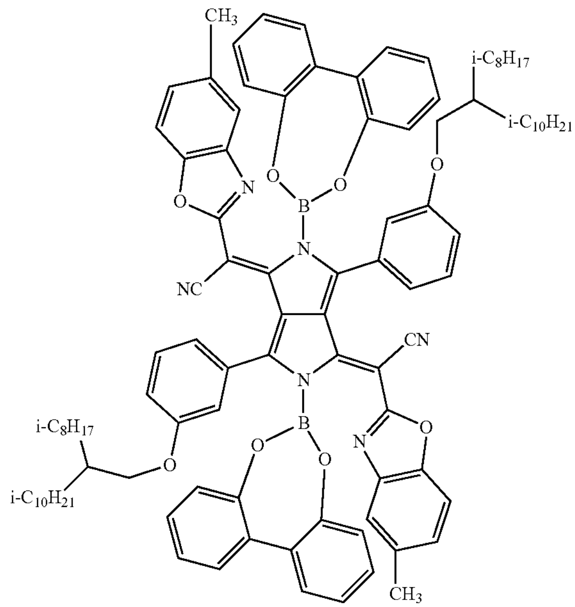

(Coloring Agent Represented by General Formula (1))

General Formula (1)

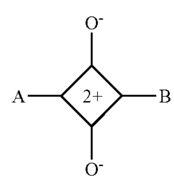

The embodiments that A and B can employ in General Formula (1) are the same as those of A and B in General Formula (1) described in the above-mentioned dye B and the dye C.

In a case where the dye D is a coloring agent represented by General Formula (1), a coloring agent represented by General Formula (14) is preferable.

General Formula (14)

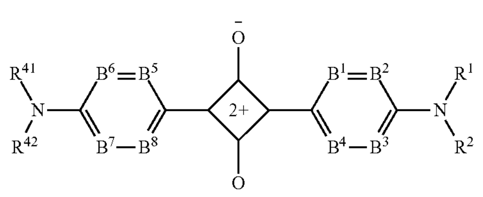

In General Formula (14), $R^1$ and $R^2$ have the same meaning as $R^1$ and $R^2$ in the above-mentioned General Formula (2). $R^{41}$ and $R^{42}$ have the same meaning as $R^1$ and $R^2$ in the above-mentioned General Formula (2).

Among these, as $R^1$, $R^2$, $R^{41}$, and $R^{42}$, an alkyl group, an alkenyl group, an aryl group, or a heteroaryl group is preferable, an alkyl group, an aryl group, or a heteroaryl group is more preferable, and an alkyl group or an aryl group is further preferable.

$R^1$, $R^2$, $R^{41}$, and $R^{42}$ may further have a substituent. A substituents that may be further provided include the substituents that $R^1$ and $R^2$ in the above-mentioned General Formula (2) may further have, and the substituent X which A, B, and G in above described General Formula (1) may have.

$B^1$, $B^2$, $B^3$, and $B^4$ in General Formula (14) have the same meaning as $B^1$, $B^2$, $B^3$, $B^4$ in the above-mentioned General Formula (2), respectively. In addition, $B^5$, $B^6$, $B^7$, and $B^8$ in General Formula (14) have the same meaning as $B^1$, $B^2$, $B^3$, and $B^4$ in the above-mentioned General Formula (2), respectively.

The substituent of a carbon atom that can be employed as $B^1$, $B^2$, $B^3$, $B^4$, $B^5$, $B^6$, $B^7$, and $B^8$ may further have a substituent. Examples of the substituent that may be further provided include the substituent X that A, B, and G in the above-mentioned General Formula (1) may have.

In General Formula (14), $R^1$ and $R^2$ may be bonded to each other to form a ring, and $R^1$ or $R^2$ and the substituent of $B^2$ or $B^3$ may be bonded to each other to form a ring. In addition, $R^{41}$ and $R^{42}$ may be bonded to each other to form a ring, and $R^{4'}$ or $R^{42}$ and the substituent of $B^6$ or $B^7$ may be bonded to each other to form a ring.

In the above, as the ring to be formed, a heterocycle or a heteroaryl ring is preferable, and the size of the ring being formed is not particularly limited, and a 5-membered ring or a 6-membered ring is preferable. Also, the number of rings to be formed is not particularly limited, and may be one or two or more. Examples of a form in which two or more rings are formed include a form in which, for example, the substituents of $R^1$ and $B^2$ and the substituents of $R^2$ and $B^3$ are bonded to each other respectively to form two rings.

Specific examples of the dye D are shown below. The following compounds F-1 to F-33 are coloring agents represented by General Formula (1).

F-1
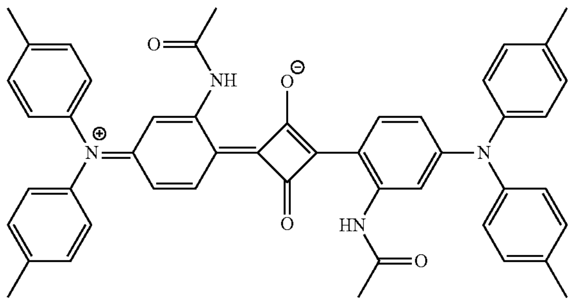
F-2
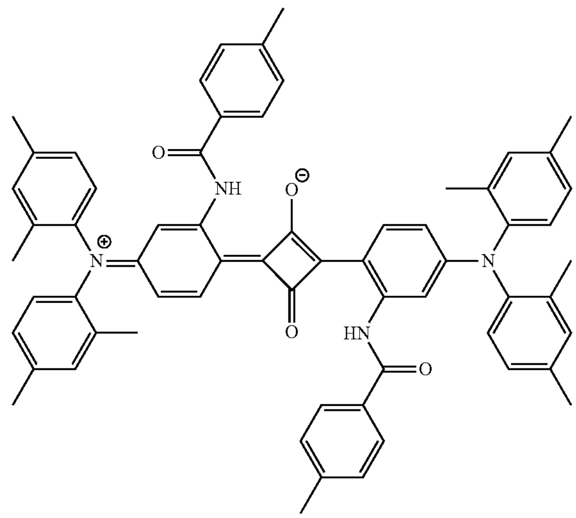
F-3
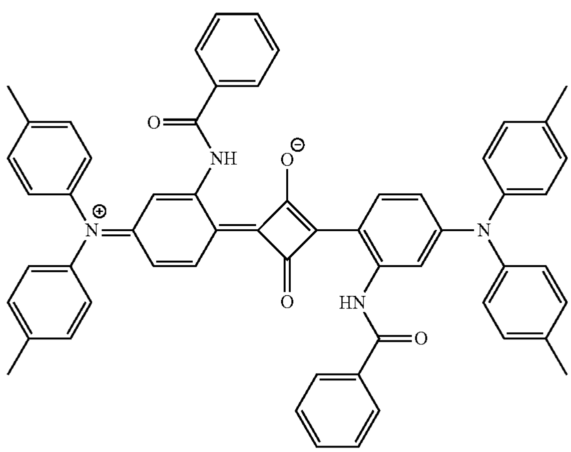
F-4
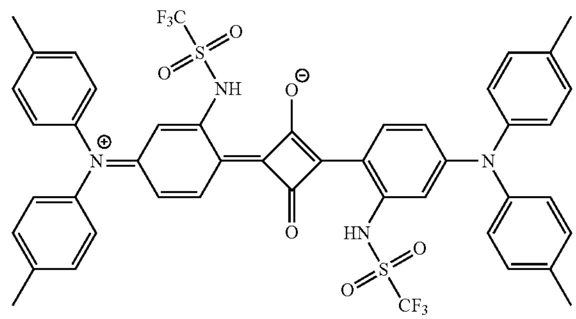
F-5
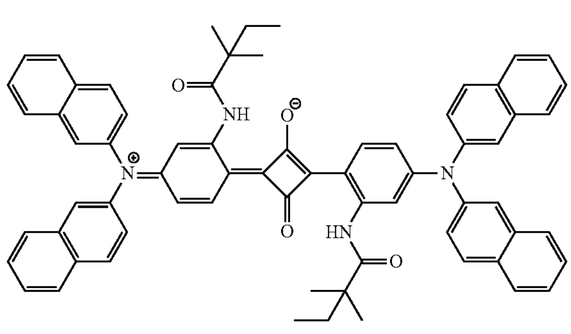
F-6
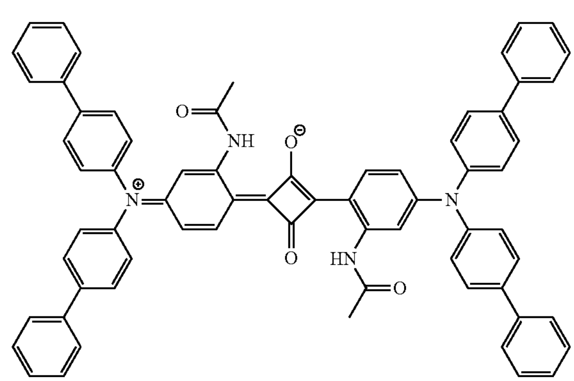

-continued
F-7
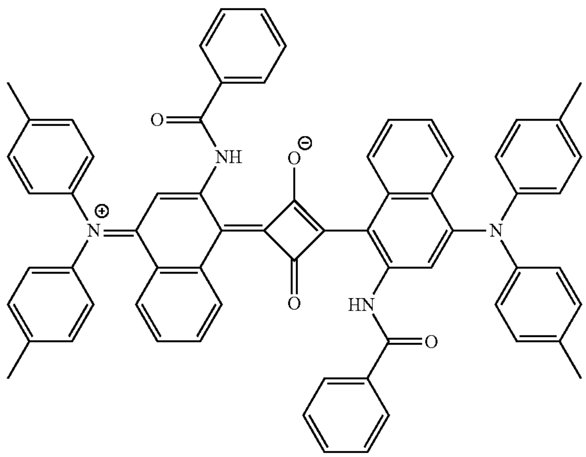
F-8
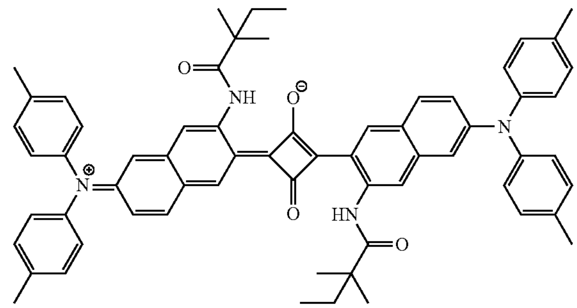
F-9
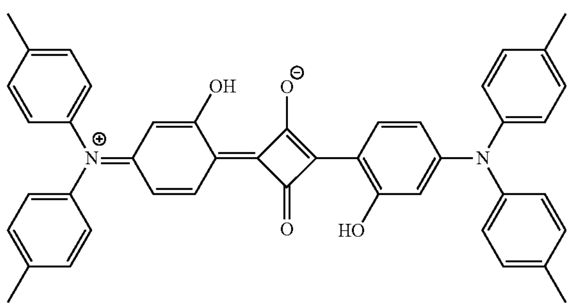
F-10
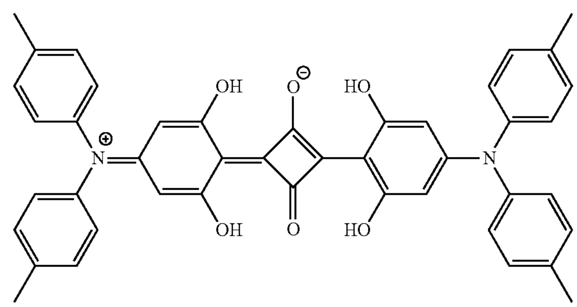
F-11
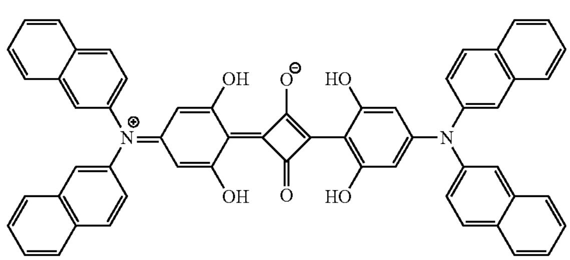
F-12
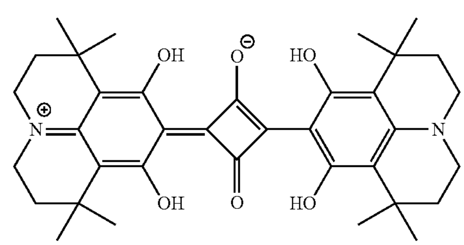
F-13
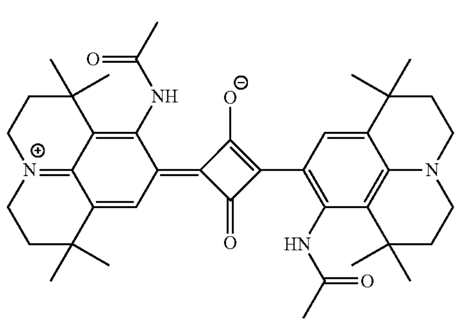
F-14
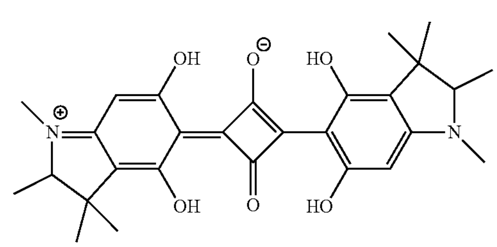

-continued
F-15
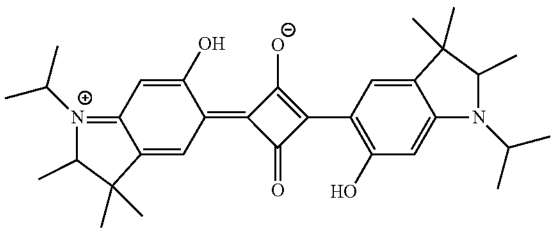
F-16
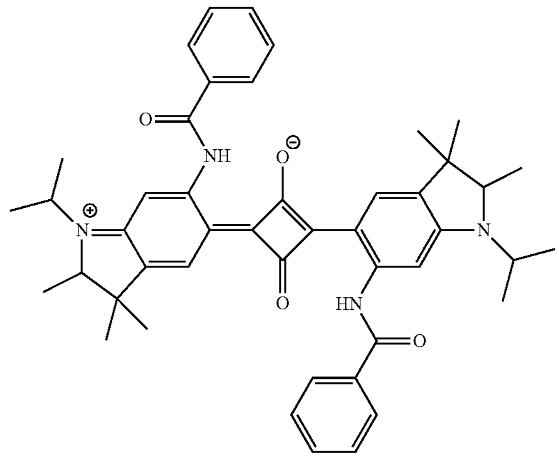
F-17
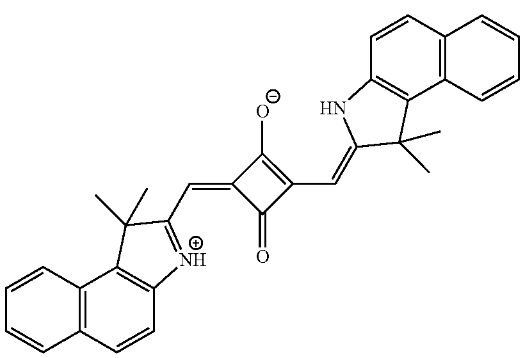
F-18
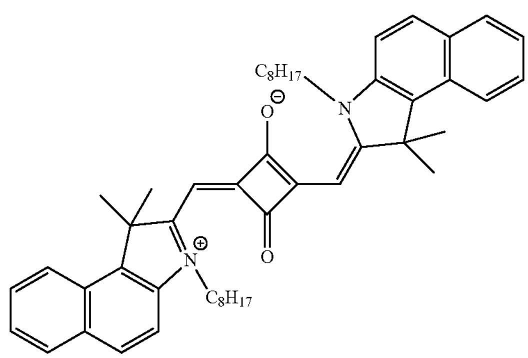
F-19
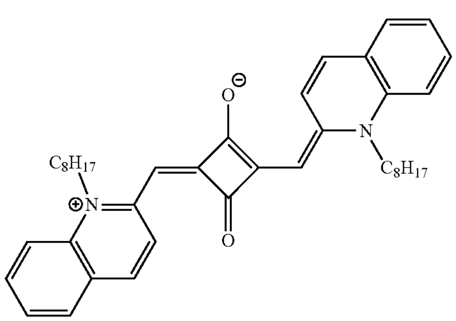
F-20
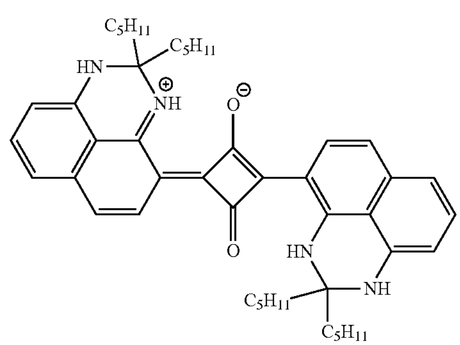

-continued
F-21
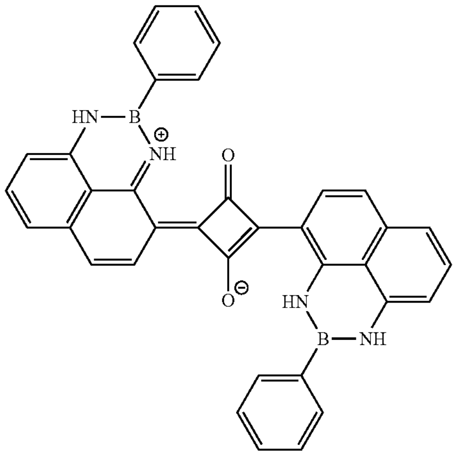
F-22
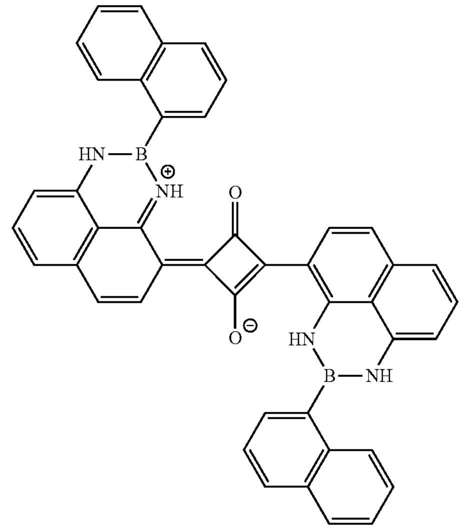
F-23
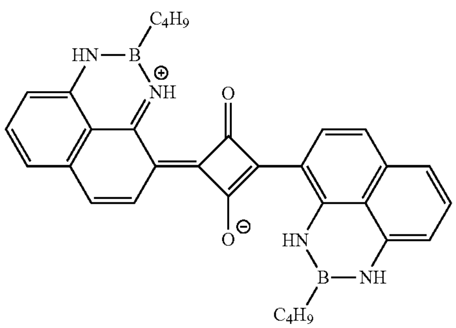
F-24
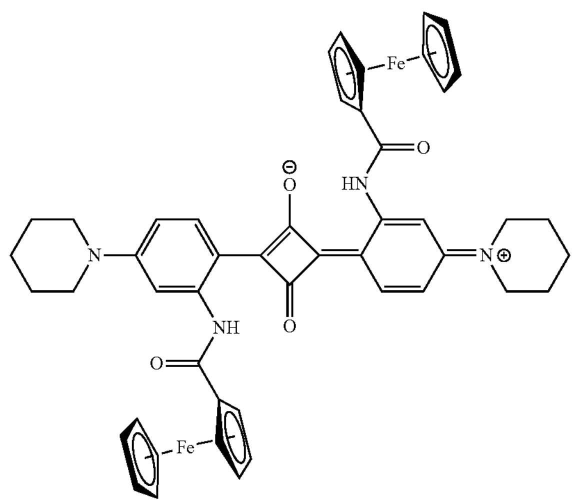
F-25
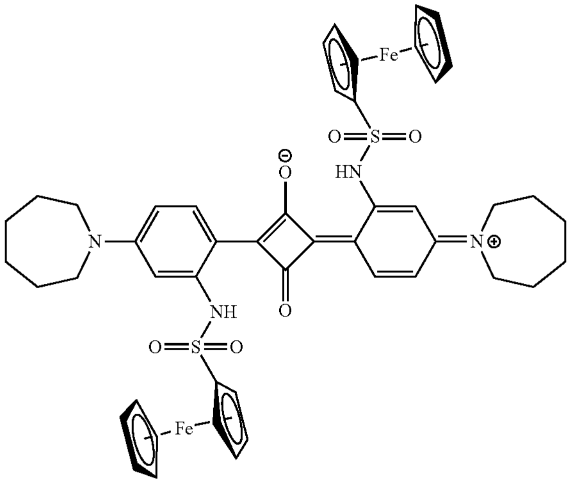
F-26
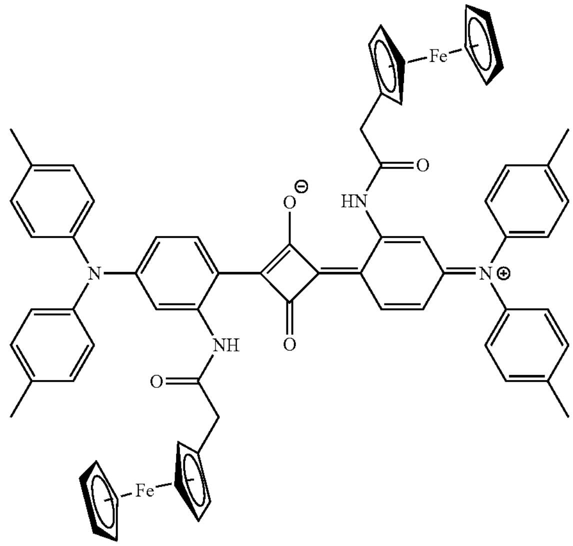

-continued
F-27
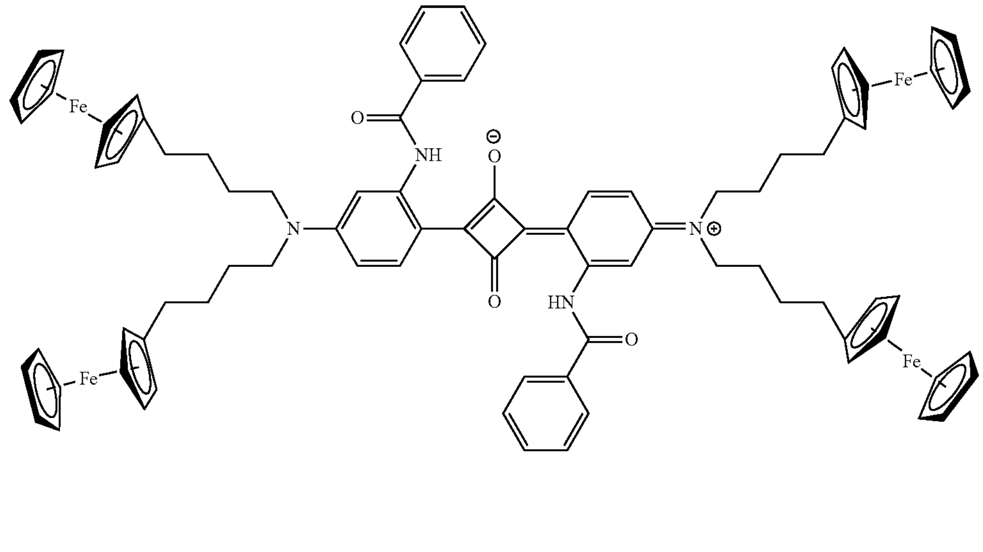
F-28
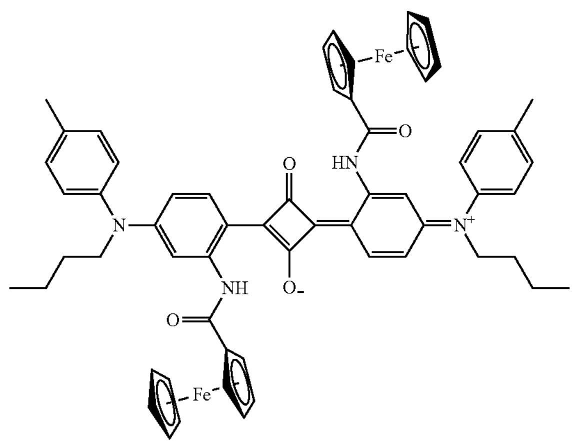
F-29
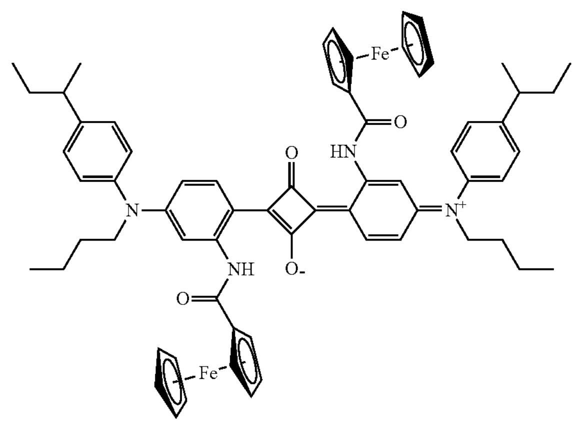
F-30
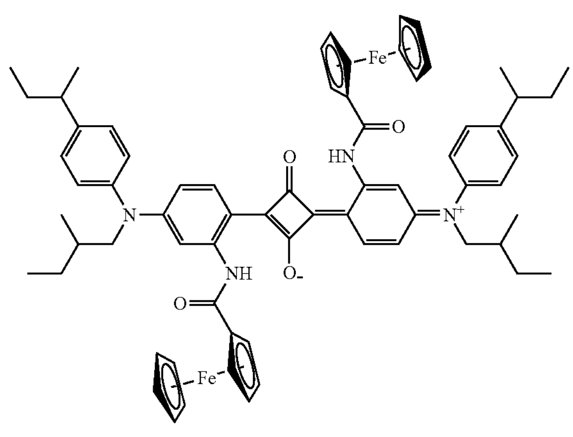
F-31
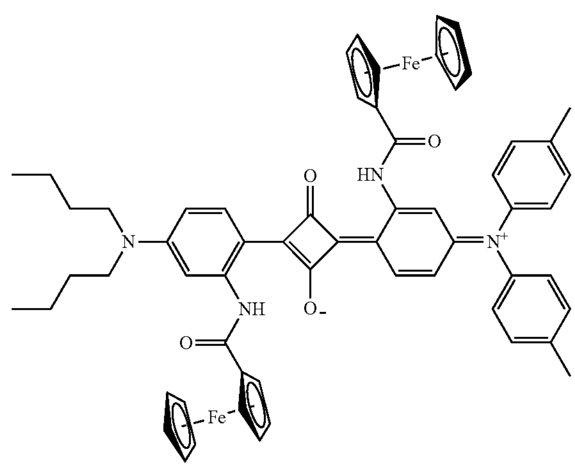

-continued

F-32

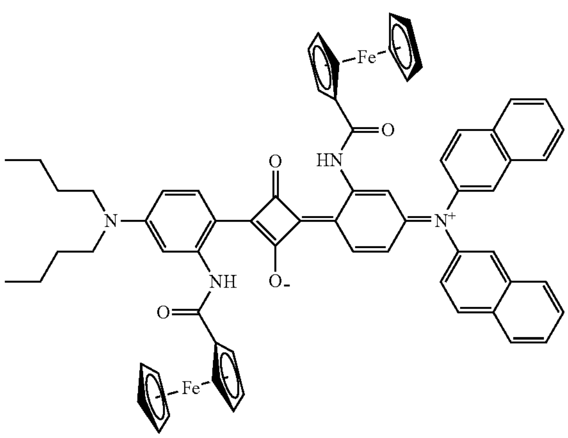

F-33

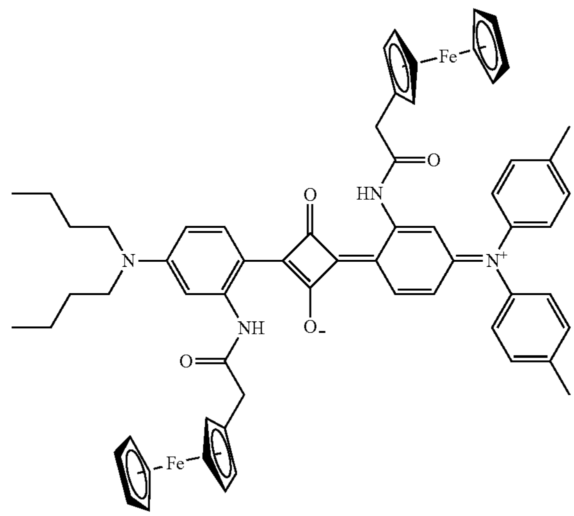

The total content of the dyes A to D in the wavelength selective absorption layer is preferably 0.10 parts by mass or more, more preferably 0.15 parts by mass or more, still more preferably 0.20 parts by mass or more, particularly preferably 0.25 parts by mass or more, and especially preferably 0.30 parts by mass or more, with respect to 100 parts by mass of the resin constituting the wavelength selective absorption layer. In a case where the total content of the dyes A to D in the wavelength selective absorption layer is equal to or more than the above-mentioned preferable lower limit value, a favorable antireflection effect can be obtained.

Further, in the wavelength selective absorption layer, the total content of the dyes A to D is usually 50 parts by mass or less with respect to 100 parts by mass of the resin constituting the wavelength selective absorption layer, preferably 40 parts by mass or less, and more preferably 30 parts by mass or less.

The content of each of the dyes A to D that can be contained in the wavelength selective absorption layer is preferably as follows.

The content of the dye A is preferably 0.01 to 45 parts by mass, and more preferably 0.1 to 30 parts by mass, with respect to 100 parts by mass of the resin constituting the wavelength selective absorption layer. The content of the dye B is preferably 0.01 to 45 parts by mass, and more preferably 0.1 to 30 parts by mass, with respect to 100 parts by mass of the resin constituting the wavelength selective absorption layer. The content of the dye C is preferably 0.01 to 30 parts by mass, and more preferably 0.1 to 10 parts by mass, with respect to 100 parts by mass of the resin constituting the wavelength selective absorption layer. The content of the dye D is preferably 0.05 to 50 parts by mass, and more preferably 0.2 to 40 parts by mass, with respect to 100 parts by mass of the resin constituting the wavelength selective absorption layer.

In a case where the wavelength selective absorption layer contains four dyes A to D, a content ratio of individual dyes A to D in the wavelength selective absorption layer is preferably dye A:dye B:dye C:dye D=1:0.1 to 10:0.05 to 5:0.1 to 10, and more preferably 1:0.2 to 5:0.1 to 3:0.2 to 5 in terms of a mass ratio.

In a case where at least one of the dye B or C is the quencher-embedded coloring agent, the content of the quencher-embedded coloring agent is preferably 0.1 parts by mass or more, with respect to 100 parts by mass of the resin constituting the wavelength selective absorption layer, from the viewpoint of antireflection effect. An upper limit value thereof is preferably 45 parts by mass or less.

<Resin>

The resin contained in the wavelength selective absorption layer (hereinafter, also referred to as "matrix resin") is not particularly limited as long as the resin can disperse (preferably dissolve) the dye and the antifading agent for a dye to be described later, and can suppress the decrease in light resistance of the dye due to the antifading agent. It is possible to satisfy the suppression of external light reflection and the suppression of brightness decrease, and moreover, it is possible to maintain the original tint of an image of the OLED display device at an excellent level, which are preferable.

In a case where at least one of the dye B or C is a squarine-based coloring agent represented by General Formula (1), the matrix resin is preferably a low-polarity matrix resin in which the squarine-based coloring agent can exhibit sharper absorption. In a case where the squarine-based coloring agent exhibits the sharper absorption, Relational Expressions (I) to (VI) can be satisfied at a preferable level, and the original tint of the image of the OLED display device can be maintained at a more excellent level. Here, the low polarity means that a fd value defined by Relational Expression I is preferably 0.50 or more.

$$fd=\delta d/(\delta d+\delta p+\delta h) \quad \text{Relational Expression I:}$$

In Relational Expression I, δd, δp, and δh respectively indicate a term corresponding to a London dispersion force, a term corresponding to a dipole-dipole force, and a term corresponding to a hydrogen bonding force with respect to a solubility parameter δt calculated by a Hoy method. A specific calculation method will be described later. That is, fd represents a ratio of δd to the sum of δd, δp, and δh.

By setting the fd value to 0.50 or more, a sharper absorption waveform can be easily obtained.

Further, in a case where the wavelength selective absorption layer contains two or more matrix resins, the fd value is calculated as follows.

$$fd=\Sigma(w_i \cdot fd_i)$$

Here, $w_i$ represents the mass fraction of the i-th matrix resin, and $fd_i$ represents the fd value of the i-th matrix resin.

—Term δd Corresponding to London Dispersion Force—

The term δd corresponding to the London dispersion force refers to δd obtained for the Amorphous Polymers described in the column "2) Method of Hoy (1985, 1989)" on pages 214 to 220 of the document "Properties of Polymers 3rd, ELSEVIER, (1990)", and is calculated according to the description in the column of the document.

—Term δp Corresponding to Dipole-Dipole Force—

The term δp corresponding to the dipole-dipole force refers to δp obtained for Amorphous Polymers described in the column "2) Method of Hoy (1985, 1989)" on pages 214 to 220 of the document "Properties of Polymers 3rd, ELSEVIER, (1990)", and is calculated according to the description in the column of the document.

—Term δh Corresponding to Hydrogen Bonding Force—

The term δh corresponding to the hydrogen bonding force refers to δh obtained for the Amorphous Polymers described in the column "2) Method of Hoy (1985, 1989)" on pages 214 to 220 of the document "Properties of Polymers 3rd, ELSEVIER, (1990)", and is calculated according to the description in the column of the document.

In addition, in a case where the matrix resin is a resin exhibiting a certain hydrophobicity, a moisture content of the wavelength selective absorption layer can be set to a low moisture content, for example, 0.5% or lower, and the light resistance of the laminate according to the embodiment of the present invention comprising the wavelength selective absorption layer is improved, which is preferable.

The resin may contain a predetermined conventional component in addition to a polymer. However, the fd of the matrix resin is a calculated value for the polymer constituting the matrix resin.

Preferable examples of the matrix resin include a polystyrene resin and a cyclic polyolefin resin, and the polystyrene resin is more preferable. Usually, the fd value of the polystyrene resin is 0.45 to 0.60, and the fd value of the cyclic polyolefin resin is 0.45 to 0.70. As described above, it is preferable to use the resin having a fd value of 0.50 or more.

Further, for example, in addition to these preferable resins, it is also preferable to use a resin component, that imparts functionality to the wavelength selective absorption layer, such as an extensible resin component and a peelability control resin component, which will be described later. That is, in the present invention, the matrix resin is used in the meaning of including the extensible resin component and the peelability control resin component in addition to the above-mentioned resins.

It is preferable that the matrix resin includes a polystyrene resin, from the viewpoint of sharpening the absorption waveform of the coloring agent.

(Polystyrene Resin)

The polystyrene contained in the polystyrene resin means a polymer containing a styrene component. The polystyrene preferably contains 50% by mass or more of the styrene component. The wavelength selective absorption layer may contain one type of polystyrene or two or more types of polystyrene. Here, the styrene component is a structural unit derived from a monomer having a styrene skeleton in the structure thereof.

The polystyrene more preferably contains 70% by mass or more of the styrene component, and still more preferably 85% by mass or more of the styrene component, in terms of controlling the photoelastic coefficient and the hygroscopicity to values within a preferable range as the wavelength selective absorption layer. It is also preferable that the polystyrene is composed of only a styrene component.

Among polystyrenes, as the polystyrenes composed of only styrene components, a homopolymer of a styrene compound and a copolymer of two or more types of a styrene compound are exemplified. Here, the styrene compound is a compound having a styrene skeleton in the structure thereof, and is meant to include, in addition to styrene, a compound in which a substituent is introduced within a range where an ethylenically unsaturated bond of styrene can act as a reactive (polymerizable) group.

Specific examples of the styrene compound include, for example, styrene; alkylstyrene such as α-methylstyrene, o-methylstyrene, m-methylstyrene, p-methylstyrene, 3,5-dimethylstyrene, 2,4-dimethylstyrene, o-ethylstyrene, p-ethylstyrene, and tert-butyl styrene; and substituted styrene having a hydroxyl group, an alkoxy group, a carboxy group, or a halogen atom introduced into the benzene nucleus of styrene such as hydroxystyrene, tert-butoxy styrene, vinyl benzoic acid, o-chlorostyrene, and p-chlorostyrene. Among these, the polystyrene is preferably a homopolymer of styrene (that is, polystyrene) from the viewpoints of availability and cost of materials.

The constituent components other than the styrene component that may be contained in the polystyrene are not particularly limited. That is, the polystyrene may be a styrene-diene copolymer, a styrene-polymerizable unsaturated carboxylic acid ester copolymer, or the like. In addition, it is also possible to use a mixture of polystyrene and synthetic rubber (for example, polybutadiene and polyisoprene). Further, high impact polystyrene (HIPS) obtained by graft-polymerizing styrene to synthetic rubber is also preferable. Further, a polystyrene obtained by dispersing a rubber-like elastic body in a continuous phase of a polymer including a styrene component (for example, a copolymer of a styrene component and a (meth)acrylate ester component), and graft-polymerizing the copolymer with the rubber-like elastic body (referred to as graft type high impact polystyrene "graft HIPS") is also preferable. Furthermore, a so-called styrene-based elastomer can also be suitably used.

In addition, the polystyrene may be hydrogenated (may be a hydrogenated polystyrene). The hydrogenated polystyrene is not particularly limited, and is preferably a hydrogenated styrene-diene-based copolymer such as a hydrogenated styrene-butadiene-styrene block copolymer (SEBS) obtained by hydrogenating a styrene-butadiene-styrene block copolymer (SBS) or hydrogenated styrene-isoprene-styrene block copolymer (SEPS) obtained by hydrogenating a styrene-isoprene-styrene block copolymer (SIS). Only one of these hydrogenated polystyrenes may be used, or two or more thereof may be used.

In addition, the polystyrene may be modified polystyrene. The modified polystyrene is not particularly limited, and examples thereof include polystyrene having a reactive group such as a polar group introduced therein. Specific examples thereof preferably include acid-modified polystyrene such as maleic acid-modified and epoxy-modified polystyrene.

As the polystyrene, a plurality of types of polystyrene resins having different compositions, molecular weights, and the like may be used in combination. The polystyrene-based resin can be obtained by a conventional method such as anion, bulk, suspension, emulsification, or a solution polymerization method. In addition, in the polystyrene, at least a part of the unsaturated double bond of the benzene ring of the conjugated diene and the styrene monomer may be hydrogenated. The hydrogenation rate can be measured by a nuclear magnetic resonance apparatus (NMR).

As the polystyrene resin, a commercially available product may be used, and examples thereof include "CLEAREN 530L" and "CLEAREN 730L" manufactured by Denki Kagaku Kogyo Kabushiki Kaisha, "TUFPRENE 126S" and "ASAPRENE T411" manufactured by Asahi Kasei Corporation, "KRATON D1102A", "KRATON D1116A" manufactured by Kraton Polymers Japan Ltd., "STYROLUX S" and "STYROLUX T" by Styrolution Group, GmbH, "ASAFLEX 840" and "ASAFLEX 860" manufactured by Asahi Kasei Chemicals Corporation (all are SBS), "679", "HF77", and "SGP-10" manufactured by PS Japan Corporation, "DIC STYRENE XC-515" and "DIC STYRENE XC-535" manufactured by DIC Corporation (all are GPPS), "475D", "H0103", and "HT478" manufactured by PS Japan Corporation, and "DIC STYRENE GH-8300-5" manufactured by DIC Corporation (all are HIPS). Examples of the hydrogenated polystyrene resin include "TUFTEC H series" manufactured by Asahi Kasei Chemicals Corporation, and "KRATON G series" manufactured by Shell Japan Ltd. (all are SEBS), "DYNARON" manufactured by JSR Corporation (hydrogenated styrene-butadiene random copolymer), and "SEPTON" manufactured by Kuraray Co., Ltd. (SEPS). Examples of the modified polystyrene resin include "TUFTEC M series" manufactured by Asahi Kasei Chemicals Corporation, "EPOFRIEND" manufactured by Daicel Corporation, "Polar Group Modified DYNARON" manufactured by JSR Corporation, and "RESEDA" manufactured by ToaGosei Co., Ltd.

The wavelength selective absorption layer preferably contains a polyphenylene ether resin in addition to the polystyrene resin. By containing the polystyrene resin and the polyphenylene ether resin together, the toughness of the wavelength selective absorption layer can be improved, and the occurrence of defects such as cracks can be suppressed even in a harsh environment such as high temperature and high humidity.

As the polyphenylene ether resin, ZYLON S201A, ZYLON 202A, ZYLON S203A, and the like manufactured by Asahi Kasei Corporation can be preferably used. In addition, a resin in which the polystyrene resin and the polyphenylene ether resin are mixed in advance may also be used. As the mixed resin of the polystyrene resin and the polyphenylene ether resin, for example, ZYLON 1002H, ZYLON 1000H, ZYLON 600H, ZYLON 500H, ZYLON 400H, ZYLON 300H, ZYLON 200H, and the like manufactured by Asahi Kasei Corporation can be preferably used.

In a case where the polystyrene resin and the polyphenylene ether resin are contained in the wavelength selective absorption layer, the mass ratio of the both resins is preferably 99/1 to 50/50, more preferably 98/2 to 60/40, and still more preferably 95/5 to 70/30, for the polystyrene resin/polyphenylene ether resin. By setting the formulation ratio of the polyphenylene ether resin in the above-mentioned preferable range, the wavelength selective absorption layer can have sufficient toughness, and the solvent can be appropriately volatilized in a case where a solution film is formed.

(Cyclic Polyolefin Resin)

The cyclic olefin compound forming the cyclic polyolefin contained in the cyclic polyolefin resin (also referred to as a polycycloolefin resin) is not particularly limited as long as the compound has a ring structure including a carbon-carbon double bond, and examples thereof include norbornene compounds and monocyclic olefin compounds, cyclic conjugated diene compounds, vinyl alicyclic hydrocarbon compounds, which are not norbornene compounds, and the like.

Examples of the cyclic polyolefin include (1) polymers including a structural unit derived from a norbornene compound, (2) polymers including a structural unit derived from a monocyclic olefin compound other than the norbornene compound, (3) polymers including a structural unit derived from a cyclic conjugated diene compound, (4) polymers including a structural unit derived from a vinyl alicyclic hydrocarbon compound, hydrides of polymers including a structural unit derived from each of the compounds (1) to (4), and the like.

In the present invention, ring-opening polymers of the respective compounds are included in the polymers including a structural unit derived from a norbornene compound and the polymers including a structural unit derived from a monocyclic olefin compound.

The cyclic polyolefin is not particularly limited, but a polymer having a structural unit derived from a norbornene compound, which is represented by General Formula (A-II) or (A-III), is preferable. The polymer having the structural unit represented by General Formula (A-II) is an addition polymer of a norbornene compound, and the polymer having the structural unit represented by General Formula (A-III) is a ring-opening polymer of a norbornene compound.

General Formula (A-II)

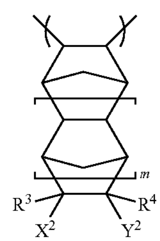

General Formula (A-III)

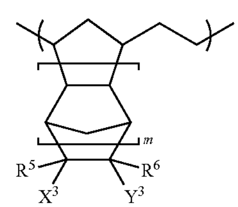

In General Formulae (A-II) and (A-III), m is an integer of 0 to 4, and preferably 0 or 1.

In General Formulae (A-II) and (A-III), $R^3$ to $R^6$ each independently represent a hydrogen atom or a hydrocarbon group having 1 to 10 carbon atoms.

The hydrocarbon group in General Formulae (A-I) to (A-III) is not particularly limited as long as the hydrocarbon group is a group consisting of a carbon atom and a hydrogen atom, and examples thereof include an alkyl group, an alkenyl group, an alkynyl group, and an aryl group (an aromatic hydrocarbon group). Among these, an alkyl group or an aryl group is preferable.

In General Formula (A-II) or (A-III), $X^2$ and $X^3$, and $Y^2$ and $Y^3$ each independently represent a hydrogen atom, a hydrocarbon group having 1 to 10 carbon atoms, a halogen atom, a hydrocarbon group having 1 to 10 carbon atoms which is substituted by a halogen atom, $-(CH_2)_nCOOR^{11}$, $-(CH_2)_nOCOR^{12}$, $-(CH_2)_nNCO$, $-(CH_2)_nNO_2$, $-(CH_2)_n CN$, $-(CH_2)_nCONR^{13}R^{14}$, $-(CH_2)_nNR^{13}R^{14}$, —$(CH_2)_n$OZ or —$(CH_2)_n$W, or $(—CO)_2O$ or $(—CO)_2NR^{15}$ which is formed by $X^2$ and $Y^2$ or $X^3$ and $Y^3$ bonded to each other.

Here, $R^{11}$ to $R^{15}$ each independently represent a hydrogen atom or a hydrocarbon group having 1 to 20 carbon atoms, Z represents a hydrocarbon group or a hydrocarbon group substituted by halogen, W represents $Si(R^{16})_pD_{(3-p)}$ ($R^{16}$ represents a hydrocarbon group having 1 to 10 carbon atoms, D represents a halogen atom, —$OCOR^{17}$, or —$OR^{17}$ ($R^{17}$ represents a hydrocarbon group having 1 to 10 carbon atoms), and p is an integer of 0 to 3). n is an integer of 0 to 10, preferably 0 to 8, and more preferably 0 to 6.

In General Formulae (A-II) and (A-III), $R^3$ to $R^6$ are each preferably a hydrogen atom or —$CH_3$, and, from the viewpoint of moisture permeability, more preferably a hydrogen atom.

$X^2$ and $X^3$ are each preferably a hydrogen atom, —$CH_3$, or —$C_2H_5$ and, from the viewpoint of moisture permeability, more preferably a hydrogen atom.

$Y^2$ and $Y^3$ are each preferably a hydrogen atom, a halogen atom (particularly a chlorine atom), or —$(CH_2)_nCOOR^{11}$ (particularly —$COOCH_3$) and, from the viewpoint of moisture permeability, more preferably a hydrogen atom.

Other groups are appropriately selected.

The polymer having the structural unit represented by General Formula (A-II) or (A-III) may further include at least one or more structural units represented by General Formula (A-I).

General Formula (A-I)

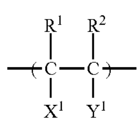

In General Formula (A-I), $R^1$ and $R^2$ each independently represent a hydrogen atom or a hydrocarbon group having 1 to 10 carbon atoms, and $X^1$ and $Y^1$ each independently represent a hydrogen atom, a hydrocarbon group having 1 to 10 carbon atoms, a halogen atom, a hydrocarbon group having 1 to 10 carbon atoms which is substituted by a halogen atom, —$(CH_2)_nCOOR^{11}$, —$(CH_2)_nOCOR^{12}$, —$(CH_2)_nNCO$, —$(CH_2)_nNO_2$, —$(CH_2)_nCN$, —$(CH_2)_nCONR^{13}R^{14}$, —$(CH_2)_nNR^{13}R^{14}$, —$(CH_2)_nOZ$, —$(CH_2)_nW$, or $(—CO)_2O$ or $(—CO)_2NR^{15}$ which is formed by $X^1$ and $Y^1$ bonded to each other.

Here, $R^{11}$ to $R^{15}$ each independently represent a hydrogen atom or a hydrocarbon group having 1 to 20 carbon atoms, Z represents a hydrocarbon group or a hydrocarbon group substituted by halogen, W represents $Si(R^{16})_pD_{(3-p)}$ ($R^{16}$ represents a hydrocarbon group having 1 to 10 carbon atoms, D represents a halogen atom, —$OCOR^7$, or —$OR^{17}$ ($R^7$ represents a hydrocarbon group having 1 to 10 carbon atoms), and p is an integer of 0 to 3). n is an integer of 0 to 10.

From the viewpoint of adhesiveness to a polarizer, the content of the structural unit derived from a norbornene compound in the cyclic polyolefin having the structural unit represented by General Formula (A-II) or (A-III) is preferably 90% by mass or less, more preferably 30% to 85% by mass, still more preferably 50% to 79% by mass, and most preferably 60% to 75% by mass with respect to the total mass of the cyclic polyolefin. Here, the proportion of the structural unit derived from a norbornene compound represents the average value in the cyclic polyolefin.

The addition (co)polymer of a norbornene compound is described in JP1998-7732A (JP-H10-7732A), JP2002-504184A, US2004/229157A1A, and WO2004/070463A.

The polymer of a norbornene compound is obtained by the addition polymerization of norbornene compounds (for example, polycyclic unsaturated compounds of norbornene).

In addition, as the polymer of a norbornene compound, copolymers obtained by the addition copolymerization of, as necessary, a norbornene compound, olefin such as ethylene, propylene, and butene, conjugated diene such as butadiene and isoprene, unconjugated diene such as ethylidene norbornene, and an ethylenically unsaturated compound such as acrylonitrile, acrylic acid, methacrylic acid, maleic acid anhydride, acrylic acid ester, methacrylic acid ester, maleimide, vinyl acetate, and vinyl chloride are exemplified. Among these, copolymers of a norbornene compound and ethylene are preferable.

Examples of the addition (co)polymers of a norbornene compound include APL8008T (Tg: 70° C.), APL6011T (Tg: 105° C.), APL6013T (Tg: 125° C.), and APL6015T (Tg: 145° C.) which are launched by Mitsui Chemicals, Inc. under a trade name of APEL and have mutually different glass transition temperatures (Tg). In addition, pellets such as TOPAS8007, TOPAS6013, and TOPAS6015 are put on the market by Polyplastics Co., Ltd. Further, Appear 3000 is put on the market by Film Ferrania S. R. L.

As the polymer of a norbornene compound, commercially available products can be used. For example, polymers are put on the market by JSR Corporation under a trade name of Arton G or Arton F, and polymers are put on the market by Zeon Corporation under a trade name of Zeonor ZF14, ZF16, Zeonex 250, or Zeonex 280.

The hydride of a polymer of a norbornene compound can be synthesized by the addition polymerization or the metathesis ring-opening polymerization of a norbornene compound or the like and then the addition of hydrogen. The synthesis method is described in, for example, JP1989-240517A (JP-H1-240517A), JP1995-196736A (JP-H7-196736A), JP1985-26024A (JP-S60-26024A), JP1987-19801A (JP-S62-19801A), JP2003-159767A, JP2004-309979A, and the like.

The molecular weight of the cyclic polyolefin is appropriately selected depending on the intended use, and is a mass average molecular weight measured in terms of polyisoprene or polystyrene by the gel permeation chromatography of a cyclohexane solution (a toluene solution in a case where the polymer is not dissolved). The molecular weight is in a range of, usually, 5000 to 500000, preferably 8000 to 200000, and more preferably 10000 to 100000. A polymer having a molecular weight in the above-mentioned range is capable of satisfying both the mechanical strength of a molded body and the molding workability of compacts at a high level in a well-balanced manner.

In the wavelength selective absorption layer, the content of the matrix resin is preferably 5% by mass or more, more preferably 20% by mass or more, still more preferably 50% by mass or more, particularly preferably 70% by mass or more, especially preferably 80% by mass, and most preferably 90% by mass or more.

The content of the matrix resin in the wavelength selective absorption layer is usually 99.90% by mass or less, and preferably 99.85% by mass or less.

The cyclic polyolefin contained in the wavelength selective absorption layer may be two or more types, and polymers having different at least one of a compositional ratio or a molecular weight may be used in combination. In this case, the total content of the respective polymers is in the above range.

(Extensible Resin Component)

The wavelength selective absorption layer can appropriately select and contain a component exhibiting extensibility (also referred to as an extensible resin component) as a resin component. Specific examples thereof include an acrylonitrile-butadiene-styrene resin (ABS resin), a styrene-butadiene resin (SB resin), an isoprene resin, a butadiene resin, a polyether-urethane resin, a silicone resin, and the like. Further, these resins may be further hydrogenated as appropriate.

As the extensible resin component, it is preferable to use the ABS resin or the SB resin, and it is more preferable to use the SB resin.

As the SB resin, for example, a commercially available one can be used. As such commercially available products, TR2000, TR2003, and TR2250 (all, trade name, manufactured by JSR Corporation), CLEAREN 210M, 220M, and 730V (all, trade name, manufactured by Denka Corporation), Asaflex 800S, 805, 810, 825, 830, and 840 (all, trade name, manufactured by Asahi Kasei Corporation), EPOREX SB2400, SB2610, and SB2710 (all, trade name, Sumitomo Chemical Co., Ltd.), and the like can be exemplified.

The wavelength selective absorption layer preferably contains an extensible resin component in the matrix resin in an amount of 15% to 95% by mass, more preferably 20% to 50% by mass, and still more preferably 25% to 45% by mass.

As the extensible resin component, in a case where a sample having a form with a thickness of 30 μm and a width of 10 mm is prepared by using the extensible resin component alone and the breaking elongation at 25° C. is measured in accordance with JIS 7127, a component having the breaking elongation of 10% or more is preferable, and a component having the breaking elongation of 20% or more is more preferable.

(Peelability Control Resin Component)

The wavelength selective absorption layer can preferably contain a component that controls the peelability (peelability control resin component), as a resin component, in a case where the wavelength selective absorption layer is prepared by a method including a step of peeling the wavelength selective absorption layer from a release film, among manufacturing methods for the wavelength selective absorption layer according to the embodiment of the present invention described later. By controlling the peelability of the wavelength selective absorption layer from the release film, it is possible to prevent a peeling mark from being left on the wavelength selective absorption layer after peeling, and it is possible to cope with various processing speeds in the peeling step. As a result, a preferable effect can be obtained for improving the quality and productivity of the wavelength selective absorption layer.

The peelability control resin component is not particularly limited and can be appropriately selected depending on the type of the release film. In a case where a polyester-based polymer film is used as the release film as described later, for example, a polyester resin (also referred to as a polyester-based additive) is suitable as the peelability control resin component. In addition, in a case where a cellulosic polymer film is used as the release film as described later, for example, a hydrogenated styrene-based thermoplastic elastomer (also referred to as a hydrogenated styrene-based additive) is suitable as the peelability control resin component, and the description of the hydrogenated polystyrene in the polystyrene resin as the resin contained in the wavelength selective absorption layer can be applied.

The polyester-based additive can be obtained by a conventional method such as a dehydration condensation reaction of a polyhydric basic acid and a polyhydric alcohol and an addition of a dibasic anhydride to a polyhydric alcohol and a dehydration condensation reaction, and a polycondensation ester formed from a dibasic acid and a diol is preferable.

The mass average molecular weight (Mw) of the polyester-based additive is preferably 500 to 50,000, more preferably 750 to 40,000, and still more preferably 2,000 to 30,000. In a case where the mass average molecular weight of the polyester-based additive is equal to or more than the above-mentioned preferable lower limit value, it is preferable from the viewpoint of brittleness and moisture-heat resistance, and in a case where the mass average molecular weight thereof is equal to or less than the above-mentioned preferable upper limit value, it is preferable from the viewpoint of compatibility with the resin.

The mass average molecular weight of the polyester-based additive is a value of the mass average molecular weight (Mw) in terms of standard polystyrene measured under the following conditions. The molecular weight distribution (Mw/Mn) can also be measured under the same conditions. Mn is a standard polystyrene-equivalent number average molecular weight.

GPC: Gel permeation chromatograph device (HLC-8220GPC manufactured by Tosoh Corporation,
column: Guard column HXL-H manufactured by Tosoh Corporation, TSK gel G7000HXL, TSK gel GMHXL 2 pieces, TSK gel G2000HXL are connected in sequence,
eluent: tetrahydrofuran,
flow velocity: 1 mL/min,
sample concentration: 0.7-0.8% by mass,
sample injection volume: 70 μL,
measurement temperature: 40° C.,
detector: differential refractometer (RI) meter (40° C.), and
standard substance: TSK standard polystyrene manufactured by Tosoh Corporation)

As the dibasic acid component constituting the polyester-based additive, dicarboxylic acid can be preferably exemplified.

Examples of the dicarboxylic acid include an aliphatic dicarboxylic acid and an aromatic dicarboxylic acid, and an aromatic dicarboxylic acid or a mixture of an aromatic dicarboxylic acid and an aliphatic dicarboxylic acid can be preferably used.

Among the aromatic dicarboxylic acids, an aromatic dicarboxylic acid having 8 to 20 carbon atoms is preferable, and an aromatic dicarboxylic acid having 8 to 14 carbon atoms is more preferable. Specifically, at least one of phthalic acid, isophthalic acid, or terephthalic acid is preferably exemplified.

Among the aliphatic dicarboxylic acids, an aliphatic dicarboxylic acid having 3 to 8 carbon atoms is preferable, and an aliphatic dicarboxylic acid having 4 to 6 carbon atoms is more preferable. Specifically, at least one of succinic acid, maleic acid, adipic acid, or a glutaric acid is preferably exemplified, and at least one of succinic acid or adipic acid is more preferable.

Examples of the diol component constituting the polyester-based additive include an aliphatic diol and an aromatic diol, and aliphatic diol is preferable.

Among the aliphatic diols, an aliphatic diol having 2 to 4 carbon atoms is preferable, and an aliphatic diol having 2 to 3 carbon atoms is more preferable.

Examples of the aliphatic diol include ethylene glycol, diethylene glycol, 1,2-propylene glycol, 1,3-propylene glycol, 1,3-butylene glycol, and 1,4-butylene glycol. These aliphatic diols can be used alone or two or more types can be used in combination.

The polyester-based additive is particularly preferably a compound obtained by condensing at least one of phthalic acid, isophthalic acid, or terephthalic acid with an aliphatic diol.

The terminal of the polyester-based additive may be sealed by reacting with a monocarboxylic acid. As the monocarboxylic acid used for sealing, an aliphatic monocarboxylic acid, preferably acetic acid, propionic acid, butanoic acid, benzoic acid, and a derivative thereof is preferably exemplified, acetic acid or propionic acid is more preferable, acetic acid is still more preferable.

Examples of commercially available polyester-based additives include ester-based resin polyesters manufactured by Nippon Synthetic Chemical Industry Co., Ltd. (for example, LP050, TP290, LP035, LP033, TP217, and TP220) and ester-based resin Byron manufactured by Toyobo Co., Ltd. (for example, Byron 245, Byron GK890, Byron 103, Byron 200, and Byron 550. GK880), and the like.

The content of the peelability control resin component in the wavelength selective absorption layer is preferably 0.05% by mass or more, and more preferably 0.1% by mass or more in the matrix resin. In addition, an upper limit value thereof is preferably 25% by mass or less, more preferably 20% by mass or less, and still more preferably 15% by mass or less. From the viewpoint of obtaining appropriate adhesiveness, the above-mentioned preferable range is preferable.

<Antifading Agent>

The wavelength selective absorption layer contains the antifading agent for a dye (simply also referred to as an antifading agent) in order to prevent the fading of the dye containing at least one of the dyes A to D.

As the antifading agent, it is possible to use commonly used antifading agents without particular limitation, such as antioxidants described in paragraphs 0143 to 0165 of WO2015/005398A, the radical scavengers described in paragraphs 0166 to 0199 of WO2015/005398A, and the deterioration preventing agents described in paragraphs 0205 to 0206 of WO2015/005398A.

The compound represented by General Formula (IV) below can be preferably used as the antifading agent.

General Formula (IV)

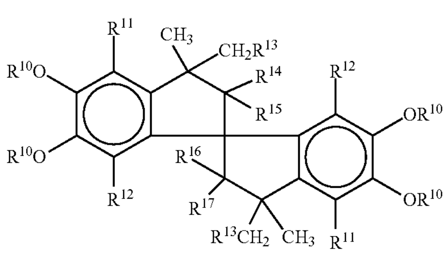

In Formula (IV), $R^{10}$ represents an alkyl group, an alkenyl group, an aryl group, a heterocyclic group, or a group represented by $R^{18}CO$—, $R^{19}SO_2$— or $R^{20}NHCO$—. Here, $R^{18}$, $R^{19}$, and $R^{20}$ each independently represent an alkyl group, an alkenyl group, an aryl group, or a heterocyclic group. $R^{11}$ and $R^{12}$ each independently represent a hydrogen atom, a halogen atom, an alkyl group, an alkenyl group, an alkoxy group, or an alkenyloxy group, and $R^{13}$, $R^{14}$, $R^{15}$, $R^{16}$, and $R^{17}$ each independently represent a hydrogen atom, an alkyl group, an alkenyl group, or an aryl group.

However, the alkyl group in $R^{10}$ to $R^{20}$ includes an aralkyl group.

As the alkyl group represented by $R^{10}$ in Formula (IV), for example, methyl, ethyl, propyl, and benzyl; as the alkenyl group, for example, allyl; as the aryl group, for example, phenyl; and as the heterocyclic group, for example, tetrahydropyranyl, and pyrimidyl may be exemplified. $R^{18}$, $R^{19}$, and $R^{20}$ each independently represent an alkyl group (for example, methyl, ethyl, n-propyl, n-butyl, or benzyl), an alkenyl group (for example, allyl), an aryl group (for example, phenyl, or methoxyphenyl), or a heterocyclic group (for example, pyridyl, or pyrimidyl).

As the halogen atom represented by $R^{11}$ and $R^{12}$ in Formula (IV), for example, chlorine and bromine; as the alkyl group, for example, methyl, ethyl, n-butyl, and benzyl; as the alkenyl group, for example, allyl; as the alkoxy group, for example, methoxy, ethoxy, and benzyloxy; and as the alkenyloxy group, for example, 2-propenyloxy may be exemplified.

As the alkyl group represented by $R^{13}$, $R^{14}$, $R^{15}$, $R^{16}$, and $R^{17}$ in Formula (IV), for example, methyl, ethyl, n-butyl, and benzyl; as the alkenyl group, for example, 2-propenyl; and as the aryl group, for example, phenyl, methoxyphenyl, and chlorophenyl may be exemplified.

$R^{10}$ to $R^{20}$ may further have a substituent, and examples of the substituent include each group represented by $R^{10}$ to $R^{20}$.

Specific examples of the compound represented by General Formula (IV) are shown below. However, the present invention is not limited thereto.

General Formula (IV)

IV-1

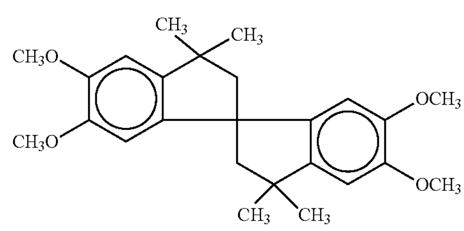

IV-2

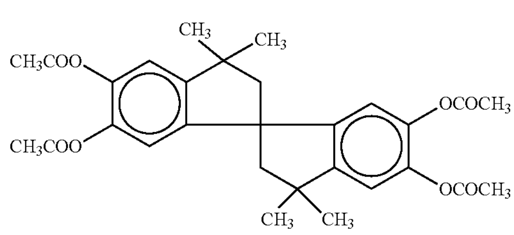

-continued

IV-3

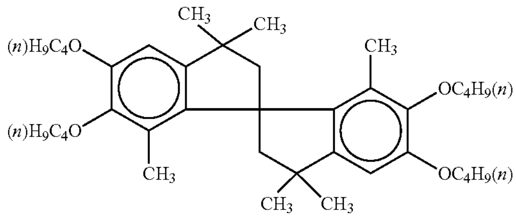

IV-4

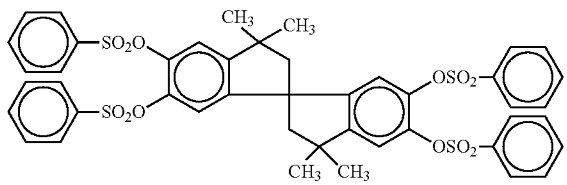

IV-5

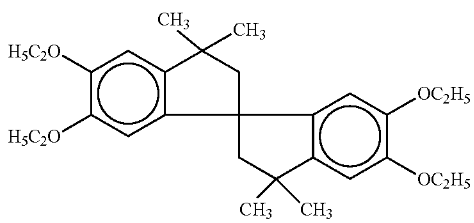

IV-6

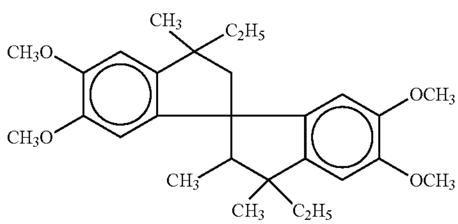

IV-7

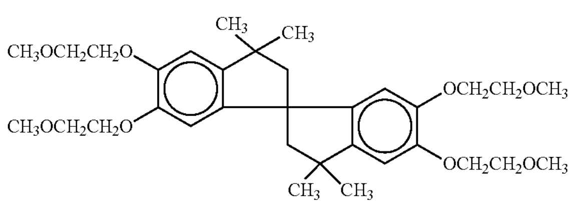

IV-8

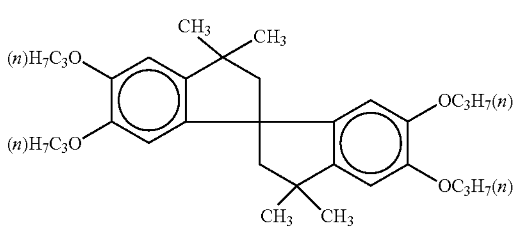

IV-9

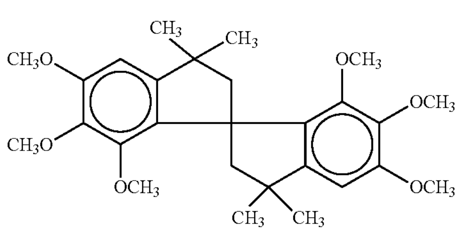

As the antifading agent, the compound represented by General Formula [III] below can also be preferably used.

General Formula [III]

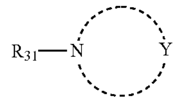

In General Formula [III], $R_{31}$ represents an aliphatic group or an aromatic group, and Y represents a group of non-metal atoms necessary for forming a 5- to 7-membered ring with a nitrogen atom.

Next, in General Formula [III], $R_{31}$ represents an aliphatic group or an aromatic group, and is preferably an alkyl group, an aryl group, or a heterocyclic group (preferably, an aliphatic heterocyclic group), and more preferably an aryl group.

Examples of the heterocycle formed by Y together with the nitrogen atom include a piperidine ring, a piperazine ring, a morpholine ring, a thiomorpholine ring, a thiomorpholine-1,1-dione ring, a pyrrolidine ring, and an imidazolidine ring.

In addition, the heterocycle may further have a substituent, and examples of the substituent include an alkyl group and an alkoxy group.

Specific examples of the compound represented by General Formula [III] are shown below. However, the present invention is not limited thereto.

III-1

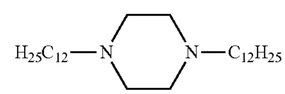

III-2

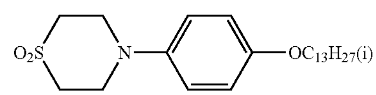

III-3

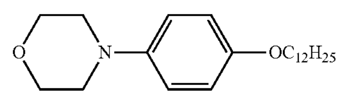

III-4

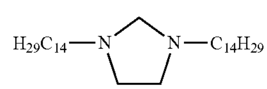

III-5

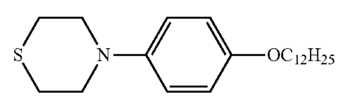

In addition to the above specific examples, specific examples of the compound represented by General Formula [III] above include exemplary compounds B-1 to B-65 described on pages 8 to 11 of JP2004-167543A (JP-H02-167543A), and exemplary compounds (1) to (120) described on pages 4 to 7 of JP1988-95439A (JP-S63-95439A).

The content of the antifading agent in the wavelength selective absorption layer is preferably 1% to 15% by mass, more preferably 5% to 15% by mass, still more preferably 5% to 12.5% by mass, particularly preferably 8% to 12.5% by mass, and especially preferably 10% to 12.5% by mass, in 100% by mass of the total mass of the wavelength selective absorption layer.

By containing the antifading agent within the preferable ranges, the laminate according to the embodiment of the present invention can improve the light resistance of the dye (coloring agent) without causing side effects such as discoloration of the wavelength selective absorption layer.

<Other Components>

The wavelength selective absorption layer may contain a matting agent, a leveling agent (surfactant), and the like, in addition to the above-mentioned dye, the matrix resin, and the antifading agent for a dye.

(Matting Agent)

It is preferable to add fine particles to the surface of the wavelength selective absorption layer in order to impart sliding properties and prevent blocking. As the fine particles, silica (silicon dioxide, $SiO_2$) whose surface is coated with a hydrophobic group and which is in the form of secondary particles is preferably used. As the fine particles, in addition to or instead of silica, fine particles of titanium dioxide, aluminum oxide, zirconium oxide, calcium carbonate, tale, clay, calcined kaolin, calcined calcium silicate, hydrated calcium silicate, aluminum silicate, magnesium silicate, and calcium phosphate may be used. Examples of commercially available products of the fine particles include the R972 or NX90S (trade name, both manufactured by Nippon Aerosil Co., Ltd.).

The fine particles function as a so-called matting agent, and the addition of the fine particles forms minute unevenness on the surface of the wavelength selective absorption layer. Due to the unevenness, even in a case where the wavelength selective absorption layers overlap each other or the wavelength selective absorption layer of the present invention and other films overlap each other, the films do not stick to each other and sliding properties are secured.

In a case where the wavelength selective absorption layer contains a matting agent as fine particles, and in the fine irregularities due to the protrusions in which fine particles protrude from the filter surface, there are $10^4/mm^2$ or more of protrusions having a height of 30 nm or more, the effect of improving sliding properties and blocking property is particularly large.

It is preferable to apply the matting agent fine particles particularly to the surface layer in order to improve the blocking properties and the sliding properties. As a method of applying the fine particles to the surface layer, there are methods such as multilayer casting and coating.

The content of the matting agent in the wavelength selective absorption layer is appropriately adjusted according to the purpose.

However, in the laminate according to the embodiment of the present invention, it is preferable to apply the above-mentioned matting agent fine particles to the surface of the wavelength selective absorption layer in contact with the gas barrier layer as long as the effect of the present invention is not impaired.

(Leveling Agent)

A leveling agent (surfactant) can be appropriately mixed with the wavelength selective absorption layer. As the leveling agent, commonly used compounds can be used, and a fluorine-containing surfactant is particularly preferable. Specific examples thereof include the compounds described in paragraphs 0028 to 0056 of JP2001-330725A.

The content of the leveling agent in the wavelength selective absorption layer is appropriately adjusted according to the purpose.

The wavelength selective absorption layer may contain, in addition to the above components, a low-molecular plasticizer, an oligomer-based plasticizer, a retardation modifier, an ultraviolet absorber, a deterioration preventing agent, a peeling accelerator, an infrared absorber, an antioxidant, a filler, a compatibilizer, and the like.

<Manufacturing Method of Wavelength Selective Absorption Layer>

The wavelength selective absorption layer can be prepared by a solution film forming method, a melt extrusion method, or a method of forming a coating layer on a substrate film (release film) (coating method) according to a predetermined method, according to a conventional method, and stretching can also be appropriately combined. The wavelength selective absorption layer is preferably prepared by a coating method.

(Solution Film Forming Method)

In the solution film forming method, a solution in which a material of the wavelength selective absorption layer is dissolved in an organic solvent or water is prepared, a concentration step, a filtration step, and the like are appropriately performed, and then the solution is uniformly cast on a support. Next, the raw dry film is peeled off from the support, both ends of a web are appropriately held by clips or the like, and the solvent is dried in the drying zone. In addition, stretching can be performed separately while or after the film is dried.

(Melt Extrusion Method)

In the melt extrusion method, the material of the wavelength selective absorption layer is melted by heat, a filtration step and the like are appropriately performed, and then the material is uniformly cast on a support. Next, a film solidified by cooling or the like can be peeled off and appropriately stretched. In a case where the main material of the wavelength selective absorption layer is a thermoplastic polymer resin, a thermoplastic polymer resin can be selected as the main material of the release film, and the polymer resin in a molten state can be formed into a film by a known co-extrusion method. At this case, by adjusting the polymer type of the wavelength selective absorption layer and the release film and the additives mixed in each layer, or by adjusting the stretching temperature, the stretching speed, the stretching ratio, and the like of the co-extruded film, the adhesive force between the wavelength selective absorption layer and the release film can be controlled.

Examples of the co-extrusion method include a co-extrusion T-die method, a co-extrusion inflation method, and a co-extrusion lamination method. Among these, the co-extrusion T-die method is preferable. The co-extrusion T-die method includes a feed block method and a multi-manifold method. Among these, the multi-manifold method is particularly preferable from the viewpoint that a variation in thickness can be reduced.

In a case where the co-extrusion T-die method is adopted, the melting temperature of the resin in an extruder having a T-die is preferably a temperature 80° C. or more higher, and more preferably a temperature 100° C. or more higher than the glass transition temperature (Tg) of each resin, and is preferably a temperature equal to or lower than a temperature 180° C. higher than the glass transition temperature, and more preferably a temperature equal to or lower than a temperature 150° C. higher than the glass transition temperature. By setting the melting temperature of the resin in the extruder to the lower limit value or greater in the above preferable range, the fluidity of the resin can be sufficiently enhanced, and by setting the melting temperature to the upper limit value or less of the above preferable range, the resin can be prevented from being deteriorated.

Usually, the sheet-like molten resin extruded from the opening portion of the die is brought into close contact with the cooling drum. The method of bringing the molten resin into close contact with the cooling drum is not particularly limited, and examples thereof include an air knife method, a vacuum box method, and an electrostatic contact method.

The number of cooling drums is not particularly limited, but is usually 2 or more. In addition, the method of arranging the cooling drum is not particularly limited and examples thereof include a linear arrangement, a Z-shaped arrangement, and an L-shaped arrangement. Further, the method of passing the molten resin extruded from the opening portion of the die through the cooling drum is not particularly limited.

The degree of close contact of the extruded sheet-like resin with the cooling drum changes depending on the temperature of the cooling drum. In a case where the temperature of the cooling drum is raised, the intimate attachment is improved, but in a case where the temperature is raised too much, the sheet-like resin may not be peeled off from the cooling drum and may be wound around the drum. Therefore, the temperature of the cooling drum is preferably (Tg+30°) C or lower, and still more preferably in a range of (Tg−5°) C to (Tg−45°) C in a case where Tg is the glass transition temperature of the resin of the layer that is brought into contact with the drum in the resin extruded from the die. By setting the cooling drum temperature within the above preferable range, problems such as slippage and scratches can be prevented.

Here, it is preferable to reduce the content of the residual solvent in the film before stretching. Examples of a method of reducing the content include methods of (1) reducing the amount of the residual solvent of the resin as the raw material; and (2) predrying the resin before forming the film before stretching. Predrying is performed, for example, in the form of pellets of resin and using a hot air dryer or the like. The drying temperature is preferably 100° C. or higher, and the drying time is preferably 2 hours or longer. By performing the predrying, it is possible to reduce the residual solvent in the film before stretching and to prevent the extruded sheet-like resin from foaming.

(Coating Method)

In the coating method, a solution of a material of the wavelength selective absorption layer is applied to a release film to form a coating layer. A release agent or the like may be appropriately applied to the surface of the release film in advance in order to control the adhesiveness to the coating layer. The coating layer can be used by peeling off the release film after being laminated with another member through an adhesive layer in a later step. A predetermined adhesive can be appropriately used as the adhesive constituting the adhesive layer. The release film can be appropriately stretched together with the release film coated with the solution of the material of the wavelength selective absorption layer or with the coating layer laminated.

The solvent used for the solution of the material of the wavelength selective absorption layer can be appropriately selected from the viewpoints that the material of the wavelength selective absorption layer can be dissolve or dispersed, a uniform surface shape can be easily achieved during the coating step and drying step, liquid storability can be secured, an appropriate saturated vapor pressure is provided, and the like.

—Addition of Dye (Coloring Agent) and Antifading Agent—

The timing of adding the dye and the antifading agent to the material of the wavelength selective absorption layer is not particularly limited as long as the dye and and the antifading agent are added at the time of film formation. For example, the dye may be added at the time of synthesizing the matrix resin, or may be mixed with the material of the wavelength selective absorption layer at the time of preparing the coating liquid for the material of the wavelength selective absorption layer.

—Release Film—

The release film used for forming the wavelength selective absorption layer according to the embodiment of the present invention by a coating method or the like preferably has a film thickness of 5 to 100 μm, more preferably 10 to 75 μm, and still more preferably 15 to 55 μm. In a case where the film thickness is equal to or more than the preferable lower limit value, sufficient mechanical strength can be easily secured, and failures such as curling, wrinkling, and buckling are less likely to occur. In addition, in a case where the film thickness is equal to or less than the preferable upper limit value, in the storage of a multilayer film of the release film and the wavelength selective absorption layer, for example, in the form of a long roll, the surface pressure applied to the multilayer film is easily adjusted to be in an appropriate range, and adhesion defect is less likely to occur.

The surface energy of the release film is not particularly limited, and by adjusting the relationship between the surface energy of the material of the wavelength selective absorption layer or the coating solution and the surface energy of the surface of the release film on which the wavelength selective absorption layer is to be formed, the adhesive force between the wavelength selective absorption layer and the release film can be adjusted. In a case where the surface energy difference is reduced, the adhesive force tends to increase, and in a case where the surface energy difference is increased, the adhesive force tends to decrease, and thus the surface energy can be set appropriately.

The surface energy of the release film can be calculated from the contact angle value between water and methylene iodide using the method of Owens. For measurement of the contact angle, for example, DM901 (contact angle meter, manufactured by Kyowa Interface Science Co., Ltd.) can be used.

The surface energy of the surface of the release film on which the wavelength selective absorption layer is to be formed is preferably 41.0 to 48.0 mN/m and more preferably 42.0 to 48.0 mN/m. In a case where the surface energy is equal to or more than the preferable lower limit value, the evenness of the thickness of the wavelength selective absorption layer is increased. In a case where the surface energy is equal to or less than the preferable upper limit value, it is easy to control the peeling force of the wavelength selective absorption layer from the release film within an appropriate range.

The surface unevenness of the release film is not particularly limited, and depending on the relationship between the surface energy of the wavelength selective absorption layer surface, the hardness, and the surface unevenness, and the surface energy and hardness of the surface of the release film opposite to the side on which the wavelength selective absorption layer is formed, for example, in order to prevent adhesion defect in a case where the multilayer film of the release film and the wavelength selective absorption layer is stored in the form of a long roll, the surface unevenness of the release film can be adjusted. In a case where the surface unevenness is increased, adhesion defect tends to be suppressed, and in a case where the surface unevenness is reduced, the surface unevenness of the wavelength selective absorption layer tends to decrease and the haze of the wavelength selective absorption layer tends to be small. Thus, the surface unevenness can be set appropriately.

For such a release film, predetermined materials and films can be appropriately used. Specific examples of materials include a polyester-based polymer (including polyethylene terephthalate-based film), an olefin-based polymer, a cyclo olefin-based polymer, a (meth)acrylic polymer, a cellulose-based polymer, and a polyamide-based polymer. In addition, a surface treatment can be appropriately performed for the purpose of adjusting the surface properties of the release film. For example, a corona treatment, a room temperature plasma treatment, a saponification treatment, and the like can be performed to lower the surface energy, and a silicone treatment, a fluorine treatment, an olefin treatment, and the like can be performed to raise the surface energy.

—Peeling Force Between Wavelength Selective Absorption Layer and Release Film—

In a case where the wavelength selective absorption layer is formed by a coating method, the peeling force between the wavelength selective absorption layer and the release film can be controlled by adjusting the material of the wavelength selective absorption layer, the material of the release film, the internal strain of the wavelength selective absorption layer, and the like. The peeling force can be measured in, for example, a test of peeling off the release film in a direction of 90°, and the peeling force as measured at a speed of 300 mm/min is preferably 0.001 to 5 N/25 mm, more preferably 0.01 to 3 N/25 mm, and still more preferably 0.05 to 1 N/25 mm. In a case where the peeling force is equal to or greater than at least the above preferable lower limit value, peeling off the release film in a step other than the peeling step can be prevented, and in a case where the peeling force is equal to or smaller than the above preferable upper limit value, peeling failure in the peeling step (for example, zipping and cracking of the wavelength selective absorption layer) can be prevented.

<Film Thickness of Wavelength Selective Absorption Layer>

The film thickness of the wavelength selective absorption layer is not particularly limited, and is preferably 1 to 18 μm, more preferably 1 to 12 μm, and still more preferably 2 to 8 μm. In a case where the film thickness is equal to or less than the above preferable upper limit value, the decrease in the degree of polarization due to the fluorescence emitted by the dye (coloring agent) can be suppressed by adding the dye to the thin film at a high concentration. In addition, the effects of the quencher and the antifading agent are easily exhibited. On the other hand, in a case where the film thickness is equal to or more than the above preferable lower limit value, it becomes easy to maintain the evenness of the in-plane absorbance.

In the present invention, the film thickness of 1 to 18 μm means that the thickness of the wavelength selective absorption layer is within a range of 1 to 18 μm at any portion. The same applies to the film thicknesses of 1 to 12 μm and 2 to 8 μm. The film thickness can be measured with an electronic micrometer manufactured by Anritsu Corporation.

<Absorbance of Wavelength Selective Absorption Layer>

In the wavelength selective absorption layer, an absorbance at a wavelength of 450 nm is preferably 0.05 or more and 3.0 or less, more preferably 0.1 or more and 2.0 or less, and even more preferably 0.1 or more and 1.0 or less.

The absorbance at a wavelength of 590 nm is preferably 0.1 or more and 3.0 or less, more preferably 0.2 or more and 2.0 or less, and still more preferably 0.3 or more and 1.5 or less.

By incorporating the wavelength selective absorption layer whose absorbance is adjusted to the above range into the OLED display device, the original tint of the image of the OLED display device can be maintained at an excellent level, and display performance in which the brightness is higher and the external light reflection is further suppressed can be obtained.

The absorbance of the wavelength selective absorption layer can be adjusted by the type or amount of dye added.

<Moisture Content of Wavelength Selective Absorption Layer>

From the viewpoint of the durability, the moisture content of the wavelength selective absorption layer is preferably 0.5% by mass or less, and more preferably 0.3% by mass or less, in conditions of 25° C. and 80% relative humidity, regardless of the film thickness.

In the specification, the moisture content of the wavelength selective absorption layer can be measured by using a sample having a thick film thickness as necessary. The moisture content can be calculated by humidity-conditioning the sample for 24 hours or longer, then measuring a moisture content (g) by the Karl Fischer method with a water measuring instrument and a sample drying apparatus "CA-03" and "VA-05" (both manufactured by Mitsubishi Chemical Corporation), and dividing the moisture content (g) by the sample mass (g, including the moisture content).

<Glass Transition Temperature (Tg) of Wavelength Selective Absorption Layer>

The glass transition temperature of the wavelength selective absorption layer is preferably 50° C. or higher and 140° C. or lower. More preferably, the glass transition temperature is 60° C. or higher and 130° C. or lower, and more preferably 70° C. or higher and 120° C. or lower. In a case where the glass transition temperature is equal to or higher than the above preferable lower limit value, deterioration of the polarizer in a case of being used at a high temperature can be suppressed, and in a case where the glass transition temperature is equal to or lower than the above preferable upper limit value, it is possible to suppress that the organic solvent used in the coating liquid easily remains in the wavelength selective absorption layer. The glass transition temperature of the wavelength selective absorption layer can be measured by the following method.

With a differential scanning calorimetry device (X-DSC7000 (manufactured by IT Measurement Control Co., Ltd.)), 20 mg of a wavelength selective absorption layer is placed in a measurement pan, and the temperature of the pan is raised from 30° C. to 120° C. in a nitrogen stream at a speed of 10° C./min, and held for 15 minutes, and then cooled to 30° C. at −20° C./min. Thereafter, the temperature is raised again from 30° C. to 250° C. at a speed of 10° C./min, and the temperature at which the baseline began to deviate from the low temperature side was defined as the glass transition temperature Tg.

The glass transition temperature of the wavelength selective absorption layer can be adjusted by mixing two or more kinds of polymers having different glass transition temperatures, or by changing the amount of a small molecule compound such as an antifading agent added.

<Treatment of Wavelength Selective Absorption Layer>

It is preferable that the wavelength selective absorption layer is subjected to, for example, a hydrophilic treatment by a predetermined glow discharge treatment, corona discharge treatment, alkali saponification treatment, or the like, and a corona discharge treatment is most preferably used. It is also preferable to apply the method disclosed in JP1994-94915A (JP-H06-94915A) and JP1994-118232A (JP-H06-118232A).

If necessary, the obtained film may be subjected to a heat treatment step, a superheated steam contact step, an organic solvent contact step, or the like. In addition, a surface treatment may be suitably performed.

Further, as the pressure sensitive adhesive layer, a layer consisting of a pressure sensitive adhesive composition in which a (meth)acrylic resin, a styrene-based resin, a silicone-based resin, or the like is used as a base polymer, and a crosslinking agent such as an isocyanate compound, an epoxy compound, or an aziridine compound is added thereto can be applied.

Preferably, the description of the pressure sensitive adhesive layer in the OLED display device described later can be applied.

<<Gas Barrier Layer>>

The laminate according to the embodiment of the present invention comprises a gas barrier layer on at least one surface of the wavelength selective absorption layer, and the gas barrier layer thereof contains the crystalline resin, has a layer thickness of 0.1 μm to 10 μm, and has a layer oxygen permeability of 60 cc/m$^2$·day·atm or less.

In the gas barrier layer, the "crystalline resin" is a resin having a melting point that undergoes a phase transition from a crystal to a liquid in a case where the temperature is raised, and can impart gas barrier properties related to oxygen gas to the gas barrier layer.

The laminate according to the embodiment of the present invention comprises the gas barrier layer at least on a surface where the wavelength selective absorption layer comes into contact with air in a case where the laminate according to the embodiment of the present invention is used. Accordingly, it is possible to suppress a decrease in an absorption intensity of a dye in the wavelength selective absorption layer. As long as the gas barrier layer is provided at an interface of the wavelength selective absorption layer in contact with air, the gas barrier layer may be provided on only one surface of the wavelength selective absorption layer, or may be provided on both surfaces.

(Crystalline Resin)

The crystalline resin contained in the gas barrier layer is a crystalline resin having gas barrier properties, and can be used without particular limitation as long as a desired oxygen permeability can be imparted to the gas barrier layer.

Examples of the crystalline resin can include polyvinyl alcohol and polyvinylidene chloride, and the polyvinyl alcohol is preferable from the viewpoint that a crystalline portion can effectively suppress the permeation of gas.

The polyvinyl alcohol may be modified or may not be modified. Examples of the modified polyvinyl alcohol include modified polyvinyl alcohol into which a group such as an acetoacetyl group and a carboxyl group is introduced.

A saponification degree of the polyvinyl alcohol is preferably 80.0 mol % or more, more preferably 90.0 mol % or more, still more preferably 97.0 mol % or more, and particularly preferably 98.0 mol % or more, from the viewpoint of further enhancing the oxygen gas barrier properties. An upper limit value is not particularly limited, and is practically 99.99 mol % or less. The saponification degree of the polyvinyl alcohol is a value calculated based on the method described in JIS K 6726 1994.

The gas barrier layer may contain any component usually contained in the gas barrier layer, as long as the effect of the present invention is not impaired. For example, in addition to the above crystalline resin, organic-inorganic hybrid materials such as an amorphous resin material and a sol-gel material, and inorganic materials such as $SiO_2$, $SiO_x$, SiON, $SiN_x$, and $Al_2O_3$ may be contained.

Further, the gas barrier layer may contain a solvent such as water and an organic solvent derived from a manufacturing step, as long as the effect of the present invention is not impaired.

The content of the crystalline resin in the gas barrier layer is, for example, preferably 90% by mass or more, and more preferably 95% by mass or more, in 100% by mass of the total mass of the gas barrier layer. An upper limit value is not particularly limited, and can be set to 100% by mass.

The oxygen permeability of the gas barrier layer is 60 cc/m$^2$·day·atm or less, preferably 50 cc/m$^2$·day·atm or less, more preferably 30 cc/m$^2$·day·atm or less, still more preferably 10 cc/m$^2$·day·atm or less, particularly preferably 5 cc/m$^2$·day·atm or less, and most preferably 1 cc/m$^2$·day·atm or less. A practical lower limit value is 0.001 cc/m$^2$·day·atm or more, and preferably, for example, is more than 0.05 cc/m$^2$·day·atm. In a case where the oxygen permeability is within the above preferable range, the light resistance can be further improved.

The oxygen permeability of the gas barrier layer is a value measured based on the gas permeability test method based on JIS K 7126-2 2006. As the measuring device, for example, an oxygen permeability measuring device OX-TRAN2/21 (trade name) manufactured by MOCON can be used. The measurement conditions are set to a temperature of 25° C. and a relative humidity of 50%.

For the oxygen permeability, (fm)/(s·Pa) can be used as the SI unit. It is possible to perform the conversion by (1 fm)/(s·Pa)=8.752 (cc)/(m$^2$·day·atm). fm is read as femtometre and represents 1 fm=$10^{-15}$ m.

The thickness of the gas barrier layer is preferably 0.5 μm to 5 μm, and more preferably 1.0 μm to 4.0 μm, from the viewpoint of further improving the light resistance. The thickness of the gas barrier layer is measured by a method described in Examples to be described later.

The degree of crystallinity of the crystalline resin contained in the gas barrier layer is preferably 25% or more, more preferably 40% or more, and still more preferably 45% or more. An upper limit value is not particularly limited, and is practically 55% or less, and preferably 50% or less.

The degree of crystallinity of the crystalline resin contained in the gas barrier layer is a value measured and calculated by the following method based on the method described in J. Appl. Pol. Sci., 81, 762 (2001).

Using a differential scanning calorimeter (DSC), a temperature of a sample peeled from the gas barrier layer is raised at 10° C./min over the range of 20° C. to 260° C., and a heat of fusion 1 is measured. In addition, as a heat of fusion 2 of a perfect crystal, a value described in J. Appl. Pol. Sci., 81, 762 (2001) is used. Using the obtained heat of fusions 1 and 2, the degree of crystallinity is calculated b the following equation.

$$[\text{Degree of crystallinity}(\%)] = ([\text{heat of fusion 1}]/[\text{heat of fusion 2}]) \times 100$$

Specifically, the degree of crystallinity is a value measured and calculated by the method described in Examples to be described later. The heat of fusions 1 and 2 may be in the same unit, and usually $Jg^{-1}$.

<Manufacturing Method of Gas Barrier Layer>

The method of forming the gas barrier layer is not particularly limited, and examples thereof include a forming method using a casting method such as spin coating and slit coating, by a conventional method. In addition, examples thereof can include a method of bonding a commercially available resin gas barrier film or a resin gas barrier film prepared in advance to the wavelength selective absorption layer.

<Optical Film>

In addition to the wavelength selective absorption layer and the gas barrier layer, the laminate according to the embodiment of the present invention may appropriately comprise any optical film as long as the effect of the present invention is not impaired.

The predetermined optional optical film is not particularly limited in terms of any of optical properties and materials, and a film containing (or containing as a main component) at least any of a cellulose ester resin, an acrylic resin, a cyclic olefin resin, and a polyethylene terephthalate resin can be preferably used. An optically isotropic film or an optically anisotropic retardation film may be used.

For the above predetermined optical films, for example, Fujitac TD80UL, Fujitac TG60UL, Fujitac TJ40UL (all manufactured by FUJIFILM Corporation) or the like can be used as a film containing a cellulose ester resin.

Regarding the predetermined optical film, as those containing an acrylic resin, an optical film containing a (meth) acrylic resin containing a styrene-based resin described in JP4570042B, an optical film containing a (meth)acrylic resin having a glutarimide ring structure in a main chain described in JP5041532B, an optical film containing a (meth)acrylic resin having a lactone ring structure described in JP2009-122664A, and an optical film containing a (meth) acrylic resin having a glutaric anhydride unit in described in JP2009-139754A can be used.

Further, regarding the predetermined optical films, as those containing a cyclic olefin resin, cyclic olefin-based resin film described in paragraphs 0029 and subsequent paragraphs of JP2009-237376A, and cyclic olefin resin film containing an additive reducing Rth described in JP4881827B, JP2008-063536B can be used.

In addition, the above-mentioned optional optical film may contain an ultraviolet absorber. In the laminate according to the embodiment of the present invention, hereinafter, the layer or optical film containing the ultraviolet absorber is also referred to as an ultraviolet absorption layer. As the ultraviolet absorber, a commonly used compound can be used without particular limitation. Examples thereof include a hindered phenol-based compound, a hydroxybenzophenone-based compound, a benzotriazole-based compound, a salicylate ester-based compound, a benzophenone-based compound, a cyanoacrylate-based compound, and a nickel complex salt-based compound.

Examples of the hindered phenol-based compound include 2,6-di-tert-butyl-p-cresol, pentaerythrityl-tetrakis[3-(3,5-di-tert-butyl-4-hydroxyphenyl)propionate], N,N'-hexamethylene bis(3,5-di-tert-butyl-4-hydroxy-hydrocinnamide), 1,3,5-trimethyl-2,4,6-tris(3,5-di-tert-butyl-4-hydroxybenzyl)benzene, and tris-(3,5-di-tert-butyl-4-hydroxybenzyl)-isocyanurate. Examples of the benzotriazole-based compound include 2-(2'-hydroxy-5'-methylphenyl) benzotriazole, 2,2-methylene bis(4-(1,1,3,3-tetramethylbutyl)-6-(2H-benzotriazole-2-yl) phenol), (2,4-bis-(n-octylthio)-6-(4-hydroxy-3,5-di-tert-butylanilino)-1,3,5-triazine, triethyleneglycol-bis[3-(3-tert-butyl-5-methyl-4-hydroxyphenyl)propionate], N,N'-hexamethylene bis(3,5-di-tert-butyl-4-hydroxy-hydrocinnamide), 1,3,5-trimethyl-2,4,6-tris(3,5-di-tert-butyl-4-hydroxybenzyl)benzene, 2-(2'-hydroxy-3', 5'-Di-tert-butylphenyl)-5-chlorbenzotriazole, (2-(2'-hydroxy-3',5'-di-tert-amylphenyl)-5-chlorbenzotriazole, 2,6-di-tert-butyl-p-cresol, 2-[5-chloro-2H-benzotriazole-2-yl]-4-methyl-6-(tert-butyl)phenol, and pentaerythrityl-tetrakis[3-(3,5-di-tert-butyl-4-hydroxyphenyl) propionate]. The content of the ultraviolet absorber in the ultraviolet absorption layer is appropriately adjusted according to the purpose.

<<Manufacturing Method of Laminate>>

The laminate according to the embodiment of the present invention can be produced by using the above-mentioned manufacturing method of a wavelength selective absorption layer and the manufacturing method of a gas barrier layer.

Examples thereof include a method of directly producing the above-mentioned gas barrier layer on the wavelength selective absorption layer produced by the above-mentioned production method. In this case, it is also preferable to apply a corona treatment to the surface of the wavelength selective absorption layer to which the gas barrier layer is provided. Further, in a case where the above-mentioned optional optical film is provided, it is also preferable to perform bonding via a pressure sensitive adhesive layer. For example, it is also preferable to provide the gas barrier layer on the wavelength selective absorption layer, and then bond an optical film containing an ultraviolet absorber via a pressure sensitive adhesive layer or an adhesive layer.

[OLED Display Device]

The OLED display device according to the embodiment of the present invention includes the laminate according to the embodiment of the present invention.

As the OLED display device according to the embodiment of the present invention, as long as the laminate according to the embodiment of the present invention is included in a configuration in which the gas barrier layer is positioned at least on the external light side from the wavelength selective absorption layer, the configuration of a commonly used OLED display device can be used without particular limitation as other configurations. The configuration example of the OLED display device according to the embodiment of the present invention is not particularly limited, and examples thereof include a display device including glass, a layer containing a thin film transistor (TFT), an OLED display element, a barrier film, a color filter, glass, a pressure sensitive adhesive layer, the laminate according to the embodiment of the present invention, and a surface film, in order from the opposite side to external light.

The OLED display element has a configuration in which an anode electrode, a light emitting layer, and a cathode electrode are laminated in this order. In addition to the light emitting layer, a hole injection layer, a hole transport layer, an electron transport layer, an electron injection layer, and the like are included between the anode electrode and the cathode electrode. In addition, for example, the description in JP2014-132522A can also be referred to.

Further, as the color filter, in addition to a normal color filter, a color filter in which quantum dots are laminated can also be used.

A resin film can be used instead of the above glass.

The OLED display device according to the embodiment of the present invention can maintain an excellent level of absorbance of the dye contained in the wavelength selective absorption layer even in a case where the laminate according to the embodiment of the present invention is provided as an antireflection unit instead of the circularly polarizing plate.

Furthermore, in a case where the dye contained in the wavelength selective absorption layer is in the form of containing four dyes A to D in combination as described above, it is possible to exhibit an excellent level of light resistance exceeding the decrease in light resistance due to the mixing of the dyes. In particular, by containing the four dyes A to D so as to satisfy the above-mentioned Relational Expressions (I) to (VI), both the suppression of external light reflection and the suppression of brightness decrease can be achieved at a sufficient level, and moreover, the original tint of the image formed by the light emitted from the light emitting layer (light source) can be maintained at an excellent level.

That is, the circularly polarizing plate having the antireflection function is usually used as the surface film. However, by adopting the laminate according to the embodiment of the present invention, the OLED display device according to the embodiment of the present invention can exhibit the excellent effect without using the circularly polarizing plate. It should be noted that it does not interfere the combination use of the antireflection film, as the configuration of the OLED display device according to the embodiment of the present invention, within the range not impairing the effects of the present invention.

The method for forming an OLED color image applicable to the OLED display device according to the embodiment of the present invention is not particularly limited, and any of a three-color painting method, a color conversion method, and a color filter method of red (R), green (G), and blue (B) can be used, and the three-color painting method can be suitably used. Therefore, as the light source of the OLED display device according to the embodiment of the present invention, each light emitting layer corresponding to the above image forming method can be applied.

<Pressure Sensitive Adhesive Layer>

In the OLED display device according to the embodiment of the present invention, it is preferable that the laminate according to the embodiment of the present invention is bonded to glass (substrate) via a pressure sensitive adhesive layer, on a surface positioned on an opposite side of external light.

The composition of the pressure sensitive adhesive composition used for forming the pressure sensitive adhesive layer is not particularly limited, and for example, a pressure sensitive adhesive composition containing a base resin having a mass average molecular weight ($M_w$) of 500,000 or more may be used. In a case where the mass average molecular weight of the base resin is less than 500,000, the durability reliability of the pressure sensitive adhesive may decrease due to a decrease in cohesive force causing bubbles or peeling phenomenon under at least one of high temperature condition or a high humidity condition. The upper limit of the mass average molecular weight of the base resin is not particularly limited, but in a case where the mass average molecular weight is excessively increased, the coating property may deteriorate due to the increase in viscosity, so that the upper limit is preferably 2,000,000 or less.

The specific type of the base resin is not particularly limited, and examples thereof include acrylic resins, silicone resins, rubber resins, and ethylene-vinyl acetate (EVA) resins. In a case of being applied to an optical device such as a liquid crystal display device, an acrylic resin is mainly used in that the acrylic resin is excellent in transparency, oxidation resistance, and resistance to yellowing, and it is not limited thereto.

Examples of the acrylic resin include a polymer of monomer mixture containing 80 parts by mass to 99.8 parts by mass of the (meth)acrylic acid ester monomer; and 0.02 parts by mass to 20 parts by mass (preferably 0.2 parts by mass to 20 parts by mass) of another crosslinkable monomer.

The type of the (meth)acrylic acid ester monomer is not particularly limited, and examples thereof include alkyl (meth)acrylate. In this case, in a case where the alkyl group contained in the monomer becomes an excessively long chain, the cohesive force of the pressure sensitive adhesive may decrease, and it may be difficult to adjust the glass transition temperature ($T_g$) or the adhesiveness. Therefore, it is preferable to use a (meth)acrylic acid ester monomer having an alkyl group having 1 to 14 carbon atoms. Examples of such monomers include methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth) acrylates, lauryl (meth)acrylates, isobonyl (meth)acrylates, and tetradecyl (meth)acrylates. In the present invention, the above-mentioned monomers may be used alone or two or more types thereof may be used in combination. The (meth) acrylic acid ester monomer is preferably contained in an amount of 80 parts by mass to 99.8 parts by mass in 100 parts by mass of the monomer mixture. In a case where the content of the (meth)acrylic acid ester monomer is less than 80 parts by mass, the initial adhesive force may decrease, and in a case where the content exceeds 99.8 parts by mass, the durability may decrease due to the decrease in cohesive force.

The other crosslinkable monomer contained in the monomer mixture reacts with a polyfunctional crosslinking agent described later to impart a cohesive force to the pressure sensitive adhesive, and can impart a crosslinking functional group having a role of adjusting the pressure sensitive adhesive force and durability reliability to the polymer. Examples of such a crosslinkable monomer include a hydroxy group-containing monomer, a carboxyl group-containing monomer, and a nitrogen-containing monomer. Examples of the hydroxy group-containing monomer include 2-hydroxyethyl (meth)acrylate, 2-hydroxypropyl (meth)acrylate, 4-hydroxybutyl (meth)acrylate, 6-hydroxyhexyl (meth)acrylate, and 8-hydroxyoctyl (meth)acrylate, 2-hydroxyethylene glycol (meth)acrylate, and 2-hydroxypropylene glycol (meth)acrylate. Examples of the carboxyl group-containing monomer include acrylic acid, methacrylic acid, 2-(meth)acryloyloxyacetic acid, 3-(meth)acryloyloxypropyl acid, 4-(meth)acryloyloxybutyl acid, and acrylic acid dimer, itaconic acid, maleic acid, and maleic acid anhydride. Examples of the nitrogen-containing monomer include (meth)acrylamide, N-vinylpyrrolidone, or N-vinylcaprolactam. In the present invention, these crosslinkable monomers may be used alone or two or more types thereof may be used in combination.

The other crosslinkable monomer may be contained in an amount of 0.02 parts by mass to 20 parts by mass in 100 parts by mass of the monomer mixture. In a case where the content is less than 0.02 parts by mass, the durability reliability of the pressure sensitive adhesive may decrease, and in a case where the content exceeds 20 parts by mass, at least one of the adhesiveness or the peelability may decrease.

The monomer mixture may further contain a monomer represented by General Formula (10). Such a monomer can be added for the purpose of adjusting the glass transition temperature of the pressure sensitive adhesive and imparting other functionality.

General Formula (10)

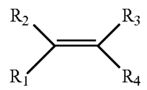

In the formula, $R_1$ to $R_3$ each independently represent a hydrogen atom or alkyl, and $R^4$ represents cyano; alkyl-substituted or unsubstituted phenyl; acetyloxy; or $COR_5$ (where $R_5$ represents an alkyl- or alkoxyalkyl-substituted or unsubstituted amino or glycidyloxy).

In the definition of $R_1$ to $R_5$ in the formula, alkyl or alkoxy means alkyl or alkoxy having 1 to 12 carbon atoms, preferably 1 to 8 carbon atoms, and more preferably 1 to 12 carbon atoms, and specifically, may be methyl, ethyl, methoxy, ethoxy, propoxy, or butoxy.

Examples of the monomer represented by General Formula (10) include one or two or more of nitrogen-containing monomers such as (meth)acrylonitrile, (meth)acrylamide, N-methyl (meth)acrylamide, and N-butoxymethyl (meth) acrylamide; styrene-based monomers such as styrene or methylstyrene; epoxy group-containing monomer such as glycidyl (meth)acrylate; or a carboxylic acid vinyl ester such as vinyl acetate, and are not limited thereto. The monomer represented by General Formula (10) can be contained in an amount of 20 parts by mass or less with respect to 100 parts by mass in total of the (meth)acrylic acid ester monomer and other crosslinkable monomers. In a case where the content exceeds 20 parts by mass, at least one of the flexibility or the peelability of the pressure sensitive adhesive may decrease. The method for manufacturing a polymer using a monomer mixture is not particularly limited, and the polymer can be produced, for example, through a general polymerization method such as solution polymerization, photopolymerization, bulk polymerization, suspension polymerization, or emulsion polymerization. In the present invention, it is particularly preferable to use a solution polymerization method, and solution polymerization is preferably carried out at a polymerization temperature of 50° C. to 140° C. by mixing an initiator in a state where each monomer is uniformly mixed. In this case, examples of the initiator used include azo-based polymerization initiators such as azobisisobutyronitrile and azobiscyclohexanecarbonitrile; and ordinary initiators such as peroxides such as benzoyl peroxide and acetyl peroxide.

The pressure sensitive adhesive composition may further contain 0.1 parts by mass to 10 parts by mass of a crosslinking agent with respect to 100 parts by mass of the base resin. Such a crosslinking agent can impart cohesive force to the pressure sensitive adhesive through a crosslinking reaction with the base resin. In a case where the content of the crosslinking agent is less than 0.1 parts by mass, the cohesive force of the pressure sensitive adhesive may decrease. On the other hand, in a case where the content exceeds 10 parts by mass, durability reliability may decrease due to delamination and floating phenomenon.

The type of the crosslinking agent is not particularly limited, and for example, a predetermined crosslinking agent such as an isocyanate-based compound, an epoxy-based compound, an aziridine-based compound, and a metal chelate-based compound can be used.

Examples of the isocyanate-based compound include tolylene diisocyanate, xylene diisocyanate, diphenylmethane diisocyanate, hexamethylene diisocyanate, isophorone diisocyanate, tetramethylxylene diisocyanate, and naphthalene diisocyanate, and a reactant of any of these compound and polyol (for example, trimethylolpropane); examples of the epoxy-based compound include ethylene glycol diglycidyl ether, triglycidyl ether, trimethylolpropane triglycidyl ether, N,N, N', N'-tetraglycidyl ethylenediamine, and glycerin diglycidyl ether; and examples of aziridine-based compounds include N,N'-toluene-2,4-bis (1-aziridine carboxamide), N,N'-diphenylmethane-4,4'-bis(1-aziridine carboxamide), triethylene melamine, bisprothaloyl-1-(2-methylaziridine), and tri-1-aziridinylphosphine oxide. Examples of the metal chelate-based compound include compounds in which at least any of polyvalent metals such as aluminum, iron, zinc, tin, titanium, antimony, magnesium, and vanadium is coordinated with acetylacetone or ethyl acetoacetate.

The pressure sensitive adhesive composition may further contain 0.01 parts by mass to 10 parts by mass of a silane-based coupling agent with respect to 100 parts by mass of the base resin. The silane-based coupling agent can contribute to the improvement of adhesive reliability in a case where the pressure sensitive adhesive is left for a long time under high temperature or high humidity conditions, particularly improve the adhesive stability in a case where adhering to a glass substrate, and improve heat resistance and moisture resistance. Examples of the silane-based coupling agent include γ-glycidoxypropyltrimethoxysilane, γ-glycidoxypropylmethyldiethoxysilane, γ-glycidoxypropyltriethoxysilane, 3-mercaptopropyltrimethoxysilane, vinyltrimethoxysilane, vinyl triethoxysilane, γ-methacryloxypropyltrimethoxysilane, γ-methacryloxypropyltriethoxysilane, γ-aminopropyltriethoxysilane, 3-isocyanuppropyltriethoxysilane, γ-acetoacetatepropyltrimethoxysilane, and the like. These silane-based coupling agents may be used alone or two or more types thereof may be used in combination.

The silane-based coupling agent is preferably contained in an amount of 0.01 parts by mass to 10 parts by mass, and further preferably contained in an amount of 0.05 parts by mass to 1 part by mass, with respect to 100 parts by mass of the base resin. In a case where the content is less than 0.01 parts by mass, the effect of increasing the pressure sensitive adhesive force may not be sufficient, and in a case where the content exceeds 10 parts by mass, durability reliability may be lowered such as bubbles or peeling phenomenon.

The above-mentioned pressure sensitive adhesive composition can further contain an antistatic agent. As the antistatic agent, any compound can be used, as long as the antistatic agent has excellent compatibility with other components contained in the pressure sensitive adhesive composition such as an acrylic resin, not adversely affect the transparency of the pressure sensitive adhesive, workability, and durability and can impart the antistatic performance to the pressure sensitive adhesive. Examples of the antistatic agent include inorganic salts and organic salts.

The inorganic salt is a salt containing an alkali metal cation or an alkaline earth metal cation as a cation component. As cations, one or two or more of lithium ion (Li), sodium ion ($Na^+$), potassium ion ($K^+$), rubidium ion ($Rb^+$), cesium ion ($Cs^+$), beryllium ion ($Be^{2+}$), magnesium ion ($Mg^{2+}$), calcium ion ($Ca^{2+}$), strontium ion ($Sr^{2+}$), and barium ion ($Ba^{2+}$) can be exemplified, and lithium ion ($Li^+$), sodium ion ($Na^+$), potassium ion ($K^+$), cesium ion ($Cs^+$), beryllium ion ($Be^{2+}$), magnesium ion ($Mg^{2+}$), calcium ion ($Ca^{2+}$), and barium ion ($Ba^{2+}$) is preferably exemplified. The inorganic salt may be used alone or two or more types thereof may be used in combination. Lithium ions ($Li^+$) are particularly preferable in terms of ion safety and mobility within the pressure sensitive adhesive.

The organic salt is a salt containing onium cations as a cation component. The term "onium cation" means ion charged to the cation (+), where at least some of the charge is unevenly distributed on one or more of the nitrogen (N), phosphorus (P), and sulfur (S). The onium cation is a cyclic or acyclic compound, and in the case of a cyclic compound, a non-aromatic or aromatic compound can be adopted. Further, in the case of a cyclic compound, one or more hetero atoms (for example, oxygen) other than nitrogen, phosphorus, or a sulfur atom can be contained. Further, the cyclic or acyclic compound is optionally substituted with a substituent such as a hydrogen atom, a halogen atom, alkyl, or aryl. Further, in the case of an acyclic compound, one or more, preferably four or more substituents can be contained, and in this case, the substituent is a cyclic type or an acyclic substituent or an aromatic or non-aromatic substituent.

As the onium cation, a cation containing a nitrogen atom is preferable, and an ammonium ion is more preferable. Ammonium ions are quaternary ammonium ions or aromatic ammonium ions.

Specifically, the quaternary ammonium ion is preferably a cation represented by General Formula 11.

General Formula 11

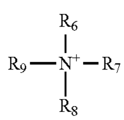

In General Formula 11, $R_6$ to $R_9$ each independently represent a hydrogen atom, substituted or unsubstituted alkyl, substituted or unsubstituted alkoxy, substituted or unsubstituted alkenyl, substituted or unsubstituted alkynyl, a substituted or unsubstituted aryl, or a substituted or unsubstituted heteroaryl.

The alkyl or alkoxy in General Formula 11 represents alkyl or alkoxy having 1 to 12 carbon atoms, and preferably 1 to 8 carbon atoms. The alkenyl or alkynyl represents alkenyl or alkynyl having 2 to 12 carbon atoms, and preferably 2 to 8 carbon atoms.

In General Formula 11, aryl represents a phenyl, biphenyl, naphthyl, or anthracenyl cyclic system, as a substituent derived from an aromatic compound, and heteroaryl represents a heterocycle or an aryl ring having 5 to 12 rings including one or more hetero atoms of O, N, and S, and specifically represents prill, pyrrolyl, pyrodinyl, thienyl, pyridinyl, piperidyl, indrill, quinolyl, thiazole, benzothiazole, triazole, and the like.

In General Formula 11, alkyl, alkoxy, alkenyl, alkynyl, aryl, or heteroaryl may be substituted with one or more substituents. In this case, as the substituent, a hydroxy group, a halogen atom, or alkyl or alkoxy having 1 to 12 carbon atoms, preferably 1 to 8 carbon atoms, more preferably 1 to 4 carbon atoms can be exemplified.

In the present invention, it is preferable to use a quaternary ammonium cation as the cation represented by General Formula 11. In particular, it is preferable to use cations in which $R_1$ to $R_4$ each independently represent substituted or unsubstituted alkyl having 1 to 12 carbon atoms and preferably having 1 to 8 carbon atoms.

Examples of the quaternary ammonium ion represented by General Formula 11 include N-ethyl-N,N-dimethyl-N-(2-methoxyethyl) ammonium ion, N,N-diethyl-N-methyl-N-(2-methoxyethyl) ammonium ion, N-ethyl-N,N-dimethyl-N-propylammonium ion, N-methyl-N,N,N-trioctylammonium ion, N,N,N-trimethyl-N-propylammonium ion, tetrabutylammonium ion, tetramethylammonium ion, tetrahexylammonium ion, N-methyl-N,N,N-tributylammonium ion, and the like.

Examples of the aromatic ammonium ion include, for example, one or more ions of pyridinium, pyridadinium, pyrimidinium, pyrazinium, imidazolium, pyrazolium, thiazolium, oxazolium, and triazolium, and N-alkylpyridinium ion substituted with an alkyl group having 4 to 16 carbon atoms, 1,3-alkylmethylimidazolium ion substituted with an alkyl group having 2 to 10 carbon atoms, and 1,2-dimethyl-3-alkylimidazolium ion substituted with an alkyl group having 2 to 10 carbon atoms are preferable. These aromatic ammonium ions may be used alone or two or more types thereof may be used in combination.

The aromatic ammonium ion is a compound represented by General Formula 12.

General Formula 12

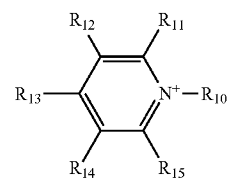

In General Formula 12, $R_{10}$ to $R_{15}$ each independently represent a hydrogen atom, substituted or unsubstituted alkyl, substituted or unsubstituted alkoxy, substituted or unsubstituted alkenyl, substituted or unsubstituted alkynyl, a substituted or unsubstituted aryl, or a substituted or unsubstituted heteroaryl.

In General Formula 12, the definitions for alkyl, alkoxy, alkenyl, alkynyl, aryl, and heteroaryl, and their substitutes are the same as in General Formula 11 above.

As the compound of General Formula 12, it is particularly preferable that $R_1$ to $R_{15}$ are each independently a hydrogen atom or alkyl, and $R_{10}$ is alkyl.

Examples of the anions contained in the cation-containing inorganic salt or organic salt as described above in the antistatic agent preferably include fluorides ($F^-$), chlorides ($Cl^-$), and bromides ($Br^-$), iodide ($I^-$), perchlorate ($ClO_4^-$), hydroxide ($OH^-$), carbonate ($CO_3^{2-}$), nitrate ($NO_3^-$), sulfonate ($SO_4^-$), methylbenzenesulfonate ($CH_3(C_6H_4)SO_3^-$), p-toluenesulfonate ($CH_3C_6H_4SO_3^-$), carboxybenzenesulfonate ($COOH(C_6H_4)SO_3^-$), trifluoromethanesulfonate ($CF_3SO_2^-$), benzoate ($C_6H_5COO^-$), acetate ($CH_3COO$), trifluoroacetate ($CF_3COO^-$), tetrafluoro borate ($BF_4$), tetrabenzylborate ($B(C_6H_5)_4^-$), hexafluorophosphate ($PF_6$), trispentafluoro ethyltrifluorophosphate ($P(C_2F_5)_3F_3^-$), bistrifluoromethanesulfonimide ($N(SO_2CF_3)_2^-$), bispentafluoroethanesulfonimide ($N(SOC_2F_5)_2^-$), bispentafluoroethanecarbonylimide ($N(COC_2F_5)_2^-$), bisperfluorobutane sulfoneimide ($N(SO_2C_4F_9)_2^-$), bisperfluorobutanecarbonylimide ($N(COC_4F_9)_2^-$), tristrifluoromethanesulfonylmethide ($C(SO_2CF_3)_3^-$), and tristrifluoromethanecarbonylmethide ($C(SO_2CF_3)_3^-$), and are not limited thereto. Among the anions, it is preferable to use an imide-based anion which can function as electron withdrawing and is replaced by fluorine having good hydrophobicity and has high ionic stability.

An antistatic agent having a quaternary ammonium ion represented by General Formula 11 is particularly preferable from the viewpoint of increasing the durability of the dye contained in the wavelength selective absorption layer.

The pressure sensitive adhesive composition contains an antistatic agent in an amount of 0.01 parts by mass to 5 parts by mass, preferably 0.01 parts by mass to 2 parts by mass, more preferably 0.1 parts by mass to 2 parts by mass, with respect to 100 parts by mass of the base resin. In a case where the content is less than 0.01 parts by mass, the desired antistatic effect may not be obtained, and in a case where the content exceeds 5 parts by mass, the compatibility with other components is reduced and the durability reliability of the pressure sensitive adhesive or the transparency may be deteriorated.

The pressure sensitive adhesive composition further includes a compound capable of forming a coordinate bond with an antistatic agent, specifically, with a cation contained in the antistatic agent (hereinafter, referred to as a "coordinate-bonding compound"). By appropriately containing the coordinate-bonding compound, it is possible to effectively impart antistatic performance by increasing the anion concentration inside the pressure sensitive adhesive layer even in a case where a relatively small amount of antistatic agent is used.

The type of the coordinate-bonding compound that can be used is not particularly limited as long as it has a functional group capable of coordinating with the antistatic agent in the molecule, and examples thereof include alkylene oxide-based compounds.

The alkylene oxide-based compound is not particularly limited, and an alkylene oxide-based compound containing an alkylene oxide unit having a basic unit having 2 or more carbon atoms, preferably 3 to 12 carbon atoms, more preferably 3 to 8 carbon atoms can be preferably used.

The alkylene oxide-based compound preferably has a molecular weight of 5,000 or less. The term "molecular weight" as used in the present invention means the molecular weight or mass average molecular weight of a compound. In the present invention, in a case where the molecular weight of the alkylene oxide-based compound exceeds 5,000, the viscosity may be excessively increased and the coating property may be deteriorated, or the complex forming ability with the metal may be lowered. On the other hand, the lower limit of the molecular weight of the alkylene oxide compound is not particularly limited, but is preferably 500 or more, and more preferably 4,000 or more.

The alkylene oxide-based compound is not particularly limited as long as the compound exhibits the above-mentioned properties, and for example, a compound represented by General Formula 13 can be used.

General Formula 13

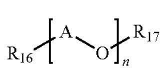

In General Formula 13, A represents an alkylene having 2 or more carbon atoms, n represents 1 to 120, $R_{16}$ and $R_{17}$ each independently represent a hydrogen atom, hydroxy, alkyl, or $C(=O)R_{18}$, and $R_{15}$ represents a hydrogen atom or an alkyl group.

In General Formula 13, the alkylene represents an alkylene having 3 to 12, preferably 3 to 8 carbon atoms, and specifically, ethylene, propylene, butylene, or pentylene.

In General Formula 13, alkyl represents alkyl having 1 to 12 carbon atoms, preferably 1 to 8 carbon atoms, and more preferably 1 to 4 carbon atoms, and n is preferably 1 to 80 and more preferably 1 to 40.

Examples of the compound represented by General Formula 13 include polyalkylene oxide (for example, polyethylene oxide, polypropylene oxide, polybutylene oxide, or polypentylene oxide), fatty acid-based alkyl esters of polyalkylene oxide (for example, polyethylene oxide, polypropylene oxide, polybutylene oxide, or polypentylene oxide), carboxylic acid esters of polyalkylene oxide (for example, polyethylene oxide, polypropylene oxide, polybutylene oxide, or polypentylene oxide), and the like, and are not limited thereto.

In the present invention, in addition to the above-mentioned alkylene oxide-based compound, various coordinate-bonding compounds such as an ester compound having one or more ether bonds disclosed in KR2006-0018495A, an oxalate group-containing compound disclosed in KR2006-0128659A, a diamine group-containing compound, a polyvalent carboxyl group-containing compound, or a ketone group-containing compound can be appropriately selected and used as necessary.

The coordinate-bonding compound is preferably contained in the pressure sensitive adhesive composition at a ratio of 3 parts by mass or less with respect to 100 parts by mass of the base resin, more preferably 0.1 parts by mass to 3 parts by mass, and still more preferably, 0.5 parts by mass to 2 parts by mass. In a case where the content exceeds 3 parts by mass, the pressure sensitive adhesive physical properties such as peelability may deteriorate.

From the viewpoint of adjusting the adhesive performance, the pressure sensitive adhesive composition may further contain 1 part by mass to 100 parts by mass of a tackifying resin with respect to 100 parts by mass of the base resin. In a case where the content of the tackifying resin is less than 1 part by mass, the addition effect may not be sufficient, and in a case where the exceeds 100 parts by mass, at least one of the compatibility or the cohesive force improving effect may be lowered. The tackifying resin is not particularly limited, and examples thereof include a (hydrogenated) hydrocarbon resin, a (hydrogenated) rosin resin, a (hydrogenated) rosin ester resin, a (hydrogenated) terpene resin, a (hydrogenated) terpene phenol resin, a polymerized rosin resin, and a hydrogenatedpolymerized rosin ester resin. These tackifying resins may be used alone or two or more types thereof may be used in combination.

The pressure sensitive adhesive composition may also contain one or more additives contain a polymerization initiator, such as a thermal polymerization initiator and a photopolymerization initiator; an epoxy resin; a curing agent; an ultraviolet stabilizer; an antioxidant; a toning agent, as long as the effect of the present invention is not affected. It may contain one or more additives such as a reinforcing agent; a filler; an antifoaming agent; a surfactant; a photopolymerizable compound such as a polyfunctional acrylate; and a plasticizer.

<Substrate>

In the OLED display device according to the embodiment of the present invention, it is preferable that the laminate according to the embodiment of the present invention is bonded to glass (substrate) via a pressure sensitive adhesive layer or an adhesive layer, on a surface positioned on an opposite side of external light.

The method for forming the pressure sensitive adhesive layer is not particularly limited, and for example, a method of applying the pressure sensitive adhesive composition to the wavelength selective absorption layer by a usual means such as a bar coater, drying, and curing the pressure sensitive adhesive composition; a method of applying the pressure sensitive adhesive composition first to the surface of a peelable substrate, and drying the composition, and then transferring the pressure sensitive adhesive layer using the peelable substrate to the wavelength selective absorption layer and then aging and curing the composition is used.

The peelable substrate is not particularly limited, and a predetermined peelable substrate can be used. For example, the release film in the manufacturing method of the wavelength selective absorption layer described above is exampled.

In addition, the conditions of application, drying, aging, and curing can be appropriately adjusted based on a conventional method.

<Refractive Index of Each Layer in Laminate>

In the OLED display device according to the embodiment of the present invention, it is preferable that in the laminate according to the embodiment of the present invention, a difference in the refractive index of each layer with respect to the adjacent layer of each layer is adjusted within a certain range, from the viewpoint of reducing the reflection of the external light. The adjacent layer means a layer in which the layers are in direct contact with each other. The difference in the refractive index between the adjacent layers is preferably 0.15 or less, more preferably 0.10 or less, still more preferably 0.06 or less, particularly preferably 0.05 or less, and especially preferably 0.04 or less. That is, it is preferable that all the layers forming the laminate according to the embodiment of the present invention satisfy the difference in the refractive index between the adjacent layers.

The laminate according to the embodiment of the present invention satisfying the difference in the refractive index between the adjacent layers preferably comprise an ultraviolet absorption layer arranged on an opposite side of the gas barrier layer from the wavelength selective absorption layer, in addition to the wavelength selective absorption layer and the gas barrier layer. Furthermore, it is also preferable to comprise at least one layer of the pressure sensitive adhesive layer or the adhesive layer. The pressure sensitive adhesive layer or the adhesive layer may be used in a case of laminating any of the layers other than between the wavelength selective absorption layer and the gas barrier layer. For example, the above-mentioned pressure sensitive adhesive layer or the adhesive layer can be arranged between the gas barrier layer and the ultraviolet absorption layer.

In addition, in a case where the laminate according to the embodiment of the present invention is used by being incorporated into the OLED display device, it is preferable to satisfy the difference in the refractive index between the adjacent layers even in the layers in which the laminate according to the embodiment of the present invention and the OLED display device are in contact with each other. In a case where the surface (for example, the surface on the opposite side to the gas barrier layer with respect to the wavelength selective absorption layer) of the laminate according to the embodiment of the present invention positioned on the opposite side to the external light is bonded to glass (substrate) via a pressure sensitive adhesive layer or an adhesive layer, it is preferable that the surface of the laminate according to the embodiment of the present invention on the opposite side to the external light, the pressure sensitive adhesive layer or the adhesive layer, and the glass satisfy the difference in the refractive index between the adjacent layers.

The sum of the interfacial reflectivity of the laminate according to the embodiment of the present invention is preferably 0.30 or less, more preferably 0.20 or less, still more preferably 0.10 or less, particularly preferably 0.06 or less, especially preferably 0.03 or less, and most preferably 0.02 or less. A lower limit value is not particularly limited.

The sum of the above interfacial reflectivity is calculated using the refractive index and film thickness of each layer according to the method of Chapter 5, pages 173 to 174 of the 7th edition of "Applied Physical Engineering Selection Book 3, Thin Film" by Sadafumi Yoshida, and is a value rounded to the third decimal place. The refractive index and the film thickness of each layer can be measured by the method described in Examples to be described later.

For example, in a case of a configuration in which surface antireflection layer/support/adhesive (pressure sensitive adhesive) layer/gas barrier layer/wavelength selective absorption layer/adhesive (pressure sensitive adhesive) layer/glass are laminated in this order in a case of being viewed from the viewer side, it is preferable to adjust the refractive index of each layer from the support to the glass in the following range. However, in the laminate according to the embodiment of the present invention, an excellent antireflection effect can be obtained even in a case where the surface antireflection layer is not provided.

Support: 1.45 to 1.55
Adhesive (pressure sensitive adhesive) layer: 1.47 to 1.57
Gas barrier layer: 1.49 to 1.59
Wavelength selective absorption layer: 1.51 to 1.61
Adhesive (pressure sensitive adhesive) layer: 1.47 to 1.57
Glass: 1.45 to 1.55

The refractive index of each layer can be adjusted by the structure of the resin used for each layer (increasing the refractive index due to addition of an aromatic ring group or a sulfur atom, reducing the refractive index due to addition of a fluorine atom), addition of high-refractive index fine particles such as titanium oxide or zirconium oxide or nanoparticles, addition of a high refractive index material containing a sulfur atom, a nitrogen atom, and the like, addition of a low refractive index material containing a fluorine atom, and the like.

The refractive index of each layer can be measured by spectroscopic microscopy or ellipsometry, and can be easily measured by, for example, a reflection spectroscopic film thickness meter FE3000 (trade name) manufactured by Otsuka Electronics Co., Ltd. Specifically, the refractive index can be measured by the method described in Examples to be described later.

As the surface antireflection layer, a surface film having an antireflection function used in an OLED display device can be used without particular limitation, and examples thereof include a circularly polarizing plate.

As the support, the above-mentioned optical film can be used, and among these, the ultraviolet absorption layer is preferable.

The adhesive (pressure sensitive adhesive) layer means an adhesive layer composed of an adhesive or a pressure sensitive adhesive layer composed of a pressure sensitive adhesive.

(Pressure Sensitive Adhesive Layer)

As the pressure sensitive adhesive layer, the description of the pressure sensitive adhesive layer in the OLED display device described above can be applied.

Examples of the high refractive index material that increases the refractive index of the pressure sensitive adhesive layer by addition to the pressure sensitive adhesive layer include a benzodithiol compound and a triazine compound.

I) Benzodithiol Compound

As the benzodithiol compound, for example, a compound represented by General Formula (A) is preferable.

General Formula (A)

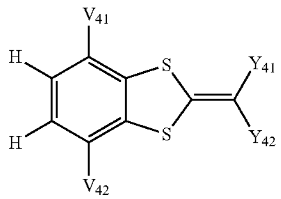

In the above formula, $Y_{41}$ and $Y_{42}$ each independently represent a hydrogen atom or a monovalent substituent, and $V_{41}$ and $V_{42}$ each independently represent a hydrogen atom or a monovalent substituent.

The compound represented by General Formula (A) is described in paragraphs [0037] to [0062] of JP2009-096972A, and the same applies to the present invention. In the present invention, the compound represented by General Formula (A) preferably does not have a linear alkyl group having 8 or more carbon atoms.

In General Formula (A), it is preferable that one of $Y_{41}$ or $Y_{42}$ is a cyano group, and the other is a substituted or unsubstituted alkylcarbonyl group, a substituted or unsubstituted arylcarbonyl group, a substituted or unsubstituted heterocyclic carbonyl group, a substituted or unsubstituted alkylsulfonyl group, or a substituted or unsubstituted arylsulfonyl group, it is more preferable that one of $Y_{41}$ or $Y_{42}$ is a cyano group, and the other is substituted or unsubstituted alkylcarbonyl group, a substituted or unsubstituted arylcarbonyl group, or a substituted or unsubstituted heterocyclic carbonyl group, and it is still more preferable that the one is a cyano group and the other is a substituted or unsubstituted alkylcarbonyl group or a substituted or unsubstituted arylcarbonyl group.

In General Formula (A), in a case where $V_{41}$ and $V_{42}$ represent a monovalent substituent, as the monovalent substituent, a halogen atom, a mercapto group, a cyano group, a carboxyl group, a phosphoric acid group, a sulfo group, a hydroxy group, a carbamoyl group, a sulfamoyl group, a nitro group, an alkoxy group, an aryloxy group, an acyl group, an acyloxy group, an acylamino group, an alkylaminocarbonyloxy group, a sulfonyl group, a sulfinyl group, a sulfonylamino group, an amino group, a substituted amino group, an ammonium group, a hydrazino group, a ureido group, an imide group, an alkyl or arylthio group, an unsubstituted or substituted alkenylthio group, an alkoxycarbonyl group, an aryloxycarbonyl group, an alkoxycarbonyloxy group, an unsubstituted alkyl group, a substituted alkyl group, a substituted or unsubstituted aryl group, or a substituted or unsubstituted heterocyclic group is preferable, a cyano group, an acyl group, an acyloxy group, or an alkylaminocarbonyloxy group is more preferable, and an acyloxy group or an alkylaminocarbonyloxy group is still more preferable. The number of carbon atoms in $Y_{41}$ and $Y_{42}$ is preferably 1 to 18 and more preferably 1 to 10.

Specific examples of the compound represented by General Formula (A) are shown below. However, the compound represented by General Formula (A) is not limited to the following specific examples.

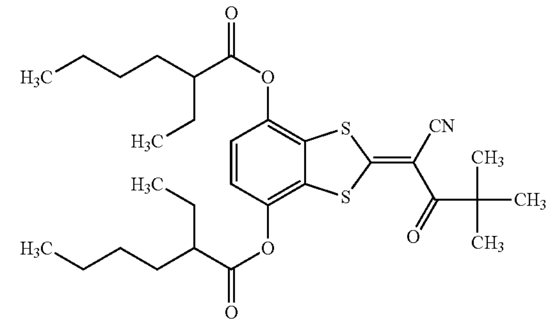

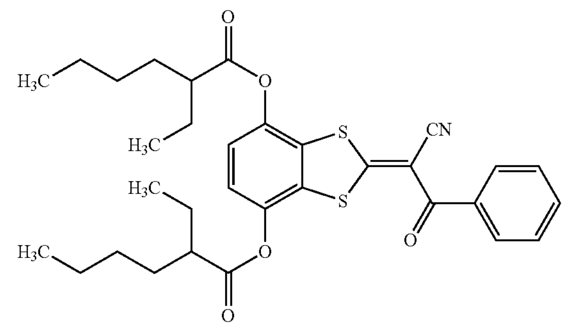

(S-03)

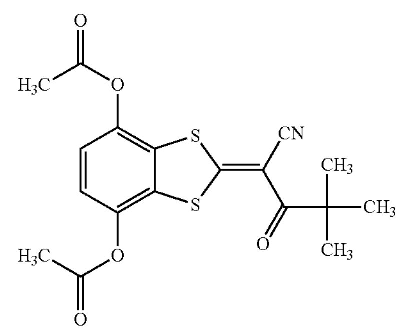

(S-04)

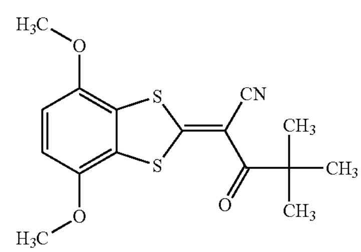

(S-05)

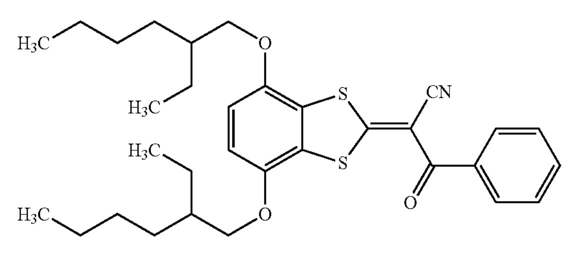

-continued (S-06)

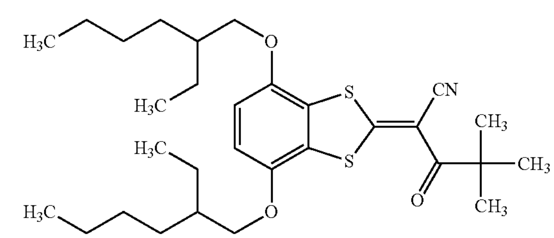

(S-11)

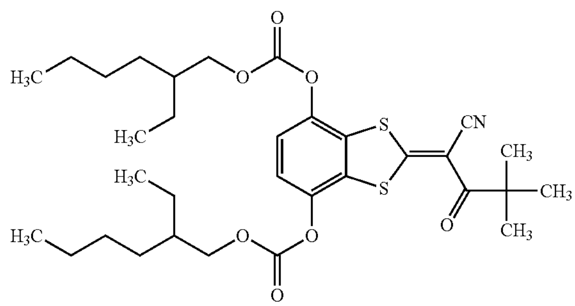

(S-12)

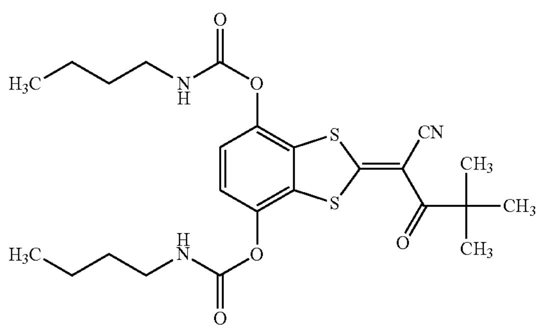

(S-13)

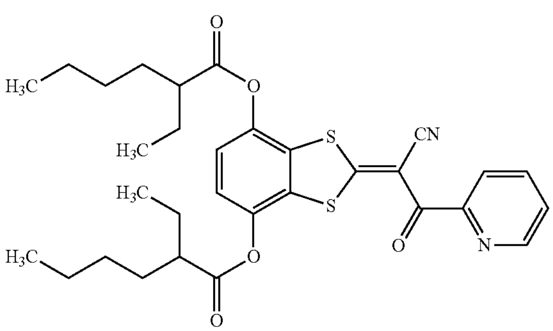

(S-14)

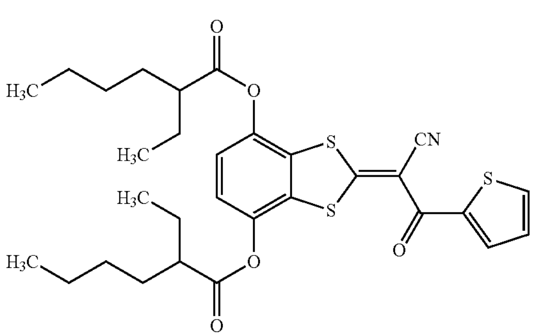

-continued (S-15)

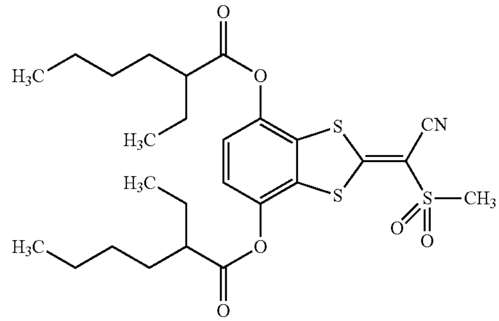

(S-16)

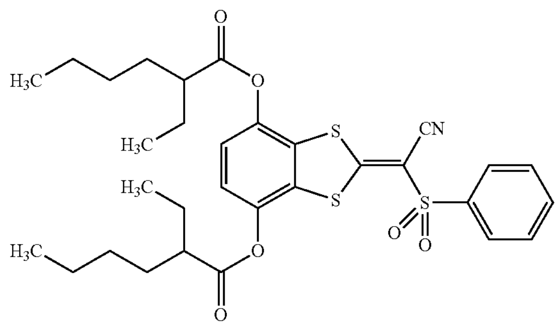

ii) Triazine Compound

Preferable examples of the triazine compound include a compound represented by General Formula (I).

(I)

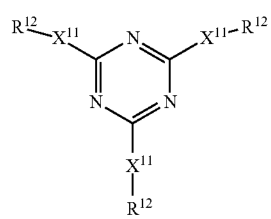

In the formula, $R^{12}$'s each independently represent an aryl group or a heterocyclic group having a substituent at least any of an ortho-position, a meta-position, or a para-position.

$X^{1}$'s each independently represent a single bond or —$NR^{13}$—. Here, $R^{13}$'s each independently represent a hydrogen atom, a substituted or unsubstituted alkyl group, an alkenyl group, an aryl group, or a heterocyclic group.

The aryl group that can be employed as $R^{12}$ is preferably phenyl or naphthyl, and particularly preferably phenyl.

Examples of the substituent of the aryl group that can be employed as $R^{12}$ include a halogen atom, a hydroxy group, a cyano group, a nitro group, a carboxy group, an alkyl group, an alkenyl group, an aryl group, an alkoxy group, an alkenyloxy group, an aryloxy group, an acyloxy group, an alkoxycarbonyl group, an alkenyloxycarbonyl group, an aryloxycarbonyl group, a sulfamoyl group, an alkyl-substituted sulfamoyl group, an alkenyl-substituted sulfamoyl group, an aryl-substituted sulfamoyl group, a sulfonamide group, a carbamoyl group, an alkyl-substituted carbamoyl group, an alkenyl-substituted carbamoyl group, an aryl-substituted carbamoyl group, an amide group, an alkylthio group, an alkenylthio group, an arylthio group, and an acyl group.

The heterocyclic group that can be employed as $R^{12}$ preferably has aromaticity. The heterocycle in the heterocyclic group is preferably a 5-membered ring, a 6-membered ring, or a 7-membered ring, more preferably a 5-membered ring or a 6-membered ring, and most preferably a 6-membered ring. The ring-constituting heteroatom of the heterocycle is preferably a nitrogen atom, a sulfur atom or an oxygen atom, and more preferably a nitrogen atom. As the heterocycle having the aromaticity, a pyridine ring (2-pyridyl or 4-pyridyl as the heterocyclic group) is particularly preferable. The heterocyclic group may have a substituent. Examples of the substituent of the heterocyclic group that can be employed as $R^{12}$ include the substituent of the aryl group.

In a case where $X^{11}$ is a single bond, the heterocyclic group that can be employed as $R^{12}$ is preferably a heterocyclic group having a free valence in the nitrogen atom. The heterocycle in the heterocyclic group with a free valence in the nitrogen atom is preferably a 5-membered ring, a 6-membered ring, or a 7-membered ring, more preferably a 5-membered ring or a 6-membered ring, and most preferably a 5-membered ring. The heterocycle in the heterocyclic group may have a plurality of nitrogen atoms as ring-constituting atom. In addition, the ring-constituting atom in the heterocyclic group may have a hetero atom (for example, an oxygen atom or a sulfur atom) other than the nitrogen atom.

The following is an example of the heterocyclic group with a free valence in the nitrogen atom. In the following structural formula, * indicates a free valence.

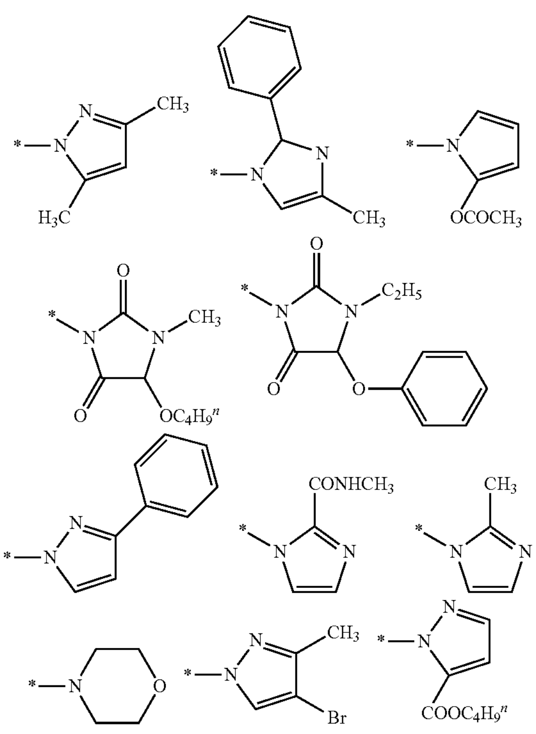

The alkyl group that can be employed as R may be a cyclic alkyl group or a chain alkyl group, and a chain alkyl group is preferable, and a linear alkyl group having no branch is more preferable. The number of carbon atoms of the alkyl group is preferably 1 to 30, more preferably 1 to 20, still more preferably 1 to 10, particularly preferably 1 to 8, and most preferably 1 to 6. The alkyl group may have a substituent. Examples of the substituent include a halogen atom, an alkoxy group (for example, methoxy and ethoxy), and an acyloxy group (for example, acryloyloxy and methacryloyloxy).

The alkenyl group that can be employed as $R^{13}$ may be a cyclic alkenyl group or a chain alkenyl group, and a chain alkenyl group is preferable, and a linear alkenyl group having no branch is more preferable. The number of carbon atoms of the alkenyl group is preferably 2 to 30, more preferably 2 to 20, still more preferably 2 to 10, particularly preferably 2 to 8, and most preferably 2 to 6. The alkenyl group may have a substituent. Examples of the substituent include a substituent that the above-mentioned alkyl group may have.

An aryl group and a heterocyclic group that can be employed as $R^{13}$ have the same meaning as the aryl group and the heterocyclic group that can be employed as $R^{12}$. The aryl group and the heterocyclic group may further have a substituent, and examples of the substituent include a substituent that the aryl group and the heterocyclic group that can be employed as $R^{12}$ may have.

The molecular weight of the compound represented by General Formula (I) is preferably 300 to 800.

Further, an ultraviolet absorber may be used in combination with the compound represented by General Formula (I). The amount of the ultraviolet absorber used is preferably 10 parts by mass or less, and more preferably 3 parts by mass or less, with respect to 100 parts by mass of the compound represented by General Formula (I).

As a specific example of the triazine compound represented by Formula (I), for example, a compound described as a specific example of the retardation expressing agent represented by General Formula (I) in paragraphs 0084 to 0094 of JP2008-239786A can be preferably mentioned.

In a case where the high refractive index material is contained in the pressure sensitive adhesive layer, the content thereof can be appropriately adjusted, for example, can be set to 0.1 to 40 parts by mass, and is preferably 0.5 to 30 parts by mass, and more preferably 1.0 to 25 parts by mass, with respect to 100 parts by mass of the solid content (component other than the solvent) of the pressure sensitive adhesive.

(Adhesive Layer)

Examples of the adhesive used in the adhesive layer include polyvinyl alcohol-based adhesives such as polyvinyl alcohol and polyvinyl butyral, and vinyl-based latexs such as butyl acrylate.

As the polyvinyl alcohol used in the adhesive layer, a degree of saponification of the polyvinyl alcohol is preferably 30 mol % or more, more preferably 50 mol % or more, from the viewpoint of the refractive index. In a case where the adhesive layer is composed of two or more kinds of polyvinyl alcohols, it is preferable that at least one kind of the polyvinyl alcohol satisfies the degree of saponification, and it is more preferable that any of the polyvinyl alcohols satisfies the degree of saponification.

As the polyvinyl alcohol-based adhesive of the present invention, commercially available polyvinyl alcohol can be used. For example, Kuraray Poval 5-98, 11-98, 28-98, 60-98, 5-88, 9-88, 2-88, and CP-1220T10 manufactured by Kuraray Co., Ltd., Denka Poval K-05, K-17C, K-17E, H-12, H-17, B-05, and B-17 manufactured by Denka Corporation, and the like (all the trade names) can be preferably used.

In a case where the laminate according to the embodiment of the present invention comprises a layer I further in contact with the gas barrier layer arranged on at least one surface of the wavelength selective absorption layer, and in a case where this layer I satisfies the specification (containing the crystalline resin and having an oxygen permeability of a specific value or less) of the gas barrier layer in the laminate according to the embodiment of the present invention, the gas barrier layer in the laminate according to the embodiment of the present invention means a layer composed of the gas barrier layer and the layer I.

Examples of the layer I understood as the gas barrier layer in the laminate according to the embodiment of the present invention include the corresponding adhesive layer among the above-mentioned adhesive layers. In this case, the thickness of the gas barrier layer of the present invention, the oxygen permeability of the layer, and the degree of crystallinity of the crystalline resin contained in the layer are measured and calculated by the methods described in Examples to be described later.

In the laminate according to the embodiment of the present invention in which surface antireflection layer/ultraviolet absorption layer/adhesive (pressure sensitive adhesive) layer/gas barrier layer/wavelength selective absorption layer/adhesive (pressure sensitive adhesive) layer/glass are laminated in this order, from the viewpoint of decreasing the difference in the refractive index between adjacent layers and reducing the external light reflection, it is preferable to have a configuration satisfying at least a condition that the layer provided between the ultraviolet absorption layer and the gas barrier layer is used as the adhesive layer, that the resin in the wavelength selective absorption layer contains the above-mentioned cyclic polyolefin resin, or that the layer provided between the wavelength selective absorption layer and the glass is the pressure sensitive adhesive layer containing a high refractive index material, it is preferable to have a configuration satisfying at least two conditions thereof, and it is still more preferable to have a configuration satisfying all conditions. However, in the laminate according to the embodiment of the present invention, an excellent antireflection effect can be obtained even in a case where the surface antireflection layer is not provided.

EXAMPLES

Hereinafter, the present invention will be described in more detail based on Examples. The materials, amount of use, ratio, details of the treatment, procedures of the treatment, and the like shown in the following examples can be appropriately changed without departing from the spirit of the present invention. Therefore, it is to be understood that the scope of the present invention is not limited to Examples shown below.

In the following examples, "parts" and "%" representing the composition are based on mass unless otherwise specified. In addition, $\lambda_{max}$ means the maximal absorption wavelength showing the maximum absorbance in the measurement of the absorbance of the light resistance evaluation film to be described later, and the unit thereof is nm.

[Preparation of Wavelength Selective Absorption Layer]

The materials used to prepare the wavelength selective absorption layer are shown below.

<Matrix Resin>

(Resin 1)

A polystyrene resin (PSJ-polystyrene GPPS SGP-10 (trade name), manufactured by PS Japan Corporation) was used as resin 1.

(Resin 2)

A polyphenylene ether resin (manufactured by Asahi Kasei Corporation, Zylon S201A (trade name), poly(2,6-dimethyl-1,4-phenylene oxide), Tg 210° C.)

(Peelability Control Resin Component 1)

Byron 550 (trade name, manufactured by Toyobo Co., Ltd., polyester additive)

<Dye>

The following E-13 or E-24 was used as the dye A, the following A-33 was used as the dye B, the following C-80 was used as the dye C, and the following D-35 or F-29 was used as the dye D.

In the following, Ph represents a phenyl group.

E-13

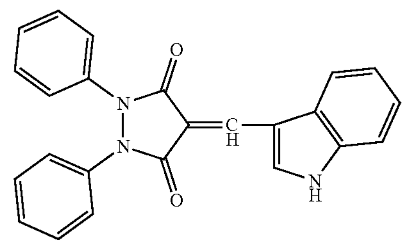

E-24

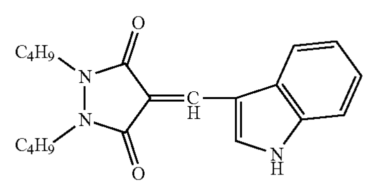

A-33

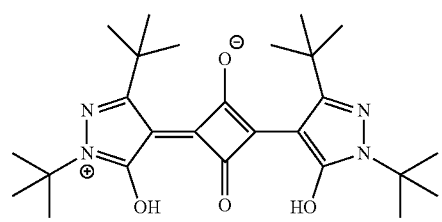

C-80

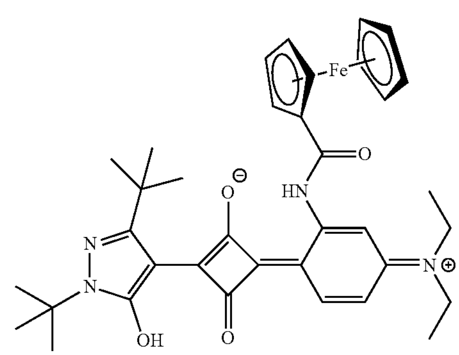

-continued

D-35

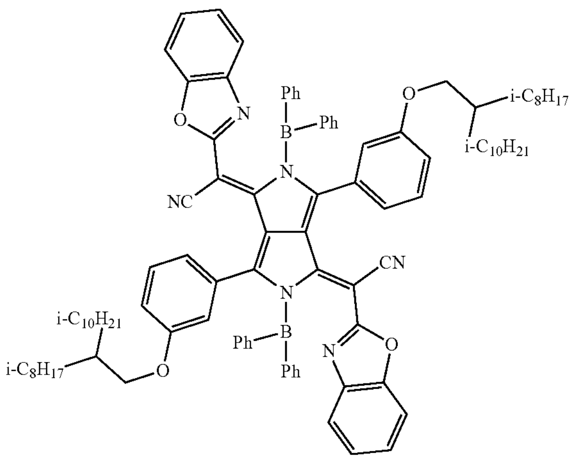

F-29

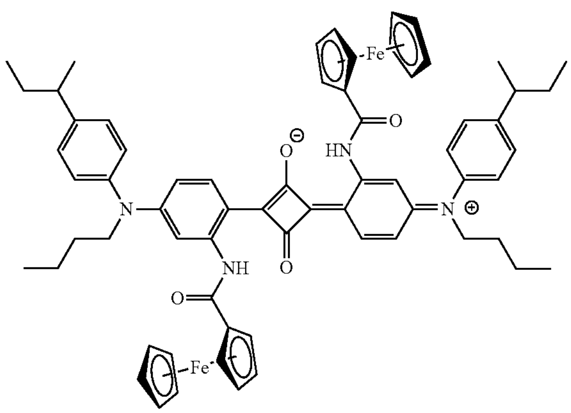

<Additives>

(Antifading Agent 1)

IV-8

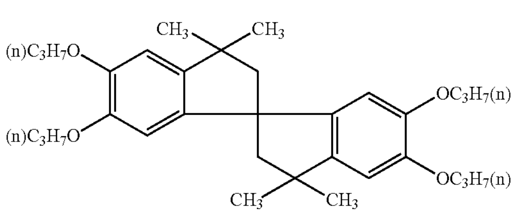

(Leveling Agent 1)

A polymer surfactant composed of the following constituent components was used as the leveling agent 1. In the following structural formula, the ratio of each constituent component is a molar ratio, and t-Bu means a tert-butyl group.

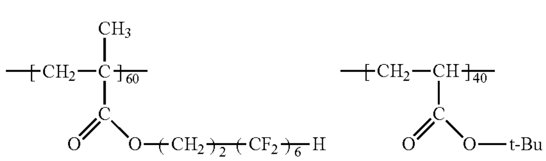

(Substrate 1)

A polyethylene terephthalate film, LUMIRROR XD-510P (trade name, film thickness: 50 μm, manufactured by Toray Industries, Inc.) was used as a substrate 1.

Example 1

<Preparation of Wavelength Selective Absorption Layer with Substrate>

(1) Preparation of Wavelength Selective Absorption Layer Forming Liquid 1

Each component was mixed with the composition shown below to prepare a wavelength selective absorption layer forming liquid 1.

| Composition of Wavelength Selective Absorption Layer Forming Liquid 1 | |
|---|---|
| Resin 1 | 66.7 parts by mass |
| Resin 2 | 17.5 parts by mass |
| Peelability Control Resin Component 1 | 0.20 parts by mass |
| Leveling Agent 1 | 0.08 parts by mass |
| Dye E-13 | 0.86 parts by mass |
| Dye D-35 | 2.23 parts by mass |
| Antifading Agent 1 | 12.4 parts by mass |
| Toluene (solvent) | 1710.0 parts by mass |
| Cyclohexanone (solvent) | 190.0 parts by mass |

Subsequently, the obtained wavelength selective absorption layer forming liquid 1 was filtered using a filter (trade name: HydrophobicFluorepore Membrane, manufactured by Millex) having an absolute filtration precision of 5 μm.

(2) Preparation of Wavelength Selective Absorption Layer 1 with Substrate

The above-mentioned wavelength selective absorption layer forming liquid 1 after the filtration treatment was applied onto the substrate 1 by using a bar coater so that the film thickness after drying was 2.5 μm, and dried at 120° C. to prepare a wavelength selective absorption layer 1 with a substrate.

<Preparation of Wavelength Selective Absorption Layers 2, 3, 4a1, 4a2, 4b, 4c, 4d1, 4d2, 5, and 6 with Substrate>

The wavelength selective absorption layers 2, 3, 4a1, 4a2, 4b, 4c, 4d1, 4d2, 5, and 6 with a substrate were prepared in the same manner as in the production of the wavelength selective absorption layer 1 with a substrate, except that the type and formulation amount of the dye were changed to the contents shown in Table 1 to be described later.

[Preparation of Laminate of Gas Barrier Layer and Wavelength Selective Absorption Layer]

The materials used for preparing the laminate of the gas barrier layer and the wavelength selective absorption layer (hereinafter, simply referred to as the laminate) are shown below.

<Resin>

(1) Crystalline Resin (Resin 3)

PVA105 (manufactured by Kuraray Co., Ltd., Kuraray Poval PVA-105 (trade name), polyvinyl alcohol, and saponification degree 98-99 mol %)

(Resin 4)

AQ-4104 (manufactured by Kuraray Co., Ltd., Exceval AQ-4104 (trade name), modified polyvinyl alcohol, saponification degree 98-99 mol %)

(Resin 5)

PVA403 (manufactured by Kuraray Co., Ltd., Kuraray Poval PVA-403 (trade name), polyvinyl alcohol, and saponification degree 80 mol %)

(Resin 6)

PVA117H (manufactured by Kuraray Co., Ltd., Kuraray Poval PVA-117H (trade name), polyvinyl alcohol, saponification degree 99 mol %)

(2) Amorphous resin (Resin 7)

Estyrene AS-70 (manufactured by Nippon Steel & Sumitomo Metal Corporation, Estyrene AS-70 (trade name), acrylonitrile-styrene copolymer)

(Substrate 2)

The wavelength selective absorption layer side of the wavelength selective absorption layer 1 with a substrate is subjected to a corona treatment using a corona treatment device (trade name: Corona-Plus, manufactured by VETAPHONE), at a discharge amount of 1,000 W-min/m$^2$, and at a processing speed of 3.2 m/min and used as a substrate 2.

<Preparation of Laminate No. L101>

(1) Preparation of Resin Solution

Each component was mixed with the composition shown below, and the mixture was stirred in a constant-temperature tank at 90° C. for 1 hour to dissolve the resin 3 to prepare a gas barrier layer forming liquid 1.

| Composition of gas barrier layer forming liquid 1 | |
|---|---|
| Resin 3 | 4.0 parts by mass |
| Pure water | 96.0 parts by mass |

Subsequently, the obtained gas barrier layer forming liquid 1 was filtered using a filter (trade name: HydrophobicFluorepore Membrane, manufactured by Millex) having an absolute filtration precision of 5 μm.

(2) Preparation of Laminate

The gas barrier layer forming liquid 1 after the filtration treatment was applied to the corona-treated surface side of the substrate 2 using a bar coater so that the film thickness after drying was 1.1 m, and dried at 120° C. for 60 seconds, and the laminate No. L101 was produced. This laminate No. L101 has a structure in which the substrate 1, the wavelength selective absorption layer, and the gas barrier layer are laminated in this order.

<Preparation of Laminate Nos. L102 to L116, Lc001 to Lc008, and Lc101 to Lc111>

Except for changing the composition of the gas barrier layer forming liquid, the type of the wavelength selective absorption layer with a substrate, and the thickness of the gas barrier layer as shown in Table 2 below, the laminate Nos. L102 to L116, Lc001 to Lc008, and Lc101 to Lc111 were produced in the same manner as the preparation of laminate No. L101. The laminate Nos. L101 to L116 are the laminate according to the embodiment of the present invention, and the laminate Nos. Lc001 to Lc008 are comparative laminates, and the laminate Nos. Lc101 to Lc111 are reference examples.

<Light Resistance>

(Preparation of Light Resistance Evaluation Film)

A TAC film (triacetyl cellulose film) containing an UV absorber 1 (trade name: TINUVIN328, manufactured by Ciba Geiki (currently Novartis Pharma), concentration with respect to TAC: 0.98 phr) and an UV absorber 2 (trade name: TINUVIN326, manufactured by Ciba Geiki (currently Novartis Pharma), concentration with respect to TAC: 0.24 phr) was bonded to the gas barrier layer side of the laminate via a pressure sensitive adhesive 1 with a thickness of about 20 μm (trade name: SK2057, manufactured by Soken Chemical Co., Ltd.). Subsequently, the substrate 1 was peeled off, and glass was bonded to the wavelength selective absorption layer side to which the substrate 1 was bonded via the pressure sensitive adhesive 1 to prepare a light resistance evaluation film.

(Maximal Absorption Value of Light Resistance Evaluation Film)

Using a UV3150 spectrophotometer (trade name) manufactured by Shimadzu Corporation, the absorbance of the light resistance evaluation film in the wavelength range of 200 nm to 1,000 nm was measured every 1 nm. The absorbance difference between the absorbance of the light resistance evaluation film at each wavelength and the absorbance of the light resistance evaluation film having the same configuration except that it does not contain the dye was calculated, and the maximum value of this absorbance difference was defined as the maximal absorption value.

(Light Resistance)

The light resistance evaluation film was irradiated with light for 200 hours in an environment of 60° C. and 50% relative humidity with Super Xenon Weather Meter SX75 (trade name) manufactured by Suga Test Instruments Co., Ltd., and the maximal absorption value before and after this irradiation was measured, and the light resistance was calculated by the following equation.

$$[\text{Light resistance }(\%)] = ([\text{Maximal absorption value after 200-hour light irradiation}]/[\text{Maximal absorption value before light irradiation}])\times 100$$

The results are shown in Table 3.

<Evaluation of Physical Properties of Gas Barrier Layer>

The degree of crystallinity, oxygen permeability, and thickness of the gas barrier layer were evaluated by the following methods. The results are shown in Table 3.

(Degree of Crystallinity)

The gas barrier layer was peeled off by 2 to 3 mg from the laminate prepared above, and the temperature was raised at 10° C./min in the range of 20° C. to 260° C. using DSC7000X (trade name) manufactured by Hitachi High-Tech Science Co., Ltd, and heat of fusion 1 was measured.

The degree of crystallinity of the gas barrier layer was calculated based on the method described in J. Appl. Pol. Sci., 81, 762 (2001). Specifically, the degree of crystallinity was calculated by the following equation using the above-mentioned heat of fusion 1 and the heat of fusion 2 of a perfect crystal described in J. Appl. Pol. Sci., 81, 762 (2001).

$$[\text{Degree of crystallinity }(\%)] = ([\text{heat of fusion 1}]/[\text{heat of fusion 2}])\times 100$$

(Oxygen Permeability)

In the above-mentioned preparation of the light resistance evaluation film, the light resistance evaluation film was prepared in the same manner except that the wavelength selective absorption layer was not subjected to corona treatment, and the substrate 1 corresponding to the substrate 2 and the wavelength selective absorption layer were peeled off. By doing so, a TAC film containing a UV absorber, a pressure sensitive adhesive 1, and a gas barrier layer were laminated in this order to prepare an oxygen permeability evaluation film. In addition, Nos. Lc101 to Lc111, the TAC film containing a UV absorber used for producing the light resistance evaluation film was used as the oxygen permeability evaluation film.

Using OX-TRAN 2/21 (trade name) manufactured by MOCON as an oxygen permeability determination device, the oxygen permeability of the oxygen permeability evaluation film was measured by an isobaric method (JIS K 7126-2) under the condition of 25° C., relative humidity 50%, oxygen partial pressure 1 atm, and measurement area 50 cm$^2$. In this test, the difference in oxygen permeability near 600 cc/m$^2$·day·atm, is considered to be within the error range due to the variation in the measurement test.

(Thickness)

A cross-sectional photograph of the laminate was taken using a field emission scanning electron microscope S-4800 (trade name) manufactured by Hitachi High-Technologies Corporation, and the thickness was read.

TABLE 11

| Wavelength selective absorption layer with substrate | Dye A | | | Dye B | | | Dye C | | | Dye D | | |
|---|---|---|---|---|---|---|---|---|---|---|---|---|
| | Type | $\lambda_{max}$ | Formulation amount | Type | $\lambda_{max}$ | Formulation amount | Type | $\lambda_{max}$ | Formulation amount | Type | $\lambda_{max}$ | Formulation amount |
| 1 | E-13 | 427 | 0.86 | — | — | — | — | — | — | D-35 | 750 | 2.23 |
| 2 | E-13 | 427 | 0.86 | A-33 | 513 | 1.04 | C-80 | 599 | 1.48 | — | — | — |
| 3 | E-13 | 427 | 0.86 | A-33 | 513 | 1.04 | C-80 | 599 | 1.48 | D-35 | 750 | 2.23 |
| 4a1 | E-13 | 427 | 0.86 | — | — | — | — | — | — | — | — | — |
| 4b | — | — | — | A-33 | 513 | 1.04 | — | — | — | — | — | — |
| 4C | — | — | — | — | — | — | C-80 | 599 | 1.48 | — | — | — |
| 4d1 | — | — | — | — | — | — | — | — | — | D-35 | 750 | 2.23 |
| 4a2 | E-24 | 407 | 0.77 | — | — | — | — | — | — | — | — | — |
| 4d2 | — | — | — | — | — | — | — | — | — | F-29 | 698 | 2.49 |
| 5 | E-24 | 407 | 0.77 | A-33 | 513 | 1.04 | C-80 | 599 | 1.48 | — | — | — |
| 6 | E-24 | 407 | 0.77 | A-33 | 513 | 1.04 | C-80 | 599 | 1.48 | F-29 | 698 | 2.49 |

The formulation amount of dye is (parts by mass) with respect to the formulation amount (parts by mass) of each component described in the wavelength selective absorption layer forming liquid 1.
The "—" notation indicates that the dye is not contained.

TABLE 2-1

| No. | Gas barrier layer forming liquid | | | | | | | Wavelength selective absorption layer with substrate | Thickness of gas barrier layer [μm] |
|---|---|---|---|---|---|---|---|---|---|
| | Resin | | Pure water | 2-Propanol | Methyl acetate | Acetonitrile | Ethanol | | |
| | Type | Formulation amount | Formulation amount | Formulation amount | Formulation amount | Formulation amount | Formulation amount | | |
| L101 | PVA105 | 4.0 | 96.0 | 0 | 0 | 0 | 0 | 1 | 1.1 |
| L102 | PVA105 | 4.0 | 96.0 | 0 | 0 | 0 | 0 | 1 | 1.6 |
| L103 | AQ-4104 | 4.0 | 88.8 | 7.2 | 0 | 0 | 0 | 1 | 1.6 |
| L104 | PVA105 | 4.0 | 96.0 | 0 | 0 | 0 | 0 | 1 | 2.5 |
| L105 | PVA105 | 4.0 | 96.0 | 0 | 0 | 0 | 0 | 2 | 1.6 |
| L106 | PVA105 | 4.0 | 96.0 | 0 | 0 | 0 | 0 | 3 | 1.6 |
| L107 | PVA105 | 4.0 | 96.0 | 0 | 0 | 0 | 0 | 4a1 | 1.6 |
| L108 | PVA105 | 4.0 | 96.0 | 0 | 0 | 0 | 0 | 4b | 1.6 |
| L109 | PVA105 | 4.0 | 96.0 | 0 | 0 | 0 | 0 | 4c | 1.6 |
| L110 | PVA105 | 4.0 | 96.0 | 0 | 0 | 0 | 0 | 4d1 | 1.6 |
| L111 | AQ-4104 | 4.0 | 88.8 | 7.2 | 0 | 0 | 0 | 4a2 | 1.6 |
| L112 | AQ-4104 | 4.0 | 88.8 | 7.2 | 0 | 0 | 0 | 4b | 1.6 |
| L113 | AQ-4104 | 4.0 | 88.8 | 7.2 | 0 | 0 | 0 | 4c | 1.6 |
| L114 | AQ-4104 | 4.0 | 88.8 | 7.2 | 0 | 0 | 0 | 4d2 | 1.6 |
| L115 | AQ-4104 | 4.0 | 88.8 | 7.2 | 0 | 0 | 0 | 5 | 1.6 |
| L116 | AQ-4104 | 4.0 | 88.8 | 7.2 | 0 | 0 | 0 | 6 | 1.6 |

The formulation amount of each component in the gas barrier layer forming liquid is described in parts by mass when a total amount of components is set to 100 parts by mass.

TABLE 2-2

| No. | Gas barrier layer forming liquid | | | | | | | Wavelength selective absorption layer with substrate | Thickness of gas barrier layer [μm] |
|---|---|---|---|---|---|---|---|---|---|
| | Resin | | Pure water | 2-Propanol | Methyl acetate | Acetonitrile | Ethanol | | |
| | Type | Formulation amount | Formulation amount | Formulation amount | Formulation amount | Formulation amount | Formulation amount | | |
| Lc001 | PVA403 | 4.0 | 96.0 | 0 | 0 | 0 | 0 | 1 | 1.1 |
| Lc002 | PVA403 | 4.0 | 96.0 | 0 | 0 | 0 | 0 | 1 | 1.6 |
| Lc003 | PVA403 | 8.0 | 92.0 | 0 | 0 | 0 | 0 | 1 | 3.7 |
| Lc004 | PVA105 | 4.0 | 96.0 | 0 | 0 | 0 | 0 | 1 | 0.1 |

TABLE 2-2-continued

| | Gas barrier layer forming liquid | | | | | | | | | |
|---|---|---|---|---|---|---|---|---|---|---|
| | Resin | | Pure water | 2-Propanol | Methyl acetate | Acetonitrile | Ethanol | Wavelength selective | |
| No. | Type | Formulation amount | Formulation amount | Formulation amount | Formulation amount | Formulation amount | Formulation amount | absorption layer with substrate | Thickness of gas barrier layer [μm] |
| Lc005 | PVA117H | 10.0 | 90.0 | 0 | 0 | 0 | 0 | 1 | 40 |
| Lc006 | | 3.8 | 0 | 0 | 48.1 | 43.3 | 4.8 | 1 | 1.1 |
| Lc007 | | 3.8 | 0 | 0 | 48.1 | 43.3 | 4.8 | 1 | 1.6 |
| Lc008 | | 7.4 | 0 | 0 | 46.3 | 41.7 | 4.6 | 1 | 3.7 |
| Lc101 | — | — | — | — | — | — | — | 1 | — |
| Lc102 | — | — | — | — | — | — | — | 2 | — |
| Lc103 | — | — | — | — | — | — | — | 3 | — |
| Lc104 | — | — | — | — | — | — | — | 4a1 | — |
| Lc105 | — | — | — | — | — | — | — | 4b | — |
| Lc106 | — | — | — | — | — | — | — | 4c | — |
| Lc107 | — | — | — | — | — | — | — | 4d1 | — |
| Lc108 | — | — | — | — | — | — | — | 4a2 | — |
| Lc109 | — | — | — | — | — | — | — | 4d2 | — |
| Lc110 | — | — | — | — | — | — | — | 5 | — |
| Lc111 | — | — | — | — | — | — | — | 6 | — |

The formulation amount of each component in the gas barrier layer forming liquid is described in parts by mass when a total amount of components is set to 100 parts by mass.
"—" notation in the column of Nos. Lc101 to Lc111 indicates that the gas barrier layer is not provided.

The formulation amount of each component in the gas barrier layer forming liquid is described in parts by mass when a total amount of components is set to 100 parts by mass.

"-" notation in the column of Nos. Lc1101 to Lc1111 indicates that the gas barrier layer is not provided.

TABLE 31

| | Gas barrier layer | | | | Light resistance | | | | | |
|---|---|---|---|---|---|---|---|---|---|---|
| | | Thickness | Degree of | Oxygen | Dye A | | Dye B | Dye C | Dye D | |
| No. | Resin | [μm] | crystallinity | permeability | E-13 | E-24 | A-33 | C-80 | D-35 | F-29 |
| L101 | PVA105 | 1.1 | 49% | 0.5 | 82% | — | — | — | 91% | — |
| L102 | PVA105 | 1.6 | 49% | 0.5 | 83% | — | — | — | 91% | — |
| L103 | AQ-4104 | 1.6 | 53% | 0.4 | 85% | — | — | — | 91% | — |
| L104 | PVA105 | 2.5 | 50% | 0.3 | 77% | — | — | — | 88% | — |
| L105 | PVA105 | 1.6 | 49% | 0.6 | 91% | — | 95% | 94% | — | — |
| L106 | PVA105 | 1.6 | 49% | 0.6 | 86% | — | 93% | 89% | 91% | — |
| L107 | PVA105 | 1.6 | 49% | 0.6 | 87% | — | — | — | — | — |
| L108 | PVA105 | 1.6 | 49% | 0.6 | — | — | 98% | — | — | — |
| L109 | PVA105 | 1.6 | 49% | 0.6 | — | — | — | 96% | — | — |
| L110 | PVA105 | 1.6 | 49% | 0.6 | — | — | — | — | 89% | — |
| L111 | AQ-4104 | 1.6 | 53% | 0.4 | — | 95% | — | — | — | — |
| L112 | AQ-4104 | 1.6 | 53% | 0.4 | — | — | 97% | — | — | — |
| L113 | AQ-4104 | 1.6 | 53% | 0.4 | — | — | — | 95% | — | — |
| L114 | AQ-4104 | 1.6 | 53% | 0.4 | — | — | — | — | — | 96% |
| L115 | AQ-4104 | 1.6 | 53% | 0.4 | — | 96% | 97% | 96% | — | — |
| L116 | AQ-4104 | 1.6 | 53% | 0.4 | — | 97% | 97% | 96% | — | 96% |
| Lc001 | PVA403 | 1.1 | 21% | 157 | 49% | — | — | — | 83% | — |
| Lc002 | PVA403 | 1.6 | 22% | 123 | 52% | — | — | — | 82% | — |
| Lc003 | PVA403 | 3.7 | 23% | 68 | 56% | — | — | — | 83% | — |
| Lc004 | PVA105 | 0.1 | 49% | 330 | 56% | — | — | — | 86% | — |
| Lc005 | PVA117H | 40 | 40% | 0.05 | 77% | — | — | — | 88% | — |
| Lc006 | | 1.1 | 0% | 590 | 55% | — | — | — | 82% | — |
| Lc007 | | 1.6 | 0% | 650 | 57% | — | — | — | 85% | — |
| Lc008 | | 3.7 | 0% | 640 | 62% | — | — | — | 88% | — |
| Lc101 | | 0 | — | 640 | 53% | — | — | — | 85% | — |
| Lc102 | | 0 | — | 640 | 77% | — | 86% | 74% | — | — |
| Lc103 | | 0 | — | 640 | 30% | — | 52% | 24% | 55% | — |
| Lc104 | | 0 | — | 640 | 80% | — | — | — | — | — |
| Lc105 | | 0 | — | 640 | — | — | 96% | — | — | — |
| Lc106 | | 0 | — | 640 | — | — | — | 76% | — | — |
| Lc107 | | 0 | — | 640 | — | — | — | — | 82% | — |
| Lc108 | | 0 | — | 640 | — | 91% | — | — | — | — |

TABLE 31-continued

| | | Gas barrier layer | | | Light resistance | | | | | |
|---|---|---|---|---|---|---|---|---|---|---|
| | | Thickness | Degree of | Oxygen | Dye A | | Dye B | Dye C | Dye D | |
| No. | Resin | [μm] | crystallinity | permeability | E-13 | E-24 | A-33 | C-80 | D-35 | F-29 |
| Lc109 | | 0 | — | 640 | — | — | — | — | — | 70% |
| Lc110 | | 0 | — | 640 | — | 80% | 87% | 75% | — | — |
| Lc111 | | 0 | — | 640 | — | 69% | 74% | 62% | — | 61% |

(Note in Table 3)
The "—" notation in the column of light resistance evaluation indicates that it does not contain a dye.

In the laminate Nos. Lc101 to Lc111, the "-" notation in the column of degree of crystallinity indicates that the measurement is not performed because the gas barrier layer is not provided.

In the laminate Nos. Lc101 to Lc111, the oxygen permeability indicates the oxygen permeability of the TAC film containing a UV absorber.

The unit of oxygen permeability is cc/m$^2$ day-atm.

As shown in Table 3, the laminate Nos. Lc006 to Lc008 of Comparative Examples provided with a gas barrier layer containing an amorphous resin had little or little effect of improving the light resistance with respect to the laminate No. Lc101 of the reference example having no gas barrier layer, and was inferior in light resistance. In addition, the laminate Nos. Lc001 to Lc004 are gas barrier layers containing a crystalline resin, and although the laminates are provided with a gas barrier layer having a specific film thickness specified in the present invention, the oxygen permeability of the gas barrier layer is higher than the specific range specified in the present invention. Laminate Nos. Lc00l to Lc004 of the comparative example had almost no effect of improving the light resistance with respect to the laminate No. Lc101 of the reference example having no gas barrier layer, and was inferior in light resistance.

In addition, the laminate No. Lc005 comprises a gas barrier layer containing a crystalline resin, has the oxygen permeability of the gas barrier layer within the specific range specified in the present invention, but has the thickness of the gas barrier layer of 40 μm, which is thicker than the film thickness of a specific range specified in the present invention. Laminate No. Lc005 of the comparative example had no difference in the effect of improving the light resistance from the laminate No. L104 of the present invention in which the film thickness of the gas barrier layer was 2.5 μm. Even if the gas barrier layer contains a crystalline resin and has a specific range of oxygen permeability, if the film thickness of the gas barrier layer is thicker than the specific range specified in the present invention, the gas barrier layer should be made thicker. It was found that even if the oxygen permeability of the gas barrier layer could be reduced, the desired light resistance improving effect could not be obtained.

On the other hand, it was found that the laminate Nos. L101 to L116 of the present invention had a large effect of improving the light resistance with respect to the laminate Nos. Lc101 to Lc111 of the reference example having no gas barrier layer, and had excellent light resistance. Specifically, it was found that the effect of improving light resistance can be obtained at an excellent level, by comparing No. Lc101 of reference example to No. L101 to 104 for the laminate containing two dyes A and B, by comparing No. Lc102 of reference example to No. L105, or by comparing of No. Lc110 of reference example to No. L115, for the laminate containing the three dyes A to C, and by comparing No. Lc103 of the reference example to No. L106 or No. Lc111 of reference example to No. L116, for the laminate containing four dyes A to D. Further, regarding the laminate containing any one of the dyes A to D, it was found to have entirely an excellent effect of improving light resistance by comparing the No. Lc104 of the reference example to No. L107, Lc105 of the reference example to No. L108, No, Lc106 of the reference example to No. L109, Lc107 of the reference example and No. L110, Lc108 of the reference example to No. L111, Lc109 of the reference example to No. L114, respectively.

Reference Example: Wavelength Selective Absorption Filter Containing Four Dyes A to D An OLED display device equipped with a wavelength selective absorption filter (wavelength selective absorption layer) containing four types of dyes A to D having a main absorption wavelength range in different wavelength ranges achieves both suppression of external light reflection and suppression of brightness decrease. In addition, the fact that the original tint of the display image can be sufficiently expressed will be described in detail below.

[Preparation of Wavelength Selective Absorption Filter]

The materials used to prepare the wavelength selective absorption filter are shown below.

<Matrix Resin>

(Resin 8)

A polystyrene resin (PSJ-polystyrene GPPS SGP-10 (trade name), Tg 100° C., fd 0.56) manufactured by PS Japan Corporation was heated at 110° C., allowed to cool to room temperature (23° C.), and used as a resin 8.

(Resin 2)

A polyphenylene ether resin (manufactured by Asahi Kasei Corporation, Zylon S201A (trade name), poly(2,6-dimethyl-1,4-phenylene oxide), Tg 210° C.)

(Extensible Resin Component 1)

Asaflex 810 (trade name, manufactured by Asahi Kasei Corporation, styrene-butadiene resin)

(Peelability Control Resin Component 1)

Byron 550 (trade name, manufactured by Toyobo Co., Ltd., polyester additive)

<Dye>

C-80

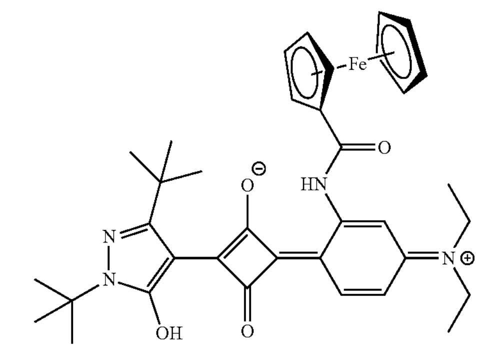

$\lambda_{max}$ 594 nm 7-21

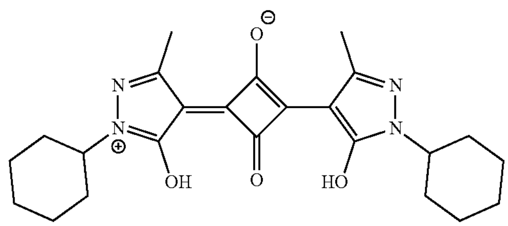

$\lambda_{max}$ 495 nm

E-13

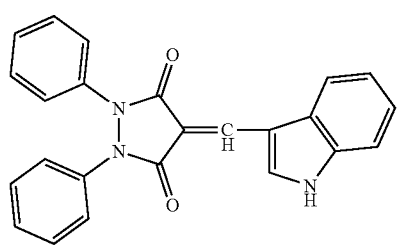

$\lambda_{max}$ 426 nm

D-35

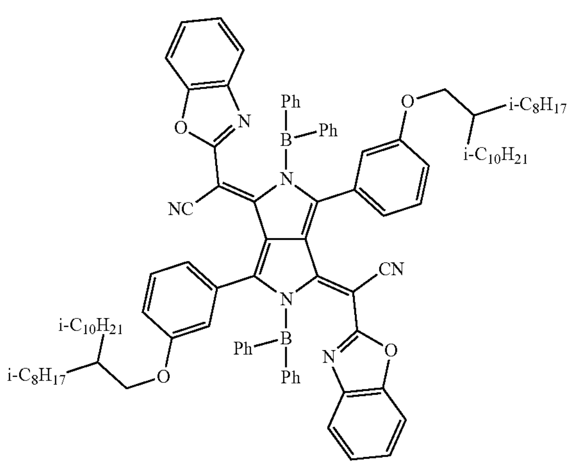

$\lambda_{max}$ 742 nm

FDG007: Trade name, manufactured by Yamada Chemical Co., Ltd., tetraazaporphyrin coloring agent, $\lambda_{max}$ 594 nm The following dyes used in Example 3 of JP2017-203810A.

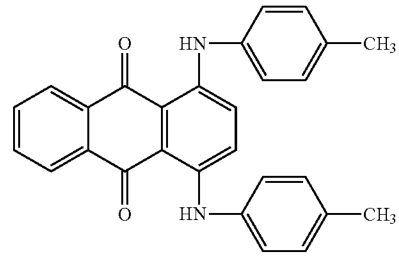

C.I. Solvent Green 3
$\lambda_{max}$ 645 nm

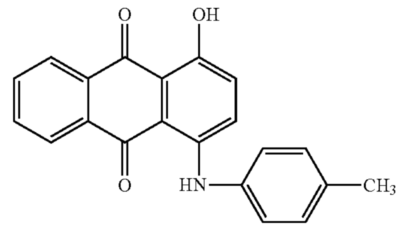

C.I. Solvent Violet 13
$\lambda_{max}$ 561 nm

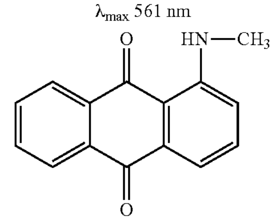

C.I. Solvent Red 111
$\lambda_{max}$ 507 nm

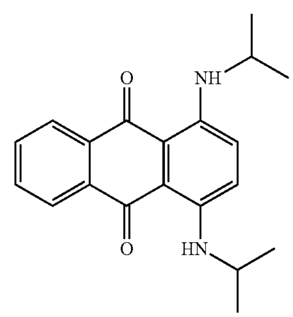

C.I. Solvent Blue 36
$\lambda_{max}$ 646 nm

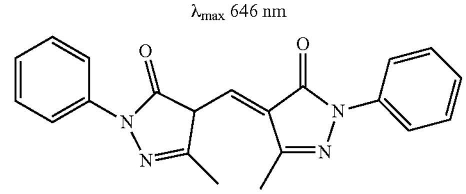

C.I. Solvent Yellow 93
$\lambda_{max}$ 400 nm

In addition, $\lambda_{max}$ described in the above-mentioned section of Dye means the maximal absorption wavelength, at which highest absorbance appears, measured under the following conditions.

That is, the above dye was dissolved in chloroform to prepare a measurement solution having a concentration of $1\times10^{-6}$ mol/L. For the measurement solution, the maximal absorption wavelength $\lambda_{max}$ at 23° C. was measured using a cell having an optical path length of 10 mm and a spectrophotometer UV-1800PC (manufactured by Shimadzu Corporation).

<Additives>

(Antifading Agent 1)

Exemplary compound IV-8 in the above antifading agent (Leveling Agent 1)

A polymer surfactant composed of the following constituent components was used as the leveling agent 1. In the following structural formula, the ratio of each constituent component is a molar ratio, and t-Bu means a tert-butyl group.

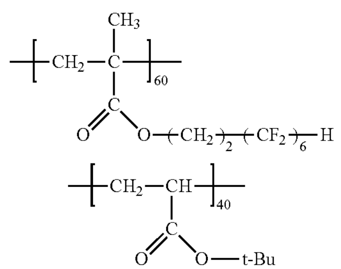

(Substrate 1)

A polyethylene terephthalate film, LUMIRROR XD-510P (trade name, film thickness: 50 μm, manufactured by Toray Industries, Inc.) was used as a substrate 1.

<Preparation of Wavelength Selective Absorption Filter No. 101 with Substrate>

(1) Preparation of Toluene Solution of Extensible Resin Component 1

2.75 parts by mass of the extensible resin component 1 was dissolved in 89.0 parts by mass of toluene. Next, 8.26 parts by mass of KYOWADO 700 SEN-S (trade name, manufactured by Kyowa Chemical Industry Co., Ltd.) was added to the obtained solution, and the mixture was stirred at room temperature (23° C.) for 1 hour, and then subjected to filtration using a metal sintered filter (trade name: Pall filter PMF, media code: FH025, manufactured by Pall) with an absolute filtration precision of 2.5 μm to remove KYOWADO 700 SEN-S, so as to prepare a toluene solution of extensible resin component 1 from which a base component was removed.

(2) Preparation of Resin Solution

Each component was mixed with the composition shown below to prepare a wavelength selective absorption filter forming liquid (composition) Ba-1.

| Composition of Wavelength Selective Absorption Filter Forming Liquid Ba-1 | |
|---|---|
| Resin 8 | 59.2 parts by mass |
| Resin 2 | 17.5 parts by mass |
| Toluene Solution of Extensible Resin Component 1 Prepared Above | 667.3 parts by mass |
| Peelability control resin component 1 | 0.20 parts by mass |
| Leveling Agent 1 | 0.16 parts by mass |
| Coloring Agent 7-21 | 0.50 parts by mass |
| Dye C-80 | 0.44 parts by mass |
| Coloring Agent E-13 | 0.86 parts by mass |
| Dye D-35 | 1.12 parts by mass |
| Antifading agent 1 | 12.4 parts by mass |
| Toluene (solvent) | 872.7 parts by mass |
| Cyclohexanone (solvent) | 380.0 parts by mass |

Subsequently, the obtained wavelength selective absorption filter forming liquid Ba-1 was filtered using a filter paper (#63, manufactured by Toyo Filter Paper Co., Ltd.) having an absolute filtration precision of 10 μm, and further subjected to subjected to filtration using a metal sintered filter (trade name: Pall filter PMF, media code: FH025, manufactured by Pall) with an absolute filtration precision of 2.5 μm.

(3) Preparation of Wavelength Selective Absorption Filter with Substrate

The above-mentioned wavelength selective absorption filter forming liquid Ba-1 after the filtration treatment was applied onto the substrate 1 by using a bar coater so that the film thickness after drying was 2.5 μm, and dried at 120° C. to prepare a wavelength selective absorption filter No. 101 with the substrate.

<Preparation of Wavelength Selective Absorption Filter No. 102 to 108 and c11 to c15 with Substrate>

The wavelength selective absorption filters No. 102 to 108 and c11 to c15 with substrate were prepared in the same manner as in the production of the wavelength selective absorption filter No. 101, except that the type and formulation amount of the dye were changed to the contents shown in Table 4.

Here, Nos. 101 to 108 are wavelength selective absorption filters satisfying the above-mentioned relational expressions (I) to (VI), and Nos. c11 to c15 are the wavelength selective absorption filters for comparison, which do not satisfy the above-mentioned relational expressions (I) to (VI).

<Maximal Absorption Value of Wavelength Selective Absorption Filter>

Using a UV3150 spectrophotometer (trade name) manufactured by Shimadzu Corporation, the absorbance of a wavelength selective absorption filter with a substrate in the wavelength range of 380 nm to 800 nm was measured every 1 nm. An absorbance difference $Ab_x(\lambda)-Ab_0(\lambda)$ between an absorbance $Ab_x(\lambda)$ at each wavelength λ nm of the wavelength selective absorption filter with a substrate and that does not contain dye and an absorbance $Ab_0(\lambda)$ of the wavelength selective absorption filter with a substrate (that is, the wavelength selective absorption filter No. c11) was calculated, and the maximum value of the absorbance difference was defined as the maximal absorption value.

<Simulation of Brightness, Reflectivity, and Tint>

For the OLED display device equipped with the wavelength selective absorption filter produced above, the external light reflection was simulated, and the brightness, reflectivity, and tint (a* and b*) were calculated.

(1) Configuration of OLED Display Device

Figure 2:
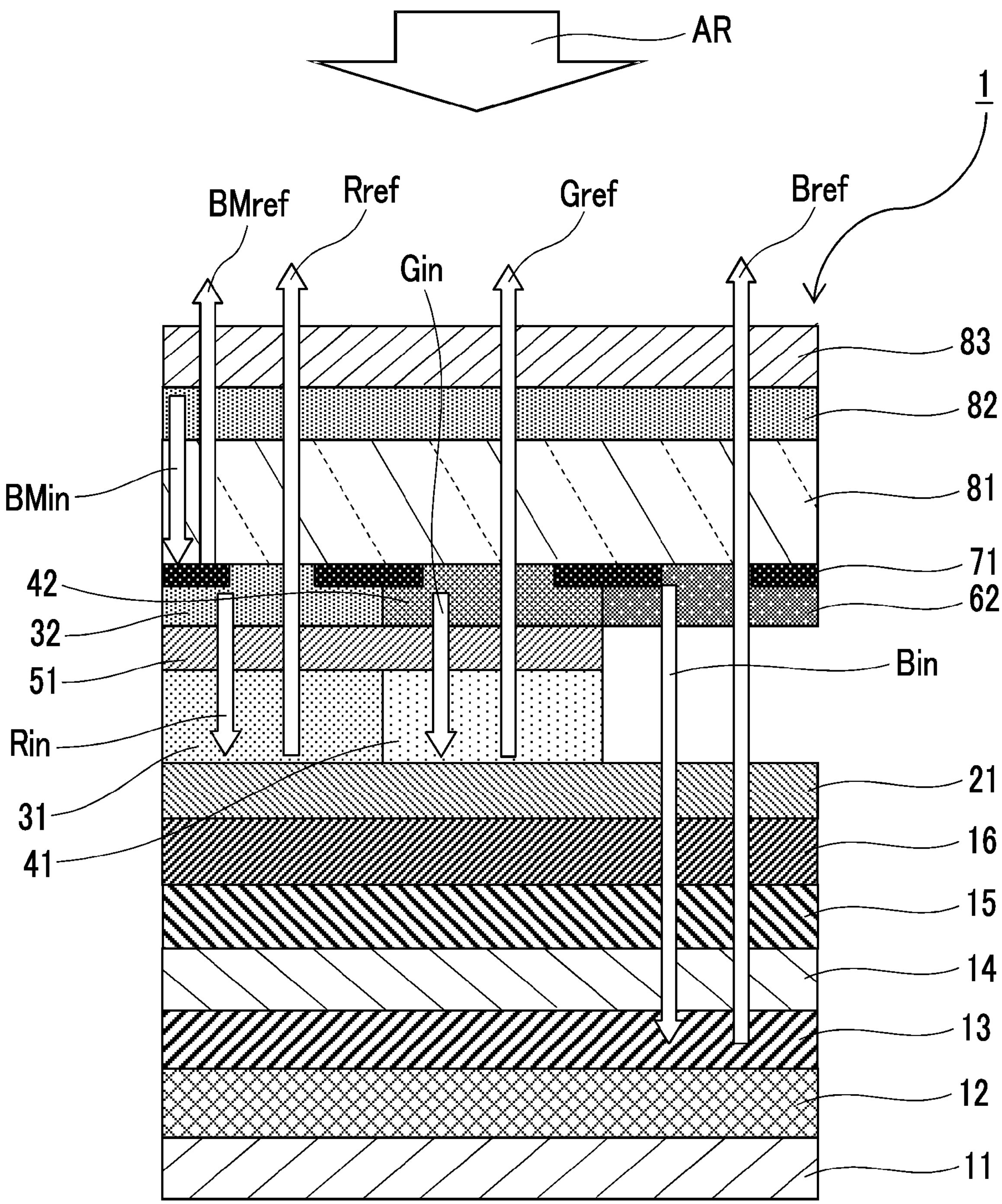
FIG. 2 is a vertical cross-sectional view schematically showing a configuration of an OLED display device assumed for simulating external light reflection in Reference Example.

As the OLED display device for performing the simulation, a device for displaying an image by a color filter including a blue OLED element and quantum dots (QD) shown in FIG. 2 was assumed.

That is, the OLED display device 1 shown in FIG. 2 includes a blue OLED element, an RG selective reflective layer 21, a color filter (CF) including quantum dots (QD), a black matrix 71, and a wavelength selective absorption filter 82 prepared in the above, on a TFT substrate in order. A wavelength selective absorption filter 82 is located on the external light side (visual recognition side).

The TFT substrate has a configuration in which the TFT 12 is provided on the substrate 11. The blue OLED element has a configuration in which the anode 13, the blue OLED 14, and the cathode 15 are laminated from the TFT substrate side. A barrier film 16 is arranged between the blue OLED element and the RG selective reflective layer 21.

A color filter containing quantum dots includes quantum dots as red and green light emitting parts. The color filter corresponding to red has a configuration in which a layer 31 containing the red quantum dots and a light diffusing body, a B selective reflective layer 51, and red color filter 32 are arranged in this order on RG selective reflective layer 21. The color filter corresponding to green has a configuration in which a layer 41 containing a green quantum dot and a light diffusing body, a B selective reflective layer 51, and a green color filter 42 are arranged in this order on the RG selective reflective layer 21. The layer 31 containing the red quantum dots and the light diffusing body is a color conversion unit that converts light in the blue wavelength range into light in the red wavelength range, and the layer 41 containing the green quantum dots and the light diffusing body is a color conversion unit that converts light in the wavelength range of blue into light in the green wavelength range. The color filter corresponding to blue has a configuration in which the blue color filter 62 is arranged on the RG selective reflective layer 21.

A glass 81 is provided between the color filter and the black matrix 71 containing the quantum dots and the wavelength selective absorption filter 82, and a low reflection surface film 83 is provided on the wavelength selective absorption filter 82.

(2) Simulation Conditions

In the OLED display device 1 shown in FIG. 2, the reflectivity, transmission spectrum, and reflection spectrum of each component were defined as follows in the simulation of the reflectivity and the reflected tint of the irradiation of the external light AR.

(i) The red-green selective reflective layer is assumed to have a reflectivity of 0% in a region having a wavelength of less than 500 nm and a reflectivity of 100% having a wavelength of 500 nm or more and 800 nm or less.

(ii) The transmission spectrum of the color filter was calculated by measuring the panel spectrum and the backlight spectrum and calculating the panel spectrum/backlight spectrum.

(iii) As the transmission spectrum of the wavelength selective absorption filter, the results of measuring the transmission spectra of the wavelength selective absorption filter with a substrate prepared above and the substrate used in the above preparation were used.

(iv) As the reflectivity of the black matrix, the reflection spectrum of carbon black was used.

(v) As the reflectivity of the OLED substrate, the reflection spectrum of the substrate measured by disassembling a commercially available TV OLED55B7P (trade name) manufactured by LG Electronics and peeling off the circularly polarizing plate was used.

(vi) The area ratios of the blue pixel, the green pixel, the red pixel, and the black matrix were calculated assuming that the area ratio of the blue pixel, the green pixel, and the red pixel was 17%, and the area ratio of the black matrix was 49%.

In the above, the transmission spectrum and the reflection spectrum were measured using a UV3150 spectrophotometer (trade name) manufactured by Shimadzu Corporation.

(3) Calculation of Reflectivity and Reflected Tint

The reflectivity and the reflected tint were calculated by calculating the reflection spectra of each of the blue pixel, the green pixel, the red pixel, and the black matrix, and multiplying these by the area ratio. Specifically, it is as follows.

First, the reflection spectra of the blue pixel, the green pixel, the red pixel, and the black matrix were set to $R_{bluc}$, $R_{green}$, $R_{red}$, and $R_{black}$, respectively, and calculated based on the following formula.

As the reflection $B_{ref}$ of the external light in the blue pixel, the reflection at the anode 13 in the blue OLED display element is defined as the external light reflection $G_{ref}$ in the green pixel and the external light reflection $R_{ref}$ in the red pixel is assumed to be reflected by the RG selective reflective layer 21 (see FIG. 2).

In the following equation, the transmission spectrum of the wavelength selective absorption filter is $T_{dye}$, the transmission spectrum of each color filter is $CF_{blue}$, $CF_{green}$, and $CF_{red}$, and the reflectivity of the green-red selective reflective layer is $R_{sel}$, the reflectivity of the OLED substrate represents $R_{sub}$, and the reflectivity of the black matrix represents $R_{BM}$.

$$R_{blue} = (T_{dye})^2 \times CF_{blue} \times R_{sub}$$

$$R_{green} = (T_{dye})^2 \times CF_{green} \times R_{sel}$$

$$R_{red} = (T_{dye})^2 \times CF_{red} \times R_{sel}$$

$$R_{Black} = (T_{dye})^2 \times R_{BM}$$

Next, the area ratios of the blue pixel, green pixel, red pixel, and black matrix are set to $A_{blue}$, $A_{green}$, $A_{red}$, and $A_{black}$, respectively. The reflection spectrum of the OLED display device was calculated by the following equation.

$$\text{Reflection spectrum of } OLED \text{ display device} = R_{blue} \times A_{blue} + R_{green} \times A_{green} + R_{eed} \times A_{red} + R_{black} \times A_{black}$$

Based on the reflection spectrum of the OLED display device calculated above, the reflectivity (luminous efficiency correction) and a* and b* were calculated.

(4) Calculation of Relative Brightness

The relative brightness in a case where the wavelength selective absorption filter produced above was used was calculated as follows.

The emission spectrum S (λ) of the display was calculated using the backlight spectrum of Samsung 55 "Q7F (quantum dot type liquid crystal television, trade name). Further, the transmission spectrum of the wavelength selective absorption filter was defined as T (λ).

The brightness in a case where the wavelength selective absorption filter was not used was calculated by performing luminous efficiency correction on the spectrum S (λ), and this brightness was set to 100. The brightness of the spectrum S (λ)×T (λ) in a case where the wavelength selective absorption filter was used was calculated as the relative brightness with respect to the brightness in a case where the above wavelength selective absorption filter was not used.

<Evaluation of Effect of Suppressing Brightness Decrease>

Using the relative brightness values obtained in the above simulation, the effect of suppressing the brightness decrease was evaluated on the basis of the following evaluation standard. In this test, "A" and "B" represent acceptance.

(Evaluation Standard)

A: 80<Relative Brightness≤100

B: 60<Relative Brightness≤80

C: 0≤Relative Brightness≤60

<Evaluation of Effect of Suppressing External Light Reflection>

Using the reflectivity value obtained in the above simulation, the reflectivity reduction rate was calculated by the following formula, and the effect of suppressing external light reflection was evaluated based on the following evaluation standard. In this test, “A” and “B” represent acceptance.

$$\text{Reflectivity reduction rate} = (R_0 - R_1)/R_0 \times 100\%$$

$R_1$: Reflectivity in a case where using a wavelength selective absorption filter containing a dye $R_0$: Reflectivity of No. c11 in a case where a wavelength selective absorption filter with a substrate that does not contain dye is used (Evaluation Standard)

A: 50%<Reflectivity reduction rate≤80%

B: 20%<Reflectivity reduction rate≤50%

C: 0%<Reflectivity reduction rate≤20%

<Evaluation of Tint>

Using the values of a* and b* calculated in the above simulation, the color difference was calculated by the following equation.

$$(\text{Color difference}) = [(a_1^* - a_0^*)^2 + (b_1^* - b_0^*)^2]^{1/2}$$

The meaning of each reference in the above formula is as follows.

$a^*_1$: a* in a case where using a wavelength selective absorption filter with a substrate containing a dye $a^*_0$: a* of No. c11 in a case where using the wavelength selective absorption filter with a substrate that does not contain dye $b^*_1$: b* in a case where using a wavelength selective absorption filter with a substrate containing a dye $b^*_0$: b* of No. c11 in a case where using the wavelength selective absorption filter with a substrate that does not contain dye The color difference calculated from the above formula is 16.0 or less at a practical level, 15.0 or less is a preferable level, and 5.0 or less is a more preferable level.

The results are shown in Table 4.

TABLE 4

| No. | Dye A Type | Dye A $\lambda_{max}$ | Dye A Formulation amount | Dye A Type | Dye A $\lambda_{max}$ | Dye A Formulation amount | Dye B Type | Dye B $\lambda_{max}$ | Dye B Formulation amount | Dye C Type | Dye C $\lambda_{max}$ | Dye C Formulation amount | Dye C Type | Dye C $\lambda_{max}$ | Dye C Formulation amount | Dye D Type | Dye D $\lambda_{max}$ | Dye D Formulation amount |
|---|---|---|---|---|---|---|---|---|---|---|---|---|---|---|---|---|---|---|
| 101 | E-13 | 425 | 0.89 | — | — | — | 7-21 | 500 | 0.52 | C-80 | 599 | 0.46 | — | — | — | D-35 | 750 | 1.15 |
| 102 | E-13 | 425 | 2.87 | — | — | — | 7-21 | 500 | 1.03 | C-80 | 599 | 0.92 | — | — | — | D-35 | 750 | 2.30 |
| 103 | E-13 | 425 | 4.85 | — | — | — | 7-21 | 500 | 2.06 | C-80 | 599 | 1.53 | — | — | — | D-35 | 750 | 3.82 |
| 104 | E-13 | 425 | 0.44 | — | — | — | R111 | 503 | 2.78 | C-80 | 599 | 0.23 | — | — | — | D-35 | 750 | 0.58 |
| 106 | E-13 | 425 | 2.87 | — | — | — | 7-21 | 500 | 1.03 | FDG007 | 594 | 1.38 | — | — | — | D-35 | 750 | 2.30 |
| 107 | E-13 | 425 | 4.85 | — | — | — | 7-21 | 500 | 2.06 | FDG007 | 594 | 2.30 | — | — | — | D-35 | 750 | 3.82 |
| 108 | E-13 | 425 | 1.32 | — | — | — | R111 | 503 | 3.17 | FDG007 | 594 | 1.73 | — | — | — | D-35 | 750 | 1.74 |
| c11 | — | — | — | — | — | — | — | — | — | — | — | — | — | — | — | — | — | — |
| c12 | Y93 | 400 | 0.84 | G3 | 409 | 5.60 | R111 | 503 | 0.84 | V13 | 582 | 2.25 | B36 | 599 | 1.45 | — | — | — |
| c13 | Y93 | 400 | 0.42 | G3 | 409 | 2.80 | R111 | 503 | 0.42 | V13 | 582 | 1.12 | B36 | 599 | 0.72 | — | — | — |
| c14 | Y93 | 400 | 0.17 | G3 | 409 | 1.12 | R111 | 503 | 0.17 | V13 | 582 | 0.45 | B36 | 599 | 0.29 | — | — | — |
| c15 | — | — | — | — | 7-21 | 500 | 0.52 | C-80 | 599 | 0.46 | — | — | — | — | — | — | — | — |

| No. | Absorbance ratio Ab(450)/Ab(430) | Ab(450)/Ab(500) | Ab(540)/Ab(500) | Ab(540)/Ab(600) | Ab(630)/Ab(600) | Ab(630)/Ab(700) | Effect of suppressing external light reflection | Effect of suppressingbrightness decrease | Color difference |
|---|---|---|---|---|---|---|---|---|---|
| 101 | 0.48 | 0.48 | 0.12 | 0.13 | 0.12 | 0.72 | B | A | 1.7 |
| 102 | 0.54 | 0.48 | 0.12 | 0.13 | 0.12 | 0.72 | B | B | 3.6 |
| 103 | 0.58 | 0.48 | 0.12 | 0.13 | 0.12 | 0.72 | A | B | 1.2 |
| 104 | 0.81 | 0.65 | 0.72 | 0.85 | 0.12 | 0.63 | B | B | 12.1 |
| 106 | 0.54 | 0.72 | 0.16 | 0.22 | 0.12 | 0.38 | B | B | 6.8 |
| 107 | 0.57 | 0.66 | 0.14 | 0.22 | 0.12 | 0.37 | A | B | 8.2 |
| 108 | 0.58 | 0.89 | 0.99 | 0.49 | 0.09 | 0.47 | A | B | 15.4 |
| c 11 | — | — | — | — | — | — | C | A | — |
| c12 | 0.64 | 1.01 | 1.95 | 0.50 | 0.69 | 5.34 | A | C | 21.1 |
| c13 | 0.64 | 1.01 | 1.95 | 0.50 | 0.69 | 5.34 | A | B | 23.2 |
| c14 | 0.64 | 1.01 | 1.95 | 0.50 | 0.69 | 5.34 | B | A | 24.9 |
| c15 | 1.72 | 0.12 | 0.11 | 0.11 | 0.06 | 64.0 | A | B | 19.9 |

(Note in the Table)

The formulation amount of the dye is described in parts by mass with respect to 100 parts by mass of the matrix resin.

The "-" notation in the dye column indicates that it does not contain a dye.

In the notation of "-" in the column of Absorbance ratio and Dye of No. c11, the value is not described because No. c11 is a wavelength selective absorption filter with a substrate that does not contain a dye and corresponds to a reference filter of each wavelength selective absorption filter.

Amax in the dye column means the wavelength (maximal absorption wavelength) showing the largest maximal absorption value among the maximal absorption values measured for the wavelength selective absorption filter.

Some of the dyes used are described using the following abbreviations.

Y93: C.I. Solvent Yellow 93

G3: C.I. Solvent Green 3

R111: C.I. Solvent Red 111

V13: C.I. Solvent Violet 13

B36: C.I. Solvent Blue 36

As shown in Table 4, the comparative wavelength selective absorption filters No. c12 to c14 containing a combination of dyes of the related art do not satisfy the above-described Relational Expressions (II), (III), (V), and (VI). The comparative wavelength selective absorption filters No. c12 to c14 have a large color difference of 20 or more from the wavelength selective absorption filter (No. c11) that does not contain a dye, resulting in a large change in tint, and thus it was not possible to suppress the change in tint while both achieving the suppression of external light reflection and suppression of brightness decrease. In addition, the comparative wavelength selective absorption filter No. c15 which does not contain the dyes A and D specified in the present invention does not satisfy above-described Relational Expressions (I) and (VI). The comparative wavelength selective absorption filter No. c15 also has a large color difference of 19.9 from the wavelength selective absorption filter (No. c11) that does not contain a dye, resulting in a large change in tint, and thus it was not possible to suppress the change in tint while both achieving the suppression of external light reflection and suppression of brightness decrease.

On the other hand, the wavelength selective absorption filters No. 101 to 108 of the reference example satisfying above-described Relational Expressions (I) to (VI) were at a practical level by sufficiently suppressing the change in tint while suppressing both the external light reflection and the brightness decrease. These showed an excellent effect of suppressing the change in tint while realizing the suppression of the external light reflection and suppression of the brightness decrease at the same level of the wavelength selective absorption filters No. c12 to c14 containing a combination of dyes of the related art. Further, the wavelength selective absorption filters No. 101 to 107 using a squarine-based coloring agent represented by General Formula (1) as at least one of the dyes B or C were found that both suppressing the external light reflection and the brightness decrease and further suppressing the change in tint at a more excellent level can be achieved.

Example 2

<Preparation of Wavelength Selective Absorption Layer with Substrate>

The materials used to prepare the wavelength selective absorption layer are shown below.

(Resin 9)

Apel APL6011 T (trade name, manufactured by Mitsui Chemicals, Inc., a copolymer of ethylene and norbornene, Tg 105° C.), which is a cyclic polyolefin resin, was used as the resin 9.

(Dye)

E-24 was used as the dye A, A-33 and 7-22 were used as the dye B, C-73 and C-80 were used as the dye C, and F-34 was used as the dye D.

E-24, A-33, and C-80 are the same as E-24, A-33, and C-80 in Example 1, respectively, and 7-22, C-73 and F-34 are as follows.

F-34

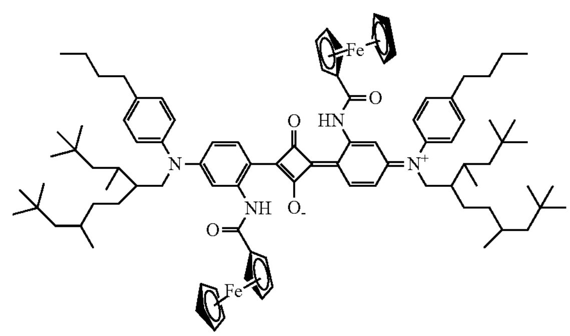

7-22

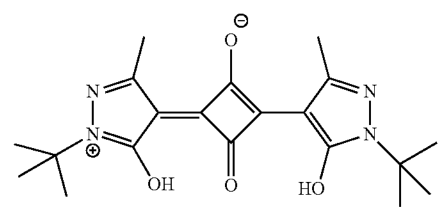

C-73

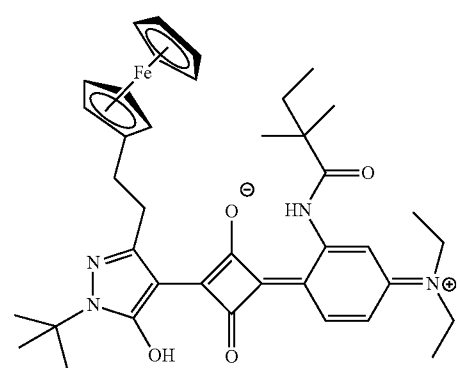

(Antifading Agent 1)

Antifading agent 1 used in Example 1

(Substrate A)

A cellulose acylate film (manufactured by Fuji Film Co., Ltd., trade name: ZRD40SL) was used as a substrate A.

(1) Preparation of Wavelength Selective Absorption Layer Forming Liquid A

Each component was mixed with the composition shown below to prepare a wavelength selective absorption layer forming liquid A.

| Composition of wavelength selective absorption layer forming liquid A | |
|---|---|
| Resin 9 | 95.5 parts by mass |
| Peelability control resin component: Tough Tech H-1043 (trade name, manufactured by Asahi Kasei Corporation) | 3.4 parts by mass |
| Leveling agent: MEGAFAC F-554 (manufactured by DIC Corporation, fluoropolymer) | 0.16 parts by mass |
| Dye E-24 | 0.39 parts by mass |
| Dye D-33 | 0.14 parts by mass |
| Dye C-80 | 0.15 parts by mass |
| Dye F34 | 0.23 parts by mass |
| Antifading agent 1 | 10.4 parts by mass |
| Cyclohexane (solvent) | 770.0 parts by mass |

Subsequently, the obtained wavelength selective absorption layer forming liquid A was filtered using a filter paper (#63, manufactured by Toyo Filter Paper Co., Ltd.) having an absolute filtration precision of 10 μm, and further filtered using a metal sintered filter (FH025, manufactured by Pall) with an absolute filtration precision of 2.5 μm.

(2) Preparation of Wavelength Selective Absorption Layer a with Substrate

The above-mentioned wavelength selective absorption layer forming liquid A after the filtration treatment was applied onto the substrate A by using a bar coater so that the film thickness after drying was 2.5 μm, and dried at 120° C. to prepare a wavelength selective absorption layer A with a substrate.

(3) Preparation of Wavelength Selective Absorption Layers B to D with Substrate

The wavelength selective absorption layers B to D with a substrate were prepared in the same manner as in the preparation of the wavelength selective absorption layer A with a substrate, except that the type and the amount of the dye added were changed to the contents shown in Table A-1 below.

<Light Resistance>

The light resistance of the laminate Nos. L502 to L511 produced above was evaluated in the same manner as in the light resistance evaluation described in Example 1. The results are shown in Table A-2 below. In addition, the laminate Nos. L503, L504, and L508 to L511 are not described in the table, but exhibit the same light resistance as No. L502.

As described above, it was found that the laminate Nos. L502 to L511 of the present invention have the same level of excellent light resistance as the laminate No. L501 of the present invention.

The dye F-29 in the table below is the same as the dye F-29 in Example 1.

TABLE A-2

| | Light Resistance | | | | | | |
|---|---|---|---|---|---|---|---|
| | Dye A | Dye B | | Dye C | | Dye D | |
| No. | E-24 | A-33 | 7-22 | C-80 | C-73 | F-29 | F-34 |
| L501 | 97% | 97% | — | 96% | — | 96% | — |
| L502 | 95% | 95% | — | 94% | — | — | 93% |
| L505 | 94% | 94% | — | — | 92% | — | 92% |
| L506 | 94% | — | 91% | 93% | — | — | 92% |
| L507 | 93% | — | 90% | — | 91% | — | 91% |

<Evaluation of Physical Properties of Gas Barrier Layer>

The gas barrier layer of the third layer in the laminate Nos. L501 and L502, and the layer consisting of the adhesive of the second layer and the gas barrier layer of the third layer in the laminate Nos. L503 to L511 correspond to the gas barrier layer of the laminate according to the embodiment of the present invention.

In the gas barrier layer in the present invention consisting of the second layer and the third layer, in the laminate Nos. L503 to L511, the degree of crystallinity and the oxygen permeability of the gas barrier layer were evaluated in the same manner as in Example 1. The results are shown in Table B.

TABLE A-1

| | Dye A | | | Dye B | | | Dye C | | | Dye D | | |
|---|---|---|---|---|---|---|---|---|---|---|---|---|
| No. | Type | $\lambda_{max}$ | Formulation amount | Type | $\lambda_{max}$ | Formulation amount | Type | $\lambda_{max}$ | Formulation amount | Type | $\lambda_{max}$ | Formulation amount |
| A | E-24 | 409 | 0.39 | A-33 | 513 | 0.14 | C-80 | 595 | 0.15 | F-34 | 699 | 0.23 |
| B | E-24 | 409 | 0.39 | A-33 | 513 | 0.14 | C-73 | 590 | 0.18 | F-34 | 699 | 0.23 |
| C | E-24 | 409 | 0.39 | 7-22 | 503 | 0.12 | C-80 | 595 | 0.15 | F-34 | 699 | 0.23 |
| D | E-24 | 409 | 0.39 | 7-22 | 503 | 0.12 | C-73 | 590 | 0.18 | F-34 | 699 | 0.23 |

<Preparation of Laminate Nos. L502 to L511>

The light resistance evaluation film of the laminate No. L116 produced in Example 1 was set as the laminate No. L501, in order from the visual recognition side, the TAC film containing a UV absorber was the first layer, the layer consisting of the pressure sensitive adhesive 1 was the second layer, the gas barrier layer was the third layer, the wavelength selective absorption layer 6 was the fourth layer, and the layer consisting of the pressure sensitive adhesive 1 was the fifth layer, and the glass was the sixth layer.

The laminate Nos. L502 to L511 were prepared in the same manner as laminate No. L501, except that the laminate No. L501, the types of the pressure sensitive adhesive constituting the second layer and the fifth layer and the wavelength selective absorption layer of the fourth layer were changed as described in Table B below.

After applying the adhesive layer corresponding to the second layer on the gas barrier layer of the laminate L116, the degree of crystallinity was calculated by peeling 2 to 3 mg of the adhesive layer and the barrier layer together and performing DSC measurement.

The thickness of the layer composed of second layer composed of the adhesive 1 or 2 was about 50 to 250 nm.

<Refractive Index>

The sum of the refractive index and thickness of each of the first to sixth layers constituting the laminate and the interfacial reflectivity was measured and calculated. The results are shown in Table B.

(Refractive Index)

The refractive indexes of the first layer and the sixth layer were calculated as follows.

A clear mier (trade name, black laminated film) manufactured by Tomoegawa Paper Co., Ltd. is attached to the surface opposite to the measurement surface of each sample (hereinafter referred to as the side surface of the substrate) so that interfacial reflection on the side surface of the substrate does not occur. Then, the reflectivity $R_1$ was measured in the range of 380 nm to 780 nm by irradiating the measurement surface side of the sample with light using a reflection spectroscopic film thickness meter FE3000 (trade name) manufactured by Otsuka Electronics Co., Ltd.

The reflectivity $R_1$ is expressed by the following equation (1) using the refractive index $n_1$ of the sample. Therefore, the refractive index $n_1$ of the sample at 380 nm to 780 nm was calculated from the measured value of the reflectivity.

$$R_1 = (1 - n_1)^2/(1 + n_1)^2 \quad \text{Equation (1)}$$

The refractive indexes of the second, third, fourth, and fifth layers and next layer were calculated as follows.

The formation liquid (sample) for each layer is applied to a support having a known refractive index with a film thickness of 1 to 3 m, and the same conditions as when forming a laminate composed of the first layer to the sixth layer (such as drying temperature) to prepare a laminate consisting of a support and a sample. A clear mier (trade name, black laminate film) manufactured by Tomogawa Paper Co., Ltd. is attached to the support side of this laminate to prevent interfacial reflection on the side surface of the substrate, and a reflection spectroscopic film thickness meter manufactured by Otsuka Electronics Co., Ltd. The measurement surface side of the sample was irradiated with light using FE3000 (trade name), and the reflectivity $R^2$ was measured in the range of 380 nm to 780 nm.

The reflectivity $R_2$ is expressed by the following equation (2) using the refractive index $n_2$ of the sample and the refractive index $n_3$ of the support. Therefore, the refractive index $n_2$ in the sample from 380 nm to 780 nm was calculated from the measured value of the reflectivity and the refractive index $n_3$ of the support.

$$R_2 = (n_2 - n_3)^2/(n_2 + n_3)^2 \quad \text{Equation (2)}$$

(Film Thickness)

The film thicknesses of the first to sixth layers were calculated as follows.

The cross section of the laminate was cut using a rotary microtome RM2265 (trade name) manufactured by LEICA, and the film thickness of each layer was determined using a scanning electron microscope S-4800 (trade name) manufactured by Hitachi High-Technologies Corporation.

<Sum of Interfacial Reflectivity>

The sum of the interfacial reflections of the laminate is calculated by using the refractive index and film thickness of each layer in the same manner as the method of Chapter 5, pages 173 to 174 of the 7th edition of "Applied Physical Engineering Selection Book 3 Thin Film" by Sadafumi Yoshida.

TABLE B

| | First layer | | Second layer | | | Third layer | | Fourth layer | | | Fifth layer | | | Sixth layer | Sum of interfacial reflectivity | Degree of crystallinity | Oxygen permeability |
|---|---|---|---|---|---|---|---|---|---|---|---|---|---|---|---|---|---|
| No. | n | Δn | Material | n | Δn | n | Δn | Wavelength selective absorption layer | n | Δn | Material | n | Δn | n | | | |
| L501 | 1.48 | 0.01 | Pressure sensitive adhesive 1 | 1.47 | 0.08 | 1.55 | 0.05 | 6 | 1.60 | 0.13 | Pressure sensitive adhesive 1 | 1.47 | 0.02 | 1.49 | 0.27% | 53% | 0.4 |
| L502 | 1.48 | 0.01 | Pressure sensitive adhesive 1 | 1.47 | 0.08 | 1.55 | 0.01 | A | 1.54 | 0.07 | Pressure sensitive adhesive 1 | 1.47 | 0.02 | 1.49 | 0.10% | 53% | 0.4 |
| L503 | 1.48 | 0.05 | Adhesive 1 | 1.53 | 0.02 | 1.55 | 0.01 | A | 1.54 | 0.07 | Pressure sensitive adhesive 1 | 1.47 | 0.02 | 1.49 | 0.06% | 56% | 0.4 |
| L504 | 1.48 | 0.05 | Adhesive 1 | 1.53 | 0.02 | 1.55 | 0.01 | A | 1.54 | 0.04 | Pressure sensitive adhesive 2 | 1.50 | 0.01 | 1.49 | 0.02% | 56% | 0.4 |
| L505 | 1.48 | 0.05 | Adhesive 1 | 1.53 | 0.02 | 1.55 | 0.01 | B | 1.54 | 0.04 | Pressure sensitive adhesive 2 | 1.50 | 0.01 | 1.49 | 0.02% | 56% | 0.4 |
| L506 | 1.48 | 0.05 | Adhesive 1 | 1.53 | 0.02 | 1.55 | 0.01 | C | 1.54 | 0.04 | Pressure sensitive adhesive 2 | 1.50 | 0.01 | 1.49 | 0.02% | 56% | 0.4 |
| L507 | 1.48 | 0.05 | Adhesive 1 | 1.53 | 0.02 | 1.55 | 0.01 | D | 1.54 | 0.04 | Pressure sensitive adhesive 2 | 1.50 | 0.01 | 1.49 | 0.02% | 56% | 0.4 |
| L508 | 1.48 | 0.05 | Adhesive 1 | 1.53 | 0.02 | 1.55 | 0.01 | A | 1.54 | 0.02 | Pressure sensitive adhesive 3 | 1.52 | 0.03 | 1.49 | 0.02% | 56% | 0.4 |
| L509 | 1.48 | 0.05 | Adhesive 1 | 1.53 | 0.02 | 1.55 | 0.01 | A | 1.54 | 0.05 | Pressure sensitive adhesive 4 | 1.49 | 0 | 1.49 | 0.03% | 56% | 0.4 |
| L510 | 1.48 | 0.03 | Adhesive 1 | 1.51 | 0.04 | 1.55 | 0.01 | A | 1.54 | 0.04 | Pressure sensitive adhesive 2 | 1.50 | 0.01 | 1.49 | 0.02% | 50% | 0.4 |
| L511 | 1.48 | 0.03 | Adhesive 1 | 1.51 | 0.04 | 1.55 | 0.01 | A | 1.54 | 0.02 | Pressure sensitive adhesive 3 | 1.52 | 0.03 | 1.49 | 0.02% | 50% | 0.4 |

<Note in Table B>

As described above, the first layer is composed of a TAC film containing a UV absorber, the third layer is composed of Excelval AQ-4104 (trade name, manufactured by Kuraray Co., Ltd.), and the sixth layer is composed of glass.

Among the wavelength selective absorption layers of the fourth layer, the wavelength selective absorption layer 6 is composed of a polystyrene resin and a polyphenylene ether resin, and the wavelength selective absorption layers A to D are composed of a cyclic polyolefin resin.

"n" means the refractive index, and "Δn" means the difference in the refractive index between the two layers described on the left and right thereof.

The pressure sensitive adhesives and adhesives described in the table are as follows.

(Pressure Sensitive Adhesive)

Pressure Sensitive Adhesive 1: SK-2057 (trade name, manufactured by Soken Chemical Co., Ltd.)

Pressure Sensitive Adhesive 2: Add 10 parts by mass of the following triazine compound to the pressure sensitive adhesive 1 with respect to 100 parts by mass of solid content.

Pressure Sensitive Adhesive 3: Add 20 parts by mass of the following triazine compound to the pressure sensitive adhesive 1 with respect to 100 parts by mass of solid content.

Pressure Sensitive Adhesive 4: Add 2.6 parts by mass of the following benzodithiol compound to the pressure sensitive adhesive 1 with respect to 100 parts by mass of solid content.

In the pressure sensitive adhesives 2 to 4, the solid content means a component other than the solvent in the pressure sensitive adhesive 1.

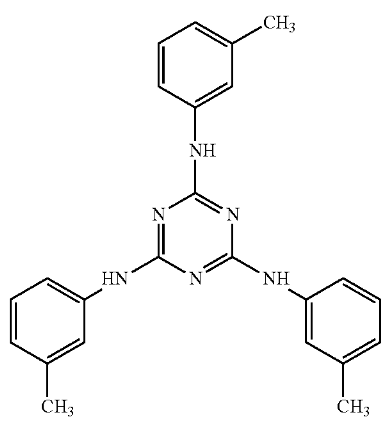

Triazine-based compound

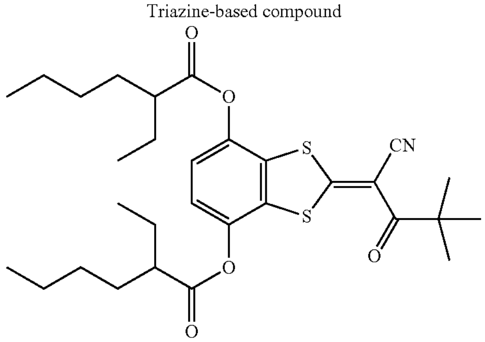

Benzodithiol-based compound (Adhesive)

Adhesive 1: Kuraray Poval 5-98 (trade name, manufactured by Kuraray Co., Ltd., saponification degree 98.0-99.0 mol %)

Adhesive 2: Kuraray Poval 5-88 (trade name, manufactured by Kuraray, saponification degree 86.5 to 89.0 mol %)/Kuraray Poval CP-1220T10 (trade name, manufactured by Kuraray Co., Ltd.)=1/2 mass ratio mixture As shown in Table B, the laminate Nos. L501 to L511 can suppress the sum of interfacial reflectivity to 0.30% or less, and among them, the laminate Nos. L502 to L511 in which all the differences in refractive index between adjacent layers were 0.10 or less can suppress the sum of interfacial reflectivity to 0.10% or less, and were more excellent from the viewpoint of suppressing external light reflection. In particular, the laminate Nos. L504 to L511 in which the difference in refractive index between adjacent layers is 0.05 or less can suppress the sum of interfacial reflectivity to 0.03% or less, and are particularly excellent from the viewpoint of suppressing external light reflection.

Although the present invention has been described with reference to the embodiments, it is our intention that the present invention not be limited by any of the details of the description, unless otherwise specified, but rather be construed broadly within its spirit and scope as set out in the accompanying claims.

EXPLANATION OF REFERENCES

1: OLED display device
11: substrate
12: thin film transistor (TFT)
13: anode
14: blue OLED (BOLED)
15: cathode
16: barrier film
21: red-green selective reflective layer (RG selective reflective layer)
31: layer containing red quantum dots (red QD) and light diffusing body
32: red color filter
41: layer containing green quantum dots (green QD) and light diffusing body
42: green color filter
51: blue selective reflective layer (B selective reflective layer)
62: blue color filter
71: black matrix
81: glass
82: wavelength selective absorption filter (wavelength selective absorption layer)
83: surface film
91: wavelength selective absorption layer
92: gas barrier layer
93: laminate
AR: external light
$BM_{in}$: incidence of external light on black matrix
$R_{in}$: incidence of external light on red pixel
$G_{in}$: Incidence of external light on green pixel
$B_{in}$: Incidence of external light on blue pixel
$BM_{ref}$: reflection of external light in black matrix
$R_{ref}$: reflection of external light in red pixel
$G_{ref}$: reflection of external light in green pixel
$B_{ref}$: reflection of external light in blue pixel

What is claimed is:

1. A laminate comprising:

a wavelength selective absorption layer containing a thermoplastic polymer resin, a dye including at least one of the following dyes A to D, and an antifading agent for a dye; and a gas barrier layer directly arranged on at least one surface of the wavelength selective absorption layer, wherein the gas barrier layer contains a crystalline resin, a thickness of the gas barrier layer is 0.1 μm to 10 μm, and an oxygen permeability of the gas barrier layer is 60 $cc/m^2 \cdot day \cdot atm$ or less, dye A: a dye having a main absorption wavelength range at a wavelength of 390 to 435 nm, dye B: a dye having a main absorption wavelength range at a wavelength of 480 to 520 nm, dye C: a dye having a main absorption wavelength range at a wavelength of 580 to 620 nm, and dye D: a dye having a main absorption wavelength range at a wavelength of 680 to 780 nm, and wherein the amount of the thermoplastic polymer resin in the wavelength selective absorption layer is 70% by mass or more and 99.90% by mass or less.

2. The laminate according to claim 1, wherein a degree of crystallinity of the crystalline resin contained in the gas barrier layer is 25% or more.

3. The laminate according to claim 1, wherein the oxygen permeability of the gas barrier layer is 0.001 $cc/m^2 \cdot day \cdot atm$ or more and 60 $cc/m^2 \cdot day \cdot atm$ or less.

4. The laminate according to claim 1, wherein the dye includes the dye B and/or the dye C, and wherein at least one of the dyes B or C is a squarine-based coloring agent represented by General Formula (1), General Formula (1)

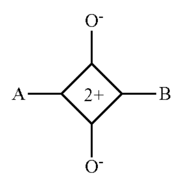

in the formula, A and B each independently represent an aryl group which may have a substituent, a heterocyclic group which may have a substituent, or —CH=G, and G represents a heterocyclic group which may have a substituent.

5. The laminate according to claim 1, wherein the dye includes the dye A, and wherein the dye A is a coloring agent represented by General Formula (A1), General Formula (A1)

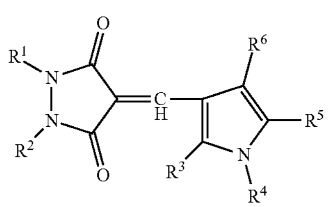

in the formula, $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

6. The laminate according to claim 1, wherein the dye D is at least one of a coloring agent represented by General Formula (D1) or a coloring agent represented by General Formula (1), General Formula (D1)

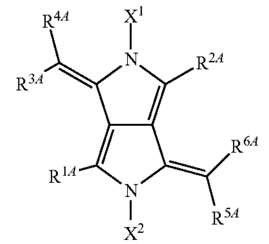

in the formula, $R^{1A}$ and $R^{2A}$ each independently represent an alkyl group, an aryl group, or a heteroaryl group, $R^{4A}$ and $R^{5A}$ each independently represent a heteroaryl group, and $R^{3A}$ and $R^{6A}$ each independently represent a substituent, $X^1$ and $X^2$ each independently represent $—BR^{21a}R^{22a}$, $R^{21a}$ and $R^{22a}$ each independently represent a substituent, and $R^{21a}$ and $R^{22a}$ may be bonded to each other to form a ring, General Formula (1)

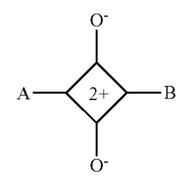

in the formula, A and B each independently represent an aryl group which may have a substituent, a heterocyclic group which may have a substituent, or —CH=G, and G represents a heterocyclic group which may have a substituent.

7. The laminate according to claim 1, wherein the antifading agent is represented by General Formula (IV), General Formula (IV)

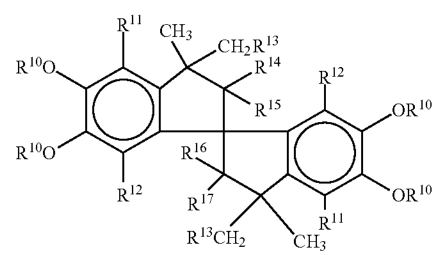

in the formula, $R^{10}$'s each independently represent an alkyl group, an alkenyl group, an aryl group, a heterocyclic group, or a group represented by $R^{18}CO—$, $R^{19}SO_2—$ or $R^{20}NHCO—$, $R^{18}$, $R^{19}$, and $R^{20}$ each independently represent an alkyl group, an alkenyl group, an aryl group, or a heterocyclic group, $R^{11}$ and $R^{12}$ each independently represent a hydrogen atom, a halogen atom, an alkyl group, an alkenyl group, an alkoxy group, or an alkenyloxy group, and $R^{13}$ to $R^{17}$ each independently represent a hydrogen atom, an alkyl group, an alkenyl group, or an aryl group.

8. The laminate according to claim 1, wherein the resin in the wavelength selective absorption layer includes a polystyrene resin.

9. The laminate according to claim 1, wherein the resin in the wavelength selective absorption layer includes a cyclic polyolefin resin.

10. The laminate according to claim 1, wherein the wavelength selective absorption layer contains all four dyes A to D.

11. The laminate according to claim 1, further comprising:

an ultraviolet absorption layer arranged on an opposite side of the wavelength selective absorption layer with respect to the gas barrier layer, and at least one layer of a pressure sensitive adhesive layer or an adhesive layer, wherein any difference in a refractive index between adjacent layers in all the layers forming the laminate is 0.05 or less.

12. An organic electroluminescent display device comprising:

the laminate according to claim 1.

13. The laminate according to claim 1, wherein any difference in a refractive index between adjacent layers in all the layers forming the laminate is 0.15 or less.

14. The laminate according to claim 1, wherein the sum of interfacial reflectivity of the laminate is 0.30% or less.

15. A laminate comprising:

a wavelength selective absorption layer containing a resin, a dye including at least one of the following dyes A to D, and an antifading agent for a dye; and a gas barrier layer directly arranged on at least one surface of the wavelength selective absorption layer, wherein the gas barrier layer contains a crystalline resin, a thickness of the gas barrier layer is 0.1 μm to 10 μm, and an oxygen permeability of the gas barrier layer is 60 $cc/m^2 \cdot day \cdot atm$ or less, any difference in a refractive index between adjacent layers in all the layers forming the laminate is 0.15 or less, dye A: a dye having a main absorption wavelength range at a wavelength of 390 to 435 nm, dye B: a dye having a main absorption wavelength range at a wavelength of 480 to 520 nm, dye C: a dye having a main absorption wavelength range at a wavelength of 580 to 620 nm, and dye D: a dye having a main absorption wavelength range at a wavelength of 680 to 780 nm.

* * * * *